US011683037B2

(12) United States Patent
Lee et al.

(10) Patent No.: US 11,683,037 B2
(45) Date of Patent: Jun. 20, 2023

(54) LOGIC DRIVE USING STANDARD COMMODITY PROGRAMMABLE LOGIC IC CHIPS

(71) Applicant: iCometrue Company Ltd., Zhubei (TW)

(72) Inventors: Jin-Yuan Lee, Hsinchu (TW); Mou-Shiung Lin, Hsinchu (TW)

(73) Assignee: iCometrue Company Ltd., Hsin-Chu County (TW)

( * ) Notice: Subject to any disclaimer, the term of this patent is extended or adjusted under 35 U.S.C. 154(b) by 0 days.

(21) Appl. No.: 17/381,193

(22) Filed: Jul. 21, 2021

(65) Prior Publication Data

US 2021/0351775 A1    Nov. 11, 2021

Related U.S. Application Data

(63) Continuation of application No. 16/820,677, filed on Mar. 16, 2020, now Pat. No. 11,101,801, which is a continuation of application No. 16/420,077, filed on May 22, 2019, now Pat. No. 10,608,638.

(60) Provisional application No. 62/768,978, filed on Nov. 18, 2018, provisional application No. 62/755,415, filed on Nov. 2, 2018, provisional application No. 62/741,513, filed on Oct. 4, 2018, provisional application No. 62/729,527, filed on Sep. 11, 2018, provisional application No. 62/675,785, filed on May 24, 2018.

(51) Int. Cl.
  *H03K 19/0175* (2006.01)
  *H03K 19/1776* (2020.01)
  *G06F 30/34* (2020.01)

(52) U.S. Cl.
  CPC ..... *H03K 19/017581* (2013.01); *G06F 30/34* (2020.01); *H03K 19/1776* (2013.01)

(58) Field of Classification Search
  CPC ................. H03K 19/01; H03K 19/017; H03K 19/017581; H03K 19/177; H03K 19/1776; H03K 19/17724; H03K 19/17728; G06F 30/30; G06F 30/34
  See application file for complete search history.

(56) References Cited

U.S. PATENT DOCUMENTS

| 4,870,302 A | 9/1989 | Freeman |
| 5,272,368 A | 12/1993 | Turner et al. |

(Continued)

FOREIGN PATENT DOCUMENTS

| CN | 103681367 | 3/2014 |
| CN | 104282650 | 1/2015 |

(Continued)

*Primary Examiner* — Jason Crawford

(57) ABSTRACT

An expandable logic scheme based on a chip package, includes: an interconnection substrate comprising a set of data buses for use in an expandable interconnection scheme, wherein the set of data buses is divided into a plurality of data bus subsets; and a first field-programmable-gate-array (FPGA) integrated-circuit (IC) chip comprising a plurality of first I/O ports coupling to the set of data buses and at least one first I/O-port selection pad configured to select a first port from the plurality of first I/O ports in a first clock cycle to pass a first data between a first data bus subset of the plurality of data bus subsets and the first field-programmable-gate-array (FPGA) integrated-circuit (IC) chip.

22 Claims, 41 Drawing Sheets

(56) References Cited

U.S. PATENT DOCUMENTS

| | | | |
|---|---|---|---|
| 5,587,603 A | 12/1996 | Kowshik | |
| 5,592,102 A | 1/1997 | Lane et al. | |
| 5,689,195 A | 11/1997 | Cliff et al. | |
| 5,796,662 A | 8/1998 | Kalter et al. | |
| 6,020,633 A | 2/2000 | Erikson | |
| 6,167,558 A | 12/2000 | Trimberger | |
| 6,356,478 B1 | 3/2002 | McCollum | |
| 6,388,466 B1 | 5/2002 | Wittig et al. | |
| 6,404,226 B1 | 6/2002 | Schadt | |
| 6,687,167 B2 | 2/2004 | Guaitini et al. | |
| 6,798,240 B1* | 9/2004 | Pedersen | H03K 19/17728 326/39 |
| 6,812,086 B2 | 11/2004 | Murthy et al. | |
| 6,828,823 B1 | 12/2004 | Tsui | |
| 6,943,580 B2 | 9/2005 | Lewis et al. | |
| 6,998,872 B1 | 2/2006 | Chirania et al. | |
| 7,030,652 B1 | 4/2006 | Lewis et al. | |
| 7,061,271 B1 | 6/2006 | Young et al. | |
| 7,190,190 B1 | 3/2007 | Camarota | |
| 7,193,433 B1 | 3/2007 | Young | |
| 7,219,237 B1 | 5/2007 | Trimberger | |
| 7,366,306 B1 | 4/2008 | Trimberger | |
| 7,385,417 B1 | 6/2008 | Agrawal et al. | |
| 7,420,390 B1* | 9/2008 | Hutton | H03K 19/1776 326/38 |
| 7,550,994 B1* | 6/2009 | Camarota | G11C 7/20 326/38 |
| 7,598,555 B1 | 10/2009 | Papworth Parkin | |
| 7,653,891 B1* | 1/2010 | Anderson | H03K 19/17784 326/41 |
| 7,747,025 B1 | 6/2010 | Trimberger | |
| 7,853,799 B1 | 12/2010 | Trimberger | |
| 7,933,140 B2 | 4/2011 | Wang et al. | |
| 7,944,231 B2 | 5/2011 | Javerliac | |
| 7,948,266 B2* | 5/2011 | Schmit | G06F 30/39 326/38 |
| 7,973,556 B1 | 7/2011 | Noguera Serra et al. | |
| 8,064,224 B2 | 11/2011 | Mahajan et al. | |
| 8,081,079 B1 | 12/2011 | Camarota | |
| 8,159,268 B1* | 4/2012 | Madurawe | H01L 27/11807 326/47 |
| 8,243,527 B2 | 8/2012 | Hung et al. | |
| 8,354,297 B2 | 1/2013 | Pagaila et al. | |
| 8,378,407 B2 | 2/2013 | Audzeyeu et al. | |
| 8,531,032 B2 | 9/2013 | Yu et al. | |
| 8,546,955 B1 | 10/2013 | Wu | |
| 8,592,886 B2 | 11/2013 | Hsu et al. | |
| 8,742,579 B2 | 6/2014 | Pagaila et al. | |
| 8,786,060 B2 | 7/2014 | Yen et al. | |
| 8,796,137 B2 | 8/2014 | Pagaila et al. | |
| 8,866,292 B2 | 10/2014 | Beer et al. | |
| 8,872,349 B2 | 10/2014 | Chiu et al. | |
| 8,878,360 B2 | 11/2014 | Meyer et al. | |
| 8,883,561 B2 | 11/2014 | Park et al. | |
| 8,885,334 B1 | 11/2014 | Baxter | |
| 8,895,440 B2 | 11/2014 | Choi et al. | |
| 8,912,822 B2 | 12/2014 | Yasuda | |
| 8,916,421 B2 | 12/2014 | Gong et al. | |
| 8,941,230 B2 | 1/2015 | Kyozuka et al. | |
| 8,952,489 B2 | 2/2015 | Elian et al. | |
| 8,952,521 B2 | 2/2015 | Wojnowski et al. | |
| 8,987,918 B2 | 3/2015 | Razdan et al. | |
| 8,993,377 B2 | 3/2015 | Koo et al. | |
| 9,003,221 B1 | 4/2015 | Abugharbieh et al. | |
| 9,082,806 B2 | 7/2015 | Lin et al. | |
| 9,106,229 B1 | 8/2015 | Hutton | |
| 9,135,185 B2 | 9/2015 | Loh et al. | |
| 9,147,638 B2 | 9/2015 | Liu et al. | |
| 9,224,647 B2 | 12/2015 | Koo et al. | |
| 9,225,512 B1 | 12/2015 | Trimberger | |
| 9,252,127 B1 | 2/2016 | Shen et al. | |
| 9,263,370 B2 | 2/2016 | Shenoy et al. | |
| 9,281,292 B2 | 3/2016 | Hu et al. | |
| 9,324,672 B2 | 4/2016 | Pagaila et al. | |
| 9,331,060 B2 | 5/2016 | Otremba et al. | |
| 9,343,442 B2 | 5/2016 | Chen et al. | |
| 9,349,703 B2 | 5/2016 | Chiu et al. | |
| 9,349,713 B2 | 5/2016 | Kim et al. | |
| 9,362,187 B2 | 6/2016 | Ossimitz | |
| 9,385,006 B2 | 7/2016 | Lin | |
| 9,385,009 B2 | 7/2016 | Lin et al. | |
| 9,385,105 B2 | 7/2016 | Meyer et al. | |
| 9,396,998 B2 | 7/2016 | Kurita et al. | |
| 9,397,050 B2 | 7/2016 | Shin et al. | |
| 9,406,619 B2 | 8/2016 | Pagaila et al. | |
| 9,406,658 B2 | 8/2016 | Lee et al. | |
| 9,437,260 B2* | 9/2016 | Prenat | H03K 19/17764 |
| 9,449,930 B2 | 9/2016 | Kim et al. | |
| 9,455,218 B2 | 9/2016 | Ooi et al. | |
| 9,508,626 B2 | 11/2016 | Pagaila et al. | |
| 9,524,955 B2 | 12/2016 | Huang et al. | |
| 9,543,276 B2 | 1/2017 | Jee et al. | |
| 9,583,431 B1 | 2/2017 | Rahman | |
| 9,593,009 B2 | 3/2017 | Fuergut et al. | |
| 9,607,967 B1 | 3/2017 | Shih | |
| 9,627,365 B1 | 4/2017 | Yu et al. | |
| 9,640,259 B2 | 5/2017 | Li et al. | |
| 9,679,863 B2 | 6/2017 | Lin et al. | |
| 9,704,843 B2 | 7/2017 | Kilger et al. | |
| 9,722,584 B1 | 8/2017 | Chang et al. | |
| 9,735,113 B2 | 8/2017 | Chi et al. | |
| 9,763,329 B1 | 9/2017 | Mason | |
| 9,773,757 B2 | 9/2017 | Yu et al. | |
| 9,806,058 B2 | 10/2017 | Wei et al. | |
| 9,812,337 B2 | 11/2017 | Chen et al. | |
| 9,818,720 B2 | 11/2017 | Wei et al. | |
| 9,831,148 B2 | 11/2017 | Yu et al. | |
| 9,859,896 B1 | 1/2018 | Gaide et al. | |
| 9,881,850 B2 | 1/2018 | Yu et al. | |
| 9,887,206 B2 | 2/2018 | Su et al. | |
| 9,893,732 B1 | 2/2018 | Lewis | |
| 9,899,248 B2 | 2/2018 | Yu et al. | |
| 9,899,355 B2 | 2/2018 | Yuan et al. | |
| 9,935,113 B2 | 4/2018 | Wu et al. | |
| 9,966,325 B2 | 5/2018 | Beyne | |
| 9,997,464 B2 | 6/2018 | Hsieh et al. | |
| 10,015,916 B1 | 7/2018 | Karp | |
| 10,026,681 B2 | 7/2018 | Ko et al. | |
| 10,033,383 B1 | 7/2018 | Richter et al. | |
| 10,037,963 B2 | 7/2018 | Chen et al. | |
| 10,038,647 B1 | 7/2018 | Lesea | |
| 10,043,768 B2 | 8/2018 | Meyer et al. | |
| 10,056,351 B2 | 8/2018 | Yu et al. | |
| 10,056,907 B1 | 8/2018 | Asnaashari | |
| 10,062,648 B2 | 8/2018 | Hsieh et al. | |
| 10,062,651 B2 | 8/2018 | Liang et al. | |
| 10,079,243 B2 | 9/2018 | Ramkumar | |
| 10,109,559 B2 | 10/2018 | Lin et al. | |
| 10,109,588 B2 | 10/2018 | Jeong et al. | |
| 10,109,617 B2 | 11/2018 | Sugiyama et al. | |
| 10,153,222 B2 | 12/2018 | Yu et al. | |
| 10,153,239 B2 | 12/2018 | Wang et al. | |
| 10,157,828 B2 | 12/2018 | Hsu et al. | |
| 10,157,849 B2 | 12/2018 | Huang et al. | |
| 10,163,798 B1 | 12/2018 | Alur et al. | |
| 10,163,802 B2 | 12/2018 | Lin et al. | |
| 10,204,684 B2 | 2/2019 | Widjaja | |
| 10,211,070 B2 | 2/2019 | Lee et al. | |
| 10,211,182 B2 | 2/2019 | Meyer et al. | |
| 10,256,219 B2 | 4/2019 | Chew | |
| 10,333,623 B2 | 6/2019 | Liao et al. | |
| 10,340,249 B1 | 7/2019 | Yu et al. | |
| 10,373,885 B2 | 8/2019 | Yu et al. | |
| 10,419,001 B2 | 9/2019 | Jo et al. | |
| 10,431,536 B2 | 10/2019 | Kim et al. | |
| 10,447,274 B2 | 10/2019 | Lee et al. | |
| 10,476,505 B2 | 11/2019 | Ngai | |
| 10,489,544 B2* | 11/2019 | Lin | G05B 19/0423 |
| 10,504,835 B1 | 12/2019 | Wang et al. | |
| 10,510,634 B2 | 12/2019 | Lin et al. | |
| 10,510,650 B2 | 12/2019 | Yu et al. | |
| 10,522,449 B2 | 12/2019 | Chen et al. | |
| 10,541,227 B2 | 1/2020 | Yeh et al. | |

(56) References Cited

U.S. PATENT DOCUMENTS

| | | |
|---|---|---|
| 10,541,228 B2 | 1/2020 | Chen et al. |
| 10,608,638 B2 * | 3/2020 | Lee ................ H03K 19/017581 |
| 10,622,321 B2 | 4/2020 | Yu et al. |
| 11,093,677 B2 * | 8/2021 | Lin ........................ G11C 7/1012 |
| 11,101,801 B2 * | 8/2021 | Lee ........................ H03K 19/177 |
| 11,211,334 B2 | 12/2021 | Lin et al. |
| 2001/0045844 A1 | 11/2001 | New et al. |
| 2002/0092307 A1 | 7/2002 | Ghoshal |
| 2003/0122578 A1 * | 7/2003 | Masui ............... H03K 19/17752 |
| | | 326/39 |
| 2004/0041584 A1 | 3/2004 | Sunaga et al. |
| 2004/0145850 A1 | 7/2004 | Fukumoto et al. |
| 2004/0222817 A1 | 11/2004 | Madurawe |
| 2005/0218929 A1 | 10/2005 | Wang et al. |
| 2006/0138509 A1 | 6/2006 | Lee et al. |
| 2007/0164279 A1 | 7/2007 | Lin et al. |
| 2007/0166912 A1 | 7/2007 | Fenigstein et al. |
| 2007/0279987 A1 | 12/2007 | Fang et al. |
| 2009/0114971 A1 | 5/2009 | Cai et al. |
| 2009/0243650 A1 * | 10/2009 | Madurawe ....... H03K 19/17796 |
| | | 326/38 |
| 2009/0243652 A1 * | 10/2009 | Dorairaj ............... G11C 7/1006 |
| | | 326/38 |
| 2009/0267238 A1 | 10/2009 | Joseph |
| 2010/0039136 A1 | 2/2010 | Chua-Eoan et al. |
| 2010/0133704 A1 * | 6/2010 | Marimuthu ......... H01L 23/3128 |
| | | 257/E23.116 |
| 2010/0157669 A1 | 6/2010 | Audzeyeu |
| 2010/0283085 A1 | 11/2010 | Bemanian |
| 2011/0026232 A1 | 2/2011 | Lin et al. |
| 2011/0221470 A1 | 9/2011 | Javerliac et al. |
| 2012/0217549 A1 | 8/2012 | Widjaja |
| 2013/0257477 A1 | 10/2013 | Yasuda et al. |
| 2013/0285253 A1 | 10/2013 | Aoki et al. |
| 2014/0017882 A1 | 1/2014 | Lei |
| 2014/0070380 A1 | 3/2014 | Chiu et al. |
| 2014/0070403 A1 | 3/2014 | Pan et al. |
| 2014/0112066 A1 | 4/2014 | Chow et al. |
| 2014/0131858 A1 | 5/2014 | Pan et al. |
| 2014/0183731 A1 | 7/2014 | Lin et al. |
| 2014/0203412 A1 | 7/2014 | Wang et al. |
| 2014/0210097 A1 | 7/2014 | Chen |
| 2014/0254232 A1 | 9/2014 | Wu |
| 2014/0302659 A1 | 10/2014 | Phatak |
| 2015/0008957 A1 | 1/2015 | Olgiati et al. |
| 2015/0014844 A1 | 1/2015 | Wu et al. |
| 2015/0085560 A1 | 3/2015 | Candelier et al. |
| 2015/0116965 A1 | 4/2015 | Kim et al. |
| 2015/0227662 A1 | 8/2015 | Lepercq |
| 2015/0287672 A1 * | 10/2015 | Yazdani ............ H01L 23/49827 |
| | | 257/774 |
| 2015/0327367 A1 | 11/2015 | Shen |
| 2016/0118390 A1 | 4/2016 | Liaw |
| 2016/0133571 A1 | 5/2016 | Lee et al. |
| 2016/0173101 A1 * | 6/2016 | Gao ................... H03K 19/1776 |
| | | 438/107 |
| 2016/0190113 A1 | 6/2016 | Sharan et al. |
| 2016/0217835 A1 | 7/2016 | Blott et al. |
| 2016/0351626 A1 | 12/2016 | McCollum |
| 2016/0372449 A1 * | 12/2016 | Rusu ........................ H01L 23/64 |
| 2017/0301650 A1 | 10/2017 | Yu |
| 2018/0053730 A1 | 2/2018 | Shao |
| 2018/0061742 A1 | 3/2018 | Ananiev |
| 2018/0068937 A1 | 3/2018 | Marimuthu et al. |
| 2018/0076179 A1 | 3/2018 | Hsu et al. |
| 2018/0150667 A1 | 5/2018 | Yu et al. |
| 2018/0151477 A1 | 5/2018 | Yu et al. |
| 2018/0151501 A1 | 5/2018 | Yu et al. |
| 2018/0158746 A1 | 6/2018 | Lin |
| 2018/0165396 A1 * | 6/2018 | Lin ........................ G11C 7/1012 |
| 2018/0174865 A1 | 6/2018 | Yu et al. |
| 2018/0204810 A1 | 7/2018 | Yu et al. |
| 2018/0204828 A1 | 7/2018 | Yu et al. |
| 2018/0210799 A1 | 7/2018 | Gao et al. |
| 2018/0226349 A1 | 8/2018 | Yu et al. |
| 2018/0247905 A1 | 8/2018 | Yu et al. |
| 2018/0269188 A1 | 9/2018 | Yu et al. |
| 2018/0275193 A1 | 9/2018 | Rouge et al. |
| 2018/0284186 A1 | 10/2018 | Chadha |
| 2018/0286776 A1 | 10/2018 | Yu et al. |
| 2018/0301351 A1 | 10/2018 | Yu et al. |
| 2018/0301376 A1 | 10/2018 | Shih et al. |
| 2018/0350629 A1 | 12/2018 | Liu et al. |
| 2018/0350763 A1 | 12/2018 | Yu et al. |
| 2018/0358312 A1 | 12/2018 | Yu et al. |
| 2018/0374824 A1 | 12/2018 | Yu et al. |
| 2019/0013276 A1 | 1/2019 | Lee et al. |
| 2019/0019756 A1 | 1/2019 | Yu et al. |
| 2019/0020343 A1 | 1/2019 | Lin et al. |
| 2019/0051641 A1 * | 2/2019 | Lee ........................ H01L 21/563 |
| 2019/0057932 A1 | 2/2019 | Wu et al. |
| 2019/0097304 A1 | 3/2019 | Hsiao et al. |
| 2019/0129817 A1 | 5/2019 | Zhuo et al. |
| 2019/0221547 A1 | 7/2019 | Drab et al. |
| 2019/0238134 A1 | 8/2019 | Lin et al. |
| 2019/0238135 A1 | 8/2019 | Lin et al. |
| 2019/0245543 A1 | 8/2019 | Lin et al. |
| 2019/0253056 A1 | 8/2019 | Lin et al. |
| 2019/0304803 A1 | 10/2019 | Hu et al. |
| 2019/0333871 A1 | 10/2019 | Chen et al. |
| 2019/0347790 A1 | 11/2019 | Lin et al. |
| 2019/0363715 A1 | 11/2019 | Lin et al. |
| 2019/0372574 A1 | 12/2019 | Lin et al. |
| 2020/0058617 A1 | 2/2020 | Wu et al. |
| 2020/0082885 A1 | 3/2020 | Lin et al. |
| 2020/0111734 A1 * | 4/2020 | Lin ........................ H01L 23/5385 |
| 2020/0144224 A1 | 5/2020 | Lin et al. |
| 2020/0161242 A1 | 5/2020 | Lin et al. |
| 2020/0243422 A1 | 7/2020 | Kim et al. |
| 2020/0373215 A1 | 11/2020 | Wu et al. |
| 2021/0043557 A1 | 2/2021 | Lin et al. |
| 2021/0050300 A1 | 2/2021 | Lin et al. |
| 2021/0090983 A1 | 3/2021 | Lin et al. |
| 2021/0005592 A1 | 4/2021 | Lin et al. |
| 2021/0159180 A1 * | 5/2021 | Zhai ..................... H01L 23/5384 |
| 2021/0217702 A1 | 7/2021 | Dabral et al. |
| 2021/0232744 A1 | 7/2021 | Lin et al. |
| 2021/0351775 A1 * | 11/2021 | Lee ................ H03K 19/017581 |
| 2022/0013504 A1 | 1/2022 | Dabral et al. |
| 2022/0014198 A1 * | 1/2022 | Lee ........................ H01L 45/1233 |
| 2022/0149845 A1 * | 5/2022 | Lee ........................ H01L 24/19 |

FOREIGN PATENT DOCUMENTS

| | | |
|---|---|---|
| CN | 105745752 | 7/2016 |
| CN | 104078453 | 4/2017 |
| TW | 200623398 | 7/2006 |
| WO | WO00/36748 | 6/2000 |
| WO | 2005010976 | 2/2005 |
| WO | WO2016160063 | 10/2016 |

* cited by examiner

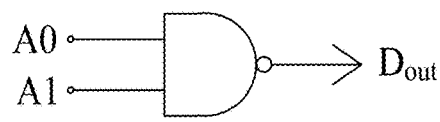
Fig. 7A
| A0 | A1 | Dout | |
|---|---|---|---|
| 0 | 0 | 1 | D0 |
| 0 | 1 | 1 | D1 |
| 1 | 0 | 1 | D2 |
| 1 | 1 | 0 | D3 |
Fig. 7B
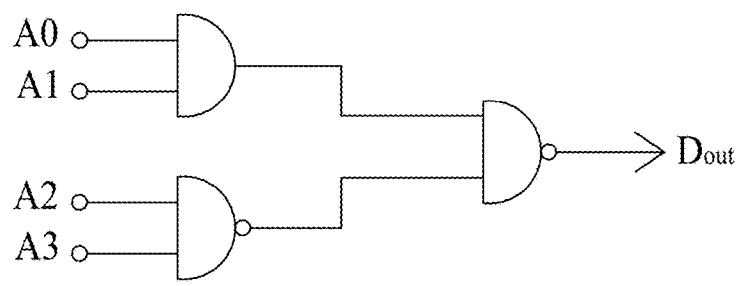
Fig. 7C
| Input | | | | Onput | |
|---|---|---|---|---|---|
| A0 | A1 | A2 | A3 | Dout | |
| 0 | 0 | 0 | 0 | 1 | D0 |
| 0 | 0 | 0 | 1 | 1 | D1 |
| 0 | 0 | 1 | 0 | 1 | D2 |
| 0 | 0 | 1 | 1 | 1 | D3 |
| 0 | 1 | 0 | 0 | 1 | D4 |
| 0 | 1 | 0 | 1 | 1 | D5 |
| 0 | 1 | 1 | 0 | 1 | D6 |
| 0 | 1 | 1 | 1 | 1 | D7 |
| 1 | 0 | 0 | 0 | 1 | D8 |
| 1 | 0 | 0 | 1 | 1 | D9 |
| 1 | 0 | 1 | 0 | 1 | D10 |
| 1 | 0 | 1 | 1 | 1 | D11 |
| 1 | 1 | 0 | 0 | 0 | D12 |
| 1 | 1 | 0 | 1 | 0 | D13 |
| 1 | 1 | 1 | 0 | 0 | D14 |
| 1 | 1 | 1 | 1 | 1 | D15 |
Fig. 7D

LOGIC DRIVE USING STANDARD COMMODITY PROGRAMMABLE LOGIC IC CHIPS

PRIORITY CLAIM

This application is a continuation of application Ser. No. 16/820,677, filed Mar. 16, 2020, now pending, which is a continuation of application Ser. No. 16/420,077, filed May 22, 2019, now U.S. Pat. No. 10,608,638, which claims priority benefits from U.S. provisional application No. 62/675,785, filed on May 24, 2018 and entitled "LOGIC DRIVE WITH BRAIN-LIKE ELASTICITY AND INTEGRALITY"; U.S. provisional application No. 62/729,527, filed on Sep. 11, 2018 and entitled "LOGIC DRIVE WITH BRAIN-LIKE ELASTICITY AND INTEGRALITY USING STANDARD COMMODITY PROGRAMMABLE LOGIC IC CHIPS"; U.S. provisional application No. 62/741,513, filed on Oct. 4, 2018 and entitled "LOGIC DRIVE BASED ON STANDARDIZED COMMODITY PROGRAMMABLE LOGIC SEMICONDUCTOR IC CHIPS"; U.S. provisional application No. 62/755,415, filed on Nov. 2, 2018 and entitled "LOGIC DRIVE BASED ON STANDARDIZED COMMODITY PROGRAMMABLE LOGIC/MEMORY SEMICONDUCTOR IC CHIP SCALE PACKAGES"; and U.S. provisional application No. 62/768,978, filed on Nov. 18, 2018 and entitled "LOGIC DRIVE BASED ON STANDARDIZED COMMODITY PROGRAMMABLE LOGIC/MEMORY SEMICONDUCTOR IC CHIP SCALE PACKAGES". The present application incorporates the foregoing disclosures herein by reference.

BACKGROUND OF THE DISCLOSURE

Field of the Disclosure

The present invention relates to a logic package, logic package drive, logic device, logic module, logic drive, logic disk, logic storage, logic storage drive, logic disk drive, logic solid-state disk, logic solid-state drive, Field Programmable Gate Array (FPGA) logic disk, or FPGA logic drive (to be abbreviated as "logic drive" or "logic storage" below, that is when "logic drive" is mentioned below, it means and reads as "logic package, logic package drive, logic device, logic module, logic drive, logic disk, logic disk drive, logic storage, logic storage drive, logic solid-state disk, logic solid-state drive, FPGA logic disk, or FPGA logic drive") comprising plural FPGA IC chips for field programming purposes, and more particularly to a standardized commodity logic drive formed by using plural standardized commodity FPGA IC chips comprising non-volatile random access memory cells, and to be used for different specific applications when field programmed or user programmed. The abbreviated "logic drive" may be alternatively referred to as "logic storage".

Brief Description of the Related Art

The Field Programmable Gate Array (FPGA) semiconductor integrated circuit (IC) has been used for development of new or innovated applications, or for small volume applications or business demands. When an application or business demand expands to a certain volume and extends to a certain time period, the semiconductor IC supplier may usually implement the application in an Application Specific IC (ASIC) chip, or a Customer-Owned Tooling (COT) IC chip. The switch from the FPGA design to the ASIC or COT design is because the current FPGA IC chip, for a given application and compared with an ASIC or COT chip, (1) has a larger semiconductor chip size, lower fabrication yield, and higher fabrication cost, (2) consumes more power, and (3) gives lower performance. When the semiconductor technology nodes or generations migrate, following the Moore's Law, to advanced nodes or generations (for example below 20 nm), the Non-Recurring Engineering (NRE) cost for designing an ASIC or COT chip increases greatly (more than US $5M or even exceeding US $10M, US $20M, US $50M or US $100M), FIG. 28. The cost of a photo mask set for an ASIC or COT chip at the 16 nm technology node or generation may be over US $1M, US $2M, US $3M, or US $5M. The high NRE cost in implementing the innovation and/or application using the advanced IC technology nodes or generations slows down or even stops the innovation and/or application using advanced and powerful semiconductor technology nodes or generations. A new approach or technology is needed to inspire the continuing innovation and to lower down the barrier for implementing the innovation in the semiconductor IC chips using the advanced and powerful semiconductor technology nodes or generations.

SUMMARY OF THE DISCLOSURE

One aspect of the disclosure provides a standardized commodity logic drive in a multi-chip package comprising plural FPGA IC chips and one or more non-volatile memory IC chips for use in different algorithms, architectures and/or applications requiring logic, computing and/or processing functions by field programming. Uses of the standardized commodity logic drive is analogues to uses of a standardized commodity data storage device or drive, for example, solid-state disk (drive), data storage hard disk (drive), data storage floppy disk, Universal Serial Bus (USB) flash drive, USB drive, USB stick, flash-disk, or USB memory, and differs in that the latter has memory functions for data storage, while the former has logic functions for processing and/or computing.

Another aspect of the disclosure provides a method to reduce Non-Recurring Engineering (NRE) expenses for implementing (i) an innovation, (ii) an innovation process or application, and/or (iii) accelerating workload processing or application in semiconductor IC chips by using the standardized commodity logic drive, FIG. 28. A person, user, or developer with an innovation and/or an application concept or idea or an aim for accelerating workload processing may purchase the standardized commodity logic drive and develop or write software codes or programs to load into the standardized commodity logic drive to implement his/her innovation and/or application concept or idea; wherein said innovation and/or application (maybe abbreviated as innovation below) comprises (i) innovative algorithms and/or architectures of computing, processing, learning and/or inferencing, and/or (ii) innovative and/or specific applications. The standard commodity logic drive comprises plural FPGA IC chips fabricated by using advanced technology nodes or generations more advanced than 20 nm or 10 nm. The innovation is implemented in the logic drive by changing the hardware of FPGA IC chips by altering the programming interconnection and LUTs therein. Compared to the implementation by developing a logic ASIC or COT IC chip, implementing the same or similar innovation and/or application using the logic drive may reduce the NRE cost down to smaller than US $1M by developing a software and installing it in the purchased or rented standard commodity logic drive. The aspect of the disclosure inspires the innovation and lowers the barrier for implementing the innovation in IC chips designed and fabricated using an advanced IC technology node or generation, for example, a technology node or generation more advanced than or below 20 nm or 10 nm.

Another aspect of the disclosure provides a "public innovation platform" by using logic drives for innovators to easily and cheaply implement or realize their innovation (algorithms, architectures and/or applications) in semiconductor IC chips fabricated using advanced IC technology nodes more advanced than 20 nm or 10 nm, and for example, using a technology node of 16 nm, 10 nm, 7 nm, 5 nm or 3 nm, FIG. 28. In early days, 1990's, innovators could implement their innovation (algorithms, architectures and/or applications) by designing IC chips and fabricate their designed IC chips in a semiconductor foundry fab using technology nodes at 1 µm, 0.8 µm, 0.5 µm, 0.35 µm, 0.18 µm or 0.13 µm, at a cost of about several hundred thousands of US dollars. The IC foundry fab was then the "public innovation platform". However, when IC technology nodes migrate to a technology node more advanced than 20 nm or 10 nm, and for example to the technology node of 16 nm, 10 nm, 7 nm, 5 nm or 3 nm, only a few giant system or IC design companies, not the public innovators, can afford to use the semiconductor IC foundry fab. It costs about or over 5 million US dollars to develop and implement an IC chip using these advanced technology nodes. The semiconductor IC foundry fab is now not "public innovation platform" anymore, it is "club innovation platform" for club innovators only. The concept of the disclosed logic drives, comprising standard commodity FPGA IC chips, provides public innovators "public innovation platform" back to semiconductor IC industry again; just as in 1990's. The innovators can implement or realize their innovation (algorithms, architectures and/or applications) by using logic drives (comprising FPGA IC chips fabricated using advanced than 20 nm or 10 nm technology nodes) and writing software programs in common programing languages, for example, C, Java, C++, C#, Scala, Swift, Matlab, Assembly Language, Pascal, Python, Visual Basic, PL/SQL or JavaScript languages, at a cost of less than 500K or 300K US dollars. The innovators can install their developed software using their own standard commodity logic drives or rented standard commodity logic drives in data centers or clouds through networks.

Another aspect of the disclosure provides a method to change the current logic ASIC or COT IC chip business into a commodity logic IC chip business, like the current commodity DRAM, or commodity NAND flash memory IC chip business, by using the standardized commodity logic drive. Since the performance, power consumption, and engineering and manufacturing costs of the standardized commodity logic drive may be better or equal to that of the ASIC or COT IC chip for a same innovation (algorithms, architectures and/or applications) or an aim for accelerating workload processing, the standardized commodity logic drive may be used as an alternative for designing an ASIC or COT IC chip. The current logic ASIC or COT IC chip design, manufacturing and/or product companies (including fabless IC design and product companies, IC foundry or contracted manufactures (may be product-less), and/or vertically-integrated IC design, manufacturing and product companies) may become companies like the current commodity DRAM, or NAND flash memory IC chip design, manufacturing, and/or product companies; or like the current DRAM module design, manufacturing, and/or product companies; or like the current flash memory module, flash USB stick or drive, or flash solid-state drive or disk drive design, manufacturing, and/or product companies.

Another aspect of the disclosure provides the standardized commodity logic drive, wherein a person, user, customer, or software developer, or algorithm/architecture/application developer may purchase the standardized commodity logic drive and write software codes to program the logic drive for his/her desired algorithms, architectures and/or applications, for example, in algorithms, architectures and/or applications of Artificial Intelligence (AI), machine learning, deep learning, big data, Internet Of Things (IOT), Virtual Reality (VR), Augmented Reality (AR), car electronics, Graphic Processing (GP), Digital Signal Processing (DSP), Micro Controlling (MC), and/or Central Processing (CP).

Another aspect of the disclosure provides a method to change the current logic ASIC or COT IC chip hardware business into a software business by using the standardized commodity logic drive. The current ASIC or COT IC chip design companies or suppliers may become software developers or suppliers; they may adapt the following business models: (1) become software companies to develop and sell/rent software for their innovation (algorithms, architectures and/or applications), and let their customers or users to install software in the customers' or users' own standard commodity logic drive. Alternatively, the software may be installed in the clouds or data centers and rented to users or customers; and/or (2) still hardware companies by selling hardware without performing ASIC or COT IC chip design and/or production. They may install their in-house developed software for the innovation (algorithms, architectures and/or applications) in one or plural non-volatile memory IC chip or chips in the purchased standard commodity logic drive; and sell the program-installed logic drive to their customers or users. They may write software codes into the standard commodity logic drive (that is, loading the software codes in the non-volatile memory IC chip or chips in or of the standardized commodity logic drive for their desired algorithms, architectures and/or applications.

Another aspect of the disclosure provides a method to change the current system design, manufactures and/or product business into a standard commodity system/product business, like current commodity DRAM, or flash memory business, by using the standardized commodity logic drive. The system, computer, processor, smart-phone, or electronic equipment or device may become a standard commodity hardware comprising mainly a standard commodity memory drive and a standard commodity logic drive. The memory drive may be a hard disk drive, a flash drive, a solid-state drive, or a memory drive packaged in a multichip package as the logic drive disclosed in this invention. The logic drive in the aspect of the disclosure may have big enough or adequate number of inputs/outputs (I/Os) to support I/O ports for used for programming all or most desired algorithms, architectures and/or applications, for example, in algorithms, architectures and/or applications of Artificial Intelligence (AI), machine learning, deep learning, big data, Internet Of Things (IOT), Virtual Reality (VR), Augmented Reality (AR), car electronics, Graphic Processing (GP), Digital Signal Processing (DSP), Micro Controlling (MC), and/or Central Processing (CP).

Another aspect of the disclosure provides a standard commodity FPGA IC chip comprising logic blocks. The logic blocks comprise (i) logic gate arrays comprising Boolean logic operators, for example, NAND, NOR, AND, and/or OR circuits; (ii) computing units comprising, for examples, adder, multiplication, shift register, floating point circuits, and/or division circuits; (iii) Look-Up-Tables (LUTs) and multiplexers. The Boolean operators, the functions of logic gates, or a certain computing, operation or process may be carried out using hard wired circuits, for example, hard macros (for example, DSP slices, microcontroller macros, fixed-wired adders, and/or fixed-wired multipliers). Alternatively, the Boolean operators, the functions of logic gates, or a certain computing, operation or process may be carried out using, for example, Look-Up-Tables (LUTs) and/or multiplexers. The Look-Up-Tables (LUTs) and/or multiplexers can be programmed or configured as functions of, for example, DSP, microcontroller, adders, and/or multipliers. The LUTs store or memorize the processing or computing results of logic gates, computing results of calculations, decisions of decision-making processes, or results of operations, events or activities, for example, functions of DSP, GPU, TPU (Tensor flow Processing Unit), microcontroller, adders, and/or multipliers. The LUTs can be used to carry out logic functions based on truth tables. The LUTs may store or memorize data or results in, for example, SRAM cells. One or a plurality of LUTs may form a logic cell.

Another aspect of the disclosure provides a standard commodity FPGA IC chip for use in the standard commodity logic drive. The standard commodity FPGA IC chip is designed, implemented and fabricated using an advanced semiconductor technology node or generation, for example more advanced than or equal to, or below or equal to 20 nm or 10 nm, for example using the technology node of 16 nm, 14 nm, 12 nm, 10 nm, 7 nm, 5 nm or 3 nm. The manufacturing cost of the standard commodity FPGA IC chip can be reduced due to: (i) optimized chip size: Since the FPGA functions can be partitioned into several FPGA IC chips packaged in the logic drive, the FPGA chip size can be optimized for maximum manufacturing yield, therefore resulting in a minimum manufacturing cost. The standard commodity FPGA IC chip may have an area between 400 mm$^2$ and 9 mm$^2$, 144 mm$^2$ and 16 mm$^2$, 75 mm$^2$ and 16 mm$^2$, or 50 mm$^2$ and 16 mm$^2$; (ii) regular circuit arrays: All or most control circuits, Input/Output (I/O) circuits or units (for example, the off-logic-drive I/O circuits, i.e., large I/O circuits, communicating with circuits or components external or outside of the logic drive), and/or hard macros (for example, DSP slices, microcontroller macros, fixed-wired adders, and/or fixed-wired multipliers) are outside of, or not included in, the standard commodity FPGA IC chip, but are included in another dedicated control chip, dedicated I/O chip, dedicated control and I/O chip, ASIC chip, CPU chip, and/or DSP chip, packaged in the same logic drive. The standard commodity FPGA IC chip may only communicate directly with other chips in or of the logic drive only; its I/O circuits may require only small I/O drivers or receivers, and small or none Electrostatic Discharge (ESD) devices. The driving capability, loading capability, output capacitance, or input capacitance of I/O drivers or receivers, or I/O circuits may be between 0.1 pF and 2 pF or 0.1 pF and 1 pF. The size of the ESD device may be between 0.05 pF and 2 pF or 0.05 pF and 1 pF. For example, a bi-directional (or tri-state) I/O pad or circuit may comprise an ESD circuit, a receiver, and a driver, and has an input capacitance, output capacitance or loading capacitance between 0.1 pF and 2 pF or 0.1 pF and 1 pF. A lower supply voltage may be used for the standard commodity FPGA chips, and the supply voltage may be smaller than or equal to 1.5 V, 1.0 V, 0.7 V or 0.5 V. The standard commodity FPGA IC chip with low power consumption and high performance is due to small I/O circuits therein, and lower power supply voltage. None or minimal area of the standard commodity FPGA IC chip is used for the control circuits, I/O circuits or hard macros, for example, less than 15%, 10%, 5%, 2% or 1% area (not counting the seal ring and the scribe line (kerf or die saw area) of the chip; that means, only including area up to the inner boundary of the seal ring) is used for the control circuits, I/O circuits or hard macros; or, none or minimal transistors of the standard commodity FPGA IC chip are used for the control circuits, I/O circuits or hard macros, for example, less than 15%, 10%, 5%, 2% or 1% of the total number of transistors are used for the control circuits, I/O circuits or hard macros. All or most area of the standard commodity FPGA IC chip is used for repetitive circuit arrays, wherein each of the repetitive circuit arrays comprises a plurality of repetitive circuit units each comprising: (i) a logic cell comprising Look-Up-Tables (LUTs) and multiplexers, and/or (ii) SRAM cells for programmable interconnection. The logic cells may be programmed or configured as functions of, for example, DSP, microcontroller, adders, and/or multipliers. For example, greater than 85%, 90%, 95% or 99% area (not counting the seal ring and the scribe line (kerf or die saw area) of the chip; that means, only including area up to the inner boundary of the seal ring) is used for repetitive circuit arrays comprising logic cells and/or SRAM cells for programmable interconnection; or, all or most transistors of the standard commodity FPGA IC chip are used for repetitive circuit arrays comprising logic cells and/or SRAM cells for programmable interconnection. A manufacture process can be tuned or optimized for the regular repetitive circuit arrays with a high manufacture yield and therefore reducing the manufacture costs.

Another aspect of the disclosure provides a method of circuit repair for a standard commodity FPGA IC chip for use in the standard commodity logic drive, wherein the method of the circuit repair increases the yield of the FPGA IC chip, therefore reducing the manufacture cost of the FPGA IC chip.

Another aspect of the disclosure provides the standard commodity logic drive in a multi-chip package comprising the standard commodity plural FPGA IC chips, for use in different algorithms, architectures and/or applications requiring logic, computing and/or processing functions by field programming, wherein the standard commodity plural FPGA IC chips, each is in a bare-die format or in a single-chip or multi-chip package. Each of standard commodity plural FPGA IC chips may have standard common features, counts or specifications: (1) a regular repetitive logic arrays with the number of logic arrays or sections equal to or greater than 2, 4, 8, 10 or 16, wherein the regular repetitive logic array includes logic blocks or elements with the count equal to or greater than 128K, 512K, 1M, 4M, 8M, 16M, 32M or 80M and/or (2) a regular memory array with the number of memory banks equal to or greater than 2, 4, 8, 10 or 16, wherein the regular memory array includes memory cells with the bit count equal to or greater than 1M, 10M, 50M, 100M, 200M or 500M bits; (2) the number of inputs to each of the logic blocks or operators: the number of inputs to each of the logic block or operator may be greater or equal to 4, 8, 16, 32, 64, 128, or 256; (3) the power supply voltage: the voltage may be between 0.1V and 1.5V, 0.1V and 1.0V, 0.1V and 0.7V, or 0.1V and 0.5V; (4) the I/O pads, in terms of layout, location, number and function. Since the FPGA chips are standard commodity IC chips, the number of FPGA chip designs or products for each technology node is reduced to a small number, therefore, the expensive photo masks or mask sets for fabricating the FPGA chips using advanced semiconductor nodes or generations are reduced to a few mask sets. For example, reduced down to between 3 and 20 mask sets, 3 and 10 mask sets, 3 and 5 mask sets, or 1 and 3 mask sets for a specific technology node or generation. The NRE and production expenses are therefore greatly reduced. With the few designs and products, the manufacturing processes may be tuned or optimized for the few chip designs or products, and resulting in very high manufacturing chip yields. This is similar to the current advanced standard commodity DRAM or NAND flash memory design and production. Furthermore, the chip inventory management becomes easy, efficient and effective; therefore, resulting in a shorter FPGA chip delivery time and becoming very cost-effective.

Another aspect of the disclosure provides the standard commodity logic drive in a multi-chip package comprising plural standard commodity FPGA IC chips and one or more non-volatile memory IC chips, for use in different algorithms, architectures and/or applications requiring logic, computing and/or processing functions by field programming, wherein the plural standard commodity FPGA IC chips, each is in a bare-die format or in a single-chip or multi-chip package format. The standard commodity logic drive may have standard common features, counts or specifications: (1) logic blocks including (i) system gates with the count greater than or equal to 8M, 40M, 80M, 200M or 400M, (ii) logic blocks or elements with the count greater than or equal to 256K, 512K, 2M, 4M, 16M or 32M, (iii) hard macros, for example DSP slices, microcontroller macros, multiplexer macros, fixed-wired adders, and/or fixed-wired multipliers and/or (iv) blocks of memory with the bit count equal to or greater than 4M, 40M, 200M, 400M, 800M or 2 G bits; (2) the power supply voltage: the voltage may be between 0.1V and 12V, 0.1V and 7V, 0.1V and 3V, 0.1V and 2V, 0.1V and 1.5V, or 0.1V and 1V; (3) the I/O pads in the multi-chip package of the standard commodity logic drive, in terms of layout, location, number and function; wherein the logic drive may comprise the I/O pads, metal pillars or bumps connecting or coupling to one or multiple (2, 3, 4, or more than 4) Universal Serial Bus (USB) ports, one or more IEEE 1394 ports, one or more Ethernet ports, one or more audio ports or serial ports, for example, RS-232 or COM (communication) ports, wireless transceiver I/Os, and/or Bluetooth transceiver I/Os, and etc. Since the logic drives are standard commodity products, the product inventory management becomes easy, efficient and effective, therefore resulting in a shorter logic drive delivery time and becoming cost-effective.

Another aspect of the disclosure provides the standard commodity logic drive in a multi-chip package comprising plural standard commodity FPGA IC chips and one or more non-volatile memory IC chips, further comprising a dedicated control chip and/or a dedicated I/O chip, designed, implemented and fabricated using varieties of semiconductor technology nodes or generations, including old or matured technology nodes or generations, for example, less advanced than or equal to, or more mature than 20 nm or 30 nm, and for example using the technology node of 22 nm, 28 nm, 40 nm, 90 nm, 130 nm, 180 nm, 250 nm, 350 nm or 500 nm. The dedicated I/O chip comprises large I/O circuits (output capacitance larger than 2 pF) for communicating or coupling with external circuits of the logic drive, and a small I/O circuits (output capacitance smaller than 2 pF) for communicating or coupling with the FPGA chips in the logic drive.

Another aspect of the disclosure provides the logic drive in a multi-chip package comprising plural standard commodity FPGA IC chips, further comprising a processing and/or computing IC chip, for example, a Central Processing Unit (CPU) chip, a Graphic Processing Unit (GPU) chip, a Digital Signal Processing (DSP) chip, a Tensor Processing Unit (TPU) chip, an ASIC chip and/or an Application Processing Unit (APU) chip.

Another aspect of the disclosure provides the logic drive in a multi-chip package comprising plural standard commodity FPGA IC chips, further comprising high speed, wide bit width, high bandwidth memory (HBM) SRAM or DRAM IC chips. The HBM IC chip may have a data bit width of equal to or greater than 64, 128, 256, 512, 1024, 2048, 4096, 8K, or 16K.

Another aspect of the disclosure provides the standard commodity logic drive in a multi-chip package comprising plural standard commodity FPGA IC chips and one or more non-volatile IC chips, for use in different applications requiring logic, computing and/or processing functions by field programming; wherein the one or more non-volatile memory IC chips comprises a NAND flash chip or chips, in a bare-die format or in a multi-chip flash package format. The standard commodity logic drive may have a standard non-volatile memory density, capacity or size of the logic drive is greater than or equal to 8 MB, 64 MB, 128 GB, 512 GB, 1 GB, 4 GB, 16 GB, 64 GB, 256 GB, or 512 GB, wherein "B" is bytes, each byte has 8 bits.

Another aspect of the disclosure provides a logic drive in a multi-chip package format further comprising an Innovated ASIC or COT (abbreviated as IAC below) chip for Intellectual Property (IP) circuits, Application Specific (AS) circuits, analog circuits, mixed-mode signal circuits, Radio-Frequency (RF) circuits, and/or transmitter, receiver, transceiver circuits, etc. The IAC chip is designed, implemented and fabricated using varieties of semiconductor technology nodes or generations, including old or matured technology nodes or generations, for example, less advanced than or equal to, or above or equal to 20 nm, 30 nm, 40 nm, 50 nm, 90 nm, 130 nm, 250 nm, 350 nm or 500 nm. Since the IAC chip in this aspect of disclosure may be designed and fabricated using older or less advanced technology nodes or generations, its NRE cost is cheaper than or less than that of the current or conventional ASIC or COT chip designed and fabricated using an advanced IC technology node or generation, for example, more advanced than or below 20 nm or 10 nm. Implementing the same or similar innovation or application using the logic drive including the IAC chip designed and fabricated using older or less advanced technology nodes or generations may reduce NRE cost down to less than US $3M or US $1M. Compared to the implementation by developing the current conventional logic ASIC or COT IC chip, the NRE cost of developing the IAC chip for the same or similar innovation or application may be reduced by a factor of larger than 2, 5, 10, 20, or 30.

Another aspect of the disclosure provides the standard commodity FPGA IC chip for use in the logic drive. The standard commodity FPGA chip is designed, implemented and fabricated using an advanced semiconductor technology node or generation, for example more advanced than or equal to, or below or equal to 20 nm or 10 nm. The standard commodity FPGA IC chips comprises a First Interconnection Scheme in, on or of the Chip (FISC) and a Second Interconnection Scheme in, on or of the Chip (SISC) on or over the FISC structure. The FISC is formed by processes comprising a damascene copper electroplating process, and the SISC is formed by processes comprising an embossing copper electroplating process.

Another aspect of the disclosure provides an interposer for flip-chip assembly or packaging in forming the multi-chip package of the logic drive. The multi-chip package is based on multiple-Chips-On-an-Interposer (COIP) flip-chip packaging method. The interposer or substrate in the COIP multi-chip package comprises: (1) high density interconnects for fan-out and interconnection between IC chips flip-chip-assembled, bonded or packaged on or over the interposer. The high density interconnects comprise a First Interconnection Scheme on or of the Interposer (FISIP) and/or a Second Interconnection Scheme on or of the Interposer (SISIP). The FISIP is formed by processes comprising a damascene copper electroplating process, and the SISIP is formed by processes comprising an embossing copper electroplating process. (2) micro metal pads, bumps or pillars on or over the high density interconnects, (3) Trough-Silicon-Vias (TSVs) in the interposer. The IC chips or packages to be flip-chip assembled, bonded or packaged, to the interposer include the chips or packages: the standard commodity FPGA chips, the non-volatile chips or packages, the dedicated control chip, the dedicated I/O chip, IAC, SRAM or DRAM HBM IC chips and/or processing and/or computing IC chip, for example CPU, GPU, DSP, TPU, or APU chip.

Another aspect of the disclosure provides a method for forming the logic drive in a COIP multi-chip package using an interposer comprising the FISIP, the SISIP, micro copper bumps or pillars and TSVs based on a flip-chip assembled multi-chip packaging technology and process.

Another aspect of the disclosure provides a method for forming the logic drive in a COIP multi-chip package using thermal compression assembly. The standard commodity FPGA chip with fine pitch thermal compression bumps is flip chip assembled on the thermal compression pad on the COIP substrate at a temperature between 240 and 300 degrees Celsius and at a pressure between 0.3 and 3 MPa. The thermal compression provides very fine pitch interconnect between the FPGA chip and the COIP substrate. Neighboring two of the thermal compression bumps may have a pitch (between centers of neighboring two of the thermal compression bumps) between 3 μm and 20 μm. Another aspect of the disclosure provides the standard commodity COIP multi-chips packaged logic drive. The standard commodity COIP logic drive may be in a shape of square or rectangle, with a certain standard widths, lengths and thicknesses. An industry standard may be set for the shape and dimensions of the logic drive. Furthermore, the metal bumps or pillars on or under the interposer in the logic drive may be in a standard footprint, for example, in an area array of M×N with a standard dimension of pitch and space between neighboring two metal bumps or pillars. The location of each metal bumps or pillars is also at a standard location.

Another aspect of the disclosure provides a method for forming a single-layer-packaged logic drive suitable for the stacked POP (Package-On-Package) assembling technology. The single-layer-packaged logic drive comprises a Backside metal Interconnection Scheme (abbreviated as BISD in below) at the backside of the single-layer-packaged logic drive and Through-Package-Vias, or Thought Polymer Vias (TPVs) in the gaps between chips in or of the logic drive, and/or in the peripheral area of the logic drive package and outside the edges of chips in or of the logic drive (the side with transistors of the IC chips are facing down).

Another aspect of the disclosure provides a method for forming a stacked logic driver using the single-layer-packaged logic drive with the BISD and TPVs.

Another aspect of the disclosure provides the logic drive in a multi-chip package format further comprising one or plural dedicated programmable interconnection IC (DPIIC) chip or chips. The DPIIC chip comprises 5 T or 6 T SRAM cells and cross-point switches, and is used for programming the interconnection between circuits or interconnections of the standard commodity FPGA chips. The 5 T or 6 T SRAM cells and cross-point switches on the DPIIC are used for programming interconnects of the FISIP and/or SISIP on the interposer. The programmable interconnects comprise interconnection metal lines or traces of the FISIP and/or SISIP between the standard commodity FPGA chips, with cross-point switch circuits in the middle of interconnection metal lines or traces of the FISIP and/or SISIP.

Another aspect of the disclosure provides the standardized commodity logic drive (for example, the single-layer-packaged logic drive) with a fixed design, layout or footprint of (i) the metal pads, pillars or bumps (copper pillars or bumps, solder bumps or gold bumps) on or under the TSVs of the interposer, and (ii) copper pads, copper pillars or solder bumps (on or over the BISD) on the backside (top side, the side with the transistors of IC chips are faced down) of the standard commodity logic drive. The standardized commodity logic drive may be used, customized for different applications by software coding or programming, using the programmable metal pads, pillars or bumps on or under the TSVs of the interposer, and/or using programmable copper pads, copper pillars or bumps, or solder bumps on or over the BISD (through programmable TPVs) for different applications.

Another aspect of the disclosure provides the logic drive, either in the single-layer-packaged or in a stacked format, comprising IC chips, logic blocks (comprising LUTs, cross-point switches, multiplexers, switch buffers, logic circuits, switch buffers, logic gates, and/or computing circuits) and/or memory cells or arrays, immersing in a super-rich interconnection scheme or environment. The logic blocks (comprising LUTs, cross-point switches, multiplexers, logic circuits, logic gates, and/or computing circuits) and/or memory cells or arrays of each of the multiple standard commodity FPGA IC chips (and/or other IC chips in the single-layer-packaged or in a stacked logic drive) are immersed in a programmable 3D Immersive IC Interconnection Environment (IIIE). The programmable 3D IIIE on, in, or of the logic driver package provides the super-rich interconnection scheme or environment based on (1) the programmable FISC, the SISC and micro copper pillars or bumps on, in or of the IC chips, (2) the programmable FISIP and/or SISIP, TPVs, micro copper pillars or bumps, and TSVs of the interposer or substrate, (3) programmable metal pads, pillars or bumps on or under the TSVs of the interposer, (4) the programmable BISD, and (5) programmable copper pads, copper pillars or bumps, or solder bumps on or over the BISD. The programmable capability of the above interconnects, vias and metal bumps are provided by the DPIIC chips and/or FPGA IC chips in the logic drive.

Another aspect of the disclosure provides an expandable logic scheme based on the logic drive using the COIP multichip package. A plurality of standard commodity FPGA IC chips and/or HBM IC chips are flip chip packaged on the COIP substrate. The COIP substrate comprises a set of data buses for use in an expandable interconnection scheme, wherein the set of data buses is divided into a plurality of data bus subsets. The set of data buses are connected to a plurality of I/O ports of each of the plurality of standard commodity FPGA IC chips and/or HBM IC chips. The plurality of I/O ports of each of the plurality of standard commodity FPGA IC chips and/or HBM IC chips provide high parallel computing or processing capability of the logic drive. In a certain clock cycle, the data or information running in one of the data bus subsets maybe picked up by or input to a FPGA IC chip through an I/O port thereon by turning on the chip-enable pad and input selection pad corresponding to the I/O port. In another clock cycle, the data or information may be output from the FPGA IC chip through an I/O port thereon to one of the data bus subsets by turning on the chip-enable pad and output selection pad corresponding to the I/O port. The chip-enable pad turns off the FPGA IC chip while not in use for power saving.

Another aspect of the disclosure provides a standard commodity memory drive, package, package drive, device, module, disk, disk drive, solid-state disk, or solid-state drive (to be abbreviated as "drive" below, that is when "drive" is mentioned below, it means and reads as "drive, package, package drive, device, module, disk, disk drive, solid-state disk, or solid-state drive"), in a multi-chip package comprising plural standard commodity memory IC chips for use in data storage. The plural memory IC chips comprise NAND flash chips and/or DRAM chips, in a bare-die format or in a package format. The standard commodity memory drive is formed by the same processes as that for forming the logic drive. Alternatively, the plural non-volatile memory IC chips may comprise Non-Volatile Radom-Access-Memory (NVRAM) IC chips, in a bare-die format or in a package format. The NVRAM may be a Ferroelectric RAM (FRAM), Magnetoresistive RAM (MRAM), Resistive RAM (RRAM), or Phase-change RAM (PRAM).

These, as well as other components, steps, features, benefits, and advantages of the present application, will now become clear from a review of the following detailed description of illustrative embodiments, the accompanying drawings, and the claims.

BRIEF DESCRIPTION OF THE DRAWINGS

The drawings disclose illustrative embodiments of the present application. They do not set forth all embodiments. Other embodiments may be used in addition or instead. Details that may be apparent or unnecessary may be omitted to save space or for more effective illustration. Conversely, some embodiments may be practiced without all of the details that are disclosed. When the same reference number or reference indicator appears in different drawings, it may refer to the same or like components or steps.

Aspects of the disclosure may be more fully understood from the following description when read together with the accompanying drawings, which are to be regarded as illustrative in nature, and not as limiting. The drawings are not necessarily to scale, emphasis instead being placed on the principles of the disclosure. In the drawings:

FIG. 7A shows a NAND gate in accordance with the present application.

FIG. 7B shows a truth table for a NAND gate in accordance with the present application.

FIG. 7C is a circuit diagram of a logic operator in accordance with an embodiment of the present application.

FIG. 7D shows a truth table for a logic operator as seen in FIG. 7C.

Figure 1A:
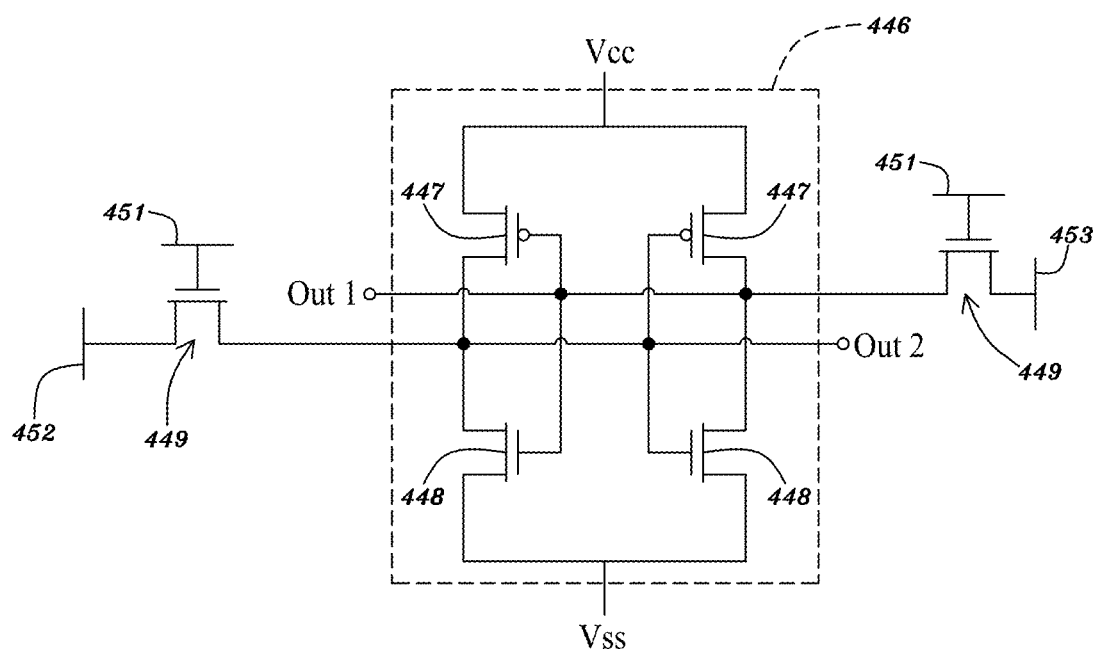
FIGS. 1A and 1B are circuit diagrams illustrating various types of memory cells in accordance with an embodiment of the present application.

While certain embodiments are depicted in the drawings, one skilled in the art will appreciate that the embodiments depicted are illustrative and that variations of those shown, as well as other embodiments described herein, may be envisioned and practiced within the scope of the present application.

DETAILED DESCRIPTION OF THE DISCLOSURE

Illustrative embodiments are now described. Other embodiments may be used in addition or instead. Details that may be apparent or unnecessary may be omitted to save space or for a more effective presentation. Conversely, some embodiments may be practiced without all of the details that are disclosed.

Specification for Static Random-Access Memory (SRAM) Cells (1) First Type of SRAM Cell (6 T SRAM Cell)

FIG. 1A is a circuit diagram illustrating a 6 T SRAM cell in accordance with an embodiment of the present application. Referring to FIG. 1A, a first type of static random-access memory (SRAM) cell 398, i.e., 6 T SRAM cell, may have a memory unit 446 composed of 4 data-latch transistors 447 and 448, that is, two pairs of a P-type MOS transistor 447 and N-type MOS transistor 448 both having respective drain terminals coupled to each other, respective gate terminals coupled to each other and respective source terminals coupled to the voltage Vcc of power supply and to the voltage Vss of ground reference. The gate terminals of the P-type and N-type MOS transistors 447 and 448 in the left pair are coupled to the drain terminals of the P-type and N-type MOS transistors 447 and 448 in the right pair, acting as a first output point of the memory unit 446 for a first data output Out1 of the memory unit 446. The gate terminals of the P-type and N-type MOS transistors 447 and 448 in the right pair are coupled to the drain terminals of the P-type and N-type MOS transistors 447 and 448 in the left pair, acting as a second output point of the memory unit 446 for a second data output Out2 of the memory unit 446.

Referring to FIG. 1A, the first type of SRAM cell 398 may further include two switches or transfer (write) transistor 449, such as N-type or P-type MOS transistors, a first one of which has a gate terminal coupled to a word line 451 and a channel having a terminal coupled to a bit line 452 and another terminal coupled to the drain terminals of the P-type and N-type MOS transistors 447 and 448 in the left pair and the gate terminals of the P-type and N-type MOS transistors 447 and 448 in the right pair, and a second one of which has a gate terminal coupled to the word line 451 and a channel having a terminal coupled to a bit-bar line 453 and another terminal coupled to the drain terminals of the P-type and N-type MOS transistors 447 and 448 in the right pair and the gate terminals of the P-type and N-type MOS transistors 447 and 448 in the left pair. A logic level on the bit line 452 is opposite a logic level on the bit-bar line 453. The switch 449 may be considered as a programming transistor for writing a programing code or data into storage nodes of the 4 data-latch transistors 447 and 448, i.e., at the drains and gates of the 4 data-latch transistors 447 and 448. The switches 449 may be controlled via the word line 451 to turn on connection from the bit line 452 to the drain terminals of the P-type and N-type MOS transistors 447 and 448 in the left pair and the gate terminals of the P-type and N-type MOS transistors 447 and 448 in the right pair via the channel of the first one of the switches 449, and thereby the logic level on the bit line 452 may be reloaded into the conductive line between the gate terminals of the P-type and N-type MOS transistors 447 and 448 in the right pair and the conductive line between the drain terminals of the P-type and N-type MOS transistors 447 and 448 in the left pair. Further, the bit-bar line 453 may be coupled to the drain terminals of the P-type and N-type MOS transistors 447 and 448 in the right pair and the gate terminals of the P-type and N-type MOS transistors 447 and 448 in the left pair via the channel of the second one of the switches 449, and thereby the logic level on the bit line 453 may be reloaded into the conductive line between the gate terminals of the P-type and N-type MOS transistors 447 and 448 in the left pair and the conductive line between the drain terminals of the P-type and N-type MOS transistors 447 and 448 in the right pair. Thus, the logic level on the bit line 452 may be registered or latched in the conductive line between the gate terminals of the P-type and N-type MOS transistors 447 and 448 in the right pair and in the conductive line between the drain terminals of the P-type and N-type MOS transistors 447 and 448 in the left pair; a logic level on the bit line 453 may be registered or latched in the conductive line between the gate terminals of the P-type and N-type MOS transistors 447 and 448 in the left pair and in the conductive line between the drain terminals of the P-type and N-type MOS transistors 447 and 448 in the right pair.

(2) Second Type of SRAM Cell (5 T SRAM Cell)

Figure 1B:
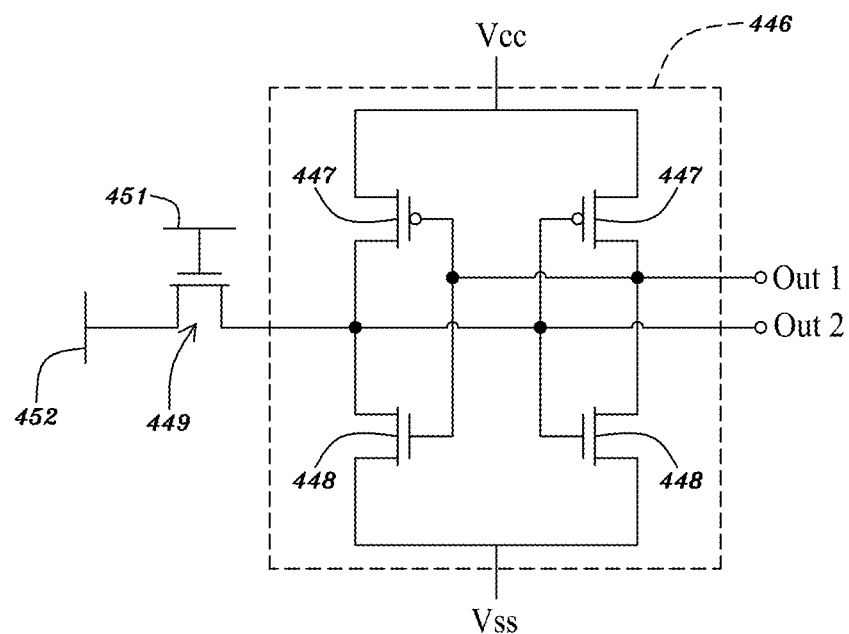

FIG. 1B is a circuit diagram illustrating a 5 T SRAM cell in accordance with an embodiment of the present application. Referring to FIG. 1B, a second type of static random-access memory (SRAM) cell 398, i.e., 5 T SRAM cell, may have the memory unit 446 as illustrated in FIG. 1A. The second type of static random-access memory (SRAM) cell 398 may further have a switch or transfer (write) transistor 449, such as N-type or P-type MOS transistor, having a gate terminal coupled to a word line 451 and a channel having a terminal coupled to a bit line 452 and another terminal coupled to the drain terminals of the P-type and N-type MOS transistors 447 and 448 in the left pair and the gate terminals of the P-type and N-type MOS transistors 447 and 448 in the right pair. The switch 449 may be considered as a programming transistor for writing a programing code or data into storage nodes of the 4 data-latch transistors 447 and 448, i.e., at the drains and gates of the 4 data-latch transistors 447 and 448. The switch 449 may be controlled via the word line 451 to turn on connection from the bit line 452 to the drain terminals of the P-type and N-type MOS transistors 447 and 448 in the left pair and the gate terminals of the P-type and N-type MOS transistors 447 and 448 in the right pair via the channel of the switch 449, and thereby a logic level on the bit line 452 may be reloaded into the conductive line between the gate terminals of the P-type and N-type MOS transistors 447 and 448 in the right pair and the conductive line between the drain terminals of the P-type and N-type MOS transistors 447 and 448 in the left pair. Thus, the logic level on the bit line 452 may be registered or latched in the conductive line between the gate terminals of the P-type and N-type MOS transistors 447 and 448 in the right pair and in the conductive line between the drain terminals of the P-type and N-type MOS transistors 447 and 448 in the left pair; a logic level, opposite to the logic level on the bit line 452, may be registered or latched in the conductive line between the gate terminals of the P-type and N-type MOS transistors 447 and 448 in the left pair and in the conductive line between the drain terminals of the P-type and N-type MOS transistors 447 and 448 in the right pair.

Specification for Pass/No-Pass Switches (1) First Type of Pass/No-Pass Switch

Figure 2B:
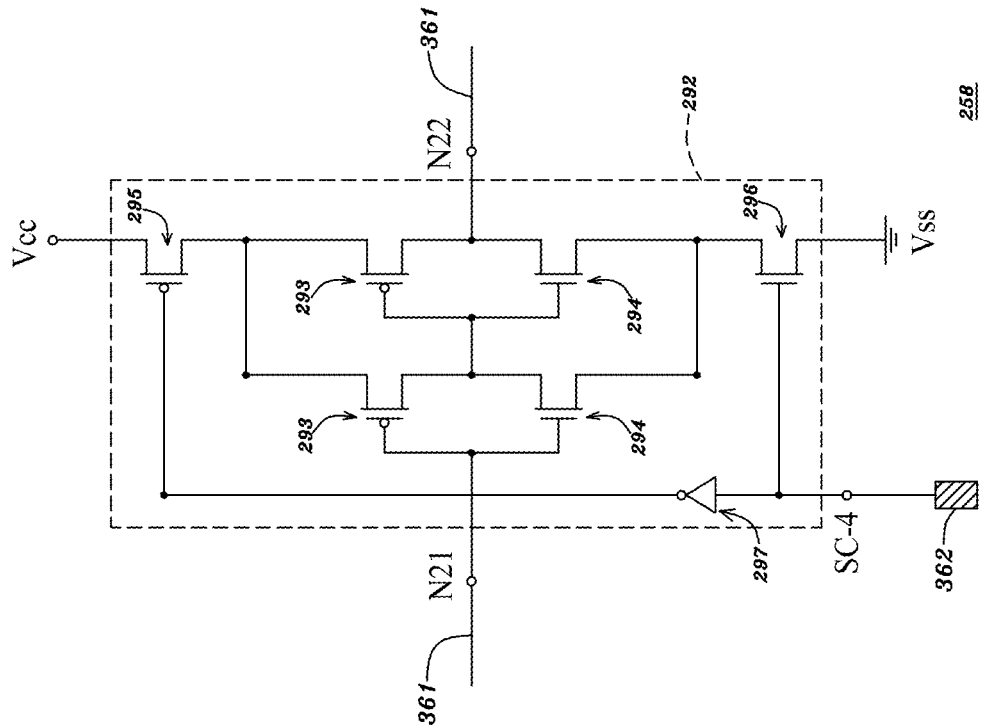
FIGS. 2A-2C are circuit diagrams illustrating various types of pass/no-pass switch in accordance with an embodiment of the present application.
Figure 2A:
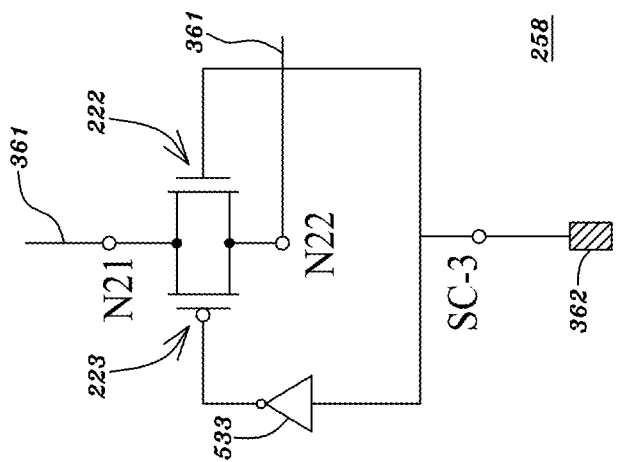

FIG. 2A is a circuit diagram illustrating a first type of pass/no-pass switch in accordance with an embodiment of the present application. Referring to FIG. 2A, a first type of pass/no-pass switch 258 may include an N-type metal-oxide-semiconductor (MOS) transistor 222 and a P-type metal-oxide-semiconductor (MOS) transistor 223 coupling in parallel to each other. Each of the N-type and P-type metal-oxide-semiconductor (MOS) transistors 222 and 223 of the pass/no-pass switch 258 of the first type may be provided with a channel having an end at a node N21 of the pass/no-pass switch 258 and the other opposite end at a node N22 of the pass/no-pass switch 258. Thereby, the first type of pass/no-pass switch 258 may be set to turn on or off connection between its nodes N21 and N22. The first type of pass/no-pass switch 258 may further include an inverter 533 configured to invert its data input at its input point coupling to a gate terminal of the N-type MOS transistor 222 and a node SC-3 as its data output at its output point coupling to a gate terminal of the P-type MOS transistor 223.

(2) Second Type of Pass/No-Pass Switch

FIG. 2B is a circuit diagram illustrating a second type of pass/no-pass switch in accordance with an embodiment of the present application. Referring to FIG. 2B, a second type of pass/no-pass switch 258 may be a multi-stage tri-state buffer 292, i.e., switch buffer, having a pair of a P-type MOS transistor 293 and N-type MOS transistor 294 in each stage, both having respective drain terminals coupling to each other and respective source terminals configured to couple to the voltage Vcc of power supply and to the voltage Vss of ground reference. In this case, the multi-stage tri-state buffer 292 is two-stage tri-state buffer, i.e., two-stage inverter buffer, having two pairs of the P-type MOS transistor 293 and N-type MOS transistor 294 in the two respective stages, i.e., first and second stages. The P-type MOS and N-type MOS transistors 293 and 294 in the pair in the first stage may have gate terminals at a node N21 of the pass/no-pass switch 258. The drain terminals of the P-type MOS and N-type MOS transistors 293 and 294 in the pair in the first stage may couple to each other and to gate terminals of the P-type MOS and N-type MOS transistors 293 and 294 in the pair in the second stage, i.e., output stage. The P-type MOS and N-type MOS transistors 293 and 294 in the pair in the second stage, i.e., output stage, may have drain terminals couple to each other at a node N22 of the pass/no-pass switch 258.

Referring to FIG. 2B, the pass/no-pass switch 258 of the second type may further include a switching mechanism configured to enable or disable the multi-stage tri-state buffer 292, wherein the switching mechanism may be composed of (1) a control P-type MOS transistor 295 having a source terminal coupling to the voltage Vcc of power supply and a drain terminal coupling to the source terminals of the P-type MOS transistors 293 in the first and second stages, (2) a control N-type MOS transistor 296 having a source terminal coupling to the voltage Vss of ground reference and a drain terminal coupling to the source terminals of the N-type MOS transistors 294 in the first and second stages and (3) an inverter 297 configured to invert a data input SC-4 of the pass/no-pass switch 258 at an input point of the inverter 297 coupling to a gate terminal of the control N-type MOS transistor 296 as a data output of the inverter 297 at an output point of the inverter 297 coupling to a gate terminal of the control P-type MOS transistor 295.

For example, referring to FIG. 2B, when the pass/no-pass switch 258 has the data input SC-4 at a logic level of "1" to turn on the pass/no-pass switch 258, the pass/no-pass switch 258 may amplify its data input and pass its data input from its input point at the node N21 to its output point at its node N22 as its data output. When the pass/no-pass switch 258 has the data input SC-4 at a logic level of "0" to turn off the pass/no-pass switch 258, the pass/no-pass switch 258 may neither pass data from its node N21 to its node N22 nor pass data from its node N22 to its node N21.

(3) Third Type of Pass/No-Pass Switch

Figure 2C:
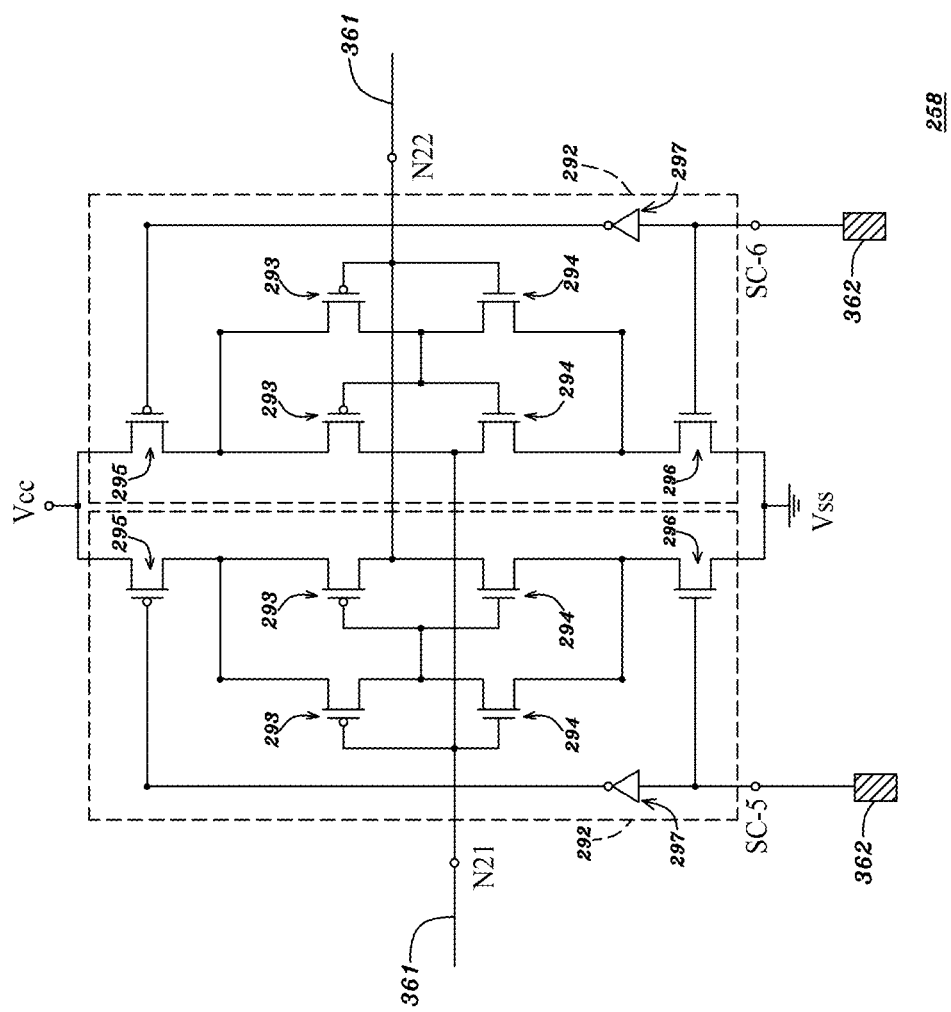

FIG. 2C is a circuit diagram illustrating a third type of pass/no-pass switch in accordance with an embodiment of the present application. For an element indicated by the same reference number shown in FIGS. 2B and 2C, the specification of the element as seen in FIG. 2C may be referred to that of the element as illustrated in FIG. 2B. Referring to FIG. 2C, a third type of pass/no-pass switch 258 may include a pair of multi-stage tri-state buffers 292, i.e., switch buffers, as illustrated in FIG. 2B. The P-type and N-type MOS transistors 293 and 294 in the first stage in the left one of the multi-stage tri-state buffers 292 in the pair may have their gate terminals at a node N21 of the pass/no-pass switch 258, which couples to the drain terminals of the P-type and N-type MOS transistors 293 and 294 in the second stage, i.e., output stage, in the right one of the multi-stage tri-state buffers 292 in the pair. The P-type and N-type MOS transistors 293 and 294 in the first stage in the right one of the multi-stage tri-state buffers 292 in the pair may have gate terminals at a node N22 of the pass/no-pass switch 258, which couples to the drain terminals of the P-type and N-type MOS transistors 293 and 294 in the second stage, i.e., output stage, in the left one of the multi-stage tri-state buffers 292 in the pair. For the left one of the multi-stage tri-state buffers 292 in the pair, its inverter 297 is configured to invert a data input SC-5 of the pass/no-pass switch 258 at an input point of its inverter 297 coupling to the gate terminal of its control N-type MOS transistor 296 as a data output of its inverter 297 at an output point of its inverter 297 coupling to the gate terminal of its control P-type MOS transistor 295. For the right one of the multi-stage tri-state buffers 292 in the pair, its inverter 297 is configured to invert a data input SC-6 of the pass/no-pass switch 258 at an input point of its inverter 297 coupling to the gate terminal of its control N-type MOS transistor 296 as a data output of its inverter 297 at an output point of its inverter 297 coupling to the gate terminal of its control P-type MOS transistor 295.

For example, referring to FIG. 2C, when the pass/no-pass switch 258 has the data input SC-5 at a logic level of "1" to turn on the left one of the multi-stage tri-state buffers 292 in the pair and the pass/no-pass switch 258 has the data input SC-6 at a logic level of "0" to turn off the right one of the multi-stage tri-state buffers 292 in the pair, the third type of pass/no-pass switch 258 may amplify its data input and pass its data input from its input point at its node N21 to its output point at its node N22 as its data output. When the pass/no-pass switch 258 has the data input SC-5 at a logic level of "0" to turn off the left one of the multi-stage tri-state buffers 292 in the pair and the pass/no-pass switch 258 has the data input SC-6 at a logic level of "1" to turn on the right one of the multi-stage tri-state buffers 292 in the pair, the third type of pass/no-pass switch 258 may amplify its data input and pass its data input from its input point at its node N22 to its output point at its node N21 as its data output. When the pass/no-pass switch 258 has the data input SC-5 at a logic level of "0" to turn off the left one of the multi-stage tri-state buffers 292 in the pair and the pass/no-pass switch 258 has the data input SC-6 at a logic level of "0" to turn off the right one of the multi-stage tri-state buffers 292 in the pair, the third type of pass/no-pass switch 258 may neither pass data from its node N21 to its node N22 nor pass data from its node N22 to its node N21. When the pass/no-pass switch 258 has the data input SC-5 at a logic level of "1" to turn on the left one of the multi-stage tri-state buffers 292 in the pair and the pass/no-pass switch 258 has the data input SC-6 at a logic level of "1" to turn on the right one of the multi-stage tri-state buffers 292 in the pair, the third type of pass/no-pass switch 258 may either amplify its data input and pass its data input from its input point at its node N21 to its output point at its node N22 as its data output or amplify its data input and pass its data input from its input point at its node N22 to its output point at its node N21 as its data output.

Figure 3A:
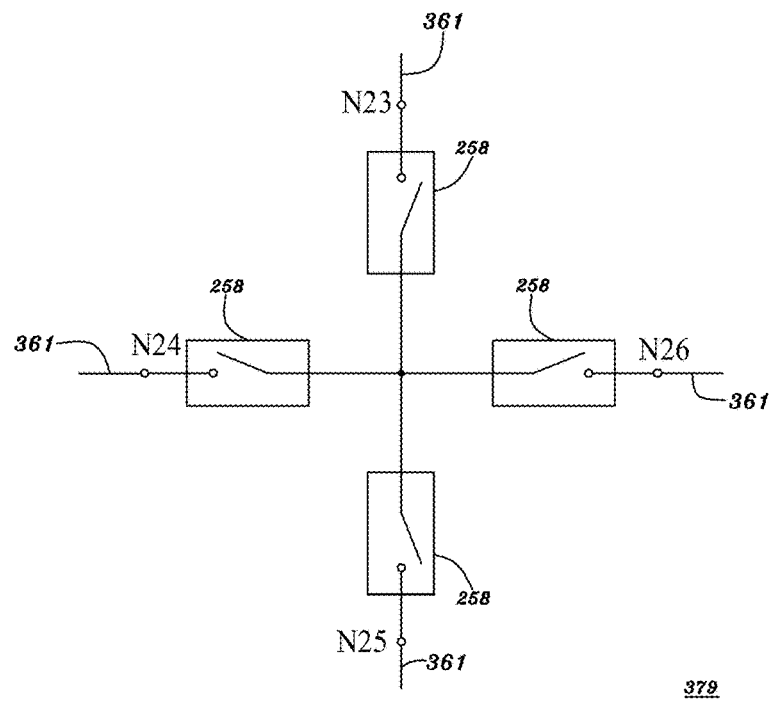
FIGS. 3A and 3B are circuit diagrams illustrating various types of cross-point switches in accordance with an embodiment of the present application.

Specification for Cross-Point Switches Constructed from Pass/No-Pass Switches (1) First Type of Cross-Point Switch FIG. 3A is a circuit diagram illustrating a first type of cross-point switch composed of four pass/no-pass switches in accordance with an embodiment of the present application. Referring to FIG. 3A, four pass/no-pass switches 258, each of which may be one of the first and third types of pass/no-pass switches 258 as illustrated in FIGS. 2A and 2C respectively, may compose a first type of cross-point switch 379. The first type of cross-point switch 379 may have four terminals N23-N26 each configured to be switched to couple to another one of its four terminals N23-N26 via two of its four pass/no-pass switches 258. The first type of cross-point switch 379 may have a central node configured to couple to its four terminals N23-N26 via its four respective pass/no-pass switches 258. Each of the pass/no-pass switches 258 may have one of the nodes N21 and N22 coupling to one of the four terminals N23-N26 and the other one of the nodes N21 and N22 coupling to the central node of the cross-point switch 379 of the first type. For example, the first type of cross-point switch 379 may be switched to pass data from its terminal N23 to its terminal N24 via top and left ones of its four pass/no-pass switches 258, to its terminal N25 via top and bottom ones of its four pass/no-pass switches 258 and/or to its terminal N26 via top and right ones of its four pass/no-pass switches 258.

(2) Second Type of Cross-Point Switch

Figure 3B:
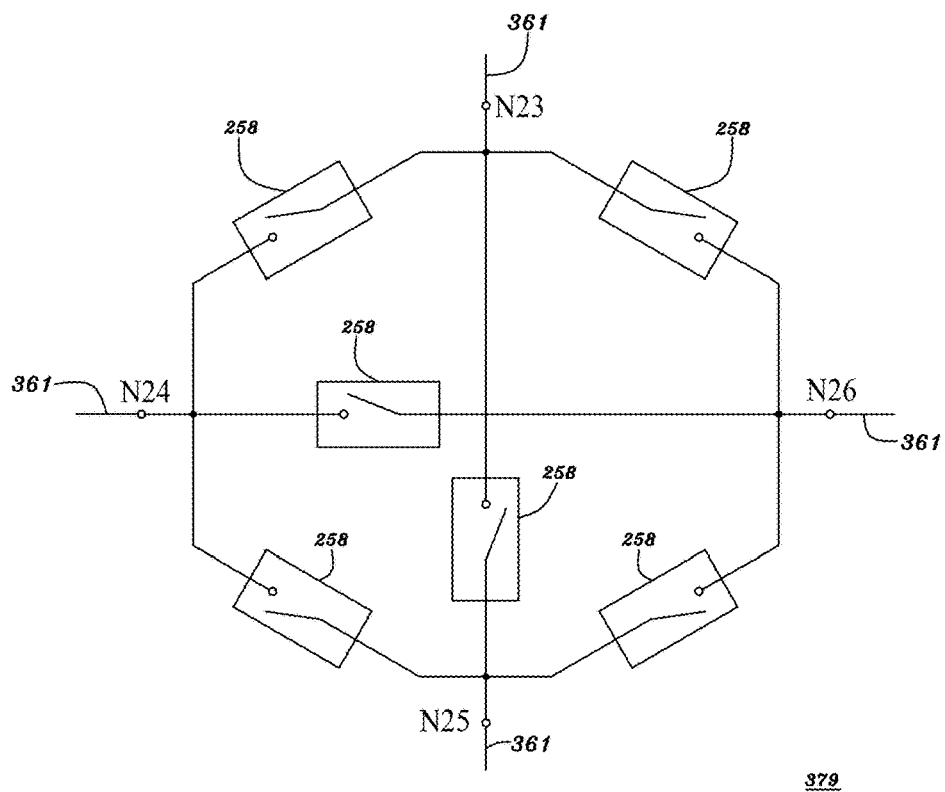

FIG. 3B is a circuit diagram illustrating a second type of cross-point switch composed of six pass/no-pass switches in accordance with an embodiment of the present application. Referring to FIG. 3B, six pass/no-pass switches 258, each of which may be one of the first and three types of pass/no-pass switches as illustrated in FIGS. 2A and 2C respectively, may compose a second type of cross-point switch 379. The second type of cross-point switch 379 may have four terminals N23-N26 each configured to be switched to couple to another one of its four terminals N23-N26 via one of its six pass/no-pass switches 258. Each of the pass/no-pass switches 258 may have one of the nodes N21 and N22 coupling to one of the four terminals N23-N26 and the other one of the nodes N21 and N22 coupling to another one of the four terminals N23-N26. For example, the second type of cross-point switch 379 may be switched to pass data from its terminal N23 to its terminal N24 via a first one of its six pass/no-pass switches 258 between its terminals N23 and N24, to its terminal N25 via a second one of its six pass/no-pass switches 258 between its terminals N23 and N25 and/or to its terminal N26 via a third one of its six pass/no-pass switches 258 between its terminals N23 and N26.

Specification for Multiplexer (MUXER)

Figure 4:
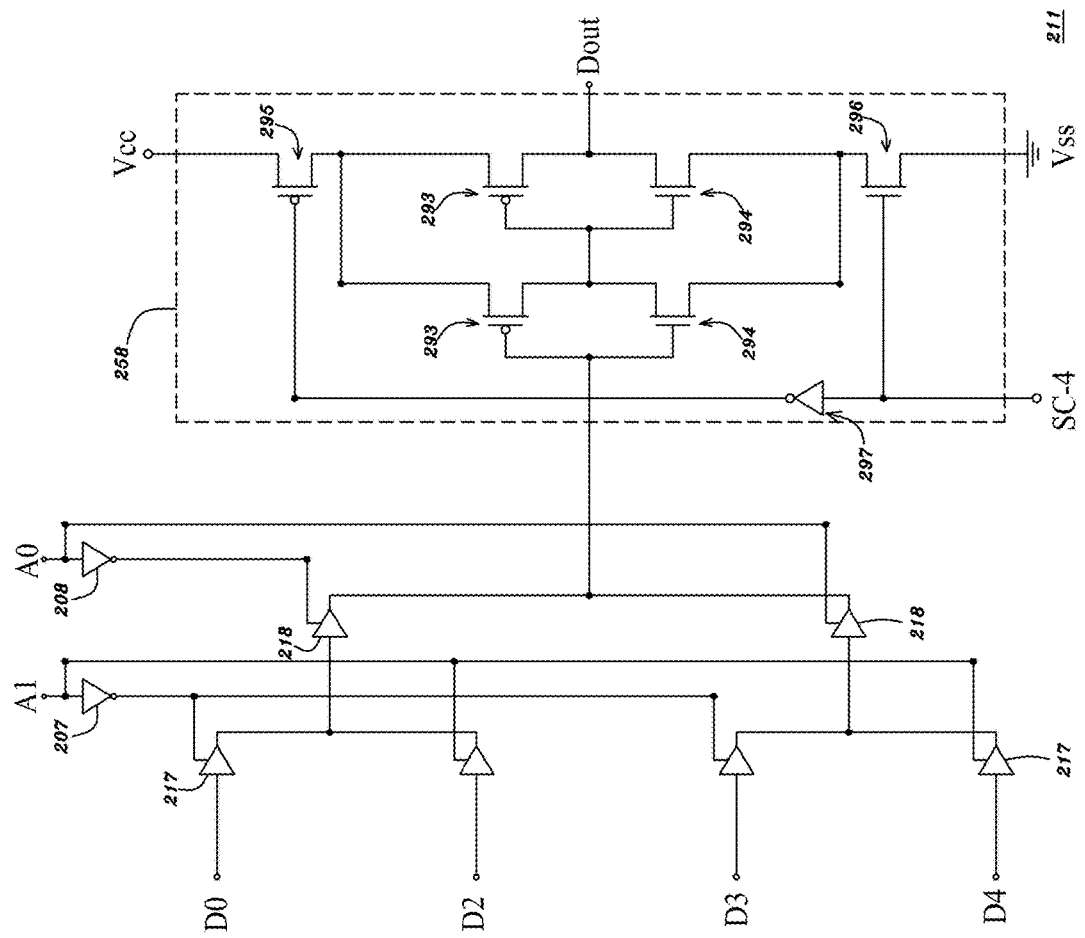
FIG. 4 is a circuit diagram illustrating a multiplexer in accordance with an embodiment of the present application.

FIG. 4 is a circuit diagram illustrating a multiplexer in accordance with an embodiment of the present application. Referring to FIG. 4, a multiplexer (MUXER) 211 may have a first set of two input points arranged in parallel for a first input data set, e.g., A0 and A1, and a second set of four input points arranged in parallel for a second input data set, e.g., D0, D1, D2 and D3. The multiplexer (MUXER) 211 may select a data input, e.g., D0, D1, D2 or D3, from its second input data set as a data output Dout at its output point based on its first input data set.

Referring to FIG. 4, the multiplexer 211 may include multiple stages of switch buffers, e.g., two stages of switch buffers 217 and 218, coupling to each other or one another stage by stage. For more elaboration, the multiplexer 211 may include four switch buffers 217 in two pairs in the first stage, i.e., input stage, arranged in parallel, each having a first input point for a first data input associated with data A1 of the first input data set of the multiplexer 211 and a second input point for a second data input associated with data, e.g., D0, D1, D2 or D3, of the second input data set of the multiplexer 211. Said each of the four switch buffers 217 in the first stage may be switched on or off to pass or not to pass its second data input from its second input point to its output point in accordance with its first data input at its first input point. The multiplexer 211 may include an inverter 207 having an input point for the data A1 of the first input data set of the multiplexer 211, wherein the inverter 207 is configured to invert the data A1 of the first input data set of the multiplexer 211 as a data output at an output point of the inverter 207. One of the two switch buffers 217 in each pair in the first stage may be switched on, in accordance with the first data input at its first input point coupling to one of the input and output points of the inverter 207, to pass the second data input from its second input point to its output point as a data output of said pair of switch buffers 217 in the first stage; the other one of the switch buffers 217 in said each pair in the first stage may be switched off, in accordance with the first data input at its first input point coupling to the other one of the input and output points of the inverter 207, not to pass the second data input from its second input point to its output point. The output points of the two switch buffers 217 in said each pair in the first stage may couple to each other. For example, a top one of the two switch buffers 217 in a top pair in the first stage may have its first input point coupling to the output point of the inverter 207 and its second input point for its second data input associated with data D0 of the second input data set of the multiplexer 211; a bottom one of the two switch buffers 217 in the top pair in the first stage may have its first input point coupling to the input point of the inverter 207 and its second input point for its second data input associated with data D1 of the second input data set of the multiplexer 211. The top one of the two switch buffers 217 in the top pair in the first stage may be switched on in accordance with its first data input at its first input point to pass its second data input from its second input point to its output point as a data output of the top pair of switch buffers 217 in the first stage; the bottom one of the two switch buffers 217 in the top pair in the first stage may be switched off in accordance with its first data input at its first input point not to pass its second data input from its second input point to its output point. Thereby, each of the two pairs of switch buffers 217 in the first stage may be switched in accordance with its two first data inputs at its two first input points coupling to the input and output points of the inverter 207 respectively to pass one of its two second data inputs from one of its two second input points to its output point coupling to a second input point of one of the switch buffers 218 in the second stage, i.e., output stage, as a data output of said each of the two pairs of switch buffers 217 in the first stage.

Referring to FIG. 4, the multiplexer 211 may include a pair of two switch buffers 218 in the second stage, i.e., output stage, arranged in parallel, each having a first input point for a first data input associated with data A0 of the first input data set of the multiplexer 211 and a second input point for a second data input associated with the data output of one of the two pairs of switch buffers 217 in the first stage. Said each of the two switch buffers 218 in the pair in the second stage, i.e., output stage, may be switched on or off to pass or not to pass its second data input from its second input point to its output point in accordance with its first data input at its first input point. The multiplexer 211 may include an inverter 208 having an input point for the data A0 of the first input data set of the multiplexer 211, wherein the inverter 208 is configured to invert the data A0 of the first input data set of the multiplexer 211 as its data output at an output point of the inverter 208. One of the two switch buffers 218 in the pair in the second stage, i.e., output stage, may be switched on, in accordance with the first data input at its first input point coupling to one of the input and output points of the inverter 208, to pass the second data input from its second input point to its output point as a data output of said pair of switch buffers 218 in the second stage; the other one of the two switch buffers 218 in the pair in the second stage, i.e., output stage, may be switched off, in accordance with the first data input at its first input point coupling to the other one of the input and output points of the inverter 208, not to pass the second data input from its second input point to its output point. The output points of the two switch buffers 218 in the pair in the second stage, i.e., output stage, may couple to each other. For example, a top one of the two switch buffers 218 in the pair in the second stage, i.e., output stage, may have its first input point coupling to the output point of the inverter 208 and its second input point for its second data input associated with the data output of the top one of the two pairs of switch buffers 217 in the first stage; a bottom one of the two switch buffers 218 in the pair in the second stage, i.e., output stage, may have its first input point coupling to the input point of the inverter 208 and its second input point for its second data input associated with the data output of the bottom one of the two pairs of switch buffers 217 in the first stage. The top one of the two switch buffers 218 in the pair in the second stage, i.e., output stage, may be switched on in accordance with its first data input at its first input point to pass its second data input from its second input point to its output point as a data output of the pair of switch buffers 218 in the second stage; the bottom one of the two switch buffers 218 in the pair in the second stage, i.e., output stage, may be switched off in accordance with its first data input at its first input point not to pass its second data input from its second input point to its output point. Thereby, the pair of switch buffers 218 in the second stage, i.e., output stage, may be switched in accordance with its two first data inputs at its two first input points coupling to the input and output points of the inverter 207 respectively to pass one of its two second data inputs from one of its two second input points to its output point as a data output of the pair of switch buffers 218 in the second stage, i.e., output stage.

Referring to FIG. 4, the multiplexer 211 may further include the second type of pass/no-pass switch or switch buffer 292 as seen in FIG. 2B. The pass/no-pass switch or switch buffer 292 may have the input point at its node N21 coupling to the output point of the pair of switch buffers 218 in the last stage, e.g., in the second stage or output stage in this case. For an element indicated by the same reference number shown in FIGS. 2B and 4, the specification of the element as seen in FIG. 4 may be referred to that of the element as illustrated in FIG. 2B. Accordingly, referring to FIG. 4, the second type of pass/no-pass switch 292 may amplify its data input associated with the data output of the pair of switch buffers 218 as its data output at its output point at its node N22 acting as a data output Dout of the multiplexer 211. The multiplexer (MUXER) 211 may select a data input from its second input data set, e.g., D0, D1, D2 and D3, at its second set of four input points as its data output Dout at its output point based on its first input data set, e.g., A0 and A1, at its first set of two input points.

Specification for Large I/O Circuits

Figure 5A:
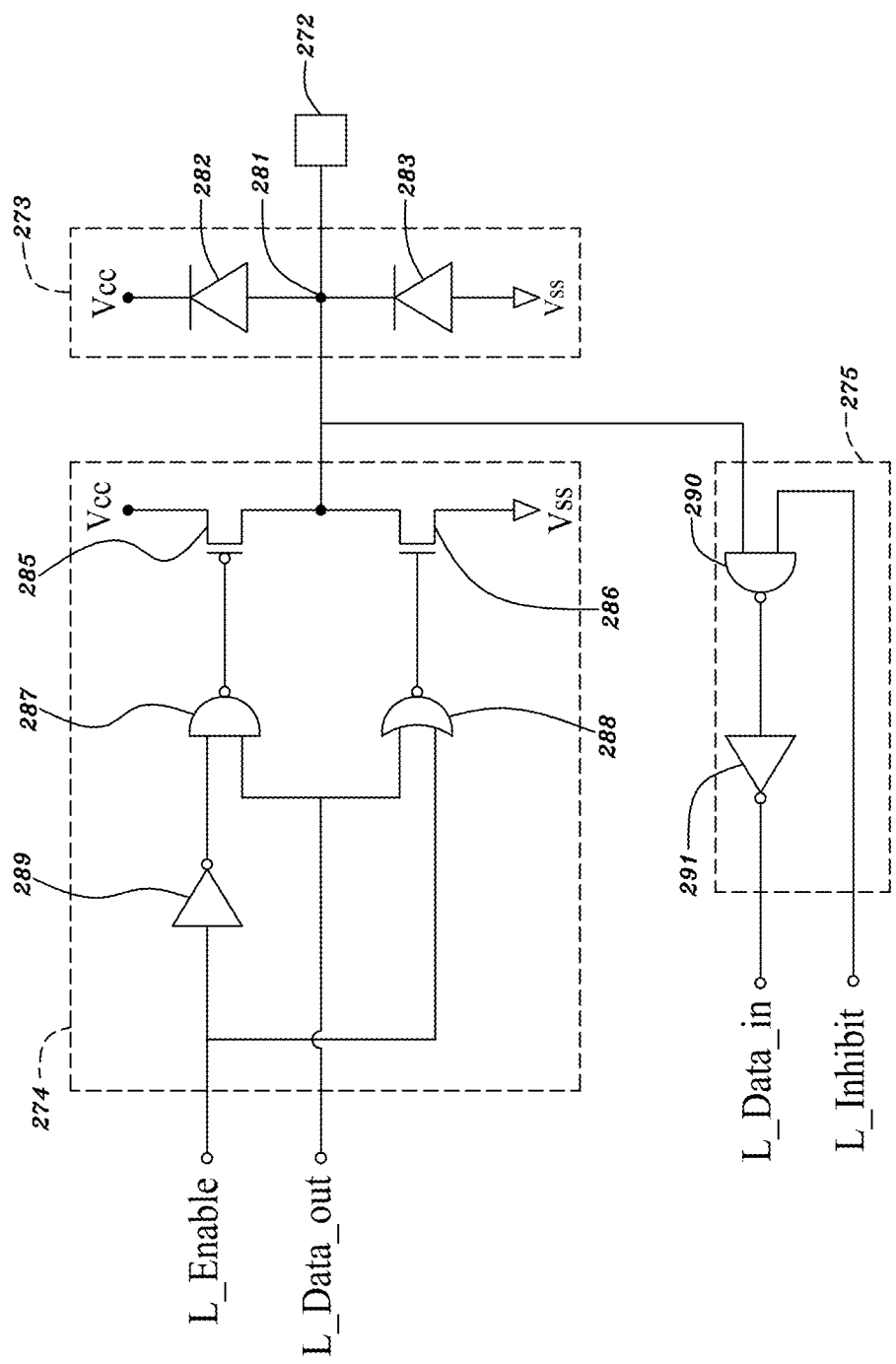
FIG. 5A is a circuit diagram of a large I/O circuit in accordance with an embodiment of the present application.

FIG. 5A is a circuit diagram of a large I/O circuit in accordance with an embodiment of the present application. Referring to FIG. 5A, a semiconductor chip may include multiple I/O pads 272 each coupling to its large ESD protection circuit or device 273, its large driver 274 and its large receiver 275. The large driver 274, large receiver 275 and large ESD protection circuit or device 273 may compose a large I/O circuit 341. The large ESD protection circuit or device 273 may include a diode 282 having a cathode coupling to the voltage Vcc of power supply and an anode coupling to a node 281 and a diode 283 having a cathode coupling to the node 281 and an anode coupling to the voltage Vss of ground reference. The node 281 couples to one of the I/O pads 272.

Referring to FIG. 5A, the large driver 274 may have a first input point for a first data input L_Enable for enabling the large driver 274 and a second input point for a second data input L_Data_out, and may be configured to amplify or drive the second data input L_Data_out as its data output at its output point at the node 281 to be transmitted to circuits outside the semiconductor chip through said one of the I/O pads 272. The large driver 274 may include a P-type MOS transistor 285 and N-type MOS transistor 286 both having respective drain terminals coupling to each other as its output point at the node 281 and respective source terminals coupling to the voltage Vcc of power supply and to the voltage Vss of ground reference. The large driver 274 may have a NAND gate 287 having a data output at an output point of the NAND gate 287 coupling to a gate terminal of the P-type MOS transistor 285 and a NOR gate 288 having a data output at an output point of the NOR gate 288 coupling to a gate terminal of the N-type MOS transistor 286. The NAND gate 287 may have a first data input at its first input point associated with a data output of its inverter 289 at an output point of an inverter 289 of the large driver 274 and a second data input at its second input point associated with the second data input L_Data_out of the large driver 274 to perform a NAND operation on its first and second data inputs as its data output at its output point coupling to the gate terminal of its P-type MOS transistor 285. The NOR gate 288 may have a first data input at its first input point associated with the second data input L_Data_out of the large driver 274 and a second data input at its second input point associated with the first data input L_Enable of the large driver 274 to perform a NOR operation on its first and second data inputs as its data output at its output point coupling to the gate terminal of the N-type MOS transistor 286. The inverter 289 may be configured to invert its data input at its input point associated with the first data input L_Enable of the large driver 274 as its data output at its output point coupling to the first input point of the NAND gate 287.

Referring to FIG. 5A, when the large driver 274 has the first data input L_Enable at a logic level of "1", the data output of the NAND gate 287 is always at a logic level of "1" to turn off the P-type MOS transistor 285 and the data output of the NOR gate 288 is always at a logic level of "0" to turn off the N-type MOS transistor 286. Thereby, the large driver 274 may be disabled by its first data input L_Enable and the large driver 274 may not pass the second data input L_Data_out from its second input point to its output point at the node 281.

Referring to FIG. 5A, the large driver 274 may be enabled when the large driver 274 has the first data input L_Enable at a logic level of "0". Meanwhile, if the large driver 274 has the second data input L_Data_out at a logic level of "0", the data outputs of the NAND and NOR gates 287 and 288 are at a logic level of "1" to turn off the P-type MOS transistor 285 and on the N-type MOS transistor 286, and thereby the data output of the large driver 274 at the node 281 is at a logic level of "0" to be passed to said one of the I/O pads 272. If the large driver 274 has the second data input L_Data_out is at a logic level of "1", the data outputs of the NAND and NOR gates 287 and 288 are at a logic level of "0" to turn on the P-type MOS transistor 285 and off the N-type MOS transistor 286, and thereby the data output of the large driver 274 at the node 281 is at a logic level of "1" to be passed to said one of the I/O pads 272. Accordingly, the large driver 274 may be enabled by its first data input L_Enable to amplify or drive its second data input L_Data_out at its second input point as its data output at its output point at the node 281 to be transmitted to circuits outside the semiconductor chip through said one of the I/O pads 272.

Referring to FIG. 5A, the large receiver 275 may have a first data input L_Inhibit at its first input point and a second data input at its second input point coupling to said one of the I/O pads 272 to be amplified or driven by the large receiver 275 as its data output L_Data_in. The large receiver 275 may be inhibited by its first data input L_Inhibit from generating its data output L_Data_in associated with its second data input. The large receiver 275 may include a NAND gate 290 and an inverter 291 having a data input at an input point of the inverter 291 associated with a data output of the NAND gate 290. The NAND gate 290 has a first input point for its first data input associated with the second data input of the large receiver 275 and a second input point for its second data input associated with the first data input L_Inhibit of the large receiver 275 to perform a NAND operation on its first and second data inputs as its data output at its output point coupling to the input point of its inverter 291. The inverter 291 may be configured to invert its data input associated with the data output of the NAND gate 290 as its data output at its output point acting as the data output L_Data_in of the large receiver 275 at an output point of the large receiver 275.

Referring to FIG. 5A, when the large receiver 275 has the first data input L_Inhibit at a logic level of "0", the data output of the NAND gate 290 is always at a logic level of "1" and the data output L_Data_in of the large receiver 275 is always at a logic level of "0". Thereby, the large receiver 275 is inhibited from generating its data output L_Data_in associated with its second data input at the node 281.

Referring to FIG. 5A, the large receiver 275 may be activated when the large receiver 275 has the first data input L_Inhibit at a logic level of "1". Meanwhile, if the large receiver 275 has the second data input at a logic level of "1" from circuits outside the semiconductor chip through said one of the I/O pads 272, the NAND gate 290 has its data output at a logic level of "0", and thereby the large receiver 275 may have its data output L_Data_in at a logic level of "1". If the large receiver 275 has the second data input at a logic level of "0" from circuits outside the semiconductor chip through said one of the I/O pads 272, the NAND gate 290 has its data output at a logic level of "1", and thereby the large receiver 275 may have its data output L_Data_in at a logic level of "0". Accordingly, the large receiver 275 may be activated by its first data input L_Inhibit signal to amplify or drive its second data input from circuits outside the semiconductor chip through said one of the I/O pads 272 as its data output L_Data_in.

Referring to FIG. 5A, the large driver 274 may have an output capacitance or driving capability or loading, for example, between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF. The output capacitance of the large driver 274 can be used as driving capability of the large driver 274, which is the maximum loading at the output point of the large driver 274, measured from said one of the I/O pads 272 to loading circuits external of said one of the I/O pads 272. The size of the large ESD protection circuit or device 273 may be between 0.1 pF and 3 pF or between 0.1 pF and 1 pF, or larger than 0.1 pF. Said one of the I/O pads 272 may have an input capacitance, provided by the large ESD protection circuit or device 273 and large receiver 275 for example, between 0.15 pF and 4 pF or between 0.15 pF and 2 pF, or greater than 0.15 pF. The input capacitance is measured from said one of the I/O pads 272 to circuits internal of said one of the I/O pads 272.

Specification for Small I/O Circuits

Figure 5B:
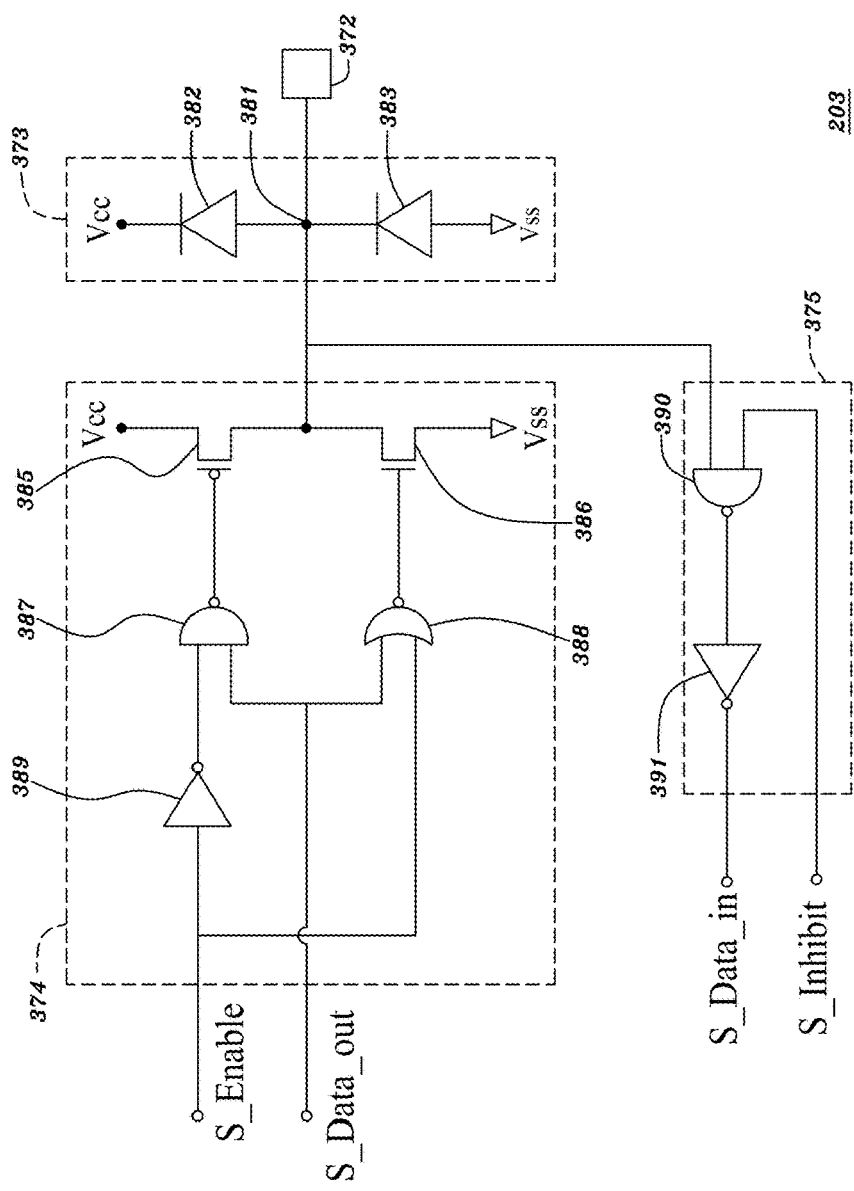
FIG. 5B is a circuit diagram of a small I/O circuit in accordance with an embodiment of the present application.

FIG. 5B is a circuit diagram of a small I/O circuit in accordance with an embodiment of the present application. Referring to FIG. 5B, a semiconductor chip may include multiple I/O pads 372 each coupling to its small ESD protection circuit or device 373, its small driver 374 and its small receiver 375. The small driver 374, small receiver 375 and small ESD protection circuit or device 373 may compose a small I/O circuit 203. The small ESD protection circuit or device 373 may include a diode 382 having a cathode coupling to the voltage Vcc of power supply and an anode coupling to a node 381 and a diode 383 having a cathode coupling to the node 381 and an anode coupling to the voltage Vss of ground reference. The node 381 couples to one of the I/O pads 372.

Referring to FIG. 5B, the small driver 374 may have a first input point for a first data input S_Enable for enabling the small driver 374 and a second input point for a second data input S_Data_out, and may be configured to amplify or drive the second data input S_Data_out as its data output at its output point at the node 381 to be transmitted to circuits outside the semiconductor chip through said one of the I/O pads 372. The small driver 374 may include a P-type MOS transistor 385 and N-type MOS transistor 386 both having respective drain terminals coupling to each other as its output point at the node 381 and respective source terminals coupling to the voltage Vcc of power supply and to the voltage Vss of ground reference. The small driver 374 may have a NAND gate 387 having a data output at an output point of the NAND gate 387 coupling to a gate terminal of the P-type MOS transistor 385 and a NOR gate 388 having a data output at an output point of the NOR gate 388 coupling to a gate terminal of the N-type MOS transistor 386. The NAND gate 387 may have a first data input at its first input point associated with a data output of its inverter 389 at an output point of an inverter 389 of the small driver 374 and a second data input at its second input point associated with the second data input S_Data_out of the small driver 374 to perform a NAND operation on its first and second data inputs as its data output at its output point coupling to the gate terminal of its P-type MOS transistor 385. The NOR gate 388 may have a first data input at its first input point associated with the second data input S_Data_out of the small driver 374 and a second data input at its second input point associated with the first data input S_Enable of the small driver 374 to perform a NOR operation on its first and second data inputs as its data output at its output point coupling to the gate terminal of the N-type MOS transistor 386. The inverter 389 may be configured to invert its data input at its input point associated with the first data input S_Enable of the small driver 374 as its data output at its output point coupling to the first input point of the NAND gate 387.

Referring to FIG. 5B, when the small driver 374 has the first data input S_Enable at a logic level of "1", the data output of the NAND gate 387 is always at a logic level of "1" to turn off the P-type MOS transistor 385 and the data output of the NOR gate 388 is always at a logic level of "0" to turn off the N-type MOS transistor 386. Thereby, the small driver 374 may be disabled by its first data input S_Enable and the small driver 374 may not pass the second data input S_Data_out from its second input point to its output point at the node 381.

Referring to FIG. 5B, the small driver 374 may be enabled when the small driver 374 has the first data input S_Enable at a logic level of "0". Meanwhile, if the small driver 374 has the second data input S_Data_out at a logic level of "0", the data outputs of the NAND and NOR gates 387 and 388 are at a logic level of "1" to turn off the P-type MOS transistor 385 and on the N-type MOS transistor 386, and thereby the data output of the small driver 374 at the node 381 is at a logic level of "0" to be passed to said one of the I/O pads 372. If the small driver 374 has the second data input S_Data_out at a logic level of "1", the data outputs of the NAND and NOR gates 387 and 388 are at a logic level of "0" to turn on the P-type MOS transistor 385 and off the N-type MOS transistor 386, and thereby the data output of the small driver 374 at the node 381 is at a logic level of "1" to be passed to said one of the I/O pads 372. Accordingly, the small driver 374 may be enabled by its first data input S_Enable to amplify or drive its second data input S_Data_out at its second input point as its data output at its output point at the node 381 to be transmitted to circuits outside the semiconductor chip through said one of the I/O pads 372.

Referring to FIG. 5B, the small receiver 375 may have a first data input S_Inhibit at its first input point and a second data input at its second input point coupling to said one of the I/O pads 372 to be amplified or driven by the small receiver 375 as its data output S_Data_in. The small receiver 375 may be inhibited by its first data input S_Inhibit from generating its data output S_Data_in associated with its second data input. The small receiver 375 may include a NAND gate 390 and an inverter 391 having a data input at an input point of the inverter 391 associated with a data output of the NAND gate 390. The NAND gate 390 has a first input point for its first data input associated with the second data input of the large receiver 275 and a second input point for its second data input associated with the first data input S_Inhibit of the small receiver 375 to perform a NAND operation on its first and second data inputs as its data output at its output point coupling to the input point of its inverter 391. The inverter 391 may be configured to invert its data input associated with the data output of the NAND gate 390 as its data output at its output point acting as the data output S_Data_in of the small receiver 375 at an output point of the small receiver 375.

Referring to FIG. 5B, when the small receiver 375 has the first data input S_Inhibit at a logic level of "0", the data output of the NAND gate 390 is always at a logic level of "1" and the data output S_Data_in of the small receiver 375 is always at a logic level of "0". Thereby, the small receiver 375 is inhibited from generating its data output S_Data_in associated with its second data input at the node 381.

Referring to FIG. 5B, the small receiver 375 may be activated when the small receiver 375 has the first data input S_Inhibit at a logic level of "1". Meanwhile, if the small receiver 375 has the second data input at a logic level of "1" from circuits outside the semiconductor chip through said one of the I/O pads 372, the NAND gate 390 has its data output at a logic level of "0", and thereby the small receiver 375 may have its data output S_Data_in at a logic level of "1". If the small receiver 375 has the second data input at a logic level of "0" from circuits outside the semiconductor chip through said one of the I/O pads 372, the NAND gate 390 has its data output at a logic level of "1", and thereby the small receiver 375 may have its data output S_Data_in at a logic level of "0". Accordingly, the small receiver 375 may be activated by its first data input S_Inhibit to amplify or drive its second data input from circuits outside the semiconductor chip through said one of the I/O pads 372 as its data output S_Data_in.

Referring to FIG. 5B, the small driver 374 may have an output capacitance or driving capability or loading, for example, between 0.05 pF and 2 pF or between 0.05 pF and 1 pF, or smaller than 2 pF or 1 pF. The output capacitance of the small driver 374 can be used as driving capability of the small driver 374, which is the maximum loading at the output point of the small driver 374, measured from said one of the I/O pads 372 to loading circuits external of said one of the I/O pads 372. The size of the small ESD protection circuit or device 373 may be between 0.01 pF and 0.1 pF or smaller than 0.1 pF. In some cases, no small ESD protection circuit or device 373 is provided in the small I/O circuit 203. In some cases, the small driver 374 or receiver 375 of the small I/O circuit 203 in FIG. 5B may be designed just like an internal driver or receiver, having no small ESD protection circuit or device 373 and having the same input and output capacitances as the internal driver or receiver. Said one of the I/O pads 372 may have an input capacitance, provided by the small ESD protection circuit or device 373 and small receiver 375 for example, between 0.15 pF and 4 pF or between 0.15 pF and 2 pF, or greater than 0.15 pF. The input capacitance is measured from said one of the I/O pads 372 to loading circuits internal of said one of the I/O pads 372.

Specification for Programmable Logic Blocks

Figure 6:
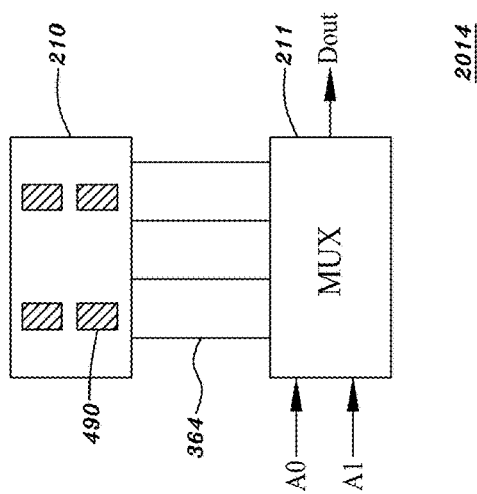
FIG. 6 is a schematic view showing a block diagram of a programmable logic block in accordance with an embodiment of the present application.

FIG. 6 is a schematic view showing a block diagram of a programmable logic cell in accordance with an embodiment of the present application. Referring to FIG. 6, a programmable logic block (LB) or element may include one or a plurality of programmable logic cells (LC) 1014 each configured to perform logic operation on its input data set at its input points. Each of the programmable logic cells (LC) 1014 may include multiple memory cells 490, i.e., configuration-programming-memory (CPM) cells, each configured to save or store one of resulting values of a look-up table (LUT) 210 and a multiplexer (MUXER) 211 having a first set of two input points arranged in parallel for a first input data set, e.g., A0 and A1 as illustrated in FIG. 4, and a second set of four input points arranged in parallel for a second input data set, e.g., D0, D1, D2 and D3 as illustrated in FIG. 4, each associated with one of the resulting values or programming codes of the look-up table (LUT) 210. The multiplexer (MUXER) 211 is configured to select, in accordance with its first input data set associated with the input data set of said each of the programmable logic cells (LC) 1014, a data input, e.g., D0, D1, D2 or D3 as illustrated in FIG. 4, from its second input data set as a data output Dout at its output point acting as a data output of said each of the programmable logic cells (LC) 1014 at an output point of said each of the programmable logic cells (LC) 1014.

Referring to FIG. 6, each of the memory cells 490, i.e., configuration-programming-memory (CPM) cells, may be referred to the memory cell 398 as illustrated in FIG. 1A or 1B, configured to save or store one of the resulting values of the look-up table (LUT) 210. The multiplexer (MUXER) 211 may have its second input data set, e.g., D0, D1, D2 and D3 as illustrated in FIG. 4, each associated with a data output, i.e., configuration-programming-memory (CPM) data, of one of the memory cells 490, e.g., one of the first and second data outputs Out1 and Out2 of the memory cell 398 as illustrated in FIG. 1A or 1B. Furthermore, the multiplexer (MUXER) 211 may have another data input SC-4 as illustrated in FIGS. 2B and 4 associated with a data output, i.e., configuration-programming-memory (CPM) data, of another of the memory cells 490, e.g., one of the first and second data outputs Out1 and Out2 of the memory cell 398 as illustrated in FIG. 1A or 1B.

Referring to FIG. 6, each of the programmable logic cells (LC) 2014 may have the memory cells 490, i.e., configuration-programming-memory (CPM) cells, configured to be programed to store or save the resulting values or programing codes of the look-up table (LUT) 210 to perform the logic operation, such as AND operation, NAND operation, OR operation, NOR operation, EXOR operation or other Boolean operation, or an operation combining two or more of the above operations. For example, one of the programmable logic cells (LC) 2014 may have the memory cells 490, i.e., configuration-programming-memory (CPM) cells, configured to be programed to store or save the resulting values or programing codes of the look-up table (LUT) 210 to perform the same logic operation as a basic logic operator, e.g., NAND operator or gate, as shown in FIG. 7A performs. For this case, said one of the programmable logic cells (LC) 2014 may perform NAND operation on its input data set, e.g., A0 and A1, at its input points as a data output Dout at its output point. FIG. 7B shows a truth table for a NAND operator. Referring to FIGS. 6, 7A and 7B, said one of the programmable logic cells (LC) 2014 may carry out logic functions based on the truth table.

Alternatively, each of the programmable logic cells (LC) 2014 may have the memory cells 490, i.e., configuration-programming-memory (CPM) cells, configured to be programed to store or save the resulting values or programing codes of the look-up table (LUT) 210 to perform the same logic operation as a logic operator as shown in FIG. 7C performs. FIG. 7D shows a truth table for a logic operator as seen in FIG. 7C. Referring to FIGS. 6, 7C and 7D, said each of the programmable logic cells (LC) 1014 may include the number $2^n$ of memory cells 490, i.e., configuration-programming-memory (CPM) cells, each configured to save or store one of resulting values of the look-up table (LUT) 210 and a multiplexer (MUXER) 211 having a first set of the number n of input points arranged in parallel for a first input data set, e.g., A0-A3 as illustrated in FIG. 7C, and a second set of the number $2^n$ of input points arranged in parallel for a second input data set, e.g., D0-D15 as illustrated in FIG. 7D, each associated with one of the resulting values or programming codes of the look-up table (LUT) 210, wherein the number n is equal to 4 for this case. The multiplexer (MUXER) 211 is configured to select, in accordance with its first input data set associated with the input data set of said each of the programmable logic cells (LC) 1014, a data input, e.g., one of D0-D15 as illustrated in FIG. 7D, from its second input data set as a data output Dout at its output point acting as a data output of said each of the programmable logic cells (LC) 1014 at an output point of said each of the programmable logic cells (LC) 1014.

Alternatively, a plurality of programmable logic cells (LC) 2014 as illustrated in FIGS. 6 and 7A-7D are configured to be programed to be integrated into the programmable logic block (LB) or element 201 acting as a computation operator to perform computation operation, such as addition, subtraction, multiplication or division operation. The computation operator may be an adder, a multiplier, a multiplexer, a shift register, floating-point circuits and/or division circuits. FIG. 7E is a block diagram illustrating a computation operator in accordance with an embodiment of the present application. For example, the computation operator as seen in FIG. 7E may be configured to multiply two two-binary-digit data inputs, i.e., [A1, A0] and [A3, A2], into a four-binary-digit output data set, i.e., [C3, C2, C1, C0], as seen in FIG. 7F. FIG. 7F shows a truth table for a logic operator as seen in FIG. 7E.

Figure 7E:
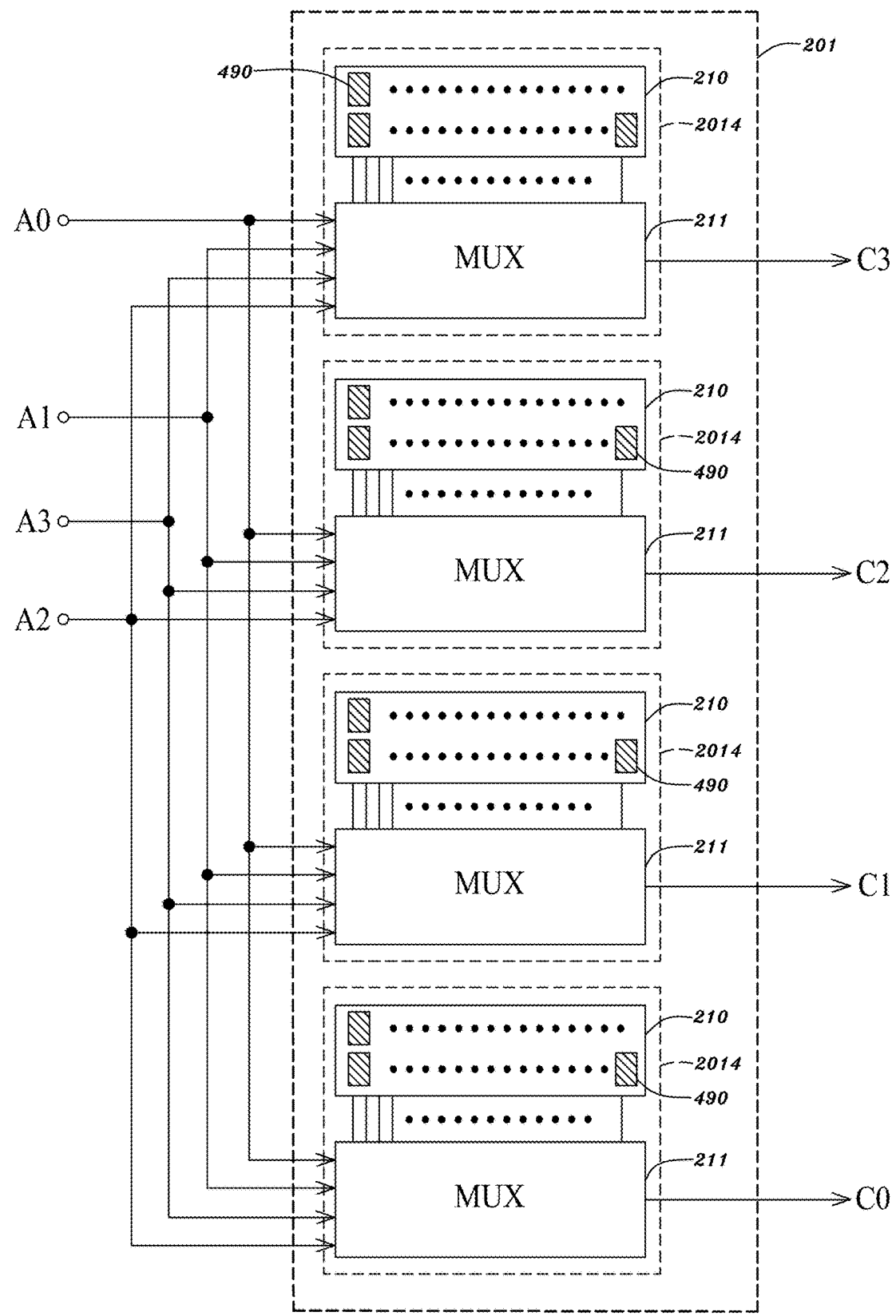
FIG. 7E is a block diagram illustrating a computation operator in accordance with an embodiment of the present application.
Figures 7F, 7G:
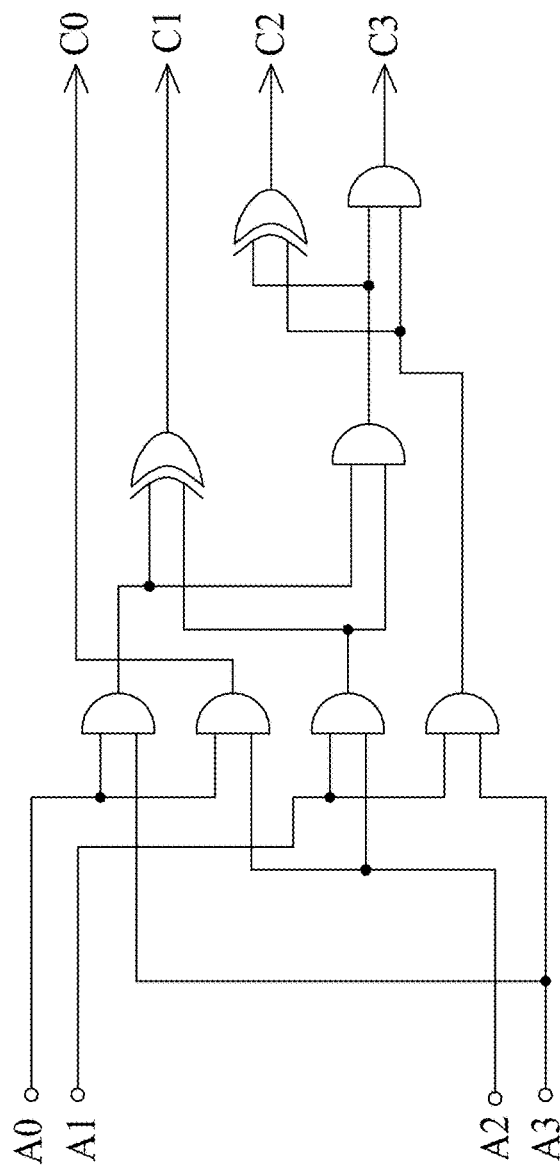
FIG. 7F shows a truth table for a logic operator as seen in FIG. 7E.
FIG. 7G is a circuit diagram of a computation operator in accordance with an embodiment of the present application.

Referring to FIGS. 6, 7E and 7F, four programmable logic cells (LC) 2014, each of which may be referred to one as illustrated in FIGS. 6 and 7A-7D, may be programed to be integrated into the computation operator. Each of the four programmable logic cells (LC) 2014 may have its input data set at its four input points associated with an input data set [A1, A0, A3, A2] of the computation operator respectively. Each of the programmable logic cells (LC) 2014 of the computation operator may generate an output data, e.g., C0, C1, C2 or C3, of the four-binary-digit data output of the computation operator based on its input data set [A1, A0, A3, A2]. In the multiplication of the two-binary-digit number, i.e., [A1, A0], by the two-binary-digit number, i.e., [A3, A2], the four programmable logic block 201 may generate its four-binary-digit output data set, i.e., [C3, C2, C1, C0], based on its input data set [A1, A0, A3, A2]. Each of the four programmable logic cells (LC) 2014 may have its memory cells 490, each of which may be referred to the memory cell 398 as illustrated in FIG. 1A or 1B, to be programed to save or store resulting values or programming codes of its look-up table 210, e.g., Table-0, Table-1, Table-2 or Table-3.

For example, referring to FIGS. 6 and 7E and 7F, a first one of the four programmable logic cells (LC) 2014 may have its memory cells 490, i.e., configuration-programming-memory (CPM) cells, configured to save or store the resulting values or programming codes of its look-up table (LUT) 210 of Table-0 and its multiplexer (MUXER) 211 configured to select, in accordance with the first input data set of its multiplexer (MUXER) 211 associated with the input data set [A1, A0, A3, A2] of the computation operator respectively, a data input from the second input data set D0-D15 of its multiplexer (MUXER) 211, each associated with the data output of one of its memory cells 490, e.g., one of the first and second data outputs Out1 and Out2 of the memory cell 398 as illustrated in FIG. 1A or 1B, associated with one of the resulting values or programming codes of its look-up table (LUT) 210 of Table-0, as its data output C0 acting as a binary-digit data output of the four-binary-digit output data set, i.e., [C3, C2, C1, C0], of the programmable logic block 201. A second one of the four programmable logic cells (LC) 2014 may have its memory cells 490, i.e., configuration-programming-memory (CPM) cells, configured to save or store the resulting values or programming codes of its look-up table (LUT) 210 of Table-1 and its multiplexer (MUXER) 211 configured to select, in accordance with the first input data set of its multiplexer (MUXER) 211 associated with the input data set [A1, A0, A3, A2] of the computation operator respectively, a data input from the second input data set D0-D15 of its multiplexer (MUXER) 211, each associated with the data output of one of its memory cells 490, e.g., one of the first and second data outputs Out1 and Out2 of the memory cell 398 as illustrated in FIG. 1A or 1B, associated with one of the resulting values or programming codes of its look-up table (LUT) 210 of Table-1, as its data output C1 acting as a binary-digit data output of the four-binary-digit output data set, i.e., [C3, C2, C1, C0], of the programmable logic block 201. A third one of the four programmable logic cells (LC) 2014 may have its memory cells 490, i.e., configuration-programming-memory (CPM) cells, configured to save or store the resulting values or programming codes of its look-up table (LUT) 210 of Table-2 and its multiplexer (MUXER) 211 configured to select, in accordance with the first input data set of its multiplexer (MUXER) 211 associated with the input data set [A1, A0, A3, A2] of the computation operator respectively, a data input from the second input data set D0-D15 of its multiplexer (MUXER) 211, each associated with the data output of one of its memory cells 490, e.g., one of the first and second data outputs Out1 and Out2 of the memory cell 398 as illustrated in FIG. 1A or 1B, associated with one of the resulting values or programming codes of its look-up table (LUT) 210 of Table-2, as its data output C2 acting as a binary-digit data output of the four-binary-digit output data set, i.e., [C3, C2, C1, C0], of the programmable logic block 201. A fourth one of the four programmable logic cells (LC) 2014 may have its memory cells 490, i.e., configuration-programming-memory (CPM) cells, configured to save or store the resulting values or programming codes of its look-up table (LUT) 210 of Table-3 and its multiplexer (MUXER) 211 configured to select, in accordance with the first input data set of its multiplexer (MUXER) 211 associated with the input data set [A1, A0, A3, A2] of the computation operator respectively, a data input from the second input data set D0-D15 of its multiplexer (MUXER) 211, each associated with the data output of one of its memory cells 490, e.g., one of the first and second data outputs Out1 and Out2 of the memory cell 398 as illustrated in FIG. 1A or 1B, associated with one of the resulting values or programming codes of its look-up table (LUT) 210 of Table-3, as its data output C3 acting as a binary-digit data output of the four-binary-digit output data set, i.e., [C3, C2, C1, C0], of the programmable logic block 201.

Thereby, referring to FIGS. 6 and 7E and 7F, the programmable logic block 201 acting as the computation operator may be composed of the four programmable logic cells (LC) 2014 to generate its four-binary-digit output data set, i.e., [C3, C2, C1, C0], based on its input data set [A1, A0, A3, A2].

Referring to FIGS. 6 and 7E and 7F, in a particular case for multiplication of 3 by 3, each of the four programmable logic cells (LC) 2014 may have its multiplexer (MUXER) 211 configured to select, in accordance with the first input data set of its multiplexer (MUXER) 211 associated with the input data set, i.e., [A1, A0, A3, A2]=[1, 1, 1, 1], of the computation operator respectively, a data input from the second input data set D0-D15 of its multiplexer (MUXER) 211, each associated with one of the resulting values or programming codes of its look-up table (LUT) 210, i.e., one of Table-0, Table-1, Table-2 and Table-3, as its data output, i.e., one of C0, C1, C2 and C3, acting as a binary-digit data output of the four-binary-digit output data set, i.e., [C3, C2, C1, C0]=[1, 0, 0, 1], of the programmable logic block 201. The first one of the four programmable logic cells (LC) 2014 may generate its data output C0 at a logic level of "1" based on its input data set, i.e., [A1, A0, A3, A2]=[1, 1, 1, 1]; the second one of the four programmable logic cells (LC) 2014 may generate its data output C1 at a logic level of "0" based on its input data set, i.e., [A1, A0, A3, A2]=[1, 1, 1, 1]; the third one of the four programmable logic cells (LC) 2014 may generate its data output C2 at a logic level of "0" based on its input data set, i.e., [A1, A0, A3, A2]=[1, 1, 1, 1]; the fourth one of the four programmable logic cells (LC) 2014 may generate its data output C3 at a logic level of "1" based on its input data set, i.e., [A1, A0, A3, A2]=[1, 1, 1, 1].

Referring to FIGS. 6, 7E and 7F, the programmable logic block (LB) 201 may be configured to be programed to perform the same computation operation as a computation operator, i.e., multiplier, as shown in FIG. 7G performs.

Figure 7H:
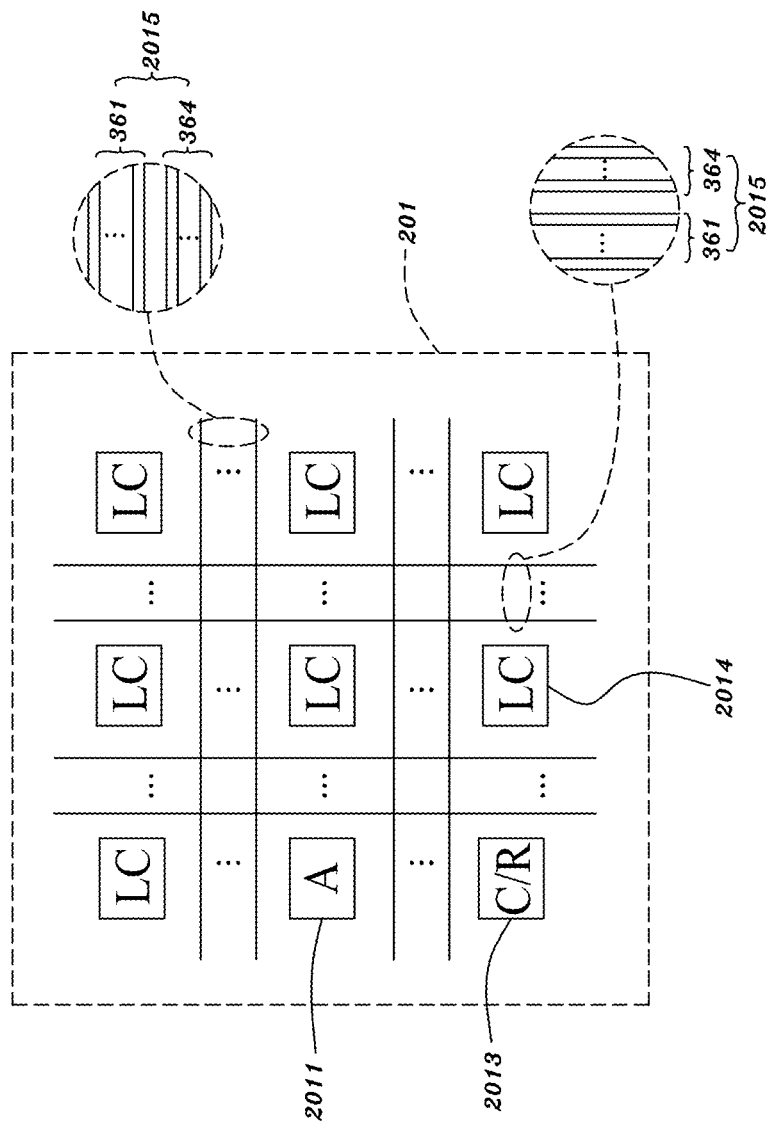
FIG. 7H is a block diagram illustrating a programmable logic block for a standard commodity FPGA IC chip in accordance with an embodiment of the present application.
Figure 8:
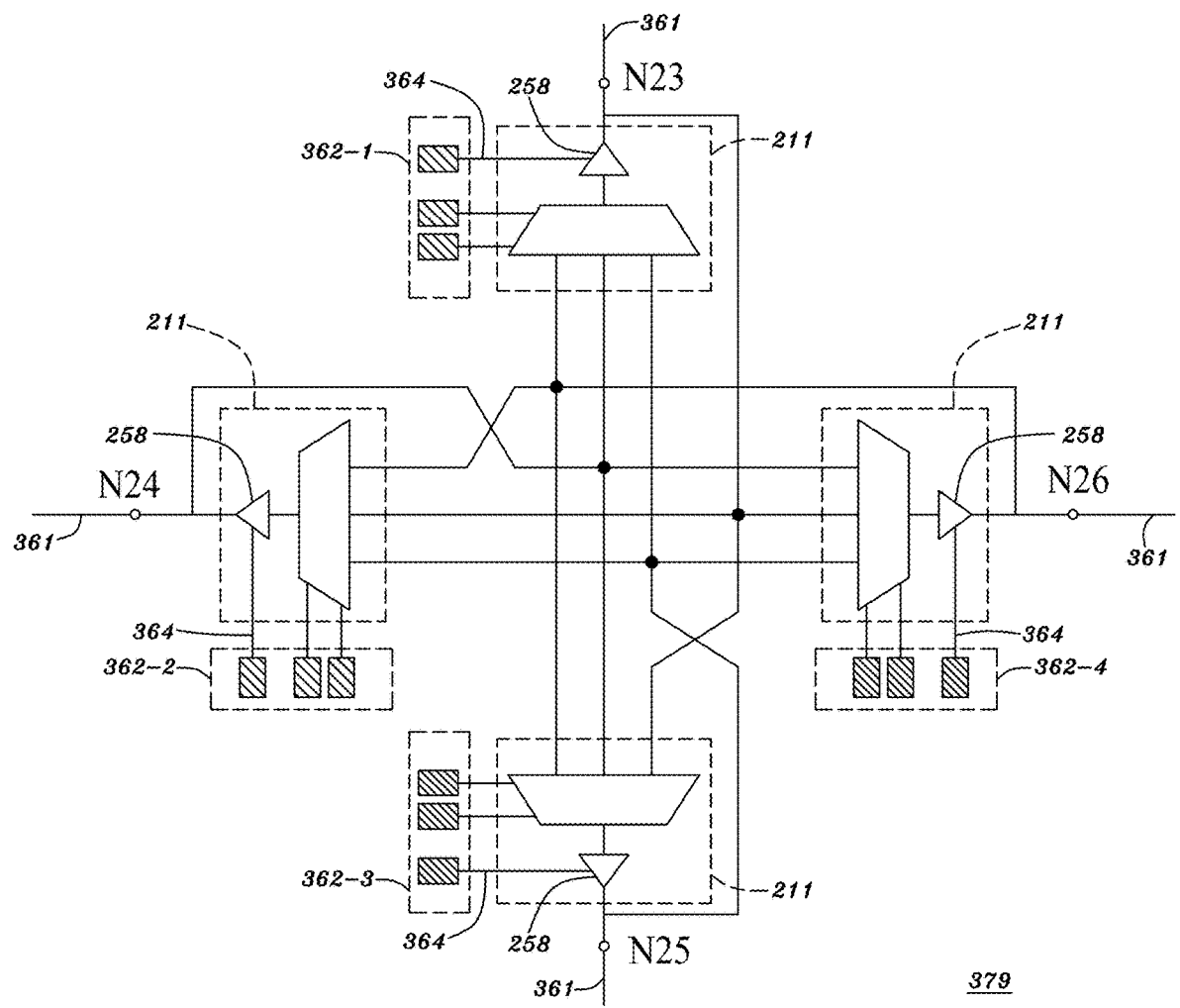
FIG. 8 is a block diagram illustrating programmable interconnects programmed by a cross-point switch in accordance with an embodiment of the present application.

Alternatively, FIG. 7H is a block diagram illustrating a programmable logic block for a standard commodity FPGA IC chip in accordance with an embodiment of the present application. Referring to FIG. 7H, the programmable logic block 201 may include (1) one or more cells (A) 2011 for fixed-wired adders, having the number ranging from 1 to 16 for example, (2) one or more cells (C/R) 2013 for caches and registers, each having capacity ranging from 256 to 2048 bits for example, and (3) the programmable logic cells (LC) 2014 as illustrated in FIGS. 6 and 7A-7G having the number ranging from 64 to 2048 for example. The programmable logic block 201 may further include multiple intra-block interconnects 2015 each extending over spaces between neighboring two of its cells 2011, 2013 and 2014 arranged in an array therein. For the programmable logic block (LB) 201, its intra-block interconnects 2015 may be divided into programmable interconnects 361 as illustrated in FIGS. 3A, 3B and 8 configured to be programmed for interconnection by its memory cells 362 and fixed interconnects 364 as illustrated in FIGS. 6 and 8 configured not to be programmable for interconnection.

Referring to FIG. 7H, each of the programmable logic cells (LC) 2014 may have its memory cells 490, i.e., configuration-programming-memory (CPM) cells, having the number ranging from 4 to 256 for example, each configured to save or store one of the resulting values or programming codes of its look-up table 210 and its multiplexer (MUXER) 211 configured to select, in accordance with the first input data set of its multiplexer (MUXER) 211 having a bit-width ranging from 2 to 8 for example at its input points coupling to at least one of the programmable interconnects 361 and fixed interconnects 364 of the intra-block interconnects 2015, a data input from the second input data set of its multiplexer (MUXER) 211 having a bit-width ranging from 4 to 256 for example as its data output at its output point coupling to at least one of the programmable interconnects 361 and fixed interconnects 364 of the intra-block interconnects 2015.

Figure 7I:
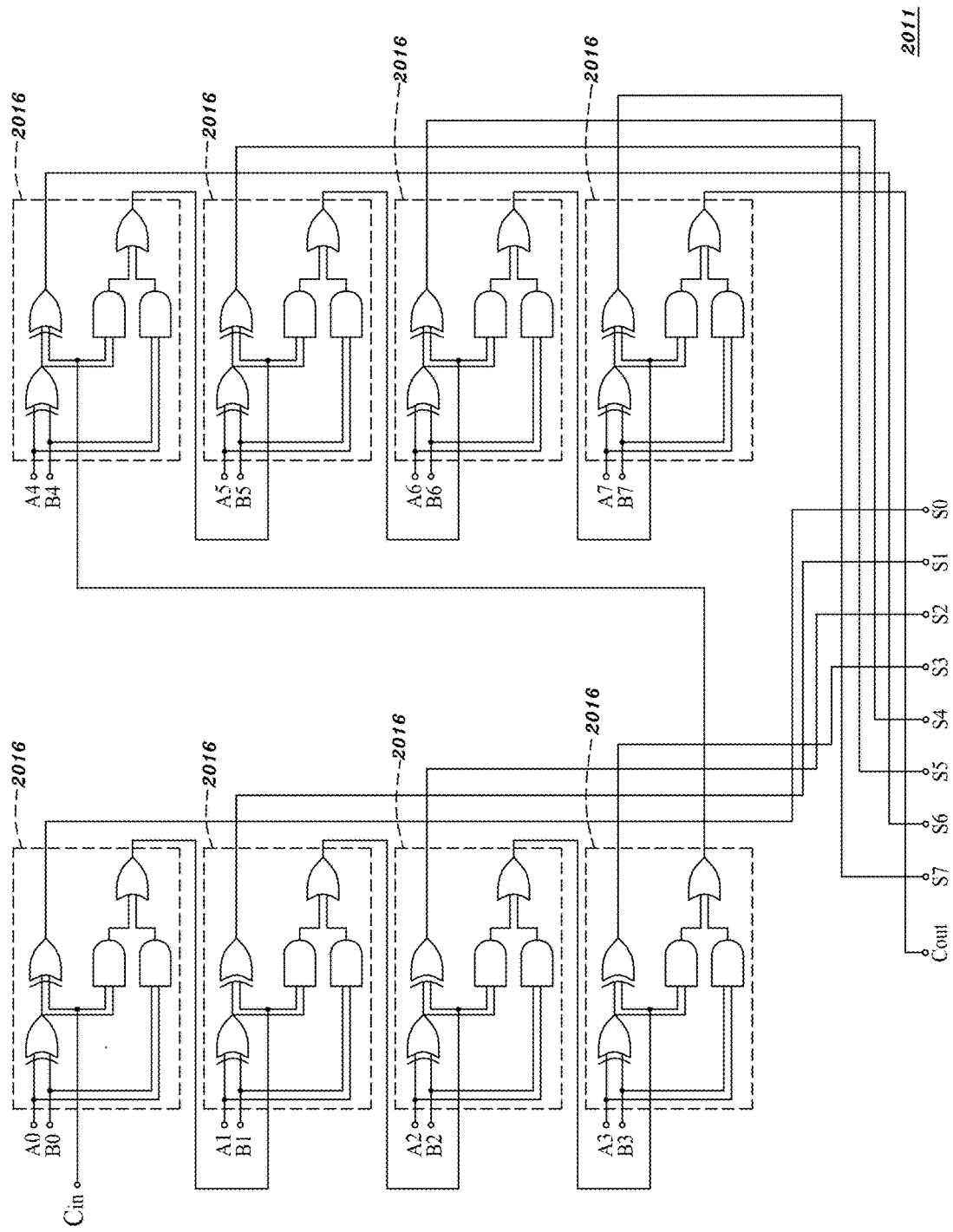
FIG. 7I is a circuit diagram illustrating a cell of an adder in accordance with an embodiment of the present application.
Figure 7J:
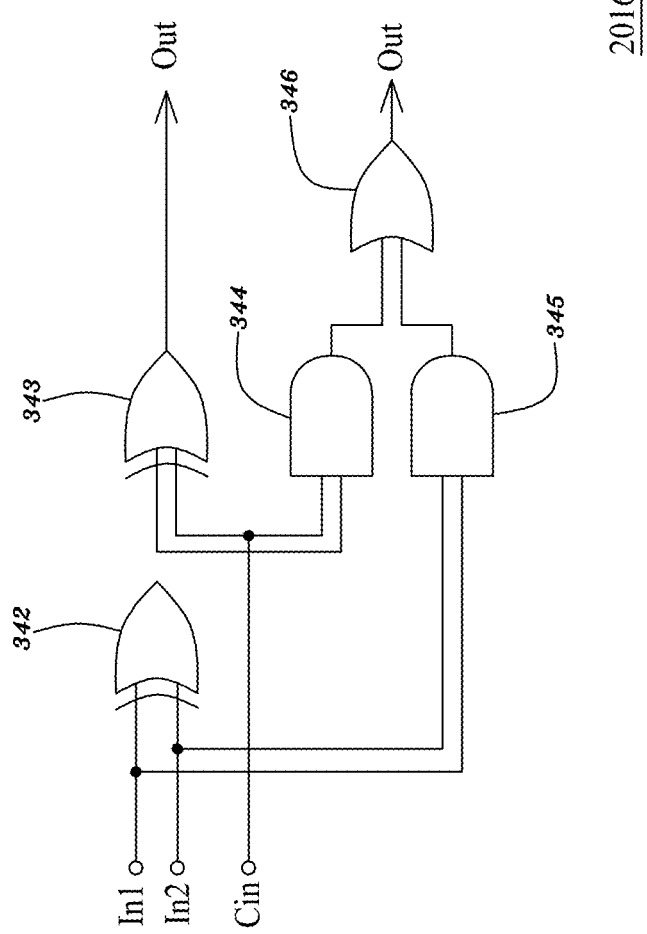
FIG. 7J is a circuit diagram illustrating an adding unit for a cell of an adder in accordance with an embodiment of the present application.

FIG. 7I is a circuit diagram illustrating a cell of an adder in accordance with an embodiment of the present application. FIG. 7J is a circuit diagram illustrating an adding unit for a cell of an adder in accordance with an embodiment of the present application. Referring to FIGS. 7H, 7I and 7J, each of the cells (A) 2011 for fixed-wired adders may include multiple adding units 2016 coupling in series and stage by stage to each other or one another. For example, said each of the cells (A) 2011 for fixed-wired adders as seen in FIG. 7H may include 8 stages of the adding unit 2016 coupling in series and stage by stage to one another as seen in FIGS. 7I and 7J to add its first 8-bit data inputs (A7, A6, A5, A4, A3, A2, A1, A0) at its first eight input points coupling to eight of the programmable interconnects 361 and fixed interconnects 364 of the intra-block interconnects 2015 by its second 8-bit data inputs (B7, B6, B5, B4, B3, B2, B1, B0) at its second eight input points coupling to another eight of the programmable interconnects 361 and fixed interconnects 364 of the intra-block interconnects 2015 as its 9-bit data output (Cout, S7, S6, S5, S4, S3, S2, S1, S0) at its output point coupling to another nine of the programmable interconnects 361 and fixed interconnects 364 of the intra-block interconnects 2015. Referring to FIGS. 7I and 7J, the adding unit 2016 of the first stage may take its carry-in data input Cin from a previous computation result coupling to one of the programmable interconnects 361 and fixed interconnects 364 of the intra-block interconnects 2015 into account to add its first data input In1 associated with the data input A0 of said each of the cells (A) 2011 for fixed-wired adders by its second data input In2 associated with the data input B0 of said each of the cells (A) 2011 as its two outputs, one of which is a data output Out acting as the data output S0 of said each of the cells (A) 2011 for fixed-wired adders and the other one of which is a carry-out data output Cout associated with a carry-in data input Cin of the adding unit 2016 of the second stage. Each of the adding units 2016 of the second through seventh stages may take its carry-in data input Cin from the carry-out data output Cout of one of the adding units 2016 of the first through sixth stages at a previous stage to said each of the adding units 2016 into account to add its first data input In1 associated with one of the data inputs A1, A2, A3, A4, A5 and A6 of said each of the cells (A) 2011 for fixed-wired adders by its second data input In2 associated with one of the data inputs B1, B2, B3, B4, B5 and B6 of said each of the cells (A) 2011 as its two data outputs, one of which is a data output Out acting as one of the data outputs S1, S2, S3, S4, S5 and S6 of said each of the cells (A) 2011 for fixed-wired adders and the other one of which is a carry-out data output Cout associated with a carry-in data input Cin of one of the adding units 2016 of the third through eighth stages at a subsequent stage to said each of the adding units 2016. For example, the adding unit 2016 of the seventh stage may take its carry-in data input Cin from a carry-out data output Cout of the adding unit 2016 of the sixth stage into account to add its first data input In1 associated with the data input A6 of said each of the cells (A) 2011 for fixed-wired adders by its second data input In2 associated with the data input B6 of said each of the cells (A) 2011 as its two outputs, one of which is a data output Out acting as the data output S6 of said each of the cells (A) 2011 for fixed-wired adders and the other one of which is a carry-out data output Cout associated with a carry-in data input Cin of the adding unit 2016 of the eighth stage. The adding unit 2016 of the eighth stage may take its carry-in data input Cin from the carry-out data output Cout of the adding unit 2016 of the seventh stage into account to add its first data input In1 associated with the data input A7 of said each of the cells (A) 2011 for fixed-wired adders by its second data input In2 associated with the data input B7 of said each of the cells (A) 2011 as its two data outputs, one of which is a data output Out acting as the data output S7 of said each of the cells (A) 2011 for fixed-wired adders and the other one of which is a carry-out data output Cout acting as the carry-out data output Cout of said each of the cells (A) 2011 for fixed-wired adders.

Referring to FIGS. 7H and 7I, each of the adding units 2016 of the first through eighth stages may include (1) an ExOR gate 342 configured to perform Exclusive-OR operation on the first and second data inputs of the ExOR gate 342 associated respectively with its first and second data inputs In1 and In2 as the data output of the ExOR gate 342, (2) an ExOR gate 343 configured to perform Exclusive-OR operation on the first data input of the ExOR gate 343 associated with the data output of the ExOR gate 342 and the second data input of the ExOR gate 343 associated with its carry-in data input Cin as the data output of the ExOR gate 343 acting as its data output Out, (3) an AND gate 344 configured to perform AND operation on the first data input of the AND gate 344 associated with its carry-in data input Cin and the second data input of the AND gate 344 associated with the data output of the ExOR gate 342 as the data output of the AND gate 344, (4) an AND gate 345 configured to perform AND operation on the first and second data inputs of the AND gate 345 associated respectively with its first and second data inputs In1 and In2 as the data output of the AND gate 345, and (5) an OR gate 346 configured to perform OR operation on the first data input of the OR gate 346 associated with the data output of the AND gate 344 and the second data input of the OR gate 346 associated with the data output of the AND gate 345 as the data output of the OR gate 346 acting as its Carry-out data output Cout.

Specification for Programmable Interconnect

FIG. 8 is a circuit diagram illustrating programmable interconnects programmed by a third type of cross-point switch in accordance with an embodiment of the present application. Besides the first and second types of cross-point switches 379 as illustrated in FIGS. 3A and 3B, a third type of cross-point switch 379 may presented as seen in FIG. 8 to include four multiplexers (MUXERs) 211 as seen in FIG. 4. Each of the four multiplexers (MUXERs) 211 may be configured to select, in accordance with its first input data set, e.g., A0 and A1, at its first set of input points, a data input from its second input data set, e.g., D0-D2, at its second set of input points as its data output. Each of the second set of three input points of one of the four multiplexers (MUXERs) 211 may couple to one of the second set of three input points of one of another two of the four multiplexers (MUXERs) 211 and to the output point of the other of the four multiplexers (MUXERs) 211. Thereby, each of the four multiplexers (MUXERs) 211 may select, in accordance with its first input data set, e.g., A0 and A1, a data input from its second input data set, e.g., D0-D2, at its second set of three input points coupling to three respective metal lines extending in three different directions and to the output point of the other respective three of the four multiplexers (MUXERs) 211 as its data output, e.g., Dout, at its output point at one of four nodes N23-N26 of the third type of cross-point switch 379 coupling to the other metal line extending in a direction other than the three different directions. Each of the four multiplexers (MUXERs) 211 as seen in FIG. 4 may further include the pass/no-pass switch or switch buffer 258 configured to be switched on or off in accordance with its data input SC-4 to pass or not to pass the data input selected from its second input data set, e.g., D0-D2, in accordance with its first input data set, e.g., A0 and A1, as its data output, e.g., Dout. For example, the top one of the four multiplexers (MUXERs) 211 may select, in accordance with its first input data set, e.g., A0 and A1, a data input from its second input data set, e.g., D0-D2, at its second set of three input points at the nodes N24, N25 and N26 of the third type of cross-point switch 379 respectively, i.e., at the output points of the left, bottom and right ones of the four multiplexers 211 respectively, as its data output, e.g., Dout, at its output point at the node N23 of the third type of cross-point switch 379. Alternatively, the top one of the four multiplexers (MUXERs) 211 may further include the pass/no-pass switch or switch buffer 258 configured to be switched on or off in accordance with its data input SC-4 to pass or not to pass the data input selected from its second input data set, e.g., D0-D2, in accordance with its first input data set, e.g., A0 and A1, as its data output, e.g., Dout, at its output point at the node N23 of the third type of cross-point switch 379.

Referring to FIG. 8, four programmable interconnects 361 may couple to the respective four nodes N23-N26 of the cross-point switch 379. Thereby, data from one of the four programmable interconnects 361 may be switched by the cross-point switch 379 to be passed to another one, two or three of the four programmable interconnects 361. Each of the four multiplexers (MUXERs) 211 as seen in FIG. 4 may have the data inputs, e.g., A0 and A1, of its first input data set each associated with a data output of one of its memory cells 362, i.e., configuration-programming-memory (CPM) cell, e.g., one of the first and second data outputs Out1 and Out2 of the memory cell 398 as illustrated in FIG. 1A or 1B. Each of the multiplexers (MUXERs) 211 as seen in FIG. 4 may have its data input SC-4 associated with a data output of another of its memory cells 362, i.e., configuration-programming-memory (CPM) cell, e.g., one of the first and second data outputs Out1 and Out2 of the memory cell 398 as illustrated in FIG. 1A or 1B. Thereby, each of the four multiplexers (MUXERs) 211 may have its memory cells 362, i.e., configuration-programming-memory (CPM) cell, configured to be programmed to save or store programming codes to control data transmission between each of three of the four programmable interconnects 361 coupling to its second set of three input points and the other of the four programmable interconnects 361 coupling to its output point, that is, to pass or not to pass a data input, e.g., D0, D1 or D2, of its second input data set at its second set of three input points coupling to three of the four programmable interconnects 361 as its data output, e.g., Dout, at its output point coupling to the other of the four programmable interconnects 361.

For example, referring to FIG. 8, the top one of the four multiplexers (MUXERs) 211 as seen in FIG. 4 may have the data inputs, e.g., A0 and A1, of its first input data set and its data input SC-4 associated respectively with the data outputs, i.e., configuration-programming-memory (CPM) data, of its three memory cells 362-1, each of which may be referred to one of the data outputs Out1 and Out2 of the memory cell 398 as illustrated in FIG. 1A or 1B; the left one of the four multiplexers (MUXERs) 211 as seen in FIG. 4 may have the data inputs, e.g., A0 and A1, of its first input data set and its data input SC-4 associated respectively with the data outputs, i.e., configuration-programming-memory (CPM) data, of its three memory cells 362-2, each of which may be referred to one of the data outputs Out1 and Out2 of the memory cell 398 as illustrated in FIG. 1A or 1B; the bottom one of the four multiplexers (MUXERs) 211 as seen in FIG. 4 may have the data inputs, e.g., A0 and A1, of its first input data set and its data input SC-4 associated respectively with the data outputs, i.e., configuration-programming-memory (CPM) data, of its three memory cells 362-3, each of which may be referred to one of the data outputs Out1 and Out2 of the memory cell 398 as illustrated in FIG. 1A or 1B; the right one of the four multiplexers (MUXERs) 211 as seen in FIG. 4 may have the data inputs, e.g., A0 and A1, of its first input data set and its data input SC-4 associated respectively with the data outputs, i.e., configuration-programming-memory (CPM) data, of its three memory cells 362-4, each of which may be referred to one of the data outputs Out1 and Out2 of the memory cell 398 as illustrated in FIG. 1A or 1B. Before the memory cells 362-1, 362-2, 362-3 and 362-4, i.e., configuration-programming-memory (CPM) cells, are programmed or when the memory cells 362-1, 362-2, 362-3 and 362-4 are being programmed, the four programmable interconnects 361 may not be used for signal transmission. The memory cells 362-1, 362-2, 362-3 and 362-4, i.e., configuration-programming-memory (CPM) cells, may be programmed to save or store programming codes, i.e., configuration-programming-memory (CPM) data, to pass data from one of the four programmable interconnects 361 to another, another two or another three of the four programmable interconnects 361, that is, from one of the nodes N23-N26 to another, another two or another three of the nodes N23-N26, for signal transmission in operation.

Alternatively, referring to FIGS. 2A-2C, two programmable interconnects 361 may be controlled, by the pass/no-pass switch 258 of either of the first through third types as seen in FIGS. 2A-2C, to pass or not to pass data therebetween. One of the programmable interconnects 361 may couple to the node N21 of the pass/no-pass switch 258, and another of the programmable interconnects 361 may couple to the node N22 of the pass/no-pass switch 258. Accordingly, the pass/no-pass switch 258 may be switched on to pass data from said one of the programmable interconnects 361 to said another of the programmable interconnects 361; the pass/no-pass switch 258 may be switched off not to pass data from said one of the programmable interconnects 361 to said another of the programmable interconnects 361.

For the first type of pass/no-pass switch 258 as illustrated in FIG. 2A, the first type of pass/no-pass switch 258 may have its data input SC-3 associated with a data output, i.e., configuration-programming-memory (CPM) data, of a memory cell 362, i.e., configuration-programming-memory (CPM) cell, which may be referred to one of the data outputs Out1 and Out2 of the memory cell 398 as illustrated in FIG. 1A or 1B. Thereby, the memory cell may be programmed to save or store a programming code to switch on or off the first type of pass/no-pass switch 258 to control data transmission between said one of the programmable interconnects 361 and said another of the programmable interconnects 361, that is, to pass or not to pass data from the node N21 of the pass/no-pass switch 258 to the node N22 of the pass/no-pass switch 258 or from the node N22 of the pass/no-pass switch 258 to the node N21 of the pass/no-pass switch 258.

For the second type of pass/no-pass switch 258 as illustrated in FIG. 2B, the second type of pass/no-pass switch 258 may have its data input SC-4 associated with a data output, i.e., configuration-programming-memory (CPM) data, of a memory cell 362, i.e., configuration-programming-memory (CPM) cell, which may be referred to one of the data outputs Out1 and Out2 of the memory cell 398 as illustrated in FIG. 1A or 1B. Thereby, the memory cell may be programmed to save or store a programming code to switch on or off the second type of pass/no-pass switch 258 to control data transmission between said one of the programmable interconnects 361 and said another of the programmable interconnects 361, that is, to pass or not to pass data from the node N21 of the pass/no-pass switch 258 to the node N22 of the pass/no-pass switch 258.

For the third type of pass/no-pass switch 258 as illustrated in FIG. 2C, the third type of pass/no-pass switch 258 may have its data inputs SC-5 and SC-6 each associated with a data output, i.e., configuration-programming-memory (CPM) data, of a memory cell 362, i.e., configuration-programming-memory (CPM) cell, which may be referred to one of the data outputs Out1 and Out2 of the memory cell 398 as illustrated in FIG. 1A or 1B. Thereby, each of the memory cells may be programmed to save or store a programming code to switch on or off the third type of pass/no-pass switch 258 to control data transmission between said one of the programmable interconnects 361 and said another of the programmable interconnects 361, that is, to pass or not to pass data from the node N21 of the pass/no-pass switch 258 to the node N22 of the pass/no-pass switch 258 or from the node N22 of the pass/no-pass switch 258 to the node N21 of the pass/no-pass switch 258.

Similarly, each of the first and second types of cross-point switches 379 as seen in FIGS. 3A and 3B may be composed of a plurality of pass/no-pass switches 258 of the first, second or third type, wherein each of the pass/no-pass switches 258 may have its data input(s) SC-3, SC-4 or (SC-5 and SC-6) each associated with a data output, i.e., configuration-programming-memory (CPM) data, of a memory cell, i.e., configuration-programming-memory (CPM) cell, as mentioned above. Each of the memory cells may be programmed to save or store a programming code to switch the cross-point switch 379 to pass data from one of its nodes N23-N26 to another, another two or another three of its nodes N23-N26 for signal transmission in operation. Four programmable interconnects 361 may couple respectively to the nodes N23-N26 of the cross-point switch 379 of the first or second type and thus may be controlled, by the cross-point switch 379 of the first or second type, to pass data from one of the four programmable interconnects 361 to another one, two or three of the four programmable interconnects 361.

Figure 9A:
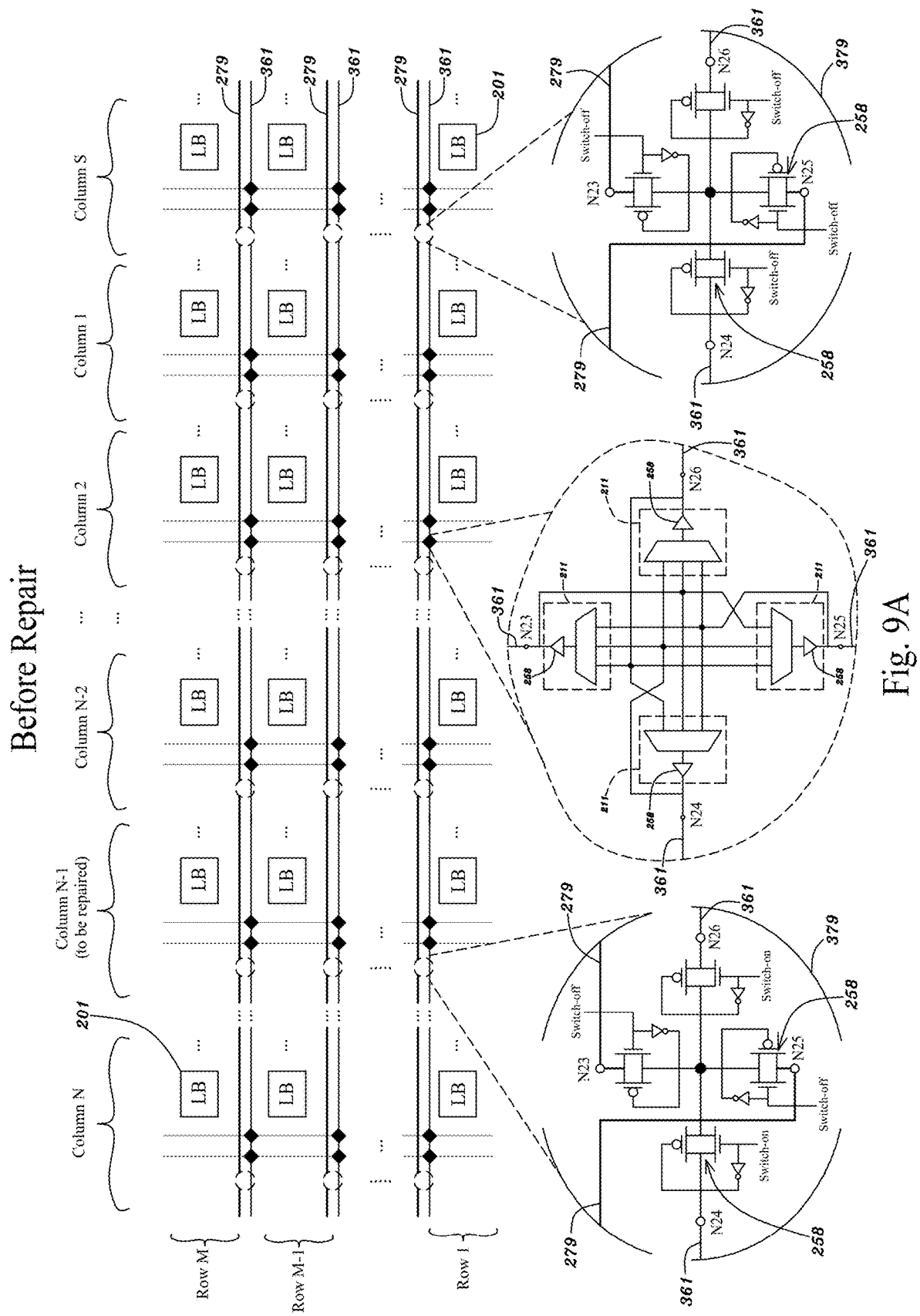
FIGS. 9A and 9B are schematic views showing a method for repairing a standard commodity FPGA IC chip in accordance with an embodiment of the present application.
Figure 9B:
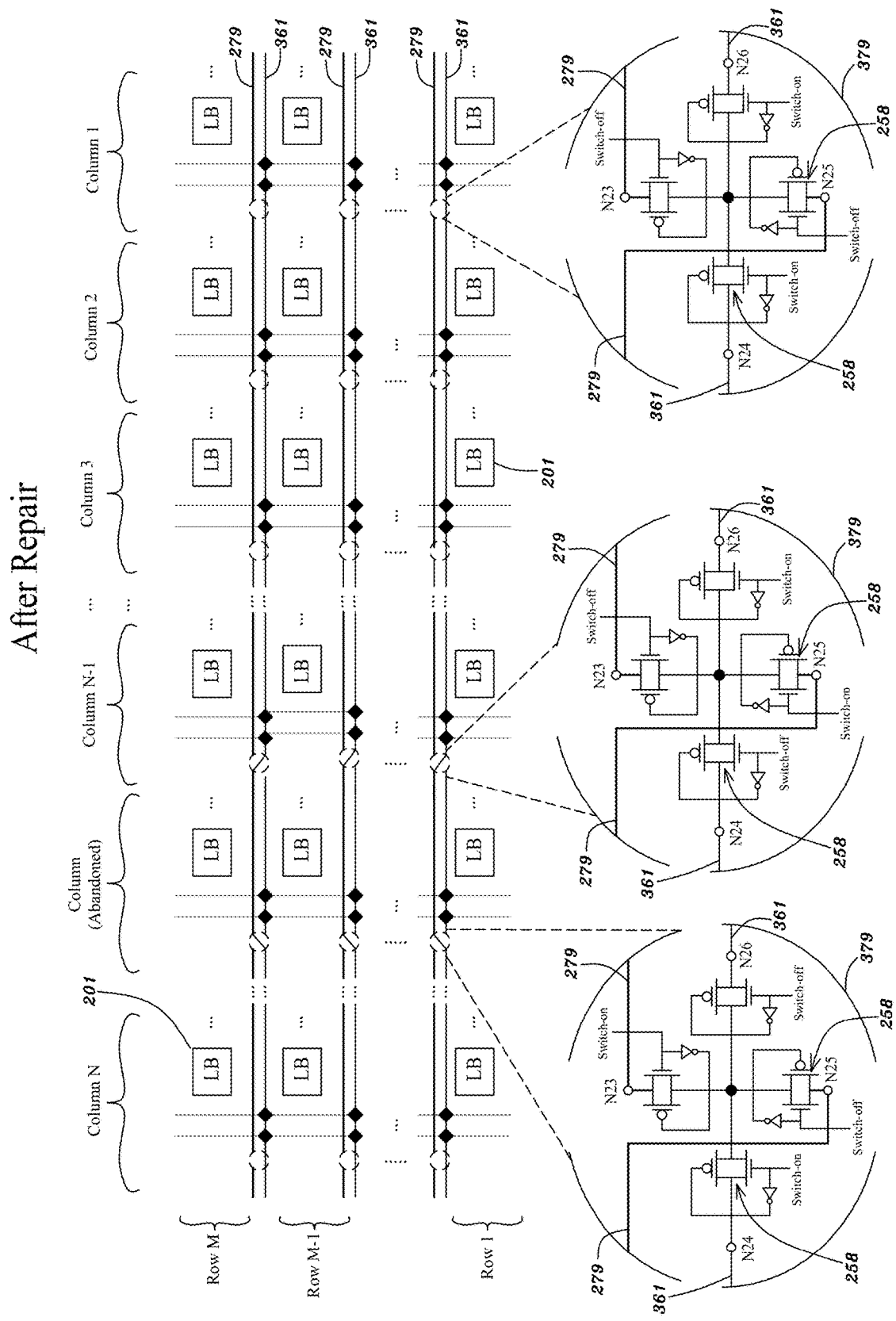

Method for Repairing Standard Commodity Field-Programmable-Gate-Array (FPGA) Integrated-Circuit (IC) Chip FIGS. 9A and 9B are schematic views showing a method for repairing a standard commodity FPGA IC chip in accordance with an embodiment of the present application. Referring to FIGS. 9A and 9B, the standard commodity FPGA IC chip 200 may include (1) a programmable logic array, bank or section including multiple programmable logic blocks (LB) 201 as illustrated in FIGS. 6 and 7A-7J arranged in an array with (N+1) columns and M rows, (2) multiple cross-point switches 379 as illustrated in FIGS. 8, 3A and 3B arranged around each of the programmable logic blocks (LB) 201, and (3) multiple intra-chip interconnects each extending over spaces between neighboring two of the programmable logic blocks 201. The programmable logic blocks (LB) 201 may have a first group for spare in the rightmost column configured to be backed up for a second group thereof in another column. In this case, the second group of programmable logic blocks (LB) 201 may be in the column (N−1) and have one, some or all of their programmable logic cells (LC) 2014, as illustrated in FIGS. 6 and 7A-7J, detected or determined to be in a broken state.

Referring to FIGS. 9A and 9B, the cross-point switches 379 may include (1) a first group of cross-point switches 379, shown with solid diamonds, as illustrated in FIG. 8 and (2) a second group of cross-point switches 379, shown with hollow cycles with dotted-line profiles, as illustrated in FIG. 3A or 3B. In this case, the cross-point switches 379 in the second group are ones as illustrated in FIG. 3A. The intra-chip interconnects may include (1) a first group of programmable interconnects 361 to serve as by-pass interconnects 279 each coupling the node N23 of one of the cross-point switches 379 in the second group to the node N25 of another one of the cross-point switches 379 in the second group to by-pass one or more of the cross-point switches 379 in the first group, (2) a second group of programmable interconnects 361 each coupling the node N26 of one of the cross-point switches 379 in the first group to the node N24 of the right neighboring one of the cross-point switches 379 in the first group, (3) a third group of programmable interconnects 361 each coupling the node N23 of one of the cross-point switches 379 in the first group to the node N26 of the upper neighboring one of the cross-point switches 379 in the first group, (4) a fourth group of programmable interconnects 361 each coupling the node N26 of one of the cross-point switches 379 in the first group to the node N24 of the right neighboring one of the cross-point switches 379 in the second group, and (5) a fifth group of programmable interconnects 361 each coupling the node N24 of one of the cross-point switches 379 in the first group to the node N26 of the left neighboring one of the cross-point switches 379 in the second group. Each of the by-pass interconnects 279 in a specific column may extend in a horizontal direction and between neighboring two of the programmable logic blocks 201 in the specific column to by-pass the cross-point switches 379 in the first group in the specific column.

Referring to FIG. 9A, before the programmable logic blocks (LB) 201 are repaired, the cross-point switches 379 in the second group in the columns 1-N may be programmed to couple its node N24 to its node N26, but the cross-point switches 379 in the second group in the column S may be programmed not to couple its node N24 to any of its nodes N23, N25 and N26.

Referring to FIG. 9B, after the programmable logic blocks (LB) 201 are repaired, that is, the programmable logic blocks (LB) 201 in the column (N−1) are skipped, the cross-point switches 379 in the second group in the column (N−1) may be programmed to couple its node N24 to its node N23 and the cross-point switches 379 in the second group in the column (N−2) may be programmed to couple its node N25 to its node N26 such that each of the by-pass interconnects 279 in the column (N−1) may couple one of the cross-point switches 379 in the second group in the column (N−1) to one of the cross-point switches 379 in the second group in the column (N−2). Further, the cross-point switches 379 in the second group in the column S may be programmed to couple its node N24 to its node N26. Next, the columns for the programmable logic blocks (LB) 201 may be renumbered such that the column S defined before repairing the programmable logic blocks (LB) 201 may be renumbered to column 1, and the column n defined before repairing the programmable logic blocks (LB) 201 may be renumbered to column (n+1), where n may be equal to an integer ranging from 1 to (N−2). Each of the programmable logic sections (LB) 201 after repaired in a specific renumbered column and in a specific row may perform the same logic or computation operations as one of the programmable logic blocks (LB) 201 before repaired in the specific column and in the specific row. For example, each of the programmable logic blocks (LB) 201 after repaired in the renumbered column (N−1) and in the row (M−1) may perform the same logic or computation operations as one of the programmable logic blocks (LB) 201 before repaired in the column (N−1) and in the row (M−1). For the FPGA IC chip 200, one of its cross-point switches 379 of the second group at a cross of each of the rows 1-M and each of the columns 1-N may pass data associated with a data input of the input data set of one of the programmable logic cells 2014, as illustrated in FIGS. 6 and 7A-7J, of one of its programmable logic blocks (LB) 201 at the cross through one or more of its cross-point switches 379 of the first group at the cross to one of the input points of said one of the programmable logic cells 2014. For the FPGA IC chip 200, one of its cross-point switches 379 of the second group at a cross of each of the rows 1-M and each of the columns 1-N may pass data associated with the data output of one of the programmable logic cells 2014, as illustrated in FIGS. 6 and 7A-7J, of its programmable logic block 201 at the cross through one or more of its cross-point switches 379 of the first group at the cross from the output point of said one of the programmable logic cells 2014.

Figure 10A:
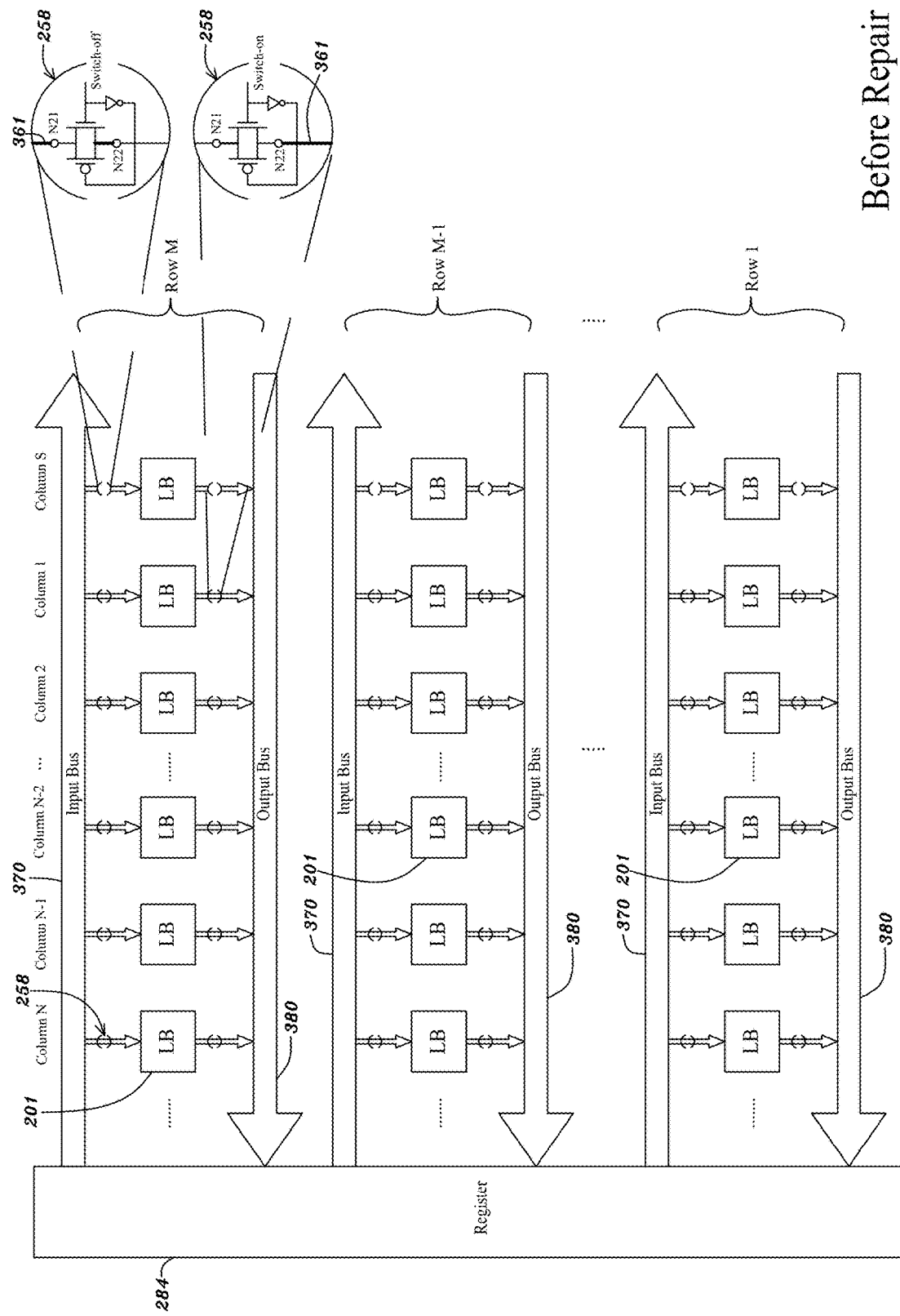
FIGS. 10A and 10B are schematic views showing a method for repairing a standard commodity FPGA IC chip in accordance with another embodiment of the present application.
Figure 10B:
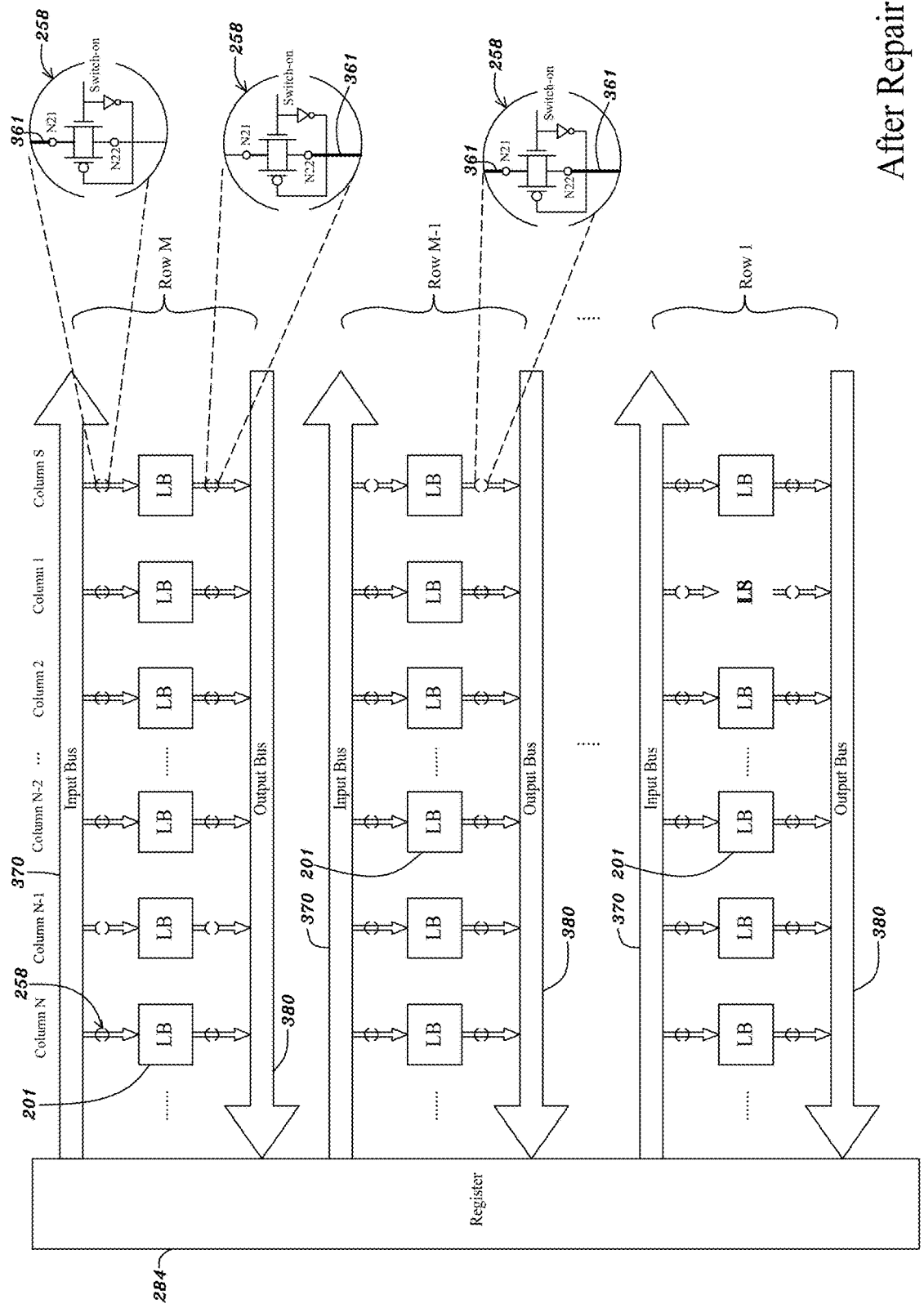

Alternatively, FIGS. 10A and 10B are schematic views showing a method for repairing a standard commodity FPGA IC chip in accordance with another embodiment of the present application. Referring to FIGS. 10A and 10B, the standard commodity FPGA IC chip 200 may include (1) a programmable logic array, bank or section including multiple programmable logic blocks (LB) 201 arranged in an array with (N+1) columns and M rows, (2) multiple programmable interconnects 361 for an input bus 370 in each of multiple sets arranged in M rows, configured to be programmed by one or more of its memory cells 362 to form at least one path to pass data to its programmable logic blocks (LB) 201 arranged in one of the M rows, (3) multiple programmable interconnects 361 for an output bus 380 in each of multiple sets arranged in M rows, configured to be programmed by one or more of its memory cells 362 to form at least one path to pass data from its programmable logic blocks (LB) 201 arranged in one of the M rows, (4) a register 284 configured to register or save data therein to be passed to each of the programmable logic blocks (LB) 201 through the programmable interconnects 361 for the input bus 370 in one of the multiple sets and to register or save data therein passed from each of the programmable logic blocks (LB) 201 through the programmable interconnects 361 for the output bus 380 in one of the multiple sets, (5) multiple pass/no-pass switches 258, as illustrated in FIGS. 2A-2C, for the data inputs of each of the programmable logic blocks (LB) 201, each having the node N21 coupling to one of the programmable interconnects 361 for the input bus 370 in one of the multiple sets and the node N22 coupling to one of the input points of said each of the programmable logic blocks (LB) 201 as illustrated in FIGS. 6 and 7A-7J, configured to switch on or off the connection between the programmable interconnects 361 for the input bus 370 and the input points of said each of the programmable logic blocks (LB) 201, and (6) one or more pass/no-pass switches 258, as illustrated in FIGS. 2A-2C, for the data output(s) of each of the programmable logic blocks (LB) 201, each having the node N22 coupling to one of the programmable interconnects 361 for the output bus 380 in one of the multiple sets and the node N21 coupling to one of the output point(s) of said each of the programmable logic blocks 201, as illustrated in FIGS. 6 and 7A-7J, configured to switch on or off the connection between the programmable interconnects 361 for the output bus 380 and the output point(s) of said each of the programmable logic blocks (LB) 201. Referring to FIGS. 10A and 10B, in each of the rows 1-M, the programmable logic blocks (LB) 201 may have one for spare in the rightmost column configured to be backed up for another thereof in another column. In this case, the programmable logic blocks (LB) 201 in the row M and the column (N−1) and in the row 1 and the column 1 may have one, some or all of their programmable logic cells (LC) 2014, as illustrated in FIGS. 6 and 7A-7J, detected or determined to be in a broken state.

Referring to FIG. 10A, before the programmable logic blocks (LB) 201 are repaired, each of the pass/no-pass switches 258 for the data inputs and outputs of the programmable logic blocks (LB) 201 arranged in the columns 1-N may be programmed to be switched on to pass data from its node N21 to its node N22, and each of the pass/no-pass switches 258 for the data inputs and outputs of the programmable logic blocks (LB) 201 arranged in the column S may be programmed to be switched off not to pass data from its node N21 to its node N22.

Referring to FIG. 10B, after the programmable logic blocks (LB) 201 are repaired, each of the pass/no-pass switches 258 for the data inputs and outputs of a broken one of the programmable logic blocks (LB) 201 in one of the rows 1-M, which is detected or determined to be in a broken state in a case, may be programmed to be switched off not to pass data from the programmable interconnects 361 for the input bus 370 in said one of the rows 1-M to the broken one of the programmable logic blocks (LB) 201 and not to pass data from the broken one of the programmable logic blocks (LB) 201 to the programmable interconnects 361 for the output bus 380 in said one of the rows 1-M, and each of the pass/no-pass switches 258 for the data inputs and outputs of a spare one of the programmable logic blocks (LB) 201 in the column S and said one of the rows 1-M may be programmed to be switched on to pass data from one of the programmable interconnects 361 for the input bus 370 in said one of the rows 1-M to the spare one of the programmable logic blocks (LB) 201 or to pass data from the spare one of the programmable logic blocks (LB) 201 to one of the programmable interconnects 361 for the output bus 380 in said one of the rows 1-M. For example, in the row M, the programmable logic block (LB) 201 in the column (N−1) is detected or determined to be in a broken state and thus each of the pass/no-pass switches 258 for the data inputs and outputs of the programmable logic block (LB) 201 in the column (N−1) may be programmed to be switched off not to pass data from the programmable interconnects 361 for the input bus 370 in the row M to the programmable logic block (LB) 201 in the column (N−1) and not to pass data from the programmable logic block (LB) 201 in the column (N−1) to the programmable interconnects 361 for the output bus 380 in the row M, and each of the pass/no-pass switches 258 for the data inputs and outputs of the programmable logic block (LB) 201 in the column S may be programmed to be switched on to pass data from one of the programmable interconnects 361 for the input bus 370 in the row M to the programmable logic block (LB) 201 in the column S or to pass data from the programmable logic block (LB) 201 in the column S to one of the programmable interconnects 361 for the output bus 380 in the row M. In the row (M−1), each of the programmable logic blocks (LB) 201 is not detected or determined to be in a broken state, and thus the pass/no-pass switches 258 in the row (M−1) are kept in the state before the programmable logic blocks (LB) 201 are repaired. In the row 1, the programmable logic block (LB) 201 in the column 1 is detected or determined to be in a broken state and thus each of the pass/no-pass switches 258 for the data inputs and outputs of the programmable logic blocks (LB) 201 in the column 1 may be programmed to be switched off not to pass data from the programmable interconnects 361 for the input bus 370 in the row 1 to the programmable logic blocks (LB) 201 in the column 1 and not to pass data from the programmable logic blocks (LB) 201 in the column 1 to the programmable interconnects 361 for the output bus 380 in the row 1, and each of the pass/no-pass switches 258 for the data inputs and outputs of the programmable logic blocks (LB) 201 in the column S may be programmed to be switched on to pass data from one of the programmable interconnects 361 for the input bus 370 in the row 1 to the programmable logic blocks (LB) 201 in the column S and to pass data from the programmable logic blocks (LB) 201 in the column S to one of the programmable interconnects 361 for the output bus 380 in the row 1.

In operation, referring to FIG. 10B, in a clock cycle, the programmable logic blocks (LB) 201 in each of the rows 1-M may process in parallel their data inputs from the input bus 370 in said each of the rows 1-M as their data outputs to be passed to the register 284 through the output bus 380 in said each of the rows 1-M and to be stored or registered in the register 284. In a following clock cycle, the register 284 may send the data outputs from the programmable logic blocks (LB) 201 in said each of the rows 1-M to the programmable logic blocks (LB) 201 in said each of the rows 1-M through the input bus 370 in said each of the rows 1-M to be processed in parallel by the programmable logic blocks (LB) 201 in said each of the rows 1-M again or to the programmable logic blocks (LB) 201 in another of the rows 1-M through the input bus 370 in said another of the rows 1-M to be processed in parallel by the programmable logic blocks (LB) 201 in said another of the rows 1-M. In other words, the architecture of programmable logic blocks (LB) 201 provides in-parallel processing in a clock cycle and sequentially in-series processing in different clock cycles.

Referring to FIG. 10B, when the standard commodity FPGA IC chip 200 is in operation, one or more of the programmable interconnects 361 for the output bus 380 in each of the rows 1-M may be programmed by one or more of the memory cells 362 as seen in FIGS. 3A, 3B and 8 to form a path to pass data associated with the second data input S_Data_out of one of the small drivers 374 as illustrated in FIG. 5B from one of the output point(s) of one of the programmable logic blocks (LB) in said each of the rows 1-M to the second input point of said one of the small drivers 374, while one or more of the programmable interconnects 361 for the input bus 370 in said each of the rows 1-M may be programmed by one or more of the memory cells 362 as seen in FIGS. 3A, 3B and 8 to form another path to pass data associated with the data output S_Data_in of one of the small receivers 375 as illustrated in FIG. 5B from the output point of said one of the small receivers 375 to one of the input points of each of the programmable logic blocks (LB) in said each of the rows 1-M.

Figure 11A:
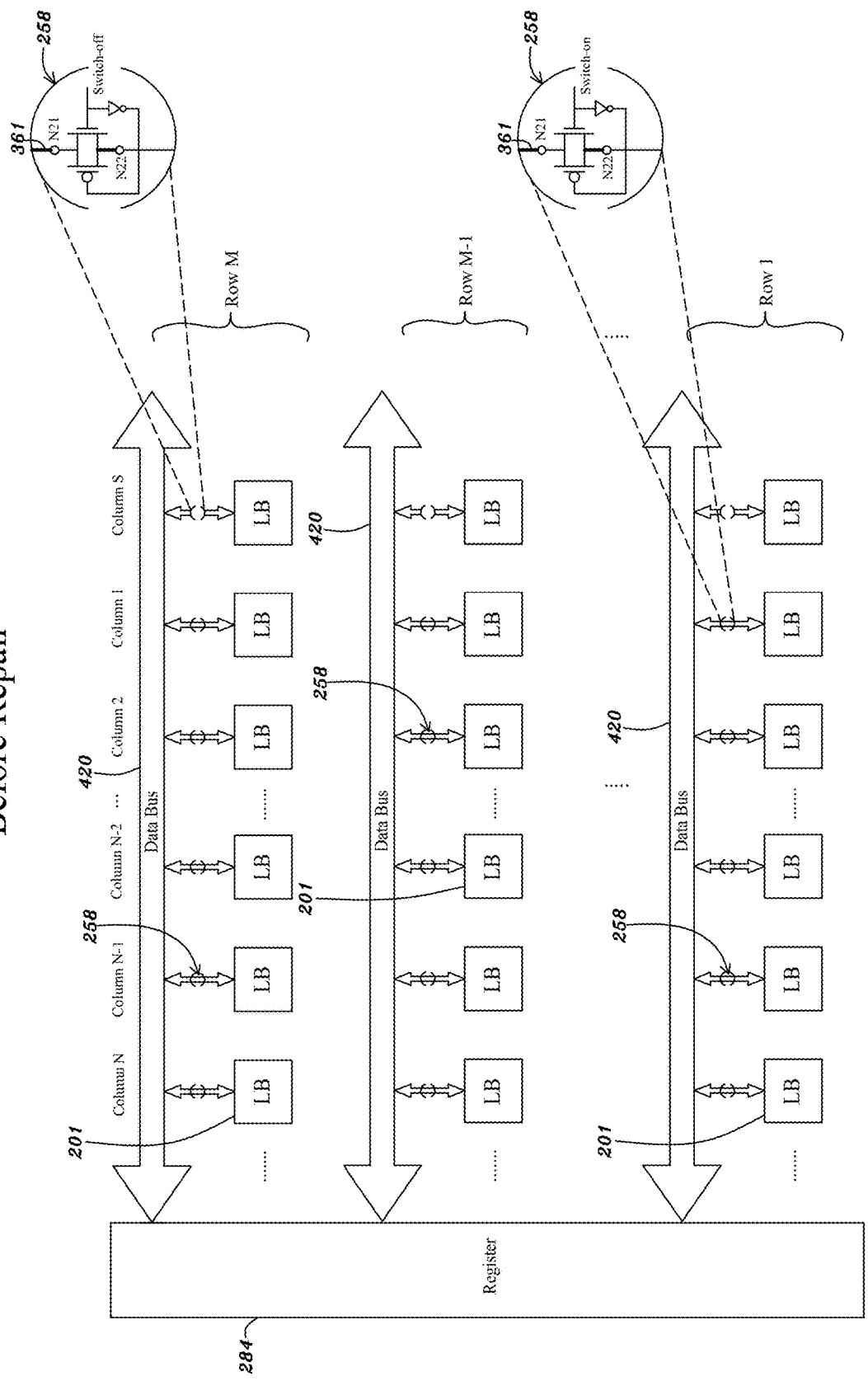
FIGS. 11A and 11B are schematic views showing a method for repairing a standard commodity FPGA IC chip in accordance with another embodiment of the present application.
Figure 11B:
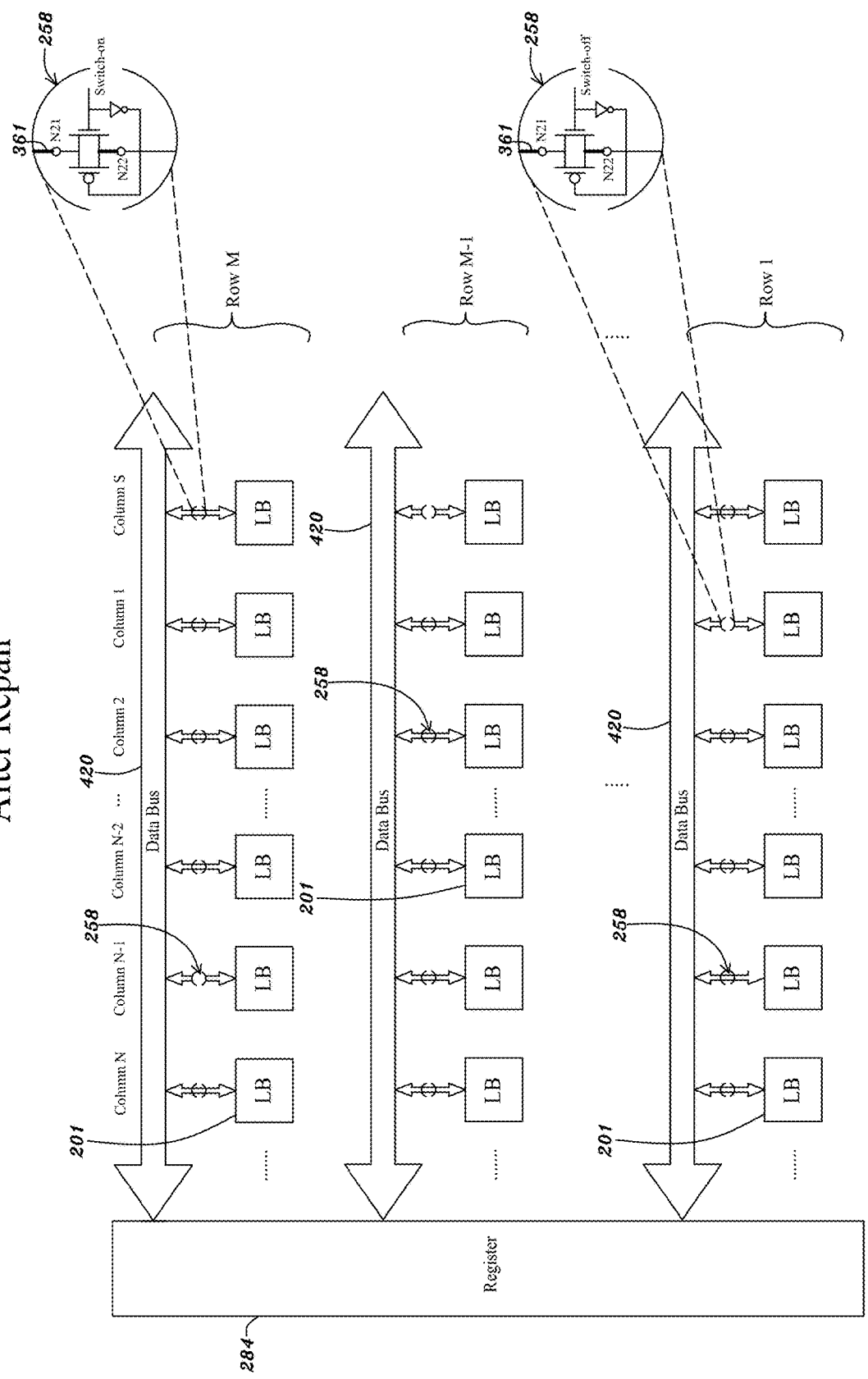

Alternatively, bi-directional programmable interconnects 361 for a data bus 420 as seen in FIGS. 11A and 11B may be provided to replace the unidirectional programmable interconnects 361 for the input and output buses 370 and 380 as seen in FIGS. 10A and 10B. FIGS. 11A and 11B are schematic views showing a method for repairing a standard commodity FPGA IC chip in accordance with another embodiment of the present application. Referring to FIGS. 11A and 11B, the standard commodity FPGA IC chip 200 may include (1) a programmable logic array, bank or section including multiple programmable logic blocks (LB) 201 arranged in an array with (N+1) columns and M rows, (2) multiple programmable interconnects 361 for a data bus 420 in each of multiple sets arranged in M rows, configured to be programmed by one or more of its memory cells 362 to form at least one path to pass data to or from the programmable logic blocks (LB) 201 arranged in one of the M rows, (3) a register 284 configured to register or save data therein to be passed to each of the programmable logic blocks (LB) 201 through the programmable interconnects 361 for the data bus 420 in one of the multiple sets and to register or save data therein passed from each of the programmable logic blocks (LB) 201 through the programmable interconnects 361 for the data bus 420 in one of the multiple sets, and (4) multiple pass/no-pass switches 258, as illustrated in FIG. 2A or 2C, for multiple data inputs and outputs of each of the programmable logic blocks (LB) 201, each having the node N21 coupling to one of the programmable interconnects 361 for the data bus 420 in one of the multiple sets and the node N22 coupling to one of the input and output points of one of the programmable logic cells 2014, as illustrated in FIGS. 6 and 7A-7J, of one of its programmable logic blocks (LB) 201. In a first clock, each of the pass/no-pass switches 258 for the data inputs of said each of the programmable logic blocks (LB) 201 maybe switched on to pass data from one of the programmable interconnects 361 for the data bus 420 to said each of the programmable logic blocks (LB) 201; in a second clock, said each of the pass/no-pass switches 258 for the data output(s) of said each of the programmable logic blocks (LB) 201 maybe switched on to pass data from said each of the programmable logic blocks (LB) 201 to said one of the programmable interconnects 361 for the data bus 420.

Referring to FIGS. 11A and 11B, in each of the rows 1-M, the programmable logic blocks (LB) 201 may have one for spare in the rightmost column configured to be backed up for another thereof in another column In this case, the programmable logic blocks (LB) 201 in the row M and the column (N−1) and in the row 1 and the column 1 may have one, some or all of their programmable logic cells (LC) 2014, as illustrated in FIGS. 6 and 7A-7J, detected or determined to be in a broken state.

Referring to FIG. 11A, before the programmable logic blocks (LB) 201 are repaired, each of the pass/no-pass switches 258 for the data inputs and outputs of the programmable logic blocks (LB) 201 arranged in the columns 1-N may be programmed to be switched on to pass data between its node N21 and its node N22, and each of the pass/no-pass switches 258 for the data inputs and outputs of the programmable logic blocks (LB) 201 arranged in the column S may be programmed to be switched off not to pass data between its node N21 and its node N22.

Referring to FIG. 11B, after the programmable logic blocks (LB) 201 are repaired, each of the pass/no-pass switches 258 for the data inputs and outputs of a broken one of the programmable logic blocks (LB) 201 in one of the rows 1-M, which is detected or determined to be in a broken state in a case, may be programmed to be switched off not to pass data between the programmable interconnects 361 for the data bus 420 in said one of the rows 1-M and the broken one of the programmable logic blocks (LB) 201, and each of the pass/no-pass switches 258 for the data inputs and outputs of a spare one of the programmable logic blocks (LB) 201 in the column S and said one of the rows 1-M may be programmed to be switched on to pass data between each of the programmable interconnects 361 for the data bus 420 in said one of the rows 1-M and the spare one of the programmable logic blocks (LB) 201. For example, in the row M, the programmable logic block (LB) 201 in the column N−1 is detected or determined to be in a broken state and thus each of the pass/no-pass switches 258 for the data inputs and outputs of the programmable logic block (LB) 201 in the column (N−1) may be programmed to be switched off not to pass data between the programmable interconnects 361 for the data buses 420 in the row M and the programmable logic block (LB) 201 in the column (N−1), and each of the pass/no-pass switches 258 for the data inputs and outputs of the programmable logic block (LB) 201 in the column S may be programmed to be switched on to pass data between each of the programmable interconnects 361 for the data bus 420 in the row M and the programmable logic block (LB) 201 in the column S. In the row (M−1), each of the programmable logic blocks (LB) 201 is not detected or determined to be in a broken state, and thus the pass/no-pass switches 258 in the row (M−1) are kept in the state before the programmable logic blocks (LB) 201 are repaired. In the row 1, the programmable logic blocks (LB) 201 in the column 1 is detected or determined to be in a broken state and thus each of the pass/no-pass switches 258 for the data inputs and outputs of the programmable logic blocks (LB) 201 in the column 1 may be programmed to be switched off not to pass data between the programmable interconnects 361 for the data bus 420 in the row 1 and the programmable logic blocks (LB) 201 in the column 1, and each of the pass/no-pass switches 258 for the data inputs and outputs of the programmable logic blocks (LB) 201 in the column S may be programmed to be switched on to pass data between each of the programmable interconnects 361 for the data bus 420 in the row 1 and the programmable logic blocks (LB) 201 in the column S.

In operation, referring to FIG. 11B, in a clock cycle, the programmable logic blocks (LB) 201 in each of the rows 1-M may process in parallel their data inputs from the data bus 420 in said each of the rows 1-M as their data outputs to be passed in a following clock cycle to the register 284 through the data bus 420 in said each of the rows 1-M and to be stored or registered in the register 284. Next, in another following clock cycle, the register 284 may send the data outputs from the programmable logic blocks (LB) 201 in said each of the rows 1-M to the programmable logic blocks (LB) 201 in said each of the rows 1-M through the data bus 420 in said each of the rows 1-M to be processed in parallel by the programmable logic blocks (LB) 201 in said each of the rows 1-M again or to the programmable logic blocks (LB) 201 in another of the rows 1-M through the data bus 420 in said another of the rows 1-M to be processed in parallel by the programmable logic blocks (LB) 201 in said another of the rows 1-M. In other words, the architecture of programmable logic blocks (LB) 201 provides in-parallel processing in a clock cycle and sequentially in-series processing in different clock cycles.

Referring to FIG. 11B, when the standard commodity FPGA IC chip 200 is in operation, in a first clock cycle, one or more of the programmable interconnects 361 for the data bus 420 in each of the rows 1-M may be programmed by one or more of the memory cells 362 as seen in FIGS. 3A, 3B and 8 to form a path to pass data associated with the second data input S_Data_out of one of the small drivers 374 as illustrated in FIG. 5B from one of the output point(s) of one of the programmable logic blocks (LB) in said each of the rows 1-M to the second input point of said one of the small drivers 374; in a second clock cycle, one or more of the programmable interconnects 361 for the data bus 420 in said each of the rows 1-M may be programmed by one or more of the memory cells 362 as seen in FIGS. 3A, 3B and 8 to form another path to pass data associated with the data output S_Data_in of one of the small receivers 375 as illustrated in FIG. 5B from the output point of said one of the small receivers 375 to one of the input points of each of the programmable logic blocks (LB) in said each of the rows 1-M. In this case, the output point of the said one of the small receivers 375 may couple to the second input point of said one of the small drivers 374.

Figure 12A:
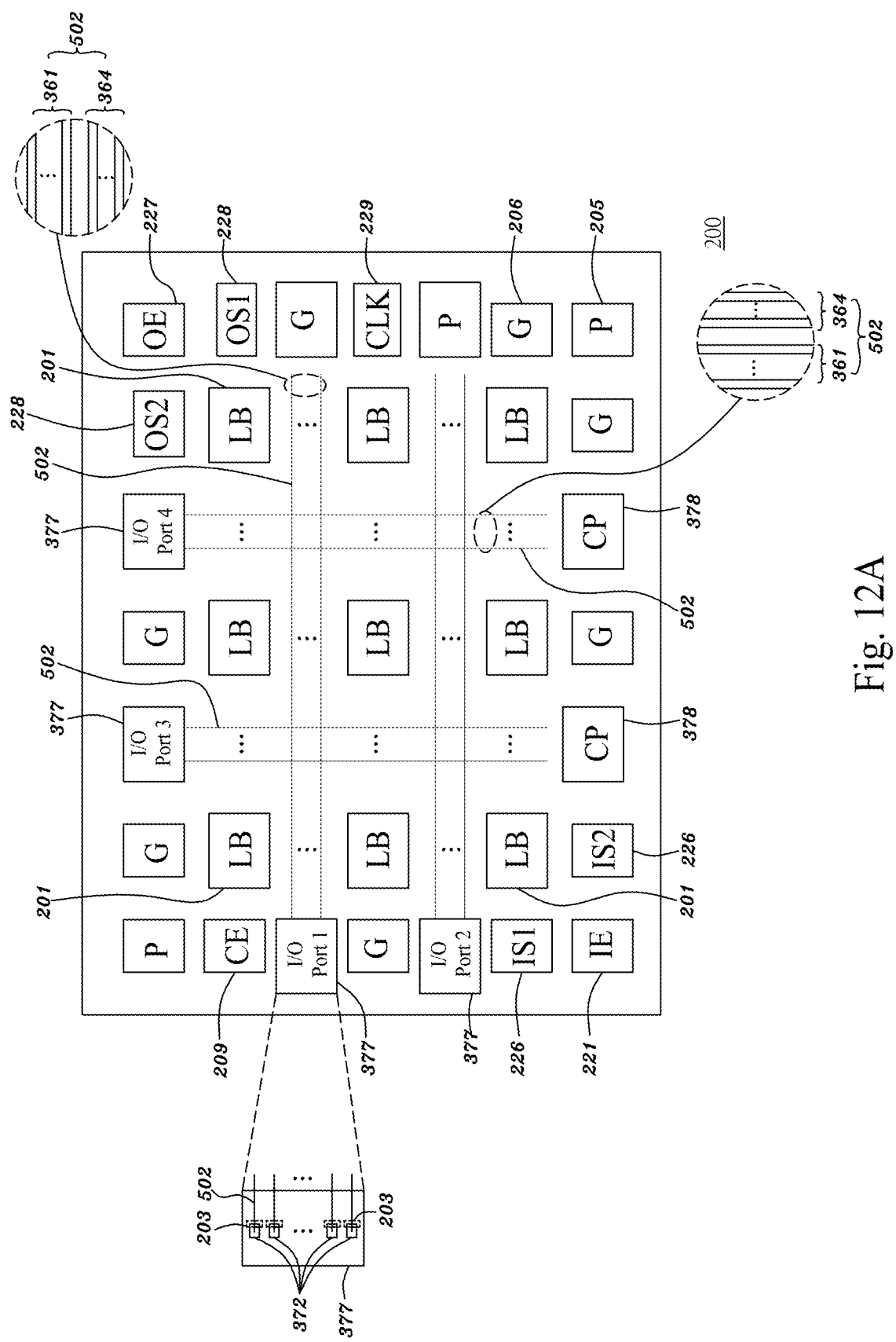
FIG. 12A is a schematically top view showing a block diagram of a standard commodity FPGA IC chip in accordance with an embodiment of the present application.

Specification for Standard Commodity Field-Programmable-Gate-Array (FPGA) Integrated-Circuit (IC) Chip FIG. 12A is a schematically top view showing a block diagram of a standard commodity FPGA IC chip in accordance with an embodiment of the present application. Referring to FIG. 12A, the standard commodity FPGA IC chip 200 may include (1) a plurality of programmable logic blocks (LB) 201 as illustrated in FIGS. 6 and 7A-7J arranged in an array in a central region thereof, (2) a plurality of cross-point switches 379 as illustrated in FIGS. 3A, 3B and 8 arranged around each of the programmable logic blocks (LB) 201, (3) a plurality of memory cells 362 as illustrated in FIGS. 3A, 3B and 8 configured to be programmed to control its cross-point switches 379, (4) a plurality of intra-chip interconnects 502 each extending over spaces between neighboring two of the programmable logic blocks 201, wherein the intra-chip interconnects 502 may include the programmable interconnects 361 as seen in FIGS. 3A, 3B and 8 configured to be programmed for interconnection by its memory cells 362 and the fixed interconnects 364 as illustrated in FIGS. 6 and 8 configured not to be programmable for interconnection, and (5) a plurality of small input/output (I/O) circuits 203 as illustrated in FIG. 5B each providing the small driver 374 with the second data input S_Data_out at the second input point of the small driver 374 coupling to one or more of the programmable or fixed interconnects 361 or 364 of the intra-chip interconnects 502 and providing the small receiver 375 with the data output S_Data_in at the output point of the small receiver 375 coupling to another one or more of the programmable or fixed interconnects 361 or 364 of the intra-chip interconnects 502. For said each of the small input/output (I/O) circuits 203, its small driver 374 may have the first data input S_Enable at the first input point of its small driver 374 coupling to another one or more of the programmable or fixed interconnects 361 or 364 of the intra-chip interconnects 502, and its small receiver 375 may have the first data input S_Inhibit at the first input point of its small receiver 375 coupling to another one or more of the programmable or fixed interconnects 361 or 364 of the intra-chip interconnects 502.

Referring to FIG. 12A, the programmable interconnects 361 of the intra-chip interconnects 502 may couple to the programmable interconnects 361 of the intra-block interconnects 2015 of each of the programmable logic blocks (LB) 201 as seen in FIG. 7H. The fixed interconnects 364 of the intra-chip interconnects 502 may couple to the fixed interconnects 364 of the intra-block interconnects 2015 of each of the programmable logic blocks (LB) 201 as seen in FIG. 7H.

Referring to FIG. 12A, each of the programmable logic blocks (LB) 201 may include one or more programmable logic cells (LC) 2014 as illustrated in FIGS. 6 and 7A-7J. Each of the one or more programmable logic cells (LC) 2014 may have the input data set at its input points each coupling to one of the programmable and fixed interconnects 361 and 364 of the intra-chip interconnects 502 and may be configured to perform logic operation or computation operation on its first input data set as its data output coupling to another of the programmable and fixed interconnects 361 and 364 of the intra-chip interconnects 502, wherein the computation operation may include an addition, subtraction, multiplication or division operation, and the logic operation may include a Boolean operation such as AND, NAND, OR or NOR operation.

Referring to FIG. 12A, the standard commodity FPGA IC chip 200 may include multiple I/O pads 372 as seen in FIG. 5B each vertically over one of its small input/output (I/O) circuits 203. In a first clock cycle, for one of the small input/output (I/O) circuits 203 of the standard commodity FPGA IC chip 200, its small driver 374 may be enabled by the first data input S_Enable of its small driver 374 and its small receiver 375 may be inhibited by the first data input S_Inhibit of its small receiver 375. Thereby, its small driver 374 may amplify the second data input S_Data_out of its small driver 374, associated with the data output of one of the programmable logic cells 2014 of the standard commodity FPGA IC chip 200 as illustrated in FIGS. 6 and 7A-7J for example through first one or more of the programmable interconnects 361 of the standard commodity FPGA IC chip 200 and/or one or more of the cross-point switches 379 of the standard commodity FPGA IC chip 200 each coupled between two of said first one or more of the programmable interconnects 361, as the data output of its small driver 374 to be transmitted to one of the I/O pads 372 vertically over said one of the small input/output (I/O) circuits 203 for external connection to circuits outside the standard commodity FPGA IC chip 200.

In a second clock, for said one of the small input/output (I/O) circuits 203 of the standard commodity FPGA IC chip 200, its small driver 374 may be disabled by the first data input S_Enable of its small driver 374 and its small receiver 375 may be activated by the first data input S_Inhibit of its small receiver 375. Thereby, its small receiver 375 may amplify the second data input of its small receiver 375 transmitted from circuits outside the standard commodity FPGA IC chip 200 through said one of the I/O pads 372 as the data output S_Data_in of its small receiver 375 associated with a data input of the input data set of one of the programmable logic cells 2014 of the standard commodity FPGA IC chip 200 as illustrated in FIGS. 6 and 7A-7J for example through second one or more of the programmable interconnects 361 of the standard commodity FPGA IC chip 200 and/or one or more of the cross-point switches 379 of the standard commodity FPGA IC chip 200 each coupled between two of said second one or more of the programmable interconnects 361.

Referring to FIG. 12A, the standard commodity FPGA IC chip 200 may include multiple I/O ports 377 having the number ranging from 2 to 64 for example, such as I/O Port 1, I/O Port 2, I/O Port 3 and I/O Port 4 for this case. Each of the I/O ports 377 may include (1) the small I/O circuits 203 as seen in FIG. 5B having the number ranging from 4 to 256, such as 64 for this case, arranged in parallel for data transmission with bit width ranging from 4 to 256, such as 64 for this case, and (2) the I/O pads 372 as seen in FIG. 5B having the number ranging from 4 to 256, such as 64 for this case, arranged in parallel and vertically over the small I/O circuits 203 respectively. For more elaboration, each of the I/O ports 377 may include the small drivers 374 having the number greater than 4 arranged in parallel, the small receivers 375 having the number greater than 4 arranged in parallel and the I/O pads 372 having the number greater than 4 arranged in parallel.

Referring to FIG. 12A, the standard commodity FPGA IC chip 200 may further include a chip-enable (CE) pad 209 configured for enabling or disabling the standard commodity FPGA IC chip 200. For example, when the chip-enable (CE) pad 209 is at a logic level of "0", the standard commodity FPGA IC chip 200 may be enabled to process data and/or operate with circuits outside of the standard commodity FPGA IC chip 200; when the chip-enable (CE) pad 209 is at a logic level of "1", the standard commodity FPGA IC chip 200 may be disabled not to process data and/or operate with circuits outside of the standard commodity FPGA IC chip 200.

Referring to FIG. 12A, the standard commodity FPGA IC chip 200 may include (1) at least one input selection (IS) pad 226, e.g., IS1 and IS2 pads, configured to select one from its I/O ports 377, e.g., I/O Port 1, I/O Port 2, I/O Port 3 and I/O Port 4, to pass data for its input operation and (2) an input-enable (IE) pad 221 configured to receive a data input associated with the first data input S_Inhibit of the small receiver 375 of each of the small input/output (I/O) circuits 203 as seen in FIG. 5B of the I/O port 377 selected in accordance with the at least one input selection (IS) pad 226 from circuits outside of the standard commodity FPGA IC chip 200 to activate or inhibit the small receiver 375 of said each of the small input/output (I/O) circuits 203. For each of the small I/O circuits 203 of the I/O port 377, selected in accordance with the at least one input selection (IS) pad 226, of the standard commodity FPGA IC chip 200, its small receiver 375 may be activated by the first data input S_Inhibit of its small receiver 375 transmitted from circuits outside of the standard commodity FPGA IC chip 200 through the input-enable (IE) pad 221 of the standard commodity FPGA IC chip 200 to amplify or pass the second data input of its small receiver 375, transmitted from circuits outside the standard commodity FPGA IC chip 200 through one of the I/O pads 372 of the I/O port 377 selected in accordance with the at least one input selection (IS) pad 226, as the data output S_Data_in of its small receiver 375 to be associated with a data input of the input data set of one of the programmable logic cells 2014 as seen in FIGS. 6 and 7A-7J of the standard commodity FPGA IC chip 200 through one or more of the programmable interconnects 361 as seen in FIGS. 3A, 3B and 8 of the standard commodity FPGA IC chip 200, for example. For each of the small I/O circuits 203 of each of the I/O ports 377, not selected in accordance with the at least one input selection (IS) pad 226, of the standard commodity FPGA IC chip 200, its small receiver 375 may be inhibited by the first data input S_Inhibit of its small receiver 375.

For example, referring to FIG. 12A, provided that the standard commodity FPGA IC chip 200 may have (1) the chip-enable (CE) pad 209 at a logic level of "0", (2) the input-enable (IE) pad 221 at a logic level of "1", (3) the IS1 pad 226 at a logic level of "0" and (4) the IS2 pad 226 at a logic level of "0", the standard commodity FPGA IC chip 200 may be enabled in accordance with the logic level at its chip-enable (CE) pad 209 and may select, in accordance with the logic levels at its IS1 and IS2 pads 226, an I/O port, i.e., I/O Port 1, from its I/O ports 377, i.e., I/O Port 1, I/O Port 2, I/O Port 3 and I/O Port 4, to pass data for the input operation. For each of the small I/O circuits 203 of the selected I/O port 377, i.e., I/O Port 1, of the standard commodity FPGA IC chip 200, its small receiver 375 may be activated by the first data input S_Inhibit of its small receiver 375 associated with the logic level at the input-enable (IE) pad 221 of the standard commodity FPGA IC chip 200. For each of the small I/O circuits 203 of the unselected I/O ports, i.e., I/O Port 2, I/O Port 3 and I/O Port 4, of the standard commodity FPGA IC chip 200, its small receiver 375 may be inhibited by the first data input S_Inhibit of its small receiver 375.

For example, referring to FIG. 12A, provided that the standard commodity FPGA IC chip 200 may have (1) the chip-enable (CE) pad 209 at a logic level of "0", (2) the input-enable (IE) pad 221 at a logic level of "1", (3) the IS1 pad 226 at a logic level of "1" and (4) the IS2 pad 226 at a logic level of "0", the standard commodity FPGA IC chip 200 may be enabled in accordance with the logic level at its chip-enable (CE) pad 209 and may select, in accordance with the logic levels at its IS1 and IS2 pads 226, an I/O port, i.e., I/O Port 2, from its I/O ports 377, i.e., I/O Port 1, I/O Port 2, I/O Port 3 and I/O Port 4, to pass data for the input operation. For each of the small I/O circuits 203 of the selected I/O port 377, i.e., I/O Port 2, of the standard commodity FPGA IC chip 200, its small receiver 375 may be activated by the first data input S_Inhibit of its small receiver 375 associated with the logic level at the input-enable (IE) pad 221 of the standard commodity FPGA IC chip 200. For each of the small I/O circuits 203 of the unselected I/O ports, i.e., I/O Port 1, I/O Port 3 and I/O Port 4, of the standard commodity FPGA IC chip 200, its small receiver 375 may be inhibited by the first data input S_Inhibit of its small receiver 375.

For example, referring to FIG. 12A, provided that the standard commodity FPGA IC chip 200 may have (1) the chip-enable (CE) pad 209 at a logic level of "0", (2) the input-enable (IE) pad 221 at a logic level of "1", (3) the IS1 pad 226 at a logic level of "0" and (4) the IS2 pad 226 at a logic level of "1", the standard commodity FPGA IC chip 200 may be enabled in accordance with the logic level at its chip-enable (CE) pad 209 and may select, in accordance with the logic levels at its IS1 and IS2 pads 226, an I/O port, i.e., I/O Port 3, from its I/O ports 377, i.e., I/O Port 1, I/O Port 2, I/O Port 3 and I/O Port 4, to pass data for the input operation. For each of the small I/O circuits 203 of the selected I/O port 377, i.e., I/O Port 3, of the standard commodity FPGA IC chip 200, its small receiver 375 may be activated by the first data input S_Inhibit of its small receiver 375 associated with the logic level at the input-enable (IE) pad 221 of the standard commodity FPGA IC chip 200. For each of the small I/O circuits 203 of the unselected I/O ports, i.e., I/O Port 1, I/O Port 2 and I/O Port 4, of the standard commodity FPGA IC chip 200, its small receiver 375 may be inhibited by the first data input S_Inhibit of its small receiver 375.

For example, referring to FIG. 12A, provided that the standard commodity FPGA IC chip 200 may have (1) the chip-enable (CE) pad 209 at a logic level of "0", (2) the input-enable (IE) pad 221 at a logic level of "0", (3) the IS1 pad 226 at a logic level of "1" and (4) the IS2 pad 226 at a logic level of "1", the standard commodity FPGA IC chip 200 may be enabled in accordance with the logic level at its chip-enable (CE) pad 209 and may select, in accordance with the logic levels at its IS1 and IS2 pads 226, an I/O port, i.e., I/O Port 4, from its I/O ports 377, i.e., I/O Port 1, I/O Port 2, I/O Port 3 and I/O Port 4, to pass data for the input operation. For each of the small I/O circuits 203 of the selected I/O port 377, i.e., I/O Port 4, of the standard commodity FPGA IC chip 200, its small receiver 375 may be activated by the first data input S_Inhibit of its small receiver 375 associated with the logic level at the input-enable (IE) pad 221 of the standard commodity FPGA IC chip 200. For each of the small I/O circuits 203 of the unselected I/O ports, i.e., I/O Port 1, I/O Port 2 and I/O Port 3, of the standard commodity FPGA IC chip 200, its small receiver 375 may be inhibited by the first data input S_Inhibit of its small receiver 375.

Referring to FIG. 12A, the standard commodity FPGA IC chip 200 may include (1) at least one output selection (OS) pad 228, e.g., OS1 and OS2 pads, configured to select one from its I/O ports 377, e.g., I/O Port 1, I/O Port 2, I/O Port 3 and I/O Port 4, to pass data for its output operation and (2) an output-enable (OE) pad 227 configured to receive a data input associated with the first data input S_Enable of the small driver 374 of each of the small input/output (I/O) circuits 203 as seen in FIG. 5B of the I/O port 377 selected in accordance with the at least one output selection (OS) pad 228 from circuits outside of the standard commodity FPGA IC chip 200 to enable or disable the small driver 374 of said each of the small input/output (I/O) circuits 203. For each of the small I/O circuits 203 of the I/O port 377, selected in accordance with the at least one output selection (OS) pad 228, of the standard commodity FPGA IC chip 200, its small driver 374 may be enabled by the first data input S_Enable of its small driver 374 transmitted from circuits outside of the standard commodity FPGA IC chip 200 through the output-enable (OE) pad 227 of the standard commodity FPGA IC chip 200 to amplify or pass the second data input S_Data_out of its small driver 374, associated with the data output of one of the programmable logic cells 2014 as seen in FIGS. 6 and 7A-7J of the standard commodity FPGA IC chip 200 through one or more of the programmable interconnects 361 as seen in FIGS. 3A, 3B and 8 of the standard commodity FPGA IC chip 200 for example, as the data output of its small driver 374 to be transmitted to circuits outside the standard commodity FPGA IC chip 200 through one of the I/O pads 372 of the I/O port 377 selected in accordance with the at least one output selection (OS) pad 228. For each of the small I/O circuits 203 of each of the I/O ports 377, not selected in accordance with the at least one output selection (OS) pads 228, of the standard commodity FPGA IC chip 200, its small driver 374 may be disabled by the first data input S_Enable of its small driver 374.

For example, referring to FIG. 12A, provided that the standard commodity FPGA IC chip 200 may have (1) the chip-enable (CE) pad 209 at a logic level of "0", (2) the output-enable (OE) pad 227 at a logic level of "0", (3) the OS1 pad 228 at a logic level of "0" and (4) the OS2 pad 228 at a logic level of "0", the standard commodity FPGA IC chip 200 may be enabled in accordance with the logic level at its chip-enable (CE) pad 209 and may select, in accordance with the logic levels at its OS1 and OS2 pads 228, an I/O port, i.e., I/O Port 1, from its I/O ports 377, i.e., I/O Port 1, I/O Port 2, I/O Port 3 and I/O Port 4, to pass data for the output operation. For each of the small I/O circuits 203 of the selected I/O port 377, i.e., I/O Port 1, of the standard commodity FPGA IC chip 200, its small driver 374 may be enabled by the first data input S_Enable of its small driver 374 associated with the logic level at the output-enable (OE) pad 227 of the standard commodity FPGA IC chip 200. For each of the small I/O circuits 203 of each of the unselected I/O ports, i.e., I/O Port 2, I/O Port 3 and I/O Port 4, of the standard commodity FPGA IC chip 200, its small driver 374 may be disabled by the first data input S_Enable of its small driver 374.

For example, referring to FIG. 12A, provided that the standard commodity FPGA IC chip 200 may have (1) the chip-enable (CE) pad 209 at a logic level of "0", (2) the output-enable (OE) pad 227 at a logic level of "0", (3) the OS1 pad 228 at a logic level of "1" and (4) the OS2 pad 228 at a logic level of "0", the standard commodity FPGA IC chip 200 may be enabled in accordance with the logic level at its chip-enable (CE) pad 209 and may select, in accordance with the logic levels at its OS1 and OS2 pads 228, an I/O port, i.e., I/O Port 2, from its I/O ports 377, i.e., I/O Port 1, I/O Port 2, I/O Port 3 and I/O Port 4, to pass data for the output operation. For each of the small I/O circuits 203 of the selected I/O port 377, i.e., I/O Port 2, of the standard commodity FPGA IC chip 200, its small driver 374 may be enabled by the first data input S_Enable of its small driver 374 associated with the logic level at the output-enable (OE) pad 227 of the standard commodity FPGA IC chip 200. For each of the small I/O circuits 203 of each of the unselected I/O ports, i.e., I/O Port 1, I/O Port 3 and I/O Port 4, of the standard commodity FPGA IC chip 200, its small driver 374 may be disabled by the first data input S_Enable of its small driver 374.

For example, referring to FIG. 12A, provided that the standard commodity FPGA IC chip 200 may have (1) the chip-enable (CE) pad 209 at a logic level of "0", (2) the output-enable (OE) pad 227 at a logic level of "0", (3) the OS1 pad 228 at a logic level of "0" and (4) the OS2 pad 228 at a logic level of "1", the standard commodity FPGA IC chip 200 may be enabled in accordance with the logic level at its chip-enable (CE) pad 209 and may select, in accordance with the logic levels at its OS1 and OS2 pads 228, an I/O port, i.e., I/O Port 3, from its I/O ports 377, i.e., I/O Port 1, I/O Port 2, I/O Port 3 and I/O Port 4, to pass data for the output operation. For each of the small I/O circuits 203 of the selected I/O port 377, i.e., I/O Port 3, of the standard commodity FPGA IC chip 200, its small driver 374 may be enabled by the first data input S_Enable of its small driver 374 associated with the logic level at the output-enable (OE) pad 227 of the standard commodity FPGA IC chip 200. For each of the small I/O circuits 203 of each of the unselected I/O ports, i.e., I/O Port 1, I/O Port 2 and I/O Port 4, of the standard commodity FPGA IC chip 200, its small driver 374 may be disabled by the first data input S_Enable of its small driver 374.

For example, referring to FIG. 12A, provided that the standard commodity FPGA IC chip 200 may have (1) the chip-enable (CE) pad 209 at a logic level of "0", (2) the output-enable (OE) pad 227 at a logic level of "1", (3) the OS1 pad 228 at a logic level of "1" and (4) the OS2 pad 228 at a logic level of "1", the standard commodity FPGA IC chip 200 may be enabled in accordance with the logic level at its chip-enable (CE) pad 209 and may select, in accordance with the logic levels at its OS1 and OS2 pads 228, an I/O port, i.e., I/O Port 4, from its I/O ports 377, i.e., I/O Port 1, I/O Port 2, I/O Port 3 and I/O Port 4, to pass data for the output operation. For each of the small I/O circuits 203 of the selected I/O port 377, i.e., I/O Port 4, of the standard commodity FPGA IC chip 200, its small driver 374 may be enabled by the first data input S_Enable of its small driver 374 associated with the logic level at the output-enable (OE) pad 227 of the standard commodity FPGA IC chip 200. For each of the small I/O circuits 203 of each of the unselected I/O ports, i.e., I/O Port 1, I/O Port 2 and I/O Port 3, of the standard commodity FPGA IC chip 200, its small driver 374 may be disabled by the first data input S_Enable of its small driver 374.

Thereby, referring to FIG. 12A, in a clock cycle, one of the I/O ports 377, e.g., I/O Port 1, I/O Port 2, I/O Port 3 and I/O Port 4, may be selected, in accordance with the logic levels at the IS1 and IS2 pads 226, to pass data for the input operation, while another of the I/O ports 377, e.g., I/O Port 1, I/O Port 2, I/O Port 3 and I/O Port 4, may be selected, in accordance with the logic levels at the OS1 and OS2 pads 228, to pass data for the output operation. The input selection (IS) pads 226 and output selection (OS) pads 228 may be provided as I/O-port selection pads.

Referring to FIG. 12A, the standard commodity FPGA IC chip 200 may further include (1) multiple power pads 205 configured for applying the voltage Vcc of power supply to its memory cells 490 for the look-up tables (LUT) 210 of its programmable logic cells (LC) 2014 as illustrated in FIGS. 6 and 7A-7J, the multiplexers (MUXERs) 211 of its programmable logic cells (LC) 2014, its memory cells 362 for its cross-point switches 379 as illustrated in FIGS. 3A, 3B and 8, its cross-point switches 379 and/or the small drivers 374 and receivers 375 of its small I/O circuits 203 as seen in FIG. 5B through one or more of its fixed interconnects 364, wherein the voltage Vcc of power supply may be between 0.2V and 2.5V, between 0.2V and 2V, between 0.2V and 1.5V, between 0.1V and 1V, or between 0.2V and 1V, or, smaller or lower than or equal to 2.5V, 2V, 1.8V, 1.5V or 1V, and (2) multiple ground pads 206 configured for providing the voltage Vss of ground reference to its memory cells 490 for the look-up tables (LUT) 210 of its programmable logic cells (LC) 2014 as illustrated in FIGS. 6 and 7A-7J, the multiplexers (MUXERs) 211 of its programmable logic cells (LC) 2014, its memory cells 362 for its cross-point switches 379 as illustrated in FIGS. 3A, 3B and 8, its cross-point switches 379 and/or the small drivers 374 and receivers 375 of its small I/O circuits 203 as seen in FIG. 5B through one or more of its fixed interconnects 364.

Referring to FIG. 12A, the standard commodity FPGA IC chip 200 may further include a clock pad (CLK) 229 configured to receive a clock signal from circuits outside of the standard commodity FPGA IC chip 200 and multiple control pads (CP) 378 configured to receive control commands to control the standard commodity FPGA IC chip 200.

Referring to FIG. 12A, for the standard commodity FPGA IC chip 200, its programmable logic cells (LC) 2014 as seen in FIGS. 6 and 7A-7J may be reconfigurable for artificial-intelligence (AI) application. For example, in a first clock, one of the programmable logic cells (LC) 2014 of the standard commodity FPGA IC chip 200 may have its memory cells 490 to be programmed to perform OR operation; however, after one or more events happen, in a second clock said one of its programmable logic cells (LC) 2014 of the standard commodity FPGA IC chip 200 may have its memory cells 490 to be programmed to perform NAND operation for better AI performance.

Figure 12B:
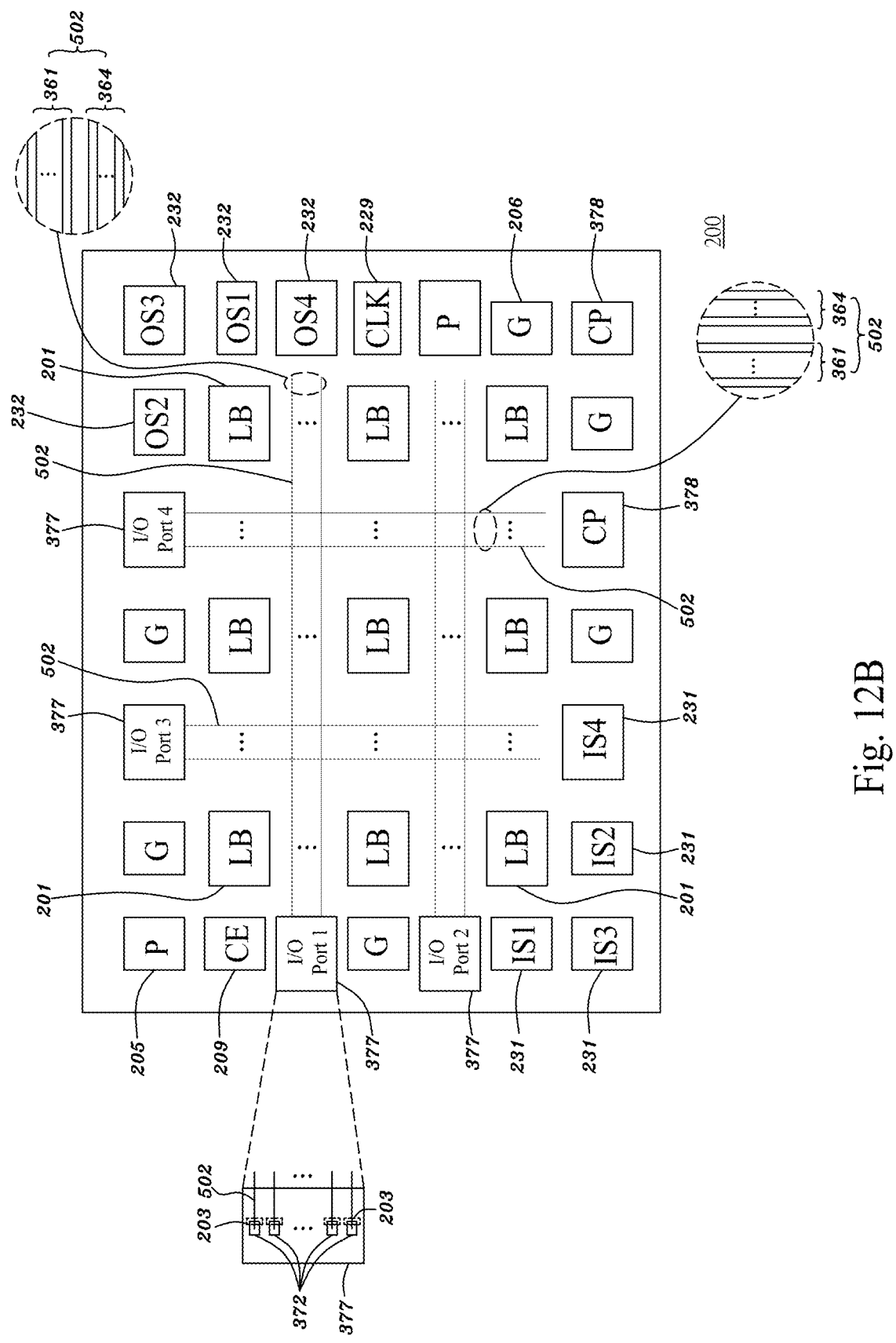
FIG. 12B is a schematically top view showing a block diagram of a standard commodity FPGA IC chip in accordance with another embodiment of the present application.

Alternatively, FIG. 12B is a schematically top view showing a block diagram of a standard commodity FPGA IC chip in accordance with another embodiment of the present application. The standard commodity FPGA IC chip 200 shown in FIG. 12B may have the same architecture as that as illustrated in FIG. 12A except the following description. For an element indicated by the same reference number shown in FIGS. 12A and 12B, the specification of the element as seen in FIG. 12B may be referred to that of the element as illustrated in FIG. 12A. Referring to FIG. 12B, the standard commodity FPGA IC chip 200 may include multiple input selection (IS) pads 231, e.g., IS1, IS2, IS3 and IS4 pads, each configured to receive a data input associated respectively with the first data input S_Inhibit of the small receiver 375 of each of the small I/O circuits 203 of one of its I/O ports 377, e.g., I/O Port 1, I/O Port 2, I/O Port 3 and I/O Port 4. For more elaboration, the IS1 pad 231 may receive a data input associated with the first data input S_Inhibit of the small receiver 375 of each of the small I/O circuits 203 of I/O Port 1; the IS2 pad 231 may receive a data input associated with the first data input S_Inhibit of the small receiver 375 of each of the small I/O circuits 203 of I/O Port 2; the IS3 pad 231 may receive a data input associated with the first data input S_Inhibit of the small receiver 375 of each of the small I/O circuits 203 of I/O Port 3; and the IS4 pad 231 may receive a data input associated with the first data input S_Inhibit of the small receiver 375 of each of the small I/O circuits 203 of I/O Port 4. The standard commodity FPGA IC chip 200 may select, in accordance with logic levels at the input selection (IS) pads 231, e.g., IS1, IS2, IS3 and IS4 pads, one or more from its I/O ports 377, e.g., I/O Port 1, I/O Port 2, I/O Port 3 and I/O Port 4 to pass data for its input operation. For each of the small I/O circuits 203 of each of the one or more I/O ports 377 selected in accordance with the logic levels at the input selection (IS) pads 231, its small receiver 375 may be activated by the first data input S_Inhibit of its small receiver 375 transmitted from circuits outside of the standard commodity FPGA IC chip 200 through one of the input selection (IS) pads 231 to amplify or pass the second data input of its small receiver 375, transmitted from circuits outside the standard commodity FPGA IC chip 200 through one of the I/O pads 372 of said each of the one or more I/O ports 377 selected in accordance with the logic levels at the input selection (IS) pads 231, as the data output S_Data_in of its small receiver 375 to be associated with a data input of the input data set of one of the programmable logic cells 2014 as seen in FIGS. 6 and 7A-7J of the standard commodity FPGA IC chip 200 through one or more of the programmable interconnects 361 as seen in FIGS. 3A, 3B and 8 of the standard commodity FPGA IC chip 200, for example. For each of the small I/O circuits 203 of each of the I/O ports 377, not selected in accordance with in accordance with the logic levels at the input selection (IS) pads 231, of the standard commodity FPGA IC chip 200, its small receiver 375 may be inhibited by the first data input S_Inhibit of its small receiver 375 associated with the logic level at one of the input selection (IS) pads 231.

For example, referring to FIG. 12B, provided that the standard commodity FPGA IC chip 200 may have (1) the chip-enable (CE) pad 209 at a logic level of "0", (2) the IS1 pad 231 at a logic level of "1", (3) the IS2 pad 231 at a logic level of "0", (4) the IS3 pad 231 at a logic level of "0" and (5) the IS4 pad 231 at a logic level of "0", the standard commodity FPGA IC chip 200 may be enabled in accordance with the logic level at its chip-enable (CE) pad 209 and may select, in accordance with the logic levels at its IS1, IS2, IS3 and IS4 pads 231, one or more I/O port, i.e., I/O Port 1, from its I/O ports 377, i.e., I/O Port 1, I/O Port 2, I/O Port 3 and I/O Port 4, to pass data for the input operation. For each of the small I/O circuits 203 of the selected I/O port 377, i.e., I/O Port 1, of the standard commodity FPGA IC chip 200, its small receiver 375 may be activated by the first data input S_Inhibit of its small receiver 375 associated with the logic level at the IS1 pad 231 of the standard commodity FPGA IC chip 200. For each of the small I/O circuits 203 of the unselected I/O ports, i.e., I/O Port 2, I/O Port 3 and I/O Port 4, of the standard commodity FPGA IC chip 200, its small receiver 375 may be inhibited by the first data input S_Inhibit of its small receiver 375 associated respectively with the logic levels at the IS2, IS3 and IS4 pads 231 of the standard commodity FPGA IC chip 200.

For example, referring to FIG. 12B, provided that the standard commodity FPGA IC chip 200 may have (1) the chip-enable (CE) pad 209 at a logic level of "0", (2) the IS1 pad 231 at a logic level of "1", (3) the IS2 pad 231 at a logic level of "1", (4) the IS3 pad 231 at a logic level of "1" and (5) the IS4 pad 231 at a logic level of "1", the standard commodity FPGA IC chip 200 may be enabled in accordance with the logic level at its chip-enable (CE) pad 209 and may select, in accordance with the logic levels at its IS1, IS2, IS3 and IS4 pads 231, all from its I/O ports 377, i.e., I/O Port 1, I/O Port 2, I/O Port 3 and I/O Port 4, to pass data for the input operation at the same clock cycle. For each of the small I/O circuits 203 of the selected I/O ports 377, i.e., I/O Port 1, I/O Port 2, I/O Port 3 and I/O Port 4, of the standard commodity FPGA IC chip 200, its small receiver 375 may be activated by the first data input S_Inhibit of its small receiver 375 associated respectively with the logic levels at the IS1, IS2, IS3 and IS4 pads 231 of the standard commodity FPGA IC chip 200.

Referring to FIG. 12B, the standard commodity FPGA IC chip 200 may include multiple output selection (OS) pads 232, e.g., OS1, OS2, OS3 and OS4 pads, each configured to receive a data input associated respectively with the first data input S_Enable of the small driver 374 of each of the small I/O circuits 203 of one of its I/O ports 377, e.g., I/O Port 1, I/O Port 2, I/O Port 3 and I/O Port 4. For more elaboration, the OS1 pad 232 may receive a data input associated with the first data input S_Enable of the small driver 374 of each of the small I/O circuits 203 of I/O Port 1; the OS2 pad 232 may receive a data input associated with the first data input S_Enable of the small driver 374 of each of the small I/O circuits 203 of I/O Port 2; the OS3 pad 232 may receive a data input associated with the first data input S_Enable of the small driver 374 of each of the small I/O circuits 203 of I/O Port 3; the OS4 pad 232 may receive a data input associated with the first data input S_Enable of the small driver 374 of each of the small I/O circuits 203 of I/O Port 4. The standard commodity FPGA IC chip 200 may select, in accordance with logic levels at the output selection (OS) pads 232, e.g., OS1, OS2, OS3 and OS4 pads, one or more from its I/O ports 377, e.g., I/O Port 1, I/O Port 2, I/O Port 3 and I/O Port 4 to pass data for its output operation. For each of the small I/O circuits 203 of each of the one or more I/O ports 377 selected in accordance with the logic levels at the output selection (OS) pads 232, its small driver 374 may be enabled by the first data input S_Enable of its small driver 374 transmitted from circuits outside of the standard commodity FPGA IC chip 200 through one of the output selection (OS) pads 232 to amplify or pass the second data input S_Data_out of its small driver 374, associated with the data output of one of the programmable logic cells 2014 as seen in FIGS. 6 and 7A-7J of the standard commodity FPGA IC chip 200 through one or more of the programmable interconnects 361 as seen in FIGS. 3A, 3B and 8 of the standard commodity FPGA IC chip 200, as the data output of its small driver 374 to be transmitted to circuits outside the standard commodity FPGA IC chip 200 through one of the I/O pads 372 of said each of the one or more I/O ports 377 selected in accordance with the logic levels at the output selection (OS) pads 232, for example. For each of the small I/O circuits 203 of each of the I/O ports 377, not selected in accordance with in accordance with the logic levels at the output selection (OS) pads 232, of the standard commodity FPGA IC chip 200, its small driver 374 may be disabled by the first data input S_Enable of its small driver 374 associated with the logic level at one of the output selection (OS) pads 232.

For example, referring to FIG. 12B, provided that the standard commodity FPGA IC chip 200 may have (1) the chip-enable (CE) pad 209 at a logic level of "0", (2) the OS1 pad 232 at a logic level of "0", (3) the OS2 pad 232 at a logic level of "1", (4) the OS3 pad 232 at a logic level of "1" and (5) the OS4 pad 232 at a logic level of "1", the standard commodity FPGA IC chip 200 may be enabled in accordance with the logic level at its chip-enable (CE) pad 209 and may select, in accordance with the logic levels at its OS1, OS2, OS3 and OS4 pads 232, one or more I/O port, i.e., I/O Port 1, from its I/O ports 377, i.e., I/O Port 1, I/O Port 2, I/O Port 3 and I/O Port 4, to pass data for the output operation. For each of the small I/O circuits 203 of the selected I/O port 377, i.e., I/O Port 1, of the standard commodity FPGA IC chip 200, its small driver 374 may be enabled by the first data input S_Enable of its small driver 374 associated with the logic level at the OS1 pad 232 of the standard commodity FPGA IC chip 200. For each of the small I/O circuits 203 of the unselected I/O ports, i.e., I/O Port 2, I/O Port 3 and I/O Port 4, of the standard commodity FPGA IC chip 200, its small driver 374 may be disabled by the first data input S_Enable of its small driver 374 associated respectively with the logic levels at the OS2, OS3 and OS4 pads 232 of the standard commodity FPGA IC chip 200.

For example, referring to FIG. 12B, provided that the standard commodity FPGA IC chip 200 may have (1) the chip-enable (CE) pad 209 at a logic level of "0", (2) the OS1 pad 232 at a logic level of "0", (3) the OS2 pad 232 at a logic level of "0", (4) the OS3 pad 232 at a logic level of "0" and (5) the OS4 pad 232 at a logic level of "0", the standard commodity FPGA IC chip 200 may be enabled in accordance with the logic level at its chip-enable (CE) pad 209 and may select, in accordance with the logic levels at its OS1, OS2, OS3 and OS4 pads 232, all from its I/O ports 377, i.e., I/O Port 1, I/O Port 2, I/O Port 3 and I/O Port 4, to pass data for the output operation. For each of the small I/O circuits 203 of the selected I/O port 377, i.e., I/O Port 1, I/O Port 2, I/O Port 3 and I/O Port 4, of the standard commodity FPGA IC chip 200, its small driver 374 may be enabled by the first data input S_Enable of its small driver 374 associated respectively with the logic levels at the OS1, OS2, OS3 and OS4 pads 232 of the standard commodity FPGA IC chip 200.

Thereby, referring to FIG. 12B, in a clock cycle, one or more of the I/O ports 377, e.g., I/O Port 1, I/O Port 2, I/O Port 3 and I/O Port 4, may be selected, in accordance with the logic levels at the IS1, IS2, IS3 and IS4 pads 231, to pass data for the input operation, while another one or more of the I/O ports 377, e.g., I/O Port 1, I/O Port 2, I/O Port 3 and I/O Port 4, may be selected, in accordance with the logic levels at the OS1, OS2, OS3 and OS4 pads 232, to pass data for the output operation. The input selection (IS) pads 231 and output selection (OS) pads 232 may be provided as I/O-port selection pads.

Figure 12C:
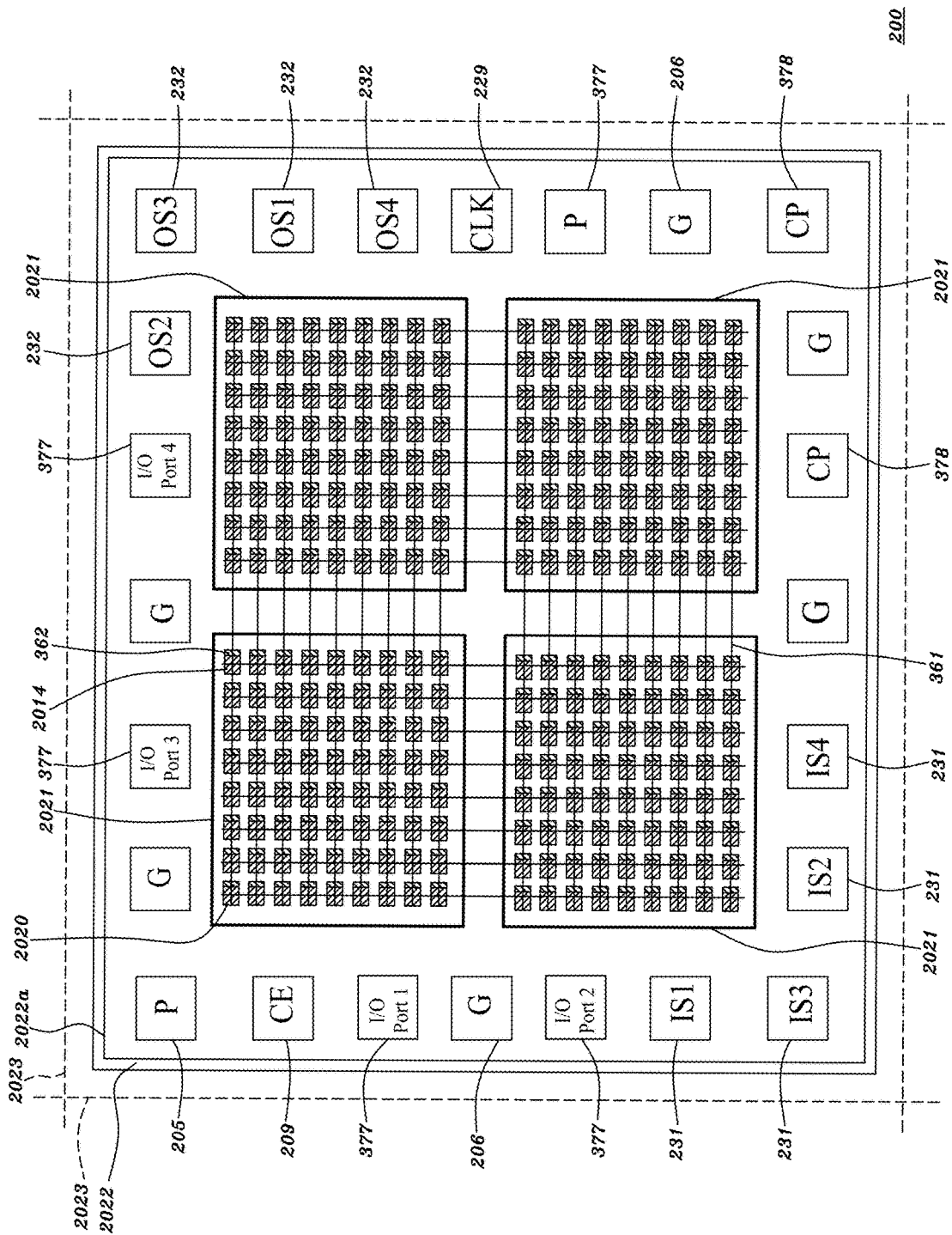
FIG. 12C is a top view showing a layout of a standard commodity FPGA IC chip in accordance with an embodiment of the present application.

FIG. 12C is a top view showing a layout of a standard commodity FPGA IC chip in accordance with an embodiment of the present application. Referring to FIG. 12C, the standard commodity FPGA IC chip 200 may include multiple repetitive circuit arrays 2021 arranged in an array therein, and each of the repetitive circuit arrays 2021 may include multiple repetitive circuit units 2020 arranged in an array therein. Each of the repetitive circuit units 2020 may include a programmable logic cell (LC) 2014 as illustrated in FIG. 6, and/or the memory cells 362 for the programmable interconnection as illustrated in FIGS. 2A-2C, 3A, 3B and 8. The programmable logic cells (LC) 2014 may be programmed or configured as functions of, for example, digital-signal processor (DSP), microcontroller, adders, and/or multipliers. For the standard commodity FPGA IC chip 200, its programmable interconnects 361 may couple neighboring two of its repetitive circuit units 2020 and the repetitive circuit units 2020 in neighboring two of its repetitive circuit units 2020. The standard commodity FPGA IC chip 200 may include a seal ring 2022 at its four edges, enclosing its repetitive circuit arrays 2021, its I/O ports 277 and its various circuits as illustrated in FIGS. 12A and 12B, and a scribe line, kerf or die-saw area 2023 at its border and outside and around the seal ring 2022. For example, for the standard commodity FPGA IC chip 200, greater than 85%, 90%, 95% or 99% area (not counting its seal ring 2022 and scribe line 2023, that is, only including an area within an inner boundary 2022a of its seal ring 2022) is used for its repetitive circuit arrays 2021; alternatively, all or most of its transistors are used for its repetitive circuit arrays 2021. Alternatively, for the standard commodity FPGA IC chip 200, none or minimal area may be provided for its control circuits, I/O circuits or hard macros, for example, less than 15%, 10%, 5%, 2% or 1% of its area (not counting its seal ring 2022 and scribe line 2023, that is, only including an area within an inner boundary 2022a of its seal ring 2022) is used for its control circuits, I/O circuits or hard macros; alternatively, none or minimal transistors may be provided for its control circuits, I/O circuits or hard macros, for example, less than 15%, 10%, 5%, 2% or 1% of the total number of its transistors are used for its control circuits, I/O circuits or hard macros.

The standard commodity plural FPGA IC chip 200 may have standard common features, counts or specifications: (1) its regular repetitive logic array may have the number of programmable logic arrays or sections equal to or greater than 2, 4, 8, 10 or 16, wherein its regular repetitive logic array may include programmable logic blocks or elements 201 as illustrated in FIGS. 7A-7J with the count equal to or greater than 128K, 512K, 1M, 4M, 8M, 16M, 32M or 80M; (2) its regular memory array may have the number of memory banks equal to or greater than 2, 4, 8, 10 or 16, wherein its regular memory array may include memory cells with the bit count equal to or greater than 1M, 10M, 50M, 100M, 200M or 500M bits; (3) the number of data inputs to each of its programmable logic blocks or elements 201 may be greater than or equal to 4, 8, 16, 32, 64, 128 or 256; (4) its applied voltage may be smaller than or equal to 1.5V, 1.0V, 0.7V or 0.5V, or may be between 0.1V and 1.5V, between 0.1V and 1.0V, between 0.1V and 0.7V, or between 0.1V and 0.5V; and (4) its I/O pads 372 as seen in FIGS. 12A and 12B may be arranged in terms of layout, location, number and function.

Figure 13:
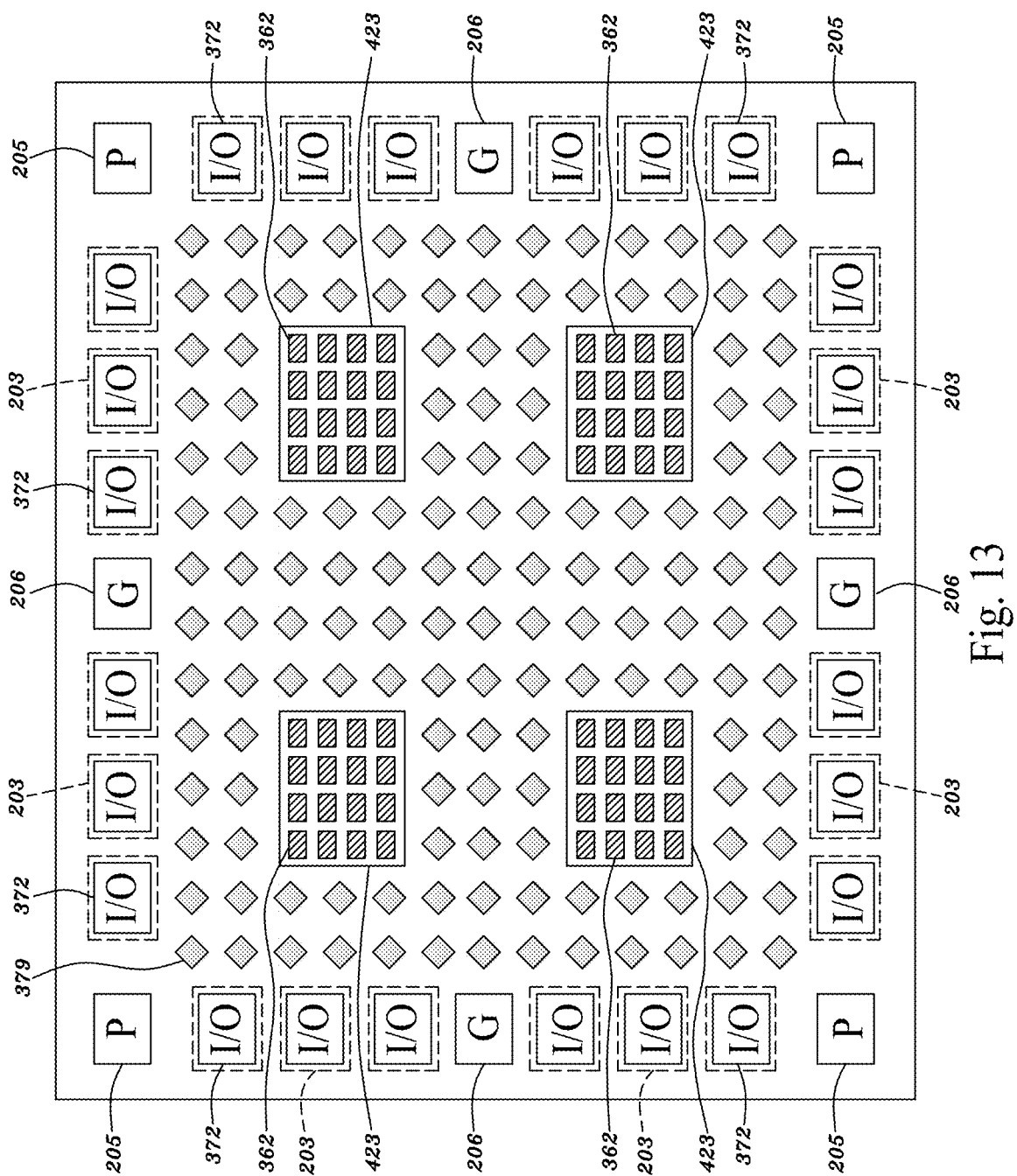
FIG. 13 is a schematically top view showing a block diagram of a dedicated programmable interconnection (DPI) integrated-circuit (IC) chip in accordance with an embodiment of the present application.

Specification for Dedicated Programmable Interconnection (DPI) Integrated-Circuit (IC) Chip FIG. 13 is a schematically top view showing a block diagram of a dedicated programmable interconnection (DPI) integrated-circuit (IC) chip in accordance with an embodiment of the present application.

Referring to FIG. 13, the DPIIC chip 410 may include (1) multiple memory-array blocks 423 arranged in an array in a central region thereof, (2) multiple groups of cross-point switches 379 as illustrated in FIGS. 3A, 3B and 8, each group of which is arranged in one or more rings around one of the memory-array blocks 423, and (3) multiple small input/output (I/O) circuits 203, as illustrated in FIG. 5B, each providing the small receiver 375 with the data output S_Data_in associated with a data input at one of the nodes N23-N26 of one of its cross-point switches 379 as illustrated in FIGS. 3A, 3B and 8 through one or more of its programmable interconnects 361 and providing the small driver 374 with the data input S_Data_out associated with a data output at one of the nodes N23-N26 of another of its cross-point switches 379 as illustrated in FIGS. 3A, 3B and 8 through another one or more of its programmable interconnects 361. In each of the memory-array blocks 423 are multiple memory cells 362, each of which may be referred to a memory cell 398 as illustrated in FIG. 1A or 1B, wherein the DPIIC chip 410 may provide the first type of pass/no-pass switches 258 for its first or second type of cross-point switches 379 as illustrated in FIG. 3A or 3B close to said each of the memory-array blocks 423, each of which may have the data input SC-3 as seen in FIG. 2A associated with a data output, i.e., configuration-programming-memory (CPM) data, of one of its memory cells 362, i.e., configuration-programming-memory (CPM) cells, in said each of its memory-array blocks 423, which may be referred to one of the data outputs Out1 and Out2 of the memory cell 398 as illustrated in FIG. 1A or 1B. Alternatively, in each of the memory-array blocks 423 are multiple memory cells 362, each of which may be referred to a memory cell 398 as illustrated in FIG. 1A or 1B, wherein the DPIIC chip 410 may provide the third type of pass/no-pass switches 258 for its first or second type of cross-point switches 379 as illustrated in FIG. 3A or 3B close to said each of the memory-array blocks 423, each of which may have the data inputs SC-5 and SC-6 as seen in FIG. 2C each associated with a data output, i.e., configuration-programming-memory (CPM) data, of one of its memory cells 362, i.e., configuration-programming-memory (CPM) cells, in said each of its memory-array blocks 423, which may be referred to one of the data outputs Out1 and Out2 of the memory cell 398 as illustrated in FIG. 1A or 1B. Alternatively, in each of the memory-array blocks 423 are multiple memory cells 362, each of which may be referred to a memory cell 398 as illustrated in FIG. 1A or 1B, wherein the DPIIC chip 410 may provide the multiplexers 211 for its third type of cross-point switches 379 as illustrated in FIG. 8 close to said each of the memory-array blocks 423, each of which may have the first set of input points for multiple data inputs of the first input data set of said each of its multiplexers 211 each associated with a data output, i.e., configuration-programming-memory (CPM) data, of one of its memory cells 362, i.e., configuration-programming-memory (CPM) cells, in said each of its memory-array blocks 423, which may be referred to one of the data outputs Out1 and Out2 of the memory cell 398 as illustrated in FIG. 1A or 1B.

Referring to FIG. 13, the DPIIC chip 410 may include multiple intra-chip interconnects (not shown) each extending over spaces between neighboring two of the memory-array blocks 423, wherein said each of the intra-chip interconnects may be the programmable interconnect 361, coupling to one of the nodes N23-N26 of one of its cross-point switches 379 as illustrated in FIGS. 3A, 3B and 8. For the DPIIC chip 410, each of its small input/output (I/O) circuits 203, as illustrated in FIG. 5B, may provide the small receiver 375 with the data output S_Data_in to be passed through one or more of its programmable interconnects 361 and the first data input S_Inhibit passed through another one or more of its programmable interconnects 361 and provide the small driver 374 with the first data input S_Enable passed through another one or more of its programmable interconnects 361 and the second data input S_Data_out passed through another one or more of its programmable interconnects.

Referring to FIG. 13, the DPIIC chip 410 may include multiple of the I/O pads 372 as seen in FIG. 5B, each vertically over one of its small input/output (I/O) circuits 203, coupling to the node 381 of said one of its small input/output (I/O) circuits 203. For the DPIIC chip 410, in a first clock cycle, data from one of the nodes N23-N26 of one of its cross-point switches 379 as illustrated in FIG. 3A, 3B or 8 may be associated with the second data input S_Data_out of the small driver 374 of one of its small input/output (I/O) circuits 203 through one or more of the programmable interconnects 361 programmed by a first group of its memory cells 362, and then the small driver 374 of said one of its small input/output (I/O) circuits 203 may amplify or pass the second data input S_Data_out of the small driver 374 of said one of its small input/output (I/O) circuits 203 as the data output of the small driver 374 of said one of its small input/output (I/O) circuits 203 to be transmitted to one of its I/O pads 372 vertically over said one of its small input/output (I/O) circuits 203 for external connection to circuits outside the DPIIC chip 410. In a second clock cycle, data from circuits outside the DPIIC chip 410 may be associated with the second data input of the small receiver 375 of said one of its small input/output (I/O) circuits 203 through said one of its I/O pads 372, and then the small receiver 375 of said one of the small input/output (I/O) circuits 203 may amplify or pass the second data input of the small receiver 375 of said one of its small input/output (I/O) circuits 203 as the data output S_Data_in of the small receiver 375 of said one of its small input/output (I/O) circuits 203 to be associated with one of the nodes N23-N26 of another of its cross-point switches 379 as illustrated in FIG. 3A, 3B or 8 through another one or more of the programmable interconnects 361 programmed by a second group of its memory cells 362.

Referring to FIG. 13, the DPIIC chip 410 may further include (1) multiple power pads 205 for applying the voltage Vcc of power supply to its memory cells 362 for its cross-point switches 379 as illustrated in FIG. 3A, 3B or 8 and/or its cross-point switches 379, wherein the voltage Vcc of power supply may be between 0.2V and 2.5V, between 0.2V and 2V, between 0.2V and 1.5V, between 0.1V and 1V, or between 0.2V and 1V, or, smaller or lower than or equal to 2.5V, 2V, 1.8V, 1.5V or 1V, and (2) multiple ground pads 206 for providing the voltage Vss of ground reference to its memory cells 362 for its cross-point switches 379 as illustrated in FIG. 3A, 3B or 8 and/or its cross-point switches 379.

Referring to FIG. 13, the DPIIC chip 410 may further include multiple 6 T SRAM cells 398 as illustrated in FIG. 1A used as cache memory for data latch or storage. Each of the 6 T SRAM cells 398 may include two switches 449, such as N-type or P-type MOS transistors, for bit and bit-bar data transfer, and two pairs of P-type and N-type MOS transistors 447 and 448 for data latch or storage nodes. For each of the 6 T SRAM cells 398 acting as the cache memory of the DPIIC chip 410, its two switches 449 may perform control of writing data into said each of the 6 T SRAM cells 398 and reading data stored in said each of the 6 T SRAM cells 398. The DPIIC chip 410 may further include a sense amplifier for reading, amplifying or detecting data from its 6 T SRAM cells 398 acting as the cache memory.

Specification for Logic Drive

Figure 14:
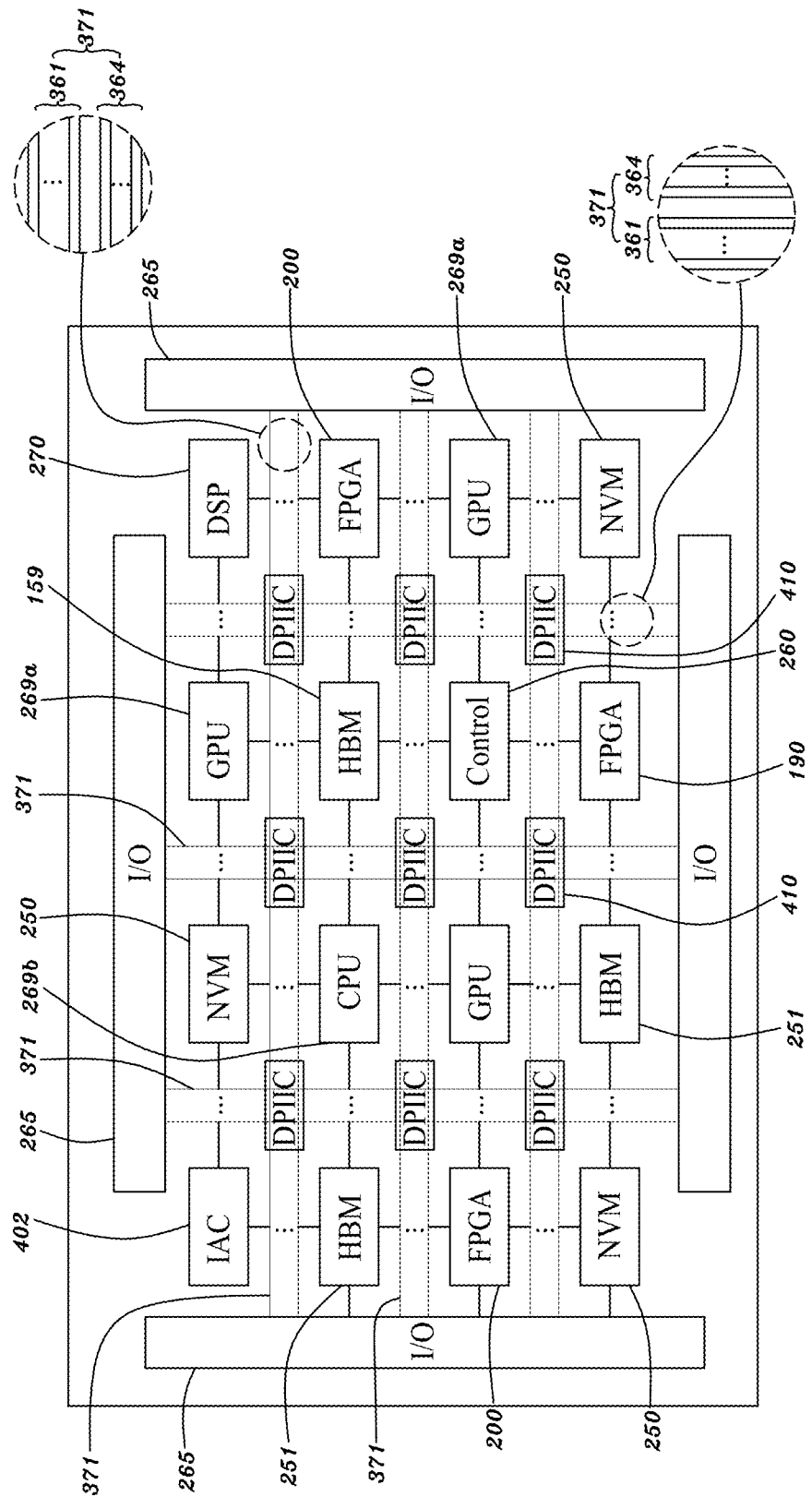
FIG. 14 is a schematically top view showing an arrangement for a logic drive in accordance with an embodiment of the present application.

FIG. 14 is a schematically top view showing arrangement for various chips packaged in a tenth type of standard commodity logic drive in accordance with an embodiment of the present application. Referring to FIG. 14, a logic drive 300 may be packaged with multiple graphic-processing unit (GPU) chips 269a, a central-processing-unit (CPU) chip 269b and a digital-signal-processing (DSP) chip 270. Further, the logic drive 300 may be packaged with multiple high-bandwidth-memory (HBM) integrated-circuit (IC) chips 251 each arranged next to one of the GPU chips 269a for communication with said one of the GPU chips 269a in a high speed, high bandwidth and wide bitwidth. Each of the HBM IC chips 251 in the logic drive 300 may be a high speed, high bandwidth, wide bitwidth dynamic-random-access-memory (DRAM) IC chip, high speed, high bandwidth, wide bitwidth cache static-random-access-memory (SRAM) chip, high speed, high bandwidth, wide bitwidth magnetoresistive random-access-memory (MRAM) chip or high speed, high bandwidth, wide bitwidth resistive random-access-memory (RRAM) chip. The logic drive 300 may be further packaged with a plurality of the standard commodity FPGA IC chip 200 and one or more of the non-volatile memory (NVM) IC chips 250 configured to store data from data information memory (DIM) cells of the HBM IC chips 251. The logic drive 300 may be further packaged with an innovated application-specific-IC (ASIC) or customer-owned-tooling (COT) (abbreviated as IAC below) chip 402 for intellectual-property (IP) circuits, application-specific (AS) circuits, analog circuits, mixed-mode signal circuits, radio-frequency (RF) circuits, and/or transmitter, receiver or transceiver circuits, etc. The logic drive 300 may be further packaged with a dedicated control and input/output (I/O) chip 260 to control data transmission between any two of its CPU chip 269b, DSP chip 270, standard commodity FPGA IC chips 200, GPU chips 269a, NVM IC chips 250, IAC chip 402 and HBMIC chips 251. The dedicated control and input/output (I/O) chip 260 may be replaced with a dedicated control chip. The CPU chip 269b, DSP chip 270, dedicated control and input/output (I/O) chip 260, standard commodity FPGA IC chips 200, GPU chips 269a, NVM IC chips 250, IAC chip 402 and HBMIC chips 251 may be arranged in an array, wherein the CPU chip 269b and dedicated control and input/output (I/O) chip 260 may be arranged in a center region surrounded by a periphery region having the standard commodity FPGA IC chips 200, DSP chip 270, GPU chips 269a, NVM IC chips 250, IAC chip 402 and HBMIC chips 251 mounted thereto.

Referring to FIG. 14, the logic drive 300 may include the inter-chip interconnects 371 each extending under spaces between neighboring two of the standard commodity FPGA IC chips 200, NVM IC chips 250, dedicated control and input/output (I/O) chip 260, GPU chips 269a, CPU chip 269b, DSP chip 270, IAC chip 402 and HBMIC chips 251. The logic drive 300 may include a plurality of the DPIIC chip 410 aligned with a cross of a vertical bundle of inter-chip interconnects 371 and a horizontal bundle of inter-chip interconnects 371. Each of the DPIIC chips 410 is at corners of four of the standard commodity FPGA IC chips 200, NVM IC chips 250, dedicated control and input/output (I/O) chip 260, GPU chips 269a, CPU chip 269b, DSP chip 270, IAC chip 402 and HBMIC chips 251 around said each of the DPIIC chips 410. The inter-chip interconnects 371 may be formed for the programmable interconnect 361. Data transmission may be built (1) between one of the programmable interconnects 361 of the inter-chip interconnects 371 and one of the programmable interconnects 361 of one of the standard commodity FPGA IC chips 200 via one of the small input/output (I/O) circuits 203 of said one of the standard commodity FPGA IC chips 200, and (2) between one of the programmable interconnects 361 of the inter-chip interconnects 371 and one of the programmable interconnects 361 one of the DPIIC chips 410 via one of the small input/output (I/O) circuits 203 of said one of the DPIIC chips 410.

Referring to FIG. 14, one or more of the programmable interconnects 361 of the inter-chip interconnects 371 may couple from each of the standard commodity FPGA IC chips 200 to all of the DPIIC chips 410. One or more of the programmable interconnects 361 of the inter-chip interconnects 371 may couple from each of the standard commodity FPGA IC chips 200 to the dedicated control and input/output (I/O) chip 260. One or more of the programmable interconnects 361 of the inter-chip interconnects 371 may couple from each of the standard commodity FPGA IC chips 200 to both of the NVM IC chips 250. One or more of the programmable interconnects 361 of the inter-chip interconnects 371 may couple from each of the standard commodity FPGA IC chips 200 to all of the GPU chips 269a. One or more of the programmable interconnects 361 of the inter-chip interconnects 371 may couple from each of the standard commodity FPGA IC chips 200 to the CPU chip 269b. One or more of the programmable interconnects 361 of the inter-chip interconnects 371 may couple from each of the standard commodity FPGA IC chips 200 to the DSP chip 270. One or more of the programmable interconnects 361 of the inter-chip interconnects 371 may couple from one of the standard commodity FPGA IC chips 200 to one of the HBMIC chips 251 next to said one of the standard commodity FPGA IC chips 200 and the communication between said one of the standard commodity FPGA IC chips 200 and said one of the HBMIC chips 251 may have a data bit width of equal to or greater than 64, 128, 256, 512, 1024, 2048, 4096, 8K, or 16K. One or more of the programmable interconnects 361 of the inter-chip interconnects 371 may couple from each of the standard commodity FPGA IC chips 200 to the other of the standard commodity FPGA IC chips 200. One or more of the programmable interconnects 361 of the inter-chip interconnects 371 may couple from each of the standard commodity FPGA IC chips 200 to the IAC chip 402. One or more of the programmable interconnects 361 of the inter-chip interconnects 371 may couple from each of the DPIIC chips 410 to the dedicated control and input/output (I/O) chip 260. One or more of the programmable interconnects 361 of the inter-chip interconnects 371 may couple from each of the DPIIC chips 410 to both of the NVM IC chips 250. One or more of the programmable interconnects 361 of the inter-chip interconnects 371 may couple from each of the DPIIC chips 410 to all of the GPU chips 269a. One or more of the programmable interconnects 361 of the inter-chip interconnects 371 may couple from each of the DPIIC chips 410 to the CPU chip 269b. One or more of the programmable interconnects 361 of the inter-chip interconnects 371 may couple from each of the DPIIC chips 410 to the DSP chip 270. One or more of the programmable interconnects 361 of the inter-chip interconnects 371 may couple from each of the DPIIC chips 410 to all of the HBM IC chips 251. One or more of the programmable interconnects 361 of the inter-chip interconnects 371 may couple from each of the DPIIC chips 410 to the others of the DPIIC chips 410. One or more of the programmable interconnects 361 of the inter-chip interconnects 371 may couple from each of the DPIIC chips 410 to the IAC chip 402. One or more of the programmable interconnects 361 of the inter-chip interconnects 371 may couple from the CPU chip 269b to all of the GPU chips 269a. One or more of the programmable interconnects 361 of the inter-chip interconnects 371 may couple from the DSP chip 270 to all of the GPU chips 269a. One or more of the programmable interconnects 361 of the inter-chip interconnects 371 may couple from the CPU chip 269b to both of the NVM IC chips 250. One or more of the programmable interconnects 361 of the inter-chip interconnects 371 may couple from the DSP chip 270 to both of the NVM IC chips 250. One or more of the programmable interconnects 361 of the inter-chip interconnects 371 may couple from the CPU chip 269b to one of the HBM IC chips 251 next to the CPU chip 269b and the communication between the CPU chip 269b and said one of the HBM IC chips 251 may have a data bit width of equal to or greater than 64, 128, 256, 512, 1024, 2048, 4096, 8K, or 16K. One or more of the programmable interconnects 361 of the inter-chip interconnects 371 may couple from the CPU chip 269b to the IAC chip 402. One or more of the programmable interconnects 361 of the inter-chip interconnects 371 may couple from the DSP chip 270 to the IAC chip 402. One or more of the programmable interconnects 361 of the inter-chip interconnects 371 may couple from the CPU chip 269b to the DSP chip 270. One or more of the programmable interconnects 361 of the inter-chip interconnects 371 may couple from one of the GPU chips 269a to one of the HBM IC chips 251 next to said one of the GPU chips 269a and the communication between said one of the GPU chips 269a and said one of the HBM IC chips 251 may have a data bit width of equal to or greater than 64, 128, 256, 512, 1024, 2048, 4096, 8K, or 16K. One or more of the programmable interconnects 361 of the inter-chip interconnects 371 may couple from each of the GPU chips 269a to both of the NVM IC chips 250. One or more of the programmable interconnects 361 of the inter-chip interconnects 371 may couple from each of the GPU chips 269a to the others of the GPU chips 269a. One or more of the programmable interconnects 361 of the inter-chip interconnects 371 may couple from each of the GPU chips 269a to the IAC chip 402. One or more of the programmable interconnects 361 of the inter-chip interconnects 371 may couple from each of the NVM IC chips 250 to the dedicated control and input/output (I/O) chip 260. One or more of the programmable interconnects 361 of the inter-chip interconnects 371 may couple from each of the HBM IC chips 251 to the dedicated control and input/output (I/O) chip 260. One or more of the programmable interconnects 361 of the inter-chip interconnects 371 may couple from each of the GPU chips 269a to the dedicated control and input/output (I/O) chip 260. One or more of the programmable interconnects 361 of the inter-chip interconnects 371 may couple from the CPU chip 269b to the dedicated control and input/output (I/O) chip 260. One or more of the programmable interconnects 361 of the inter-chip interconnects 371 may couple from the DSP chip 270 to the dedicated control and input/output (I/O) chip 260. One or more of the programmable interconnects 361 of the inter-chip interconnects 371 may couple from each of the NVM IC chips 250 to all of the HBM IC chips 251. One or more of the programmable interconnects 361 of the inter-chip interconnects 371 may couple from each of the NVM IC chips 250 to the IAC chip 402. One or more of the programmable interconnects 361 of the inter-chip interconnects 371 may couple from each of the HBM IC chips 251 to the IAC chip 402. One or more of the programmable interconnects 361 of the inter-chip interconnects 371 may couple from each of the IAC chip 402 to the dedicated control and input/output (I/O) chip 260. One or more of the programmable interconnects 361 of the inter-chip interconnects 371 may couple from each of the NVM IC chips 250 to the other of the NVM IC chips 250. One or more of the programmable interconnects 361 of the inter-chip interconnects 371 may couple from each of the HBM IC chips 251 to the others of the HBM IC chips 251.

Referring to FIG. 14, the logic drive 300 may include multiple dedicated input/output (I/O) chips 265 in a peripheral region thereof surrounding a central region thereof having the standard commodity FPGA IC chips 200, NVM IC chips 250, dedicated control and input/output (I/O) chip 260, GPU chips 269a, CPU chip 269b, DSP chip 270, HBM IC chips 251, IAC chip 402 and DPIIC chips 410 located therein. One or more of the programmable interconnects 361 of the inter-chip interconnects 371 may couple from each of the standard commodity FPGA IC chips 200 to all of the dedicated input/output (I/O) chips 265. One or more of the programmable interconnects 361 of the inter-chip interconnects 371 may couple from each of the DPIIC chips 410 to all of the dedicated input/output (I/O) chips 265. One or more of the programmable interconnects 361 of the inter-chip interconnects 371 may couple from each of the NVM IC chips 250 to all of the dedicated input/output (I/O) chips 265. One or more of the programmable interconnects 361 of the inter-chip interconnects 371 may couple from the dedicated control and input/output (I/O) chip 260 to all of the dedicated input/output (I/O) chips 265. One or more of the programmable interconnects 361 of the inter-chip interconnects 371 may couple from each of the GPU chips 269a to all of the dedicated input/output (I/O) chips 265. One or more of the programmable interconnects 361 of the inter-chip interconnects 371 may couple from the CPU chip 269b to all of the dedicated input/output (I/O) chips 265. One or more of the programmable interconnects 361 of the inter-chip interconnects 371 may couple from the DSP chip 270 to all of the dedicated input/output (I/O) chips 265. One or more of the programmable interconnects 361 of the inter-chip interconnects 371 may couple from each of the HBM IC chips 251 to all of the dedicated input/output (I/O) chips 265. One or more of the programmable interconnects 361 of the inter-chip interconnects 371 may couple from the IAC chip 402 to all of the dedicated input/output (I/O) chips 265. For the standard commodity logic drive 300, its dedicated control and input/output (I/O) chip 260 is configured to control data transmission between each of its dedicated input/output (I/O) chips 265 and one of its CPU chip 269b, DSP chip 270, standard commodity FPGA IC chips 200, GPU chips 269*a*, NVM IC chips 250, IAC chip 402 and HBMIC chips 251.

Referring to FIG. 14, for the standard commodity logic drive 300 being in operation, each of its DPIIC chip 410 may be arranged with the 6 T SRAM cells 398, as seen in FIG. 1A, acting as cache memory to store data from any of the CPU chip 269*b*, DSP chip 270, dedicated control and input/output (I/O) chip 260, standard commodity FPGA IC chips 200, GPU chips 269*a*, NVM IC chips 250, IAC chip 402 and HBMIC chips 251.

Interconnection for Logic Drive

Figure 15:
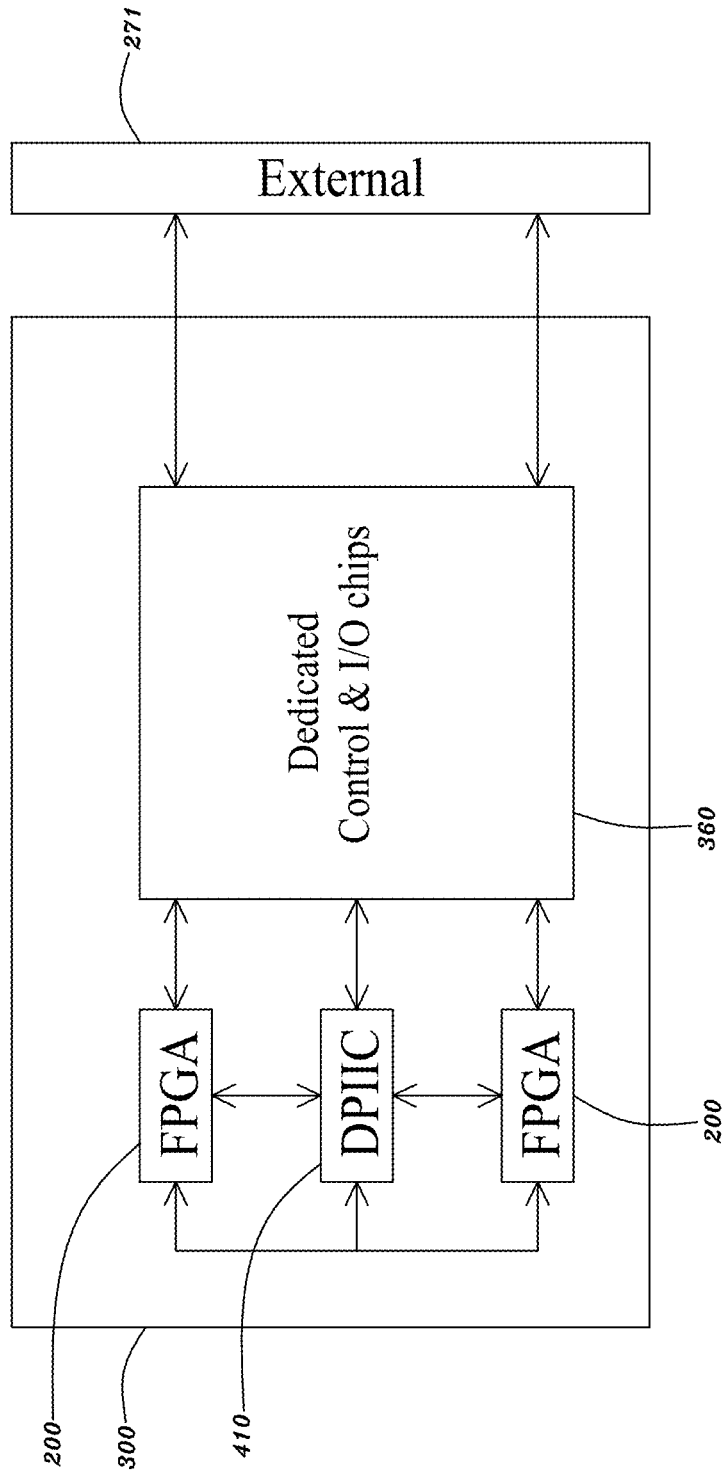
FIG. 15 is a block diagram showing interconnection between chips in a standard commodity logic drive in accordance with an embodiment of the present application.

FIG. 15 is a block diagram showing interconnection between chips in a standard commodity logic drive in accordance with an embodiment of the present application. Referring to FIG. 15, two blocks 200 may be two different groups of the standard commodity FPGA IC chips 200 in the logic drive 300 illustrated in FIG. 14; a block 410 may be a combination of the DPIIC chips 410 in the logic drive 300 illustrated in FIG. 14; a block 360 may be a combination of the dedicated I/O chips 265 and dedicated control and input/output (I/O) chip 260 in the logic drive 300 illustrated in FIG. 14.

Referring to FIGS. 14 and 15, for the standard commodity logic drive 300, one or more of the programmable interconnects 361 of its inter-chip interconnects 371 may couple one or more of the small I/O circuits 203 of each of its dedicated I/O chips 265 in the block 360 to one or more of the small I/O circuits 203 of one of its standard commodity FPGA IC chips 200. One or more of the programmable interconnects 361 of its inter-chip interconnects 371 may couple one or more of the small I/O circuits 203 of each of its dedicated I/O chips 265 in the block 360 to one or more of the small I/O circuits 203 of one of its DPIIC chips 410. One or more of the fixed interconnects 364 of the inter-chip interconnects 371 may couple one or more of the small I/O circuits 203 of each of its dedicated I/O chips 265 in the block 360 to one or more of the small I/O circuits 203 of one of its standard commodity FPGA IC chips 200. One or more of the fixed interconnects 364 of the inter-chip interconnects 371 may couple one or more of the small I/O circuits 203 of each of its dedicated I/O chips 265 in the block 360 to one or more of the small I/O circuits 203 of one of its DPIIC chips 410.

Referring to FIGS. 14 and 15, for the standard commodity logic drive 300, one or more of the programmable interconnects 361 of its inter-chip interconnects 371 may couple one or more of the small I/O circuits 203 of each of its DPIIC chips 410 to one or more of the small I/O circuits 203 of one of the standard commodity FPGA IC chips 200. One or more of the programmable interconnects 361 of its inter-chip interconnects 371 may couple one or more of the small I/O circuits 203 of each of its DPIIC chips 410 to one or more of the small I/O circuits 203 of another of the DPIIC chips 410. One or more of the fixed interconnects 364 of the inter-chip interconnects 371 may couple one or more of the small I/O circuits 203 of each of its DPIIC chips 410 to one or more of the small I/O circuits 203 of one of its standard commodity FPGA IC chips 200. One or more of the fixed interconnects 364 of the inter-chip interconnects 371 may couple one or more of the small I/O circuits 203 of each of its DPIIC chips 410 to one or more of the small I/O circuits 203 of another of the DPIIC chips 410.

Referring to FIGS. 14 and 15, for the standard commodity logic drive 300, one or more of the programmable interconnects 361 of its inter-chip interconnects 371 may couple one or more of the small I/O circuits 203 of each of its standard commodity FPGA IC chips 200 to one or more of the small I/O circuits 203 of another of the standard commodity FPGA IC chips 200. One or more of the fixed interconnects 364 of its inter-chip interconnects 371 may couple one or more of the small I/O circuits 203 of each of its standard commodity FPGA IC chips 200 to one or more of the small I/O circuits 203 of another of its standard commodity FPGA IC chips 200.

Referring to FIGS. 14 and 15, for the standard commodity logic drive 300, one or more of the programmable interconnects 361 of its inter-chip interconnects 371 may couple one or more of the small I/O circuits 203 of the dedicated control and I/O chip 260 in the block 360 to one or more of the small I/O circuits 203 of each of the standard commodity FPGA IC chips 200. One more of the fixed interconnects 364 of its inter-chip interconnects 371 may couple one or more of the small I/O circuits 203 of its dedicated control and I/O chip 260 in the block 360 to one or more of the small I/O circuits 203 of each of its standard commodity FPGA IC chips 200. One or more of the programmable interconnects 361 of its inter-chip interconnects 371 may couple one or more of the small I/O circuits 203 of its dedicated control and I/O chip 260 in the block 360 to one or more of the small I/O circuits 203 of each of the DPIIC chips 410. One more of the fixed interconnects 364 of its inter-chip interconnects 371 may couple one or more of the small I/O circuits 203 of the dedicated control and I/O chip 260 in the block 360 to one or more of the small I/O circuits 203 of each of its DPIIC chips 410. One or more of the fixed interconnects 364 of its inter-chip interconnects 371 may couple one or more of the large I/O circuits 341 of the dedicated control and I/O chip 260 in the block 360 to one or more of the large I/O circuits 341 of each of the dedicated I/O chips 265. One or more of the large I/O circuits 341 of its dedicated control and I/O chip 260 in the block 360 may couple to the external circuitry 271 outside the standard commodity logic drive 300.

Referring to FIGS. 14 and 15, for the standard commodity logic drive 300, one or more of the large I/O circuits 341 of each of its dedicated I/O chips 265 in the block 360 may couple to the external circuitry 271 outside the standard commodity logic drive 300.

(1) Interconnection for Operation

Referring to FIGS. 14 and 15, for the standard commodity logic drive 300, each of its standard commodity FPGA IC chips 200 may reload resulting values or first programming codes from its non-volatile memory (NVM) IC chip 250 to the memory cells 490 of said each of its standard commodity FPGA IC chips 200 via one or more of the fixed interconnects 364 of its intra-chip interconnects 502, and thereby the resulting values or first programming codes may be stored or latched in the memory cells 490 of said each of its standard commodity FPGA IC chips 200 to program its programmable logic cells 2014 as illustrated in FIGS. 6 and 7A-7J. Said each of its standard commodity FPGA IC chips 200 may reload second programming codes from its non-volatile memory (NVM) IC chip 250 to the memory cells 362 of said each of its standard commodity FPGA IC chips 200 via one or more of the fixed interconnects 364 of its intra-chip interconnects 502, and thereby the second programming codes may be stored or latched in the memory cells 362 of said each of its standard commodity FPGA IC chips 200 to program the pass/no-pass switches 258 or cross-point switches 379 of said each of its standard commodity FPGA IC chips 200 as illustrated in FIGS. 2A-2C, 3A, 3B and 8. Said each of its DPIIC chips 410 may reload third programming codes from its non-volatile memory (NVM) IC chip 250 to the memory cells 362 of said each of its DPIIC chips 410, and thereby the third programming codes may be stored or latched in the memory cells 362 of said each of its DPIIC chips 410 to program the pass/no-pass switches 258 or cross-point switches 379 of said each of its DPIIC chips 410 as illustrated in FIGS. 2A-2C, 3A, 3B, 8 and 13.

Thereby, referring to FIGS. 14 and 15, one of the dedicated I/O chips 265 of the standard commodity logic drive 300 may have one of its large I/O circuits 341 to drive data from the external circuitry 271 outside the logic drive 300 to one of its small I/O circuits 203. For said one of the dedicated I/O chips 265, said one of its small I/O circuits 203 may drive the data to a first one of the small I/O circuits 203 of one of the DPIIC chips 410 of the standard commodity logic drive 300 via one or more of the programmable interconnects 361 of the inter-chip interconnects 371 of the standard commodity logic drive 300. For said one of the dedicated DPIIC chips 410, the first one of its small I/O circuits 203 may drive the data to one of its cross-point switches 379 via a first one of the programmable interconnects 361 of its intra-chip interconnects; said one of its cross-point switches 379 may pass the data from the first one of the programmable interconnects 361 of its intra-chip interconnects to a second one of the programmable interconnects 361 of its intra-chip interconnects to be passed to a second one of its small I/O circuits 203; the second one of its small I/O circuits 203 may drive the data to one of the small I/O circuits 203 of one of the standard commodity FPGA IC chips 200 of the standard commodity logic drive 300 via one or more of the programmable interconnects 361 of the inter-chip interconnects 371 of the standard commodity logic drive 300. For said one of the standard commodity FPGA IC chips 200, said one of its small I/O circuits 203 may drive the data to one of its cross-point switches 379 through a first group of programmable interconnects 361 of its intra-chip interconnects 502 as seen in FIGS. 12A and 12B; said one of its cross-point switches 379 may pass the data from the first group of programmable interconnects 361 of its intra-chip interconnects 502 to a second group of programmable interconnects 361 of its intra-chip interconnects 502 to be associated with a data input of the first input set of one of its programmable logic cells (LC) 201 as seen in FIGS. 6 and 7A-7H.

Referring to FIGS. 14 and 15, in another aspect, for a first one of the standard commodity FPGA IC chips 200 of the standard commodity logic drive 300, one of its programmable logic cells (LC) 2014 as seen in FIGS. 6 and 7A-7J may have the data output to be passed to one of its cross-point switches 379 via a first group of programmable interconnects 361 of its intra-chip interconnects 502; said one of its cross-point switches 379 may pass the data output of said one of its programmable logic cells (LC) 2014 from the first group of programmable interconnects 361 of its intra-chip interconnects 502 to a second group of programmable interconnects 361 of its intra-chip interconnects 502 to be passed to one of its small I/O circuits 203; said one of its small I/O circuits 203 may drive the data output of said one of its programmable logic cells (LC) 2014 to a first one of the small I/O circuits 203 of one of the DPIIC chips 410 of the standard commodity logic drive 300 via one or more of programmable interconnects 361 of the inter-chip interconnects 371 of the standard commodity logic drive 300. For said one of the DPIIC chips 410, the first one of its small I/O circuits 203 may drive the data output of said one of its programmable logic cells (LC) 2014 to one of its cross-point switches 379 via a first group of programmable interconnects 361 of its intra-chip interconnects; said one of its cross-point switches 379 may pass the data output of said one of its programmable logic cells (LC) 2014 from the first group of programmable interconnects 361 of its intra-chip interconnects to a second group of programmable interconnects 361 of its intra-chip interconnects to be passed to a second one of its small I/O circuits 203; the second one of its small I/O circuits 203 may drive the data output of said one of its programmable logic cells (LC) 2014 to one of the small I/O circuits 203 of a second one of the standard commodity FPGA IC chips 200 of the standard commodity logic drive 300 via one or more of the programmable interconnects 361 of the inter-chip interconnects 371 of the standard commodity logic drive 300. For the second one of the FPGA IC chips 200, said one of its small I/O circuits 203 may drive the data output of said one of its programmable logic cells (LC) 2014 to one of its cross-point switches 379 through a first group of programmable interconnects 361 of its intra-chip interconnects 502; said one of its cross-point switches 379 may pass the data output of said one of its programmable logic cells (LC) 2014 from the first group of programmable interconnects 361 of its intra-chip interconnects 502 to a second group of programmable interconnects 361 of its intra-chip interconnects 502 to be associated with a data input of the input data set of one of its programmable logic cells (LC) 2014 as seen in FIGS. 6 and 7A-7J.

Referring to FIGS. 14 and 15, in another aspect, for one of the standard commodity FPGA IC chips 200 of the standard commodity logic drive 300, one of its programmable logic cells (LC) 2014 as seen in FIGS. 6 and 7A-7J may have a data output to be passed to one of its cross-point switches 379 via a first group of programmable interconnects 361 of its intra-chip interconnects 502; said one of its cross-point switches 379 may pass the data output of said one of its programmable logic cells (LC) 2014 from the first group of programmable interconnects 361 of its intra-chip interconnects 502 to a second group of programmable interconnects 361 of its intra-chip interconnects 502 to be passed to one of its small I/O circuits 203; said one of its small I/O circuits 203 may drive the data output of said one of its programmable logic cells (LC) 2014 to a first one of the small I/O circuits 203 of one of the DPIIC chips 410 of the standard commodity FPGA IC chips 200 via one or more of the programmable interconnects 361 of the inter-chip interconnects 371 of the standard commodity FPGA IC chips 200. For said one of the DPIIC chips 410, the first one of its small I/O circuits 203 may drive the data output of said one of its programmable logic cells (LC) 2014 to one of its cross-point switches 379 via a first group of programmable interconnects 361 of its intra-chip interconnects; said one of its cross-point switches 379 may pass the data output of said one of its programmable logic cells (LC) 2014 from the first group of programmable interconnects 361 of its intra-chip interconnects to a second group of programmable interconnects 361 of its intra-chip interconnects to be passed to a second one of its small I/O circuits 203; the second one of its small I/O circuits 203 may drive the data output of said one of its programmable logic cells (LC) 2014 to one of the small I/O circuits 203 of one of the dedicated I/O chips 265 of the standard commodity FPGA IC chips 200 via one or more of programmable interconnects 361 of the inter-chip interconnects 371 of the standard commodity FPGA IC chips 200. For said one of the dedicated I/O chips 265, said one of its small I/O circuits 203 may drive the data output of said one of its programmable logic cells (LC) 2014 to one of its large I/O circuits 341 to be passed to the external circuitry 271 outside the standard commodity logic drive 300.

(3) Accessibility

Referring to FIGS. 14 and 15, the external circuitry 271 outside the standard commodity logic drive 300 may not be allowed to reload the resulting values and first, second and third programming codes from any of the NVM IC chips 250 of the standard commodity logic drive 300. Alternatively, the external circuitry 271 outside the standard commodity logic drive 300 may be allowed to reload the resulting values and first, second and third programming codes from one or more of the NVM IC chips 250 of the standard commodity logic drive 300.

Figure 16:
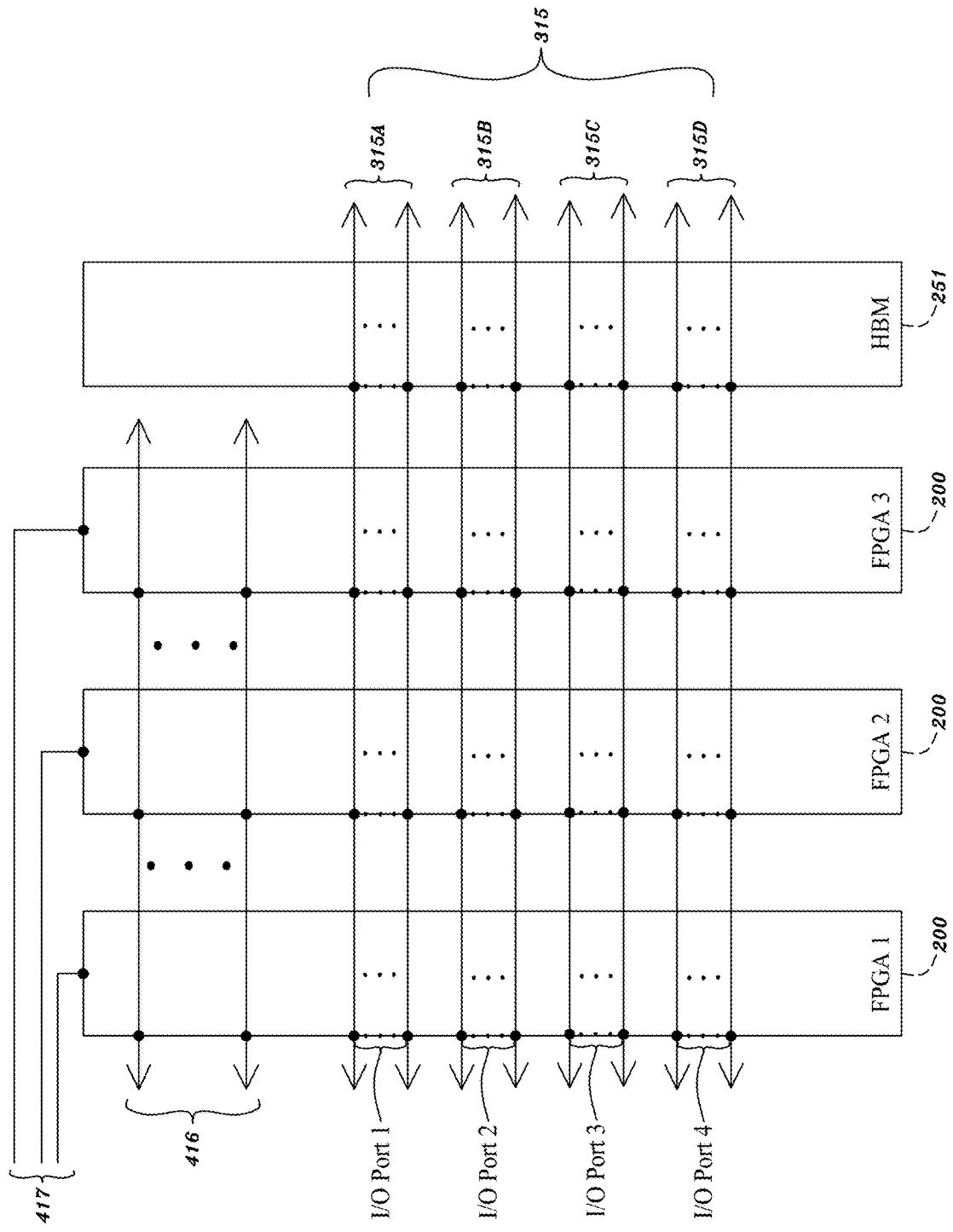
FIG. 16 is a block diagram illustrating multiple control buses for one or more standard commodity FPGA IC chips and multiple data buses for one or more standard commodity FPGA IC chips and high bandwidth memory (HBM) IC chips in accordance with the present application.

Data and Control Buses for Expandable Logic Scheme Based on Standard Commodity FPGA IC Chips and/or High Bandwidth Memory (HBM) IC Chips FIG. 16 is a block diagram illustrating multiple control buses for one or more standard commodity FPGA IC chips and multiple data buses for an expandable logic scheme based on one or more standard commodity FPGA IC chips and high bandwidth memory (HBM) IC chips in accordance with the present application. Referring to FIGS. 12A, 12B, 14 and 16, the standard commodity logic drive 300 may be provided with multiple control buses 416 each constructed from multiple of the programmable interconnects 361 of its inter-chip interconnects 371 or multiple of the fixed interconnects 364 of its inter-chip interconnects 371.

For example, in the arrangement as illustrated in FIG. 12A, for the standard commodity logic drive 300, one of its control buses 416 may couple the input-enable (IE) pads 221 of all of its standard commodity FPGA IC chips 200 to each other or one another. Another of its control buses 416 may couple the IS1 pads 226 of all of its standard commodity FPGA IC chips 200 to each other or one another. Another of its control buses 416 may couple the IS2 pads 226 of all of its standard commodity FPGA IC chips 200 to each other or one another. Another of its control buses 416 may couple the output-enable (OE) pad 227 of all of its standard commodity FPGA IC chips 200 to each other or one another. Another of its control buses 416 may couple the OS1 pads 228 of all of its standard commodity FPGA IC chips 200 to each other or one another. Another of its control buses 416 may couple the OS2 pads 228 of all of its standard commodity FPGA IC chips 200 to each other or one another.

For example, in the arrangement as illustrated in FIG. 12B, for the standard commodity logic drive 300, one of its control buses 416 may couple the IS1 pads 231 of all of its standard commodity FPGA IC chips 200 to each other or one another. Another of its control buses 416 may couple the IS2 pads 231 of all of its standard commodity FPGA IC chips 200 to each other or one another. Another of its control buses 416 may couple the IS3 pads 231 of all of its standard commodity FPGA IC chips 200 to each other or one another. Another of its control buses 416 may couple the IS4 pads 231 of all of its standard commodity FPGA IC chips 200 to each other or one another. Another of its control buses 416 may couple the OS1 pads 232 of all of its standard commodity FPGA IC chips 200 to each other or one another. Another of its control buses 416 may couple the OS2 pads 232 of all of its standard commodity FPGA IC chips 200 to each other or one another. Another of its control buses 416 may couple the OS3 pads 232 of all of its standard commodity FPGA IC chips 200 to each other or one another. Another of its control buses 416 may couple the OS4 pads 232 of all of its standard commodity FPGA IC chips 200 to each other or one another.

Referring to FIGS. 12A, 12B, 14 and 16, the standard commodity logic drive 300 may be provided with multiple chip-enable (CE) lines 417 each constructed from one or more of the programmable interconnects 361 of its inter-chip interconnects 371 or one or more of the fixed interconnects 364 of its inter-chip interconnects 371 to couple to the chip-enable (CE) pad 209 of one of its standard commodity FPGA IC chips 200.

Furthermore, referring to FIGS. 12A, 12B, 14 and 16, the standard commodity logic drive 300 may be provided with a set of data buses 315 for use in an expandable interconnection scheme. In this case, for the standard commodity logic drive 300, the set of its data buses 315 may include four data bus subsets or data buses, e.g., 315A, 315B, 315C and 315D, each coupling to or being associated with one of the I/O ports 377, e.g., I/O Port 1, I/O Port 2, I/O Port 3 and I/O Port 4, of each of its standard commodity FPGA IC chips 200 and one of multiple I/O ports of each of its high bandwidth memory (HBM) IC chips 251, that is, the data bus 315A couples to and is associated with one of the I/O ports 377, e.g., I/O Port 1, of each of its standard commodity FPGA IC chips 200 and a first one of the I/O ports of each of its high bandwidth memory (HBM) IC chips 251; the data bus 315B couples to and is associated with one of the I/O ports 377, e.g., I/O Port 2, of each of its standard commodity FPGA IC chips 200 and a second one of the I/O ports of each of its high bandwidth memory (HBM) IC chips 251; the data bus 315C couples to and is associated with one of the I/O ports 377, e.g., I/O Port 3, of each of its standard commodity FPGA IC chips 200 and a third one of the I/O ports of each of its high bandwidth memory (HBM) IC chips 251; and the data bus 315D couples to and is associated with one of the I/O ports 377, e.g., I/O Port 4, of each of its standard commodity FPGA IC chips 200 and a fourth one of the I/O ports of each of its high bandwidth memory (HBM) IC chips 251. Each of the four data buses, e.g., 315A, 315B, 315C and 315D, may provide data transmission with bit width ranging from 4 to 256, such as 64 for a case. In this case, for the standard commodity logic drive 300, each of its four data buses, e.g., 315A, 315B, 315C and 315D, may be composed of multiple data paths, having the number of 64 arranged in parallel, coupling respectively to the I/O pads 372, having the number of 64 arranged in parallel, of one of the I/O ports 377, e.g., I/O Port 1, I/O Port 2, I/O Port 3 and I/O Port 4, of each of its standard commodity FPGA IC chips 200, wherein each of the data paths of said each of its four data buses, e.g., 315A, 315B, 315C and 315D, may be constructed from multiple of the programmable interconnects 361 of its inter-chip interconnects 371 or multiple of the fixed interconnects 364 of its inter-chip interconnects 371.

Furthermore, referring to FIGS. 12A, 12B, 14 and 16, for the standard commodity logic drive 300, each of its data buses 315 may pass data for each of its standard commodity FPGA IC chips 200 and each of its high bandwidth memory (HBM) IC chips 251 (only one is shown in FIG. 16). For example, in a first clock cycle, for the standard commodity logic drive 300, a first one of its standard commodity FPGA IC chips 200 may be selected in accordance with a logic level at the chip-enable pad 209 of the first one of its standard commodity FPGA IC chips 200 to be enabled to pass data for the input operation of the first one of its standard commodity FPGA IC chips 200, and a second one of its standard commodity FPGA IC chips 200 may be selected in accordance with a logic level at the chip-enable pad 209 of the second one of its standard commodity FPGA IC chips 200 to be enabled to pass data for the output operation of the second one of its standard commodity FPGA IC chips 200. In the arrangement as illustrated in FIG. 12A, for the first one of the standard commodity FPGA IC chips 200 of the standard commodity logic drive 300, an I/O port, e.g. I/O Port 1, may be selected from its I/O ports 377, e.g., I/O Port 1, I/O Port 2, I/O Port 3 and I/O Port 4, to activate the small receivers 375 of the small I/O circuits 203 of its selected I/O port 377, e.g. I/O Port 1, in accordance with logic levels at its input-enable (IE) pad 221 and its input-selection (IS) pads 226, e.g., IS1 and IS2 pads, and to disable the small drivers 374 of the small I/O circuits 203 of its selected I/O port 377, e.g. I/O Port 1; for the second one of its standard commodity FPGA IC chips 200, the same I/O port, e.g. I/O Port 1, may be selected from its I/O ports 377, e.g., I/O Port 1, I/O Port 2, I/O Port 3 and I/O Port 4, to enable the small drivers 374 of the small I/O circuits 203 of its selected I/O port 377, e.g. I/O Port 1, in accordance with logic levels at its output-enable (OE) pad 227 and its output-selection (OS) pads 228, e.g., OS1 and OS2 pads, and to inhibit the small receivers 375 of the small I/O circuits 203 of its selected I/O port 377, e.g. I/O Port 1. Alternatively, in the arrangement as illustrated in FIG. 12B, for the first one of the standard commodity FPGA IC chips 200 of the standard commodity logic drive 300, an I/O port, e.g. I/O Port 1, may be selected from its I/O ports 377, e.g., I/O Port 1, I/O Port 2, I/O Port 3 and I/O Port 4, to activate the small receivers 375 of the small I/O circuits 203 of its selected I/O port 377, e.g. I/O Port 1, in accordance with logic levels at its input-selection (IS) pads 231, e.g., IS1, IS2, IS3 and IS4 pads, and to disable the small drivers 374 of the small I/O circuits 203 of its selected I/O port 377, e.g. I/O Port 1, in accordance with logic levels at its output-selection (OS) pads 232, e.g., 0S1, OS2, OS3 and OS4 pads; for the second one of its standard commodity FPGA IC chips 200, the same I/O port, e.g. I/O Port 1, may be selected from its I/O ports 377, e.g., I/O Port 1, I/O Port 2, I/O Port 3 and I/O Port 4, to enable the small drivers 374 of the small I/O circuits 203 of its selected I/O port 377, e.g. I/O Port 1, in accordance with logic levels at its output-selection (OS) pads 232, e.g., OS1, OS2, OS3 and OS4 pads, and to inhibit the small receivers 375 of the small I/O circuits 203 of its selected I/O port 377, e.g. I/O Port 1, in accordance with logic levels at its input-selection (IS) pads 231, e.g., IS1, IS2, IS3 and IS4 pads. Thereby, in the arrangement as illustrated in FIGS. 12A and 12B, in the first clock cycle, for the standard commodity logic drive 300, the selected I/O port, e.g., I/O Port 1, of the second one of its standard commodity FPGA IC chips 200 may have the small drivers 374 to drive or pass first data associated with the data output of one of the programmable logic cells (LC) 2014 of the second one of its standard commodity FPGA IC chips 200, for example, to a first one, e.g., 315A, of its data buses 315 and the small receivers 375 of the selected I/O port, e.g., I/O Port 1, of the first one of its standard commodity FPGA IC chips 200 may receive the first data to be associated with a data input of the input data set of one of the programmable logic cells (LC) 2014 of the first one of its standard commodity FPGA IC chips 200, for example, from the first one, e.g., 315A, of its data buses 315. The first one, e.g., 315A, of its data buses 315 may have the data paths each coupling the small driver 374 of one of the small I/O circuits 203 of the selected I/O port, e.g., I/O Port 1, of the second one of its standard commodity FPGA IC chips 200 to the small receiver 375 of one of the small I/O circuits 203 of the selected I/O port, e.g., I/O Port 1, of the first one of its standard commodity FPGA IC chips 200.

Furthermore, referring to FIGS. 12A, 12B, 14 and 16, in the first clock cycle, for the standard commodity logic drive 300, a third one of its standard commodity FPGA IC chips 200 may be selected in accordance with a logic level at the chip-enable pad 209 of the third one of its standard com-modity FPGA IC chips 200 to be enabled to pass data for the input operation of the third one of its standard commodity FPGA IC chips 200. In the arrangement as illustrated in FIG. 12A, for the third one of the standard commodity FPGA IC chips 200 of the standard commodity logic drive 300, an I/O port, e.g. I/O Port 1, may be selected from its I/O ports 377, e.g., I/O Port 1, I/O Port 2, I/O Port 3 and I/O Port 4, to activate the small receivers 375 of the small I/O circuits 203 of its selected I/O port 377, e.g. I/O Port 1, in accordance with logic levels at its input-enable (IE) pad 221 and its input-selection (IS) pads 226, e.g., IS1 and IS2 pads, and to disable the small drivers 374 of the small I/O circuits 203 of its selected I/O port 377, e.g. I/O Port 1. Alternatively, in the arrangement as illustrated in FIG. 12B, for the third one of the standard commodity FPGA IC chips 200 of the standard commodity logic drive 300, an I/O port, e.g. I/O Port 1, may be selected from its I/O ports 377, e.g., I/O Port 1, I/O Port 2, I/O Port 3 and I/O Port 4, to activate the small receivers 375 of the small I/O circuits 203 of its selected I/O port 377, e.g. I/O Port 1, in accordance with logic levels at its input-selection (IS) pads 231, e.g., IS1, IS2, IS3 and IS4 pads, and to disable the small drivers 374 of the small I/O circuits 203 of its selected I/O port 377, e.g. I/O Port 1, in accordance with logic levels at its output-selection (OS) pads 232, e.g., OS1, OS2, OS3 and OS4 pads. Thereby, in the arrangement as illustrated in FIGS. 12A and 12B, in the first clock cycle, for the standard commodity logic drive 300, the small receivers 375 of the selected I/O port, e.g., I/O Port 1, of the third one of its standard commodity FPGA IC chips 200 may receive the first data to be associated with a data input of the input data set of one of the programmable logic cells (LC) 2014 of the third one of its standard commodity FPGA IC chips 200, for example, from the first one, e.g., 315A, of its data buses 315. The first one, e.g., 315A, of its data buses 315 may have the data paths each coupling to the small receiver 375 of one of the small I/O circuits 203 of the selected I/O port, e.g., I/O Port 1, of the third one of its standard commodity FPGA IC chips 200. For the others of the standard commodity FPGA IC chips 200 of the standard commodity logic drive 300, the small driver and receiver 374 and 375 of each of the small I/O circuits 203 of their I/O ports 377, e.g. I/O Port 1, coupling to the first one, e.g., 315A, of its data buses 315 may be disabled and inhibited. For all of the high bandwidth memory (HBM) IC chips 251 of the standard commodity logic drive 300, the small driver and receiver 374 and 375 of each of the small I/O circuits 203 of their I/O ports, e.g. first I/O Port, coupling to the first one, e.g., 315A, of the data buses 315 of the standard commodity logic drive 300 may be disabled and inhibited.

Furthermore, referring to FIGS. 12A, 12B, 14 and 16, in the first clock cycle, in the arrangement as illustrated in FIG. 12A, for the first one of the standard commodity FPGA IC chips 200 of the standard commodity logic drive 300, another I/O port, e.g. I/O Port 2, may be selected from its I/O ports 377, e.g., I/O Port 1, I/O Port 2, I/O Port 3 and I/O Port 4, to enable the small drivers 374 of the small I/O circuits 203 of its selected I/O port 377, e.g. I/O Port 2, in accordance with logic levels at its output-enable (OE) pad 227 and its output-selection (OS) pads 228, e.g., OS1 and OS2 pads, and to inhibit the small receivers 375 of the small I/O circuits 203 of its selected I/O port 377, e.g. I/O Port 2; for the second one of its standard commodity FPGA IC chips 200, the same I/O port, e.g. I/O Port 2, may be selected from its I/O ports 377, e.g., I/O Port 1, I/O Port 2, I/O Port 3 and I/O Port 4, to activate the small receivers 375 of the small I/O circuits 203 of its selected I/O port 377, e.g. I/O Port 2, in accordance with logic levels at its input-enable (IE) pad 221 and its input-selection (IS) pads 226, e.g., IS1 and IS2 pads, and to disable the small drivers 374 of the small I/O circuits 203 of its selected I/O port 377, e.g. I/O Port 2. Alternatively, in the arrangement as illustrated in FIG. 12B, for the first one of the standard commodity FPGA IC chips 200 of the standard commodity logic drive 300, an I/O port, e.g. I/O Port 2, may be selected from its I/O ports 377, e.g., I/O Port 1, I/O Port 2, I/O Port 3 and I/O Port 4, to enable the small drivers 374 of the small I/O circuits 203 of its selected I/O port 377, e.g. I/O Port 2, in accordance with logic levels at its output-selection (OS) pads 232, e.g., OS1, OS2, OS3 and OS4 pads, and to inhibit the small receivers 375 of the small I/O circuits 203 of its selected I/O port 377, e.g. I/O Port 2, in accordance with logic levels at its input-selection (IS) pads 231, e.g., IS1, IS2, IS3 and IS4 pads; for the second one of its standard commodity FPGA IC chips 200, the same I/O port, e.g. I/O Port 2, may be selected from its I/O ports 377, e.g., I/O Port 1, I/O Port 2, I/O Port 3 and I/O Port 4, to activate the small receivers 375 of the small I/O circuits 203 of its selected I/O port 377, e.g. I/O Port 2, in accordance with logic levels at its input-selection (IS) pads 231, e.g., IS1, IS2, IS3 and IS4 pads, and to disable the small drivers 374 of the small I/O circuits 203 of its selected I/O port 377, e.g. I/O Port 2, in accordance with logic levels at its output-selection (OS) pads 232, e.g., OS1, OS2, OS3 and OS4 pads. Thereby, in the arrangement as illustrated in FIGS. 12A and 12B, in the first clock cycle, for the standard commodity logic drive 300, the selected I/O port, e.g., I/O Port 2, of the first one of its standard commodity FPGA IC chips 200 may have the small drivers 374 to drive or pass additional data associated with the data output of said one of the programmable logic cells (LC) 2014 of the first one of its standard commodity FPGA IC chips 200, for example, to a second one, e.g., 315B, of its data buses 315 and the small receivers 375 of the selected I/O port, e.g., I/O Port 2, of the second one of its standard commodity FPGA IC chips 200 may receive the additional data to be associated with a data input of the input data set of said one of the programmable logic cells (LC) 2014 of the second one of its standard commodity FPGA IC chips 200, for example, from the second one, e.g., 315B, of its data buses 315. The second one, e.g., 315B, of its data buses 315 may have the data paths each coupling the small driver 374 of one of the small I/O circuits 203 of the selected I/O port, e.g., I/O Port 2, of the first one of its standard commodity FPGA IC chips 200 to the small receiver 375 of one of the small I/O circuits 203 of the selected I/O port, e.g., I/O Port 2, of the second one of its standard commodity FPGA IC chips 200. For example, said one of the programmable logic cells (LC) 2014 of the first one of its standard commodity FPGA IC chips 200 may be programmed to perform logic operation for multiplication.

Further, referring to FIGS. 12A, 12B, 14 and 16, in a second clock cycle, for the standard commodity logic drive 300, the first one of its standard commodity FPGA IC chips 200 may be selected in accordance with the logic level at the chip-enable pad 209 of the first one of its standard commodity FPGA IC chips 200 to be enabled to pass data for the input operation of the first one of its standard commodity FPGA IC chips 200. In the arrangement as illustrated in FIG. 12A, for the first one of the standard commodity FPGA IC chips 200 of the standard commodity logic drive 300, the I/O port, e.g. I/O Port 1, may be selected from its I/O ports 377, e.g., I/O Port 1, I/O Port 2, I/O Port 3 and I/O Port 4, to activate the small receivers 375 of the small I/O circuits 203 of its selected I/O port 377, e.g. I/O Port 1, in accordance with logic levels at its input-enable (IE) pad 221 and its input-selection (IS) pads 226, e.g., IS1 and IS2 pads, and to disable the small drivers 374 of the small I/O circuits 203 of its selected I/O port 377, e.g. I/O Port 1. Alternatively, in the arrangement as illustrated in FIG. 12B, for the first one of the standard commodity FPGA IC chips 200 of the standard commodity logic drive 300, the I/O port, e.g. I/O Port 1, may be selected from its I/O ports 377, e.g., I/O Port 1, I/O Port 2, I/O Port 3 and I/O Port 4, to activate the small receivers 375 of the small I/O circuits 203 of its selected I/O port 377, e.g. I/O Port 1, in accordance with logic levels at its input-selection (IS) pads 231, e.g., IS1, IS2, IS3 and IS4 pads, and to disable the small drivers 374 of the small I/O circuits 203 of its selected I/O port 377, e.g. I/O Port 1, in accordance with logic levels at its output-selection (OS) pads 232, e.g., OS1, OS2, OS3 and OS4 pads. Further, in the second clock cycle, for the standard commodity logic drive 300, a first one of its high bandwidth memory (HBM) IC chips 251 may be selected to be enabled to pass data for an output operation of the first one of its high bandwidth memory (HBM) IC chips 251. For the first one of the high bandwidth memory (HBM) IC chips 251 of the standard commodity logic drive 300, its first I/O port may be selected from its I/O ports, e.g., first, second, third and fourth I/O ports, to enable the small drivers 374 of the small I/O circuits 203 of its selected I/O port, e.g. first I/O Port, in accordance with logic levels at its I/O-port selection pads, and to inhibit the small receivers 375 of the small I/O circuits 203 of its selected I/O port, e.g. first I/O Port, in accordance with logic levels at its I/O-port selection pads. Thereby, in the arrangement as illustrated in FIGS. 12A and 12B, in the second clock cycle, for the standard commodity logic drive 300, the selected I/O port, e.g., first I/O Port, of the first one of its high bandwidth memory (HBM) IC chips 251 may have the small drivers 374 to drive or pass second data to the first one, e.g., 315A, of its data buses 315 and the small receivers 375 of the selected I/O port, e.g., I/O Port 1, of the first one of its standard commodity FPGA IC chips 200 may receive the second data to be associated with a data input of the input data set of said one of the programmable logic cells (LC) 2014 of the first one of its standard commodity FPGA IC chips 200, for example, from the first one, e.g., 315A, of its data buses 315. The first one, e.g., 315A, of its data buses 315 may have the data paths each coupling the small driver 374 of one of the small I/O circuits 203 of the selected I/O port, e.g., first I/O port, of the first one of its high bandwidth memory (HBM) IC chips 251 to the small receiver 375 of one of the small I/O circuits 203 of the selected I/O port, e.g., I/O Port 1, of the first one of its standard commodity FPGA IC chips 200.

Furthermore, referring to FIGS. 12A, 12B, 14 and 16, in the second clock cycle, for the standard commodity logic drive 300, the second one of its standard commodity FPGA IC chips 200 may be selected in accordance with a logic level at the chip-enable pad 209 of the second one of its standard commodity FPGA IC chips 200 to be enabled to pass data for the input operation of the third one of its standard commodity FPGA IC chips 200. In the arrangement as illustrated in FIG. 12A, for the second one of the standard commodity FPGA IC chips 200 of the standard commodity logic drive 300, an I/O port, e.g. I/O Port 1, may be selected from its I/O ports 377, e.g., I/O Port 1, I/O Port 2, I/O Port 3 and I/O Port 4, to activate the small receivers 375 of the small I/O circuits 203 of its selected I/O port 377, e.g. I/O Port 1, in accordance with logic levels at its input-enable (IE) pad 221 and its input-selection (IS) pads 226, e.g., IS1 and IS2 pads, and to disable the small drivers 374 of the small I/O circuits 203 of its selected I/O port 377, e.g. I/O Port 1. Alternatively, in the arrangement as illustrated in FIG. 12B, for the second one of the standard commodity FPGA IC chips 200 of the standard commodity logic drive 300, an I/O port, e.g. I/O Port 1, may be selected from its I/O ports 377, e.g., I/O Port 1, I/O Port 2, I/O Port 3 and I/O Port 4, to activate the small receivers 375 of the small I/O circuits 203 of its selected I/O port 377, e.g. I/O Port 1, in accordance with logic levels at its input-selection (IS) pads 231, e.g., IS1, IS2, IS3 and IS4 pads, and to disable the small drivers 374 of the small I/O circuits 203 of its selected I/O port 377, e.g. I/O Port 1, in accordance with logic levels at its output-selection (OS) pads 232, e.g., OS1, OS2, OS3 and OS4 pads. Thereby, in the arrangement as illustrated in FIGS. 12A and 12B, in the second clock cycle, for the standard commodity logic drive 300, the small receivers 375 of the selected I/O port, e.g., I/O Port 1, of the second one of its standard commodity FPGA IC chips 200 may receive the second data to be associated with a data input of the input data set of said one of the programmable logic cells (LC) 2014 of the second one of its standard commodity FPGA IC chips 200, for example, from the first one, e.g., 315A, of its data buses 315. The first one, e.g., 315A, of its data buses 315 may have the data paths each coupling to the small receiver 375 of one of the small I/O circuits 203 of the selected I/O port, e.g., I/O Port 1, of the second one of its standard commodity FPGA IC chips 200. For the others of the standard commodity FPGA IC chips 200 of the standard commodity logic drive 300, the small driver and receiver 374 and 375 of each of the small I/O circuits 203 of their I/O ports 377, e.g. I/O Port 1, coupling to the first one, e.g., 315A, of the data buses 315 of the standard commodity logic drive 300 may be disabled and inhibited. For the others of the high bandwidth memory (HBM) IC chips 251 of the standard commodity logic drive 300, the small driver and receiver 374 and 375 of each of the small I/O circuits 203 of their I/O ports, e.g. first I/O Port, coupling to the first one, e.g., 315A, of the data buses 315 of the standard commodity logic drive 300 may be disabled and inhibited.

Further, referring to FIGS. 12A, 12B, 14 and 16, in a third clock cycle, for the standard commodity logic drive 300, the first one of its standard commodity FPGA IC chips 200 may be selected in accordance with a logic level at the chip-enable pad 209 of the first one of its standard commodity FPGA IC chips 200 to be enabled to pass data for the output operation of the first one of its standard commodity FPGA IC chips 200. In the arrangement as illustrated in FIG. 12A, for the first one of the standard commodity FPGA IC chips 200 of the standard commodity logic drive 300, the I/O port, e.g. I/O Port 1, may be selected from its I/O ports 377, e.g., I/O Port 1, I/O Port 2, I/O Port 3 and I/O Port 4, to enable the small drivers 374 of the small I/O circuits 203 of its selected I/O port 377, e.g. I/O Port 1, in accordance with logic levels at its output-enable (OE) pad 227 and its output-selection (OS) pads 228, e.g., OS1 and OS2 pads, and to inhibit the small receivers 375 of the small I/O circuits 203 of its selected I/O port 377, e.g. I/O Port 1. Alternatively, in the arrangement as illustrated in FIG. 12B, for the first one of the standard commodity FPGA IC chips 200 of the standard commodity logic drive 300, the I/O port, e.g. I/O Port 1, may be selected from its I/O ports 377, e.g., I/O Port 1, I/O Port 2, I/O Port 3 and I/O Port 4, to enable the small drivers 374 of the small I/O circuits 203 of its selected I/O port 377, e.g. I/O Port 1, in accordance with logic levels at its output-selection (OS) pads 232, e.g., OS1, OS2, OS3 and OS4 pads, and to inhibit the small receivers 375 of the small I/O circuits 203 of its selected I/O port 377, e.g. I/O Port 1, in accordance with logic levels at its input-selection (IS) pads 231, e.g., IS1, IS2, IS3 and IS4 pads. Further, in the third clock cycle, for the standard commodity logic drive 300, the first one of its high bandwidth memory (HBM) IC chips 251 may be selected to be enabled to pass data for an input operation of the first one of its high bandwidth memory (HBM) IC chips 251. For the first one of the high bandwidth memory (HBM) IC chips 251 of the standard commodity logic drive 300, its first I/O port may be selected from its I/O ports, e.g., first, second, third and fourth I/O ports, to activate the small receivers 375 of the small I/O circuits 203 of its selected I/O port, e.g. first I/O Port, in accordance with logic levels at its I/O-port selection pads, and to disable the small drivers 374 of the small I/O circuits 203 of its selected I/O port, e.g. first I/O Port, in accordance with logic levels at its I/O-port selection pads. Thereby, in the arrangement as illustrated in FIGS. 12A and 12B, in the third clock cycle, for the standard commodity logic drive 300, the selected I/O port, e.g., first I/O Port, of the first one of its high bandwidth memory (HBM) IC chips 251 may have the small receivers 375 to receive third data from the first one, e.g., 315A, of its data buses 315 and the small drivers 374 of the selected I/O port, e.g., I/O Port 1, of the first one of its standard commodity FPGA IC chips 200 may drive or pass the third data associated with the data output of said one of the programmable logic cells (LC) 2014 of the first one of its standard commodity FPGA IC chips 200, for example, to the first one, e.g., 315A, of its data buses 315. The first one, e.g., 315A, of its data buses 315 may have the data paths each coupling the small driver 374 of one of the small I/O circuits 203 of the selected I/O port, e.g., I/O Port 1, of the first one of its standard commodity FPGA IC chips 200 to the small receiver 375 of one of the small I/O circuits 203 of the selected I/O port, e.g., first I/O port, of the first one of its high bandwidth memory (HBM) IC chips 251.

Furthermore, referring to FIGS. 12A, 12B, 14 and 16, in the third clock cycle, for the standard commodity logic drive 300, the second one of its standard commodity FPGA IC chips 200 may be selected in accordance with a logic level at the chip-enable pad 209 of the second one of its standard commodity FPGA IC chips 200 to be enabled to pass data for the input operation of the second one of its standard commodity FPGA IC chips 200. In the arrangement as illustrated in FIG. 12A, for the second one of the standard commodity FPGA IC chips 200 of the standard commodity logic drive 300, an I/O port, e.g. I/O Port 1, may be selected from its I/O ports 377, e.g., I/O Port 1, I/O Port 2, I/O Port 3 and I/O Port 4, to activate the small receivers 375 of the small I/O circuits 203 of its selected I/O port 377, e.g. I/O Port 1, in accordance with logic levels at its input-enable (IE) pad 221 and its input-selection (IS) pads 226, e.g., IS1 and IS2 pads, and to disable the small drivers 374 of the small I/O circuits 203 of its selected I/O port 377, e.g. I/O Port 1. Alternatively, in the arrangement as illustrated in FIG. 12B, for the second one of the standard commodity FPGA IC chips 200 of the standard commodity logic drive 300, an I/O port, e.g. I/O Port 1, may be selected from its I/O ports 377, e.g., I/O Port 1, I/O Port 2, I/O Port 3 and I/O Port 4, to activate the small receivers 375 of the small I/O circuits 203 of its selected I/O port 377, e.g. I/O Port 1, in accordance with logic levels at its input-selection (IS) pads 231, e.g., IS1, IS2, IS3 and IS4 pads, and to disable the small drivers 374 of the small I/O circuits 203 of its selected I/O port 377, e.g. I/O Port 1, in accordance with logic levels at its output-selection (OS) pads 232, e.g., OS1, OS2, OS3 and OS4 pads. Thereby, in the arrangement as illustrated in FIGS. 12A and 12B, in the third clock cycle, for the standard commodity logic drive 300, the small receivers 375 of the selected I/O port, e.g., I/O Port 1, of the second one of its standard commodity FPGA IC chips 200 may receive the third data to be associated with a data input of the input data set of said one of the programmable logic cells (LC) 2014 of the second one of its standard commodity FPGA IC chips 200, for example, from the first one, e.g., 315A, of its data buses 315. The first one, e.g., 315A, of its data buses 315 may have the data paths each coupling to the small receiver 375 of one of the small I/O circuits 203 of the selected I/O port, e.g., I/O Port 1, of the second one of its standard commodity FPGA IC chips 200. For the others of the standard commodity FPGA IC chips 200 of the standard commodity logic drive 300, the small driver and receiver 374 and 375 of each of the small I/O circuits 203 of their I/O ports 377, e.g. I/O Port 1, coupling to the first one, e.g., 315A, of its data buses 315 may be disabled and inhibited. For the others of the high bandwidth memory (HBM) IC chips 251 of the standard commodity logic drive 300, the small driver and receiver 374 and 375 of each of the small I/O circuits 203 of their I/O ports, e.g. first I/O Port, coupling to the first one, e.g., 315A, of the data buses 315 of the standard commodity logic drive 300 may be disabled and inhibited.

Further, referring to FIGS. 12A, 12B, 14 and 16, in a fourth clock cycle, for the standard commodity logic drive 300, the first one of its high bandwidth memory (HBM) IC chips 251 may be selected to be enabled to pass data for an input operation of the first one of its high bandwidth memory (HBM) IC chips 251. For the first one of the high bandwidth memory (HBM) IC chips 251 of the standard commodity logic drive 300, its first I/O port may be selected from its I/O ports, e.g., first, second, third and fourth I/O ports, to activate the small receivers 375 of the small I/O circuits 203 of its selected I/O port, e.g. first I/O Port, in accordance with logic levels at its I/O-port selection pads, and to disable the small drivers 374 of the small I/O circuits 203 of its selected I/O port, e.g. first I/O Port, in accordance with logic levels at its I/O-port selection pads. Further, in the fourth clock cycle, for the standard commodity logic drive 300, a second one of its high bandwidth memory (HBM) IC chips 251 may be selected to be enabled to pass data for an output operation of the second one of its high bandwidth memory (HBM) IC chips 251. For the second one of the high bandwidth memory (HBM) IC chips 251 of the standard commodity logic drive 300, its first I/O port may be selected from its I/O ports, e.g., first, second, third and fourth I/O ports, to enable the small drivers 374 of the small I/O circuits 203 of its selected I/O port, e.g. first I/O Port, in accordance with logic levels at its I/O-port selection pads, and to inhibit the small receivers 375 of the small I/O circuits 203 of its selected I/O port, e.g. first I/O Port, in accordance with logic levels at its I/O-port selection pads. Thereby, in the fourth clock cycle, for the standard commodity logic drive 300, the selected I/O port, e.g., first I/O Port, of the first one of its high bandwidth memory (HBM) IC chips 251 may have the small receivers 375 to receive fourth data from the first one, e.g., 315A, of its data buses 315 and the selected I/O port, e.g., first I/O Port, of the second one of its high bandwidth memory (HBM) IC chips 251 may have the small drivers 374 to drive of pass the fourth data to the first one, e.g., 315A, of its data buses 315. The first one, e.g., 315A, of its data buses 315 may have the data paths each coupling the small driver 374 of one of the small I/O circuits 203 of the selected I/O port, e.g., first I/O port, of the second one of its high bandwidth memory (HBM) IC chips 251 to the small receiver 375 of one of the small I/O circuits 203 of the selected I/O port, e.g., first I/O port, of the first one of its high bandwidth memory (HBM) IC chips 251. For all of the standard commodity FPGA IC chips 200 of the standard commodity logic drive 300, the small driver and receiver 374 and 375 of each of the small I/O circuits 203 of their I/O ports 377, e.g. I/O Port 1, coupling to the first one, e.g., 315A, of its data buses 315 may be disabled and inhibited. For the others of the high bandwidth memory (HBM) IC chips 251 of the standard commodity logic drive 300, the small driver and receiver 374 and 375 of each of the small I/O circuits 203 of their I/O ports, e.g. first I/O Port, coupling to the first one, e.g., 315A, of the data buses 315 of the standard commodity logic drive 300 may be disabled and inhibited.

Architecture of Operation in Standard Commodity FPGA IC Chip

Figure 17:
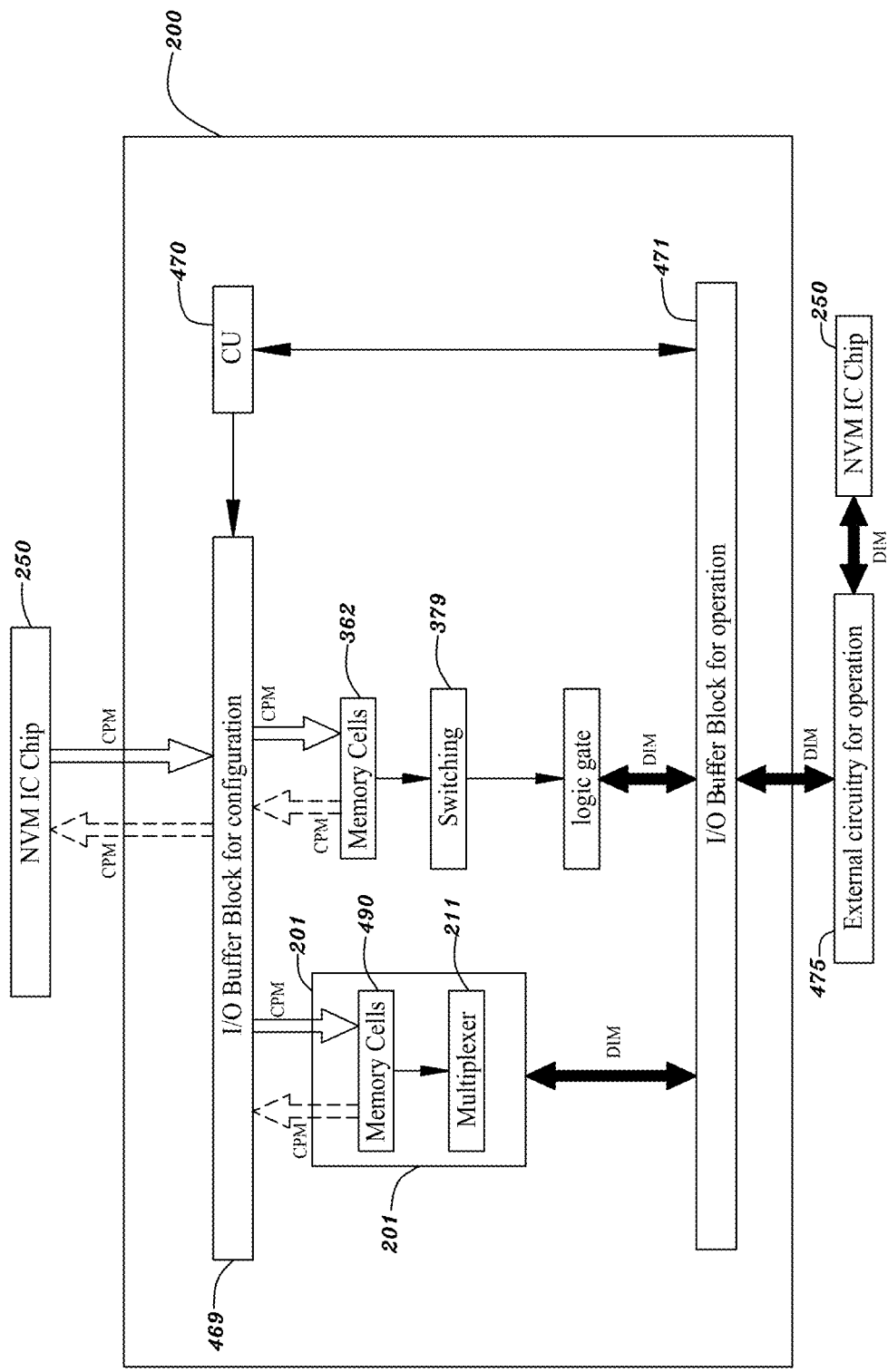
FIG. 17 is a block diagrams showing architecture of programming and operation in a standard commodity FPGA IC chip in accordance with the present application.

FIG. 17 is a block diagrams showing architecture of programming and operation in a standard commodity FPGA IC chip in accordance with the present application. Referring to FIG. 17, One of the non-volatile memory (NVM) IC chips 250 in the standard commodity logic drive 300 as illustrated in FIG. 15 may include three non-volatile memory blocks each composed of multiple non-volatile memory cells arranged in an array. For the standard commodity logic drive 300, the non-volatile memory cells, i.e., configuration programming memory (CPM) cells, of a first one of the three non-volatile memory blocks of said one of its non-volatile memory (NVM) IC chips 250 are configured to save or store original resulting values or programming codes of the look-up tables (LUT) 210 as seen in FIGS. 6 and 7A-7J and original programming codes for the cross-point switches 379 as seen in FIGS. 3A, 3B and 8, i.e., configuration programming memory (CPM) data; the non-volatile memory cells, i.e., configuration programming memory (CPM) cells, of a second one of the three non-volatile memory blocks of said one of its non-volatile memory (NVM) IC chips 250 are configured to save or store immediately-previously self-configured resulting values or programming codes of the look-up tables (LUT) 210 as seen in FIGS. 6 and 7A-7J and immediately-previously self-configured programming codes for the cross-point switches 379 as seen in FIGS. 3A, 3B and 8, i.e., configuration programming memory (CPM) data; the non-volatile memory cells, i.e., configuration programming memory (CPM) cells, of a third one of the three non-volatile memory blocks of said one of its non-volatile memory (NVM) IC chips 250 are configured to save or store currently self-configured resulting values or programming codes of the look-up tables (LUT) 210 as seen in FIGS. 6 and 7A-7J and currently self-configured programming codes for the cross-point switches 379 as seen in FIGS. 3A, 3B and 8, i.e., configuration programming memory (CPM) data.

Referring to FIG. 17, for the standard commodity logic drive 300, the original, immediately-previously self-configured or currently self-configured resulting values or programming codes of the look-up tables (LUT) 210 and the original, immediately-previously self-configured or currently self-configured programming codes for the cross-point switches 379 stored in one of the three non-volatile memory blocks of said one of its non-volatile memory (NVM) IC chips 250 may be passed to the memory cells 490, i.e., configuration programming memory (CPM) cells, of the programmable logic cells (LC) 2014 of its standard commodity FPGA IC chips 200 as illustrated in FIGS. 6 and 7A-7J and the memory cells 362, i.e., configuration programming memory (CPM) cells, for the cross-point switches 379 of its standard commodity FPGA IC chips 200 as illustrated in FIGS. 3A, 3B and 8 through multiple of the small I/O circuits 203 of its standard commodity FPGA IC chips 200 as seen in FIG. 5B, which are defined in an I/O buffering block 469 of its standard commodity FPGA IC chips 200, to be stored in the memory cells 490 of the programmable logic cells (LC) 2014 of its standard commodity FPGA IC chips 200 and the memory cells 362 for the cross-point switches 379 of its standard commodity FPGA IC chips 200, and thereby the programmable logic cells (LC) 2014 of its standard commodity FPGA IC chips 200 may be programmed by the original, immediately-previously self-configured or currently self-configured resulting values or programming codes of the look-up tables (LUT) 210 and the cross-point switches 379 of its standard commodity FPGA IC chips 200 may be programmed by the original, immediately-previously self-configured or currently self-configured programming codes for the cross-point switches 379.

Referring to FIG. 17, for the standard commodity logic drive 300 as illustrated in FIG. 15, multiple data information memory (DIM) cells of circuits 475 external of its standard commodity FPGA IC chips 200, such as SRAM or DRAM cells of one of its HBM IC chips 251, may pass a data information memory (DIM) stream to be associated with the first input data set of the multiplexer 211 of one of the programmable logic cells (LC) 2014 of one of its standard commodity FPGA IC chips 200 through one or more of the small I/O circuits 203 of said one of its standard commodity FPGA IC chips 200 as seen in FIG. 5B, which are defined in an I/O buffering block 471 of said one of its standard commodity FPGA IC chips 200. A data information memory (DIM) cell of circuits 475 external of its standard commodity FPGA IC chips 200, such as SRAM or DRAM cell of said one of its HBM IC chips 251, may receive a data information memory (DIM) stream associated with the data output of the multiplexer 211 of said one of the programmable logic cells (LC) 2014 of said one of its standard commodity FPGA IC chips 200 through one or more of the small I/O circuits 203 of said one of its standard commodity FPGA IC chips 200 as seen in FIG. 5B. One of the cross-point switches 379 of said one of its standard commodity FPGA IC chips 200 may pass a data information memory (DIM) stream for a data input of a logic gate or logic operation, such as data input of the input data set of one of the programmable logic cells (LC) 2014 of said one of its standard commodity FPGA IC chips 200, which is associated with data from a data information memory (DIM) cell of the circuits 475 external of its standard commodity FPGA IC chips 200, such as SRAM or DRAM cell of said one of its HBM IC chips 251, through one or more of the small I/O circuits 203 of said one of its standard commodity FPGA IC chips 200 as seen in FIG. 5B. One of the cross-point switches 379 of said one of its standard commodity FPGA IC chips 200 may pass a data information memory (DIM) stream for a data output of a logic gate or logic operation, such as the data output of one of the programmable logic cells (LC) 2014 of said one of its standard commodity FPGA IC chips 200, which is associated with data to a data information memory (DIM) cell of the circuits 475 external of its standard commodity FPGA IC chips 200, such as SRAM or DRAM cell of said one of its HBM IC chips 251, through one or more of the small I/O circuits 203 of said one of its standard commodity FPGA IC chips 200 as seen in FIG. 5B.

Referring to FIG. 17, for the standard commodity logic drive 300 as illustrated in FIG. 15, the data for the data information memory (DIM) stream saved or stored in the SRAM or DRAM cells, i.e., data information memory (DIM) cells, of one of its HBM IC chips 251 may be backed up or stored in one of its NVM IC chips 250 or circuits outside the standard commodity logic drive 300. Thereby, when the standard commodity logic drive 300 is powered off, the data for the data information memory (DIM) stream stored in said one of the NVM IC chips 250 of the standard commodity logic drive 300 may be kept.

For reconfiguration for artificial intelligence (AI), machine learning or deep learning, for each of the standard commodity FPGA IC chips 200 of the standard commodity logic drive 300 as illustrated in FIG. 15, the current logic operation, such as AND logic operation, of one of its programmable logic cells (LC) 2014 may be self-reconfigured to another logic operation, such as NAND logic operation, by reconfiguring the resulting values or programming codes, i.e., configuration programming memory (CPM) data, in the memory cells 490 of said one of its programmable logic cells (LC) 2014. The current switching state of one of its cross-point switches 379 may be self-reconfigured to another switching state by reconfiguring the programming codes, i.e., configuration programming memory (CPM) data, in the memory cells 362 for said one of its cross-point switches 379. The currently self-reconfigured resulting values or programming codes, i.e., configuration programming memory (CPM) data, in the memory cells 490 of said one of its programmable logic cells (LC) 2014 and in the memory cells 362 for said one of its cross-point switches 379 may be passed to the third one of the three non-volatile memory blocks of said one of the non-volatile memory (NVM) IC chips 250 of the standard commodity logic drive 300 through multiple of its small I/O circuits 203 as seen in FIG. 5B, which are defined in its I/O buffering block 469, to be stored in the non-volatile memory cells, i.e., configuration programming memory (CPM) cells, of the third one of the three non-volatile memory blocks of said one of the non-volatile memory (NVM) IC chips 250 of the standard commodity logic drive 300.

Accordingly, referring to FIG. 17, for the standard commodity logic drive 300, when it is powered on, the currently self-configured configuration programming memory (CPM) data stored or saved in the non-volatile memory cells in the third one of the three non-volatile memory blocks of said one of its non-volatile memory (NVM) IC chips 250 may be reloaded to the memory cells 490 and 362 of its standard commodity FPGA IC chips 200. During operation, its standard commodity FPGA IC chips 200 may be reset to pass the original or immediately-previously self-configured configuration programming memory (CPM) data from the non-volatile memory cells in the first or second one of the three non-volatile memory blocks of said one of its non-volatile memory (NVM) IC chips 250 to the memory cells 490 and 362 of its standard commodity FPGA IC chips 200 to be stored in the memory cells 490 and 362 of its standard commodity FPGA IC chips 200.

Specification for Processes for Fabricating Semiconductor Chip

Figure 18:
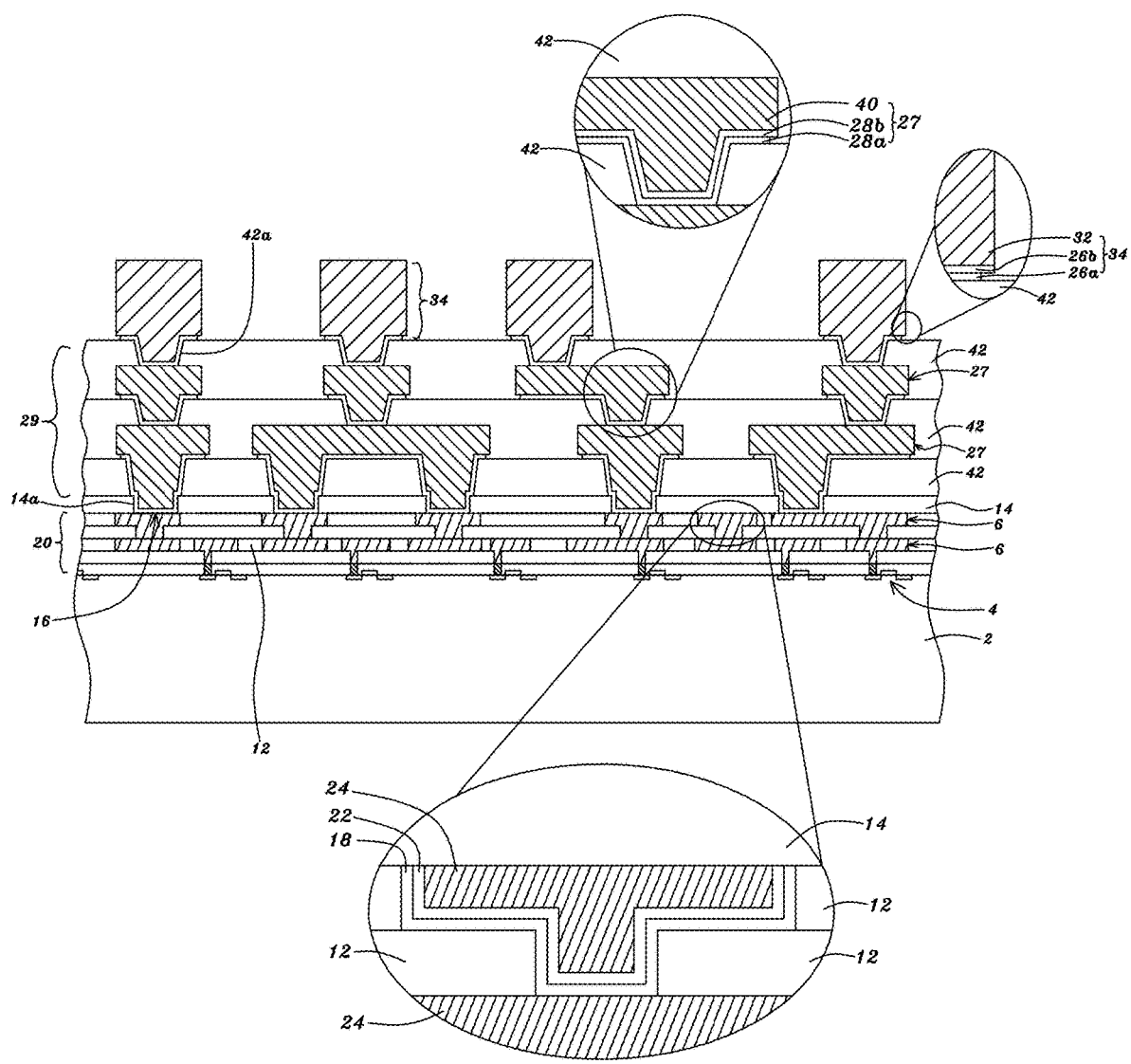
FIG. 18 is a schematically cross-sectional view showing a semiconductor chip in accordance with an embodiment of the present application.

FIG. 18 is a schematically cross-sectional view showing a semiconductor chip in accordance with an embodiment of the present application. Referring to FIG. 18, the standard commodity FPGA IC chips 200, DPIIC chips 410, dedicated I/O chips 265, dedicated control chip 260, NVM IC chips 250, DRAM IC chips 321, IAC chip 402, HBM IC chips 251, GPU chips 269a and CPU chip 269b as seen in FIG. 14 may have a structure for a semiconductor chip 100 mentioned as below. The semiconductor chip 100 may include (1) a semiconductor substrate 2, such as silicon substrate, GaAs substrate, SiGe substrate or Silicon-On-Insulator (SOI) substrate; (2) multiple semiconductor devices 4 in or over a semiconductor-device area of the semiconductor substrate 2; (3) a first interconnection scheme for a chip (FISC) 20 over the semiconductor substrate 2, provided with one or more interconnection metal layers 6 coupling to the semiconductor devices 4 and one or more insulating dielectric layers 12 each between neighboring two of the interconnection metal layers 6; (4) a passivation layer 14 over the first interconnection scheme for a chip (FISC) 20, wherein the first interconnection scheme 20 has multiple first metal pads at bottoms of multiple openings 14*a* in the passivation layer 14; (5) a second interconnection scheme 29 for a chip (SISC) optionally provided over the passivation layer 14, provided with one or more interconnection metal layers 27 coupling to the first metal pads of the first interconnection scheme for a chip (FISC) 20 through the openings 14*a* and one or more polymer layers 42 each between neighboring two of the interconnection metal layers 27, under a bottommost one of the interconnection metal layers 27 or over a topmost one of the interconnection metal layers 27, wherein the second interconnection scheme 29 has multiple second metal pads at bottoms of multiple openings 42*a* in the topmost one of its polymer layers 42; and (6) multiple micro-bumps or micro-pillars 34 on the second metal pads of the second interconnection scheme for a chip (SISC) 29 or, if the SISC 29 is not provided, on the first metal pads of the first interconnection scheme 20 for a chip (FISC).

Referring to FIG. 18, the semiconductor devices 4 may include a memory cell, a logic circuit, a passive device, such as resistor, capacitor, inductor or filter, or an active device, such as p-channel and/or n-channel MOS devices. The semiconductor devices 4 may compose the multiplexer 211 of the programmable logic cells (LC) 2014, memory cells 490 of the programmable logic cells (LC) 2014, memory cells 362 for the cross-point switches 379 and small I/O circuits 203, as illustrated in FIGS. 1A-11B, for each of its standard commodity FPGA IC chips 200 as seen in FIG. 14. The semiconductor devices 4 may compose the memory cells 362 for the cross-point switches 379 and small I/O circuits 203, as illustrated in FIGS. 1A-5B and 8, for each of its DPIIC chips 410 as seen in FIGS. 13 and 14. The semiconductor devices 4 may compose the large and small I/O circuits 341 and 203, as illustrated in FIGS. 5A and 5B, for each of the dedicated I/O chips 265 as seen in FIG. 14.

Referring to FIG. 18, each of the interconnection metal layers 6 of the FISC 20 may include (1) a copper layer 24 having lower portions in openings in a lower one of the insulating dielectric layers 12, such as SiOC layers having a thickness of between 3 nm and 500 nm, and upper portions having a thickness of between 3 nm and 500 nm over the lower one of the insulating dielectric layers 12 and in openings in an upper one of the insulating dielectric layers 12, (2) an adhesion layer 18, such as titanium or titanium nitride having a thickness of between 1 nm and 50 nm, at a bottom and sidewall of each of the lower portions of the copper layer 24 and at a bottom and sidewall of each of the upper portions of the copper layer 24, and (3) a seed layer 22, such as copper, between the copper layer 24 and the adhesion layer 18, wherein the copper layer 24 has a top surface substantially coplanar with a top surface of the upper one of the insulating dielectric layers 12.

Referring to FIG. 18, the passivation layer 14 containing a silicon-nitride, SiON or SiCN layer having a thickness greater than 0.3 μm for example may protect the semiconductor devices 4 and the interconnection metal layers 6 from being damaged by moisture foreign ion contamination, or from water moisture or contamination form external environment, for example sodium mobile ions. Each of the openings 14*a* in the passivation layer 14 may have a transverse dimension, from a top view, of between 0.5 and 20 μm.

Referring to FIG. 18, each of the interconnection metal layers 27 of the SISC 29 may include (1) a copper layer 40 having lower portions in openings in one of the polymer layers 42 having a thickness of between 0.3 μm and 20 μm, and upper portions having a thickness 0.3 μm and 20 μm over said one of the polymer layers 42, (2) an adhesion layer 28*a*, such as titanium or titanium nitride having a thickness of between 1 nm and 50 nm, at a bottom and sidewall of each of the lower portions of the copper layer 40 and at a bottom of each of the upper portions of the copper layer 40, and (3) a seed layer 28*b*, such as copper, between the copper layer 40 and the adhesion layer 28*a*, wherein said each of the upper portions of the copper layer 40 may have a sidewall not covered by the adhesion layer 28*a*.

Referring to FIG. 18, each of the micro-bumps or micro-pillars 34 over the SISC 29 or FISC 20 may be of various types. A first type of micro-bumps or micro-pillars 34 may include, as seen in FIG. 18, (1) an adhesion layer 26*a*, such as titanium (Ti) or titanium nitride (TiN) layer having a thickness of between 1 nm and 50 nm, on the second metal pads of the second interconnection scheme for a chip (SISC) 29 or, if the SISC 29 is not provided, on the first metal pads of the first interconnection scheme for a chip (FISC) 20, (2) a seed layer 26*b*, such as copper, on its adhesion layer 26*a* and (3) a copper layer 32 having a thickness of between 1 μm and 60 μm on its seed layer 26*b*. Alternatively, a second type of micro-bumps or micro-pillars 34 may include the adhesion layer 26*a*, seed layer 26*b* and copper layer 32 as mentioned above, and may further include, as seen in FIG. 20A, a tin-containing solder cap 33 made of tin or a tin-silver alloy, which has a thickness of between 1 μm and 50 μm on its copper layer 32. Alternatively, a third type of micro-bumps or micro-pillars 34 may be thermal compression bumps, including the adhesion layer 26*a* and seed layer 26*b* as mentioned above, and may further include, as seen in FIG. 21A, a copper layer 37 having a thickness $t_3$ of between 2 μm and 20 μm, such as 3 μm, and a largest transverse dimension $w_3$, such as diameter in a circular shape, between 1 μm and 15 μm, such as 3 μm, on its seed layer 26*b* and a solder cap 38 made of a tin-silver alloy, a tin-gold alloy, a tin-copper alloy, a tin-indium alloy, indium or tin, which has a thickness of between 1 μm and 15 μm, such as 2 μm, and a largest transverse dimension, such as diameter in a circular shape, between 1 μm and 15 μm, such as 3 μm, on its copper layer 37. The third type of micro-bumps or micro-pillars 34 are formed respectively on multiple metal pads 6*b* provided as seen in FIG. 18 by a topmost one of the interconnection metal layers 27 of the SISC 29 or by, if the SISC 29 is not provided, a topmost one of the interconnection metal layers 6 of the FISC 20, wherein each of the metal pads 6*b* may have a thickness t1 between 1 and 10 micrometers or between 2 and 10 micrometers and a largest transverse dimension w1, such as diameter in a circular shape, between 1 μm and 15 μm, such as 5 μm.

Embodiment for Interposer

One or more semiconductor chips 100 as seen in FIG. 18 may be packaged using an interposer. The interposer may be provided with high density interconnects for fan-out of the semiconductor chips 100 and interconnection between two of the semiconductor chips 100.

Figure 19:
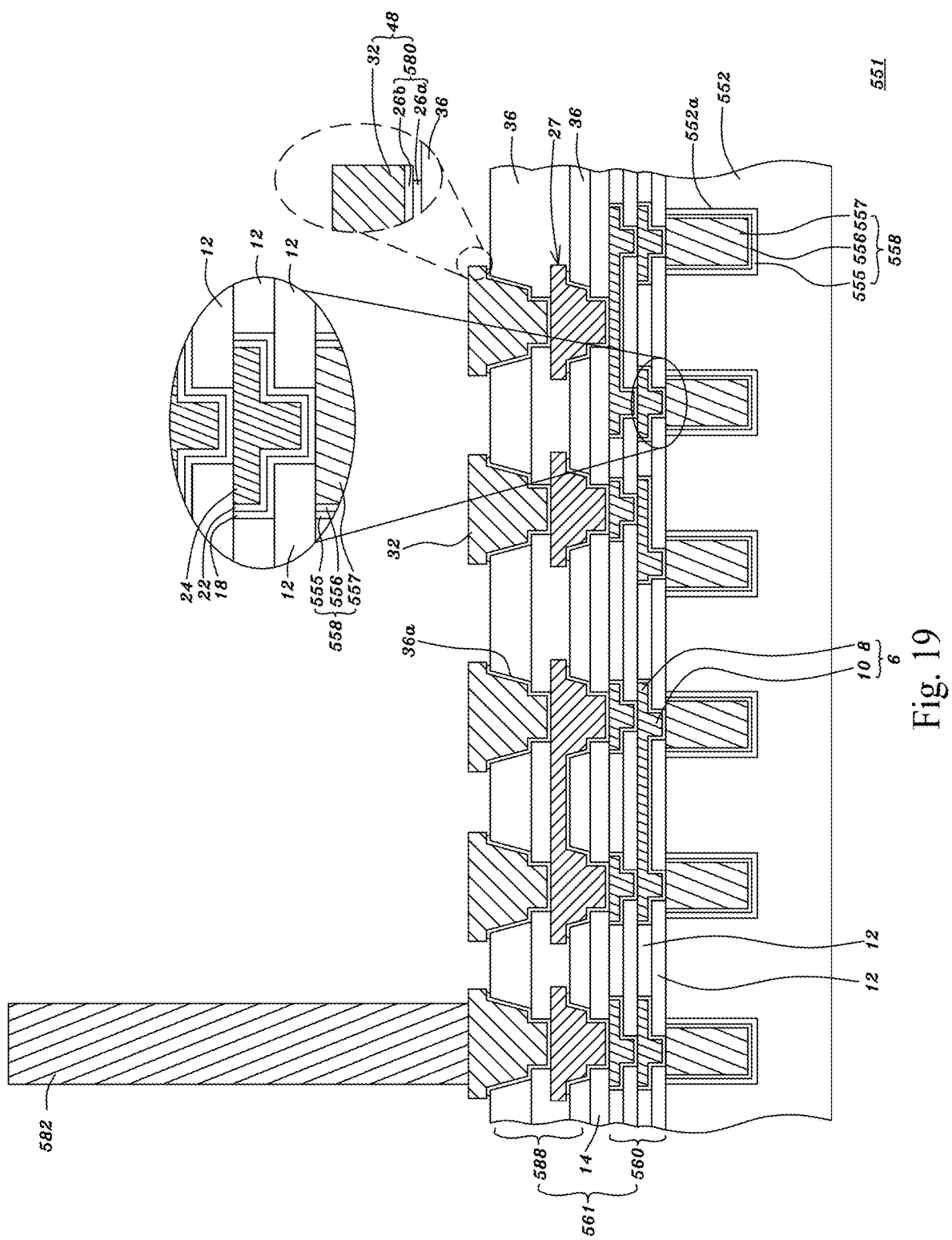
FIG. 19 is a schematically cross-sectional views showing an interposer in accordance with various embodiments of the present application.

FIG. 19 is a schematically cross-sectional view showing an interposer in accordance with various embodiments of the present application. Referring to FIG. 19, an interposer 551 may include (1) a semiconductor substrate 552, such as silicon wafer; (2) multiple vias 558 in the semiconductor substrate 552; (3) a first interconnection scheme for an interposer (FISIP) 560 over the semiconductor substrate 552, provided with one or more interconnection metal layers 6 coupling to the vias 558 and one or more insulating dielectric layers 12 each between neighboring two of the interconnection metal layers 6, wherein the specification and process for the interconnection metal layers 6 and insulating dielectric layers 12 for the FISIP 560 may be referred to those for the FISC 20 as illustrated in FIG. 18; (4) a passivation layer 14 over the first interconnection scheme for an interposer (FISIP) 560, wherein the first interconnection scheme 20 has multiple third metal pads at bottoms of multiple openings 14a in the passivation layer 14, wherein the specification and process for the passivation layer 14 over the FISIP 560 may be referred to those for the passivation layer 14 over the FISC 20 as illustrated in FIG. 18; (5) a second interconnection scheme for an interposer (SISIP) 588 optionally provided over the passivation layer 14, provided with one or more interconnection metal layers 27 coupling to the third metal pads of the first interconnection scheme for an interposer (FISIP) 560 through the openings 14a and one or more polymer layers 42 each between neighboring two of the interconnection metal layers 27, under a bottommost one of the interconnection metal layers 27 or over a topmost one of the interconnection metal layers 27, wherein the second interconnection scheme for an interposer (SISIP) 588 has multiple fourth metal pads at bottoms of multiple openings 42a in the topmost one of its polymer layers 42, wherein the specification and process for the interconnection metal layers 27 and polymer layers 14 for the SISIP 588 may be referred to those for the SISC 29 as illustrated in FIG. 18; (6) multiple micro-pads 48 on the fourth metal pads of the second interconnection scheme for an interposer (SISIP) 588 or, if the SISIP 588 is not provided, on the third metal pads of the first interconnection scheme for an interposer (FISIP) 560; and (7) multiple through package vias (TPVs) 582 each having a copper layer with a thickness of between 5 μm and 300 μm on the copper layer 32 of some of the micro-pads 48 of the interposer 551.

Alternatively, each of the micro-pads 48 over the SISIP 588 or FISIP 560 may be of various types. A first type of micro-pads 48 may include, as seen in FIG. 19, (1) an adhesion layer 26a, such as titanium (Ti) or titanium nitride (TiN) layer having a thickness of between 1 nm and 50 nm, on the fourth metal pads of the second interconnection scheme for an interposer (SISIP) 588 or, if the SISIP 588 is not provided, on the third metal pads of the first interconnection scheme for an interposer (FISIP) 560, (2) a seed layer 26b, such as copper, on its adhesion layer 26a and (3) a copper layer 32 having a thickness of between 1 μm and 60 μm on its seed layer 26b. Alternatively, a second type of micro-pads 48 may be thermal compression pads, including the adhesion layer 26a and seed layer 26b as mentioned above, and further including, as seen in FIG. 21A, a copper layer 39 having a thickness t2 of between 1 μm and 10 μm or between 2 and 10 micrometers and a largest transverse dimension w2, such as diameter in a circular shape, between 1 μm and 15 μm, such as 5 μm, on its seed layer 26b and a metal cap 49 made of a tin-silver alloy, a tin-gold alloy, a tin-copper alloy, a tin-indium alloy, indium, tin or gold, which has a thickness of between 0.1 μm and 5 μm, such as 1 μm, on its copper layer 39. Neighboring two of the micro-pads 48 of the second type may have a pitch (between centers of the neighboring two thereof) between 3 μm and 20 μm.

Referring to FIG. 19, each of the vias 558 may include (1) a copper layer 557 in the semiconductor substrate 552, (2) an insulating layer 555 at a sidewall and bottom of the copper layer 557 and in the semiconductor substrate 552 and (3) an adhesion/seed layer 556 at the sidewall and bottom of the copper layer 557 and between the copper layer 557 and the insulating layer 555. Each of the vias 588 or the copper layer 577 may have a depth between 30 μm and 150 μm, or 50 μm and 100 μm, and a diameter or largest transverse size between 5 μm and 50 μm, or 5 μm and 15 μm. The adhesion/seed layer 556 may include (1) a titanium (Ti) or titanium nitride (TiN) layer for adhesion with a thickness of between 1 nm to 50 nm at the sidewall and bottom of the copper layer 557 and between the copper layer 557 and the insulating layer 555, and (2) a seed layer, such as copper, with a thickness of between 3 nm and 200 nm at the sidewall and bottom of the copper layer 557 and between the copper layer 557 and the titanium (Ti) or titanium nitride (TiN) layer. The insulating layer 555 may include a thermally grown silicon oxide ($SiO_2$) and/or a CVD silicon nitride ($Si_3N_4$), for example.

Chip-to-Interposer Assembly

Figure 20A:
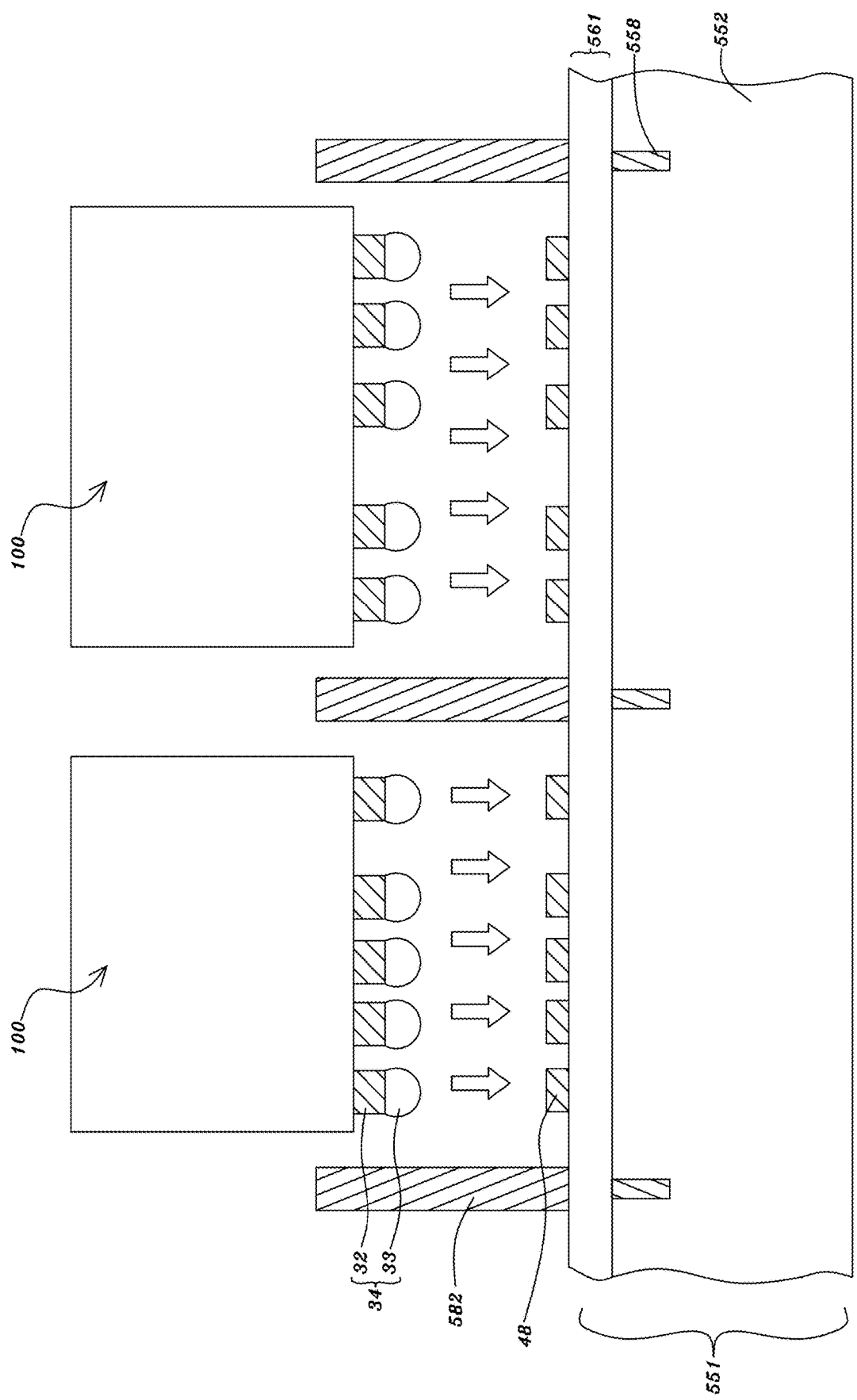
FIGS. 20A-20B are schematically cross-sectional views showing a process for fabricating a chip package for a logic drive in accordance with an embodiment of the present application.
Figure 20B:
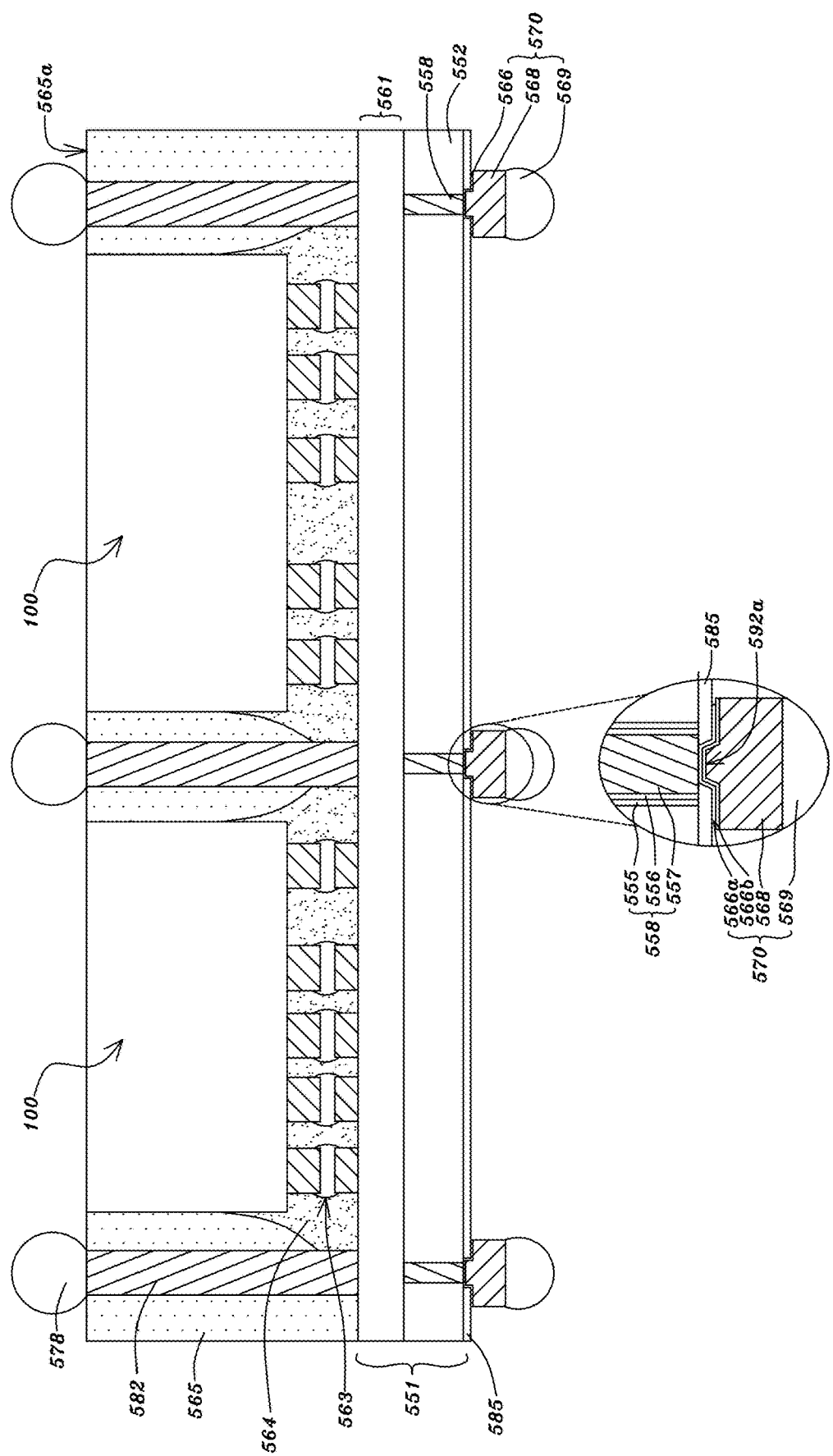
Figure 21A:
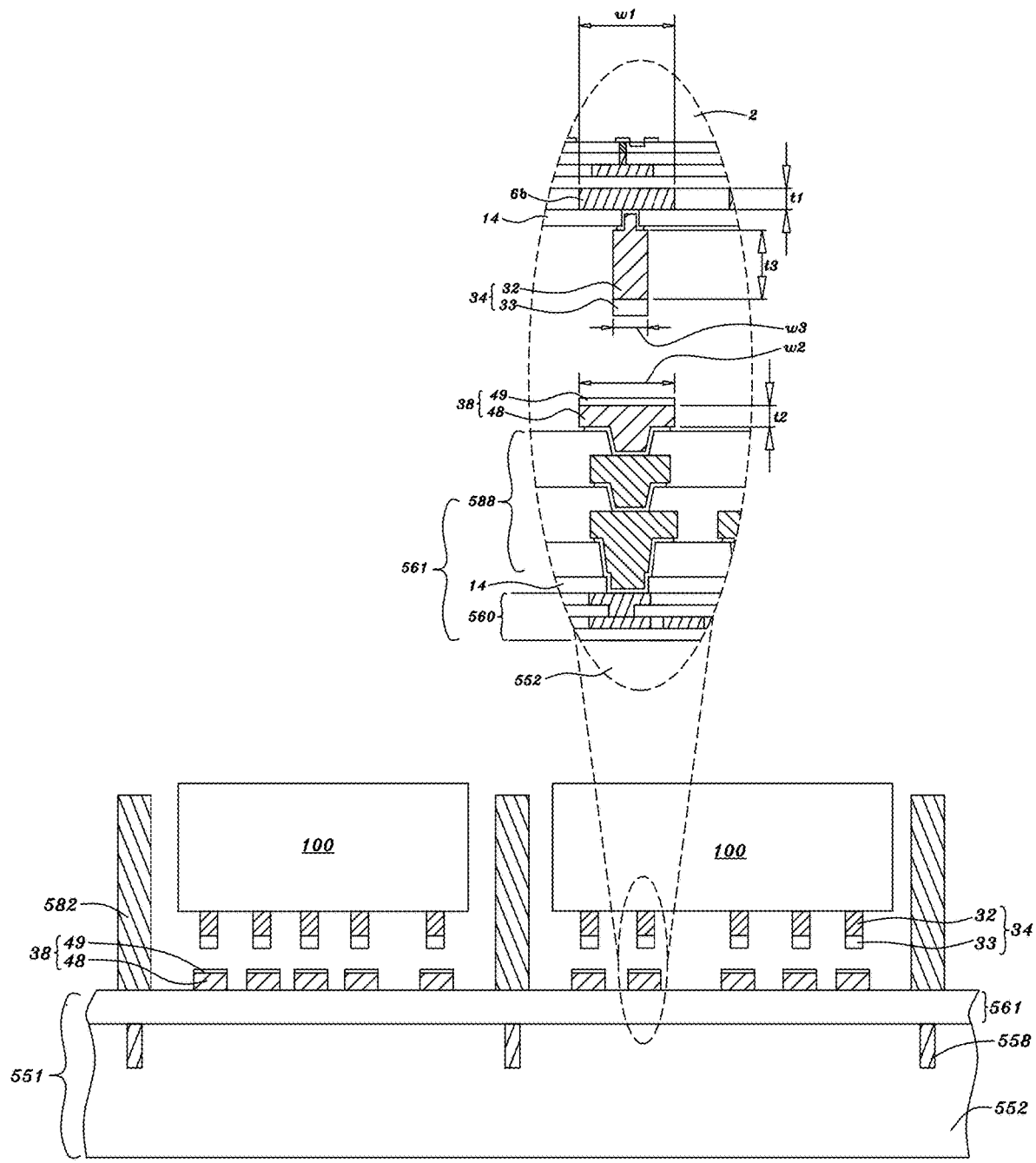
FIGS. 21A-21B are schematically cross-sectional views showing a process for fabricating a chip package for a logic drive in accordance with another embodiment of the present application.
Figure 21B:
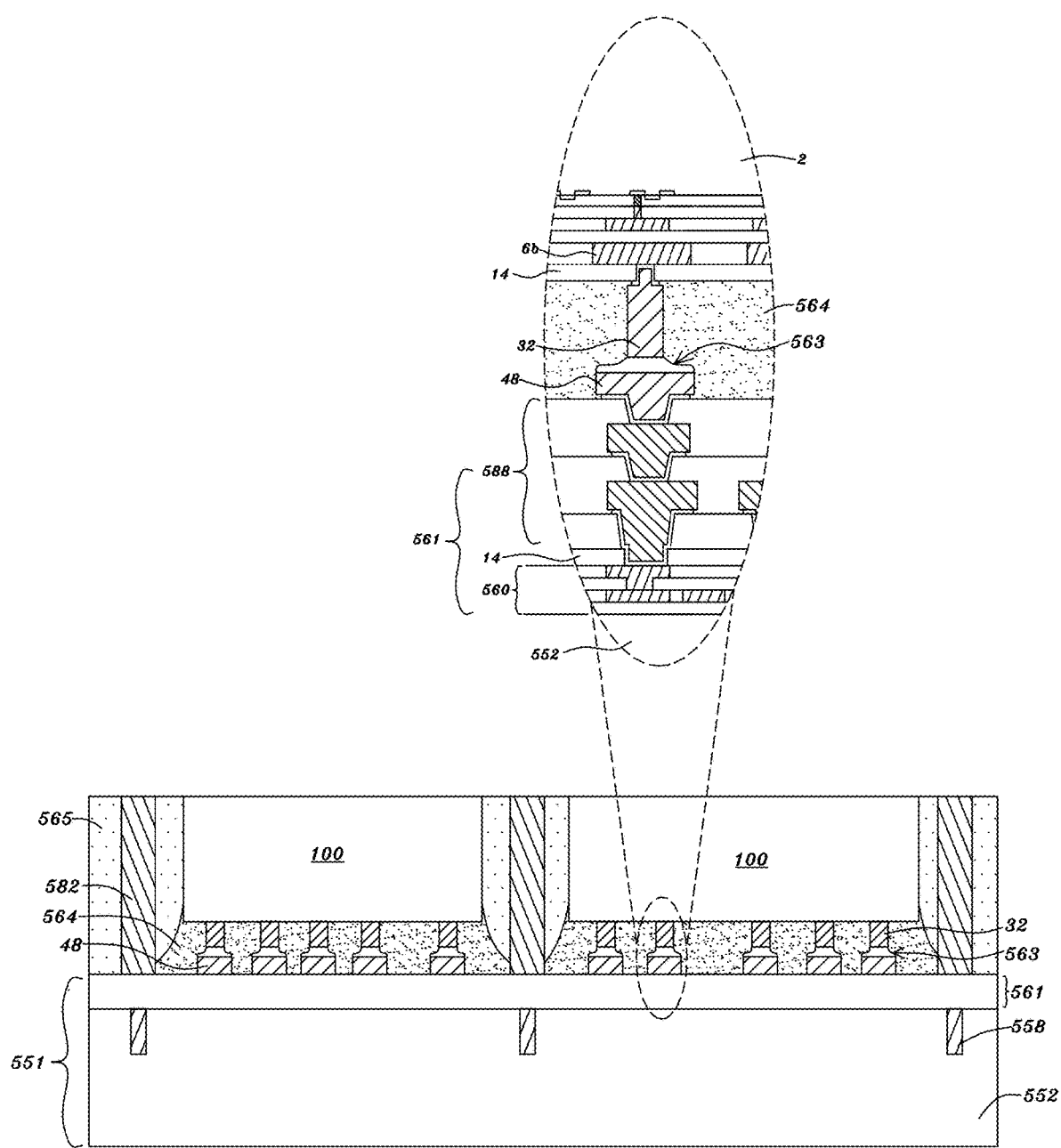

FIGS. 20A-20B are schematically cross-sectional views showing a process for fabricating a chip package for a standard commodity logic drive in accordance with an embodiment of the present application. FIGS. 21A-21B are schematically cross-sectional views showing a process for fabricating a chip package for a standard commodity logic drive in accordance with another embodiment of the present application. First, referring to FIG. 20A, each of the semiconductor chips 100 as seen in FIG. 18 may have the second type of micro-pillars or micro-bumps 34 to be bonded to the first type of micro-pads 48 preformed on the interposer 551. For example, for said each of the semiconductor chips 100, the second type of its micro-pillars or micro-bumps 34 may have the tin-containing solder cap 33 to be bonded onto the copper layer 32 of the micro-pads 48 of the first type preformed on the interposer 551 into multiple bonded contacts 563 as seen in FIG. 20B, wherein each of its micro-pillars or micro-bumps 34 of the second type may have the copper layer 32 having the thickness greater than the thickness of the copper layer 32 of the micro-pads 48 of the first type preformed on the interposer 551. An interconnection scheme 561 shown in FIGS. 20A-20B represents the first interconnection scheme for an interposer (FISIP) 560 and second interconnection scheme for an interposer (SISIP) 588 as seen in FIG. 19 or, if the SISIP 588 is not provided, represents the first interconnection scheme for an interposer (FISIP) 560 as seen in FIG. 19.

Alternatively, referring to FIG. 21A, each of the semiconductor chips 100 as seen in FIG. 18 may have the third type of micro-pillars or micro-bumps 34 to be thermally compressed, at a temperature between 240 and 300 degrees Celsius and at a pressure between 0.3 and 3 MPa, onto the second type of micro-pads 48 preformed on the interposer 551 for a time period between 3 and 15 seconds. A force applied to the semiconductor chip 100 in the thermal compression process may be substantially equal to the pressure times a contact area between one of the micro-pillars or micro-bumps 34 and one of the micro-pads 48 times the total number of the micro-pillars or micro-bumps 34 of the semiconductor chip 100. For example, for said each of the semiconductor chips 100 as seen in FIG. 18, the third type of its micro-pillars or micro-bumps 34 may have the solder cap 38 to be bonded onto the metal cap 49 of the micro-pads 48 of the second type preformed on the interposer 551 into multiple bonded contacts 563 as seen in FIG. 21B, wherein each of its micro-pillars or micro-bumps 34 of the third type may be provided with the copper layer 37 having the thickness t3 greater than the thickness t2 of the copper layer 39 of the micro-pads 48 of the second type preformed on the interposer 551 and having the largest transverse dimension w3 equal to between 0.7 and 0.1 times of the largest transverse dimension w2 of the copper layer 39 of the micro-pads 48 of the second type preformed on the interposer 551. Alternatively, each of its micro-pillars or micro-bumps 34 of the third type may be provided with the copper layer 37 having a cross-sectional area equal to between 0.5 and 0.01 times of the cross-sectional area of the copper layer 39 of the micro-pads 48 of the second type preformed on the interposer 551. Thereby, for the interposer 551, its interconnection scheme 561 may bear reduced stress from the micro-pillars or micro-bumps 34 of the third type during the thermal compression process. Each of its micro-pillars or micro-bumps 34 of the third type may be provided with the copper layer 37 having the thickness t3 greater than the thickness t1 of its metal pads 6b and having the largest transverse dimension w3 equal to between 0.7 and 0.1 times of the largest transverse dimension w1 of its metal pads 6b. Alternatively, each of its micro-pillars or micro-bumps 34 of the third type may be provided with the copper layer 37 having a cross-sectional area equal to between 0.5 and 0.01 times of the cross-sectional area of its metal pads 6b. Thereby, for said each of the semiconductor chips 100, its SISC 29 and/or FISC 20 as seen in FIG. 18 may bear reduced stress from the micro-pillars or micro-bumps 34 of the third type during the thermal compression process. Thereby, a bonded solder between the copper layers 32 and 48 of each of the bonded contacts 563 may be mostly kept on a top surface of one of the micro-pads 48 of the interposer 551 and extends out of the edge of said one of the micro-pads 48 of the interposer 551 less than 0.5 micrometers. A short between the bonded solders of neighboring two of the bonded contacts 563 even in a fine-pitched fashion may be avoided. An interconnection scheme 561 shown in FIGS. 21A-21B represents the first interconnection scheme for an interposer (FISIP) 560 and second interconnection scheme for an interposer (SISIP) 588 as seen in FIG. 19 or, if the SISIP 588 is not provided, represents the first interconnection scheme for an interposer (FISIP) 560 as seen in FIG. 19.

Figure 22:
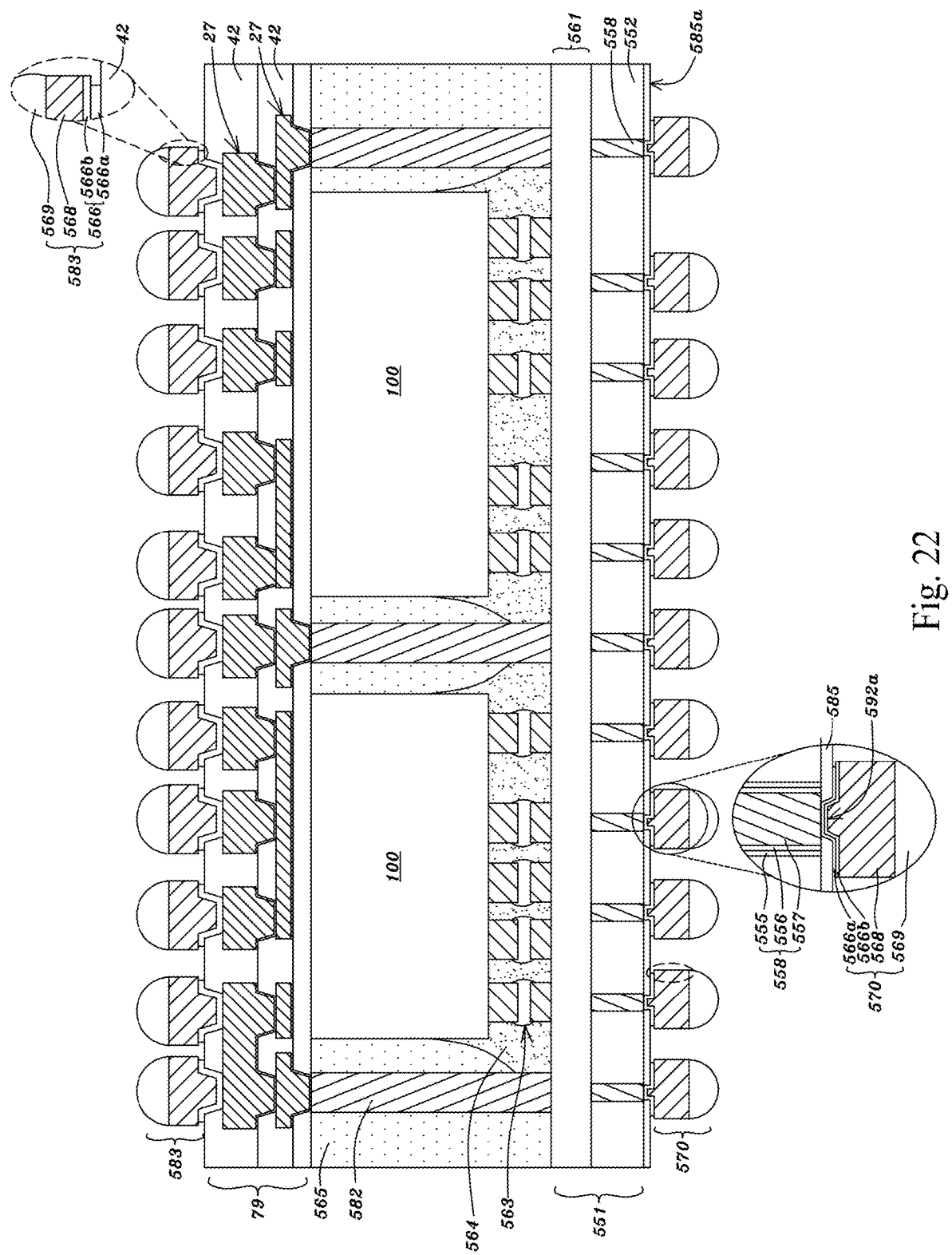
FIG. 22 is a schematically cross-sectional view showing a chip package for a logic drive in accordance with another embodiment of the present application.

Next, referring to FIGS. 20B and 21B, an underfill 564, such as epoxy resins or compounds, may be filled into a gap between each of the semiconductor chips 100 and the interposer 551, enclosing the bonded contacts 563. Next, a polymer layer 565, e.g., resin or compound, may be applied to fill a gap between each neighboring two of the semiconductor chips 100, to fill a gap between each neighboring two of the through package vias (TPVs) 582, and to cover a backside of said each of the semiconductor chips 100 and a top of each of the through package vias (TPVs) 582. Next, a polishing or grinding process may be applied to remove a top portion of the polymer layer 565 and a top portion of one or more of the semiconductor chips 100 until the top of said each of the through package vias (TPVs) 582 is exposed. Next, a chemically-and-mechanically-polishing (CMP) process or a wafer backside grinding process is applied to a backside of the interposer 551 until each of the vias 558 is exposed, that is, its insulating layer 555 at its backside is removed into an insulating lining surrounding its adhesion/seed layer 556 and copper layer 557, and a bottom end of its copper layer 557 is exposed. Next, a polymer layer 585 may be formed on a bottom surface of the interposer 551, and multiple openings 585a in the polymer layer 585 may expose the copper layer 557 of the vias 558 of the interposer 551. Next, multiple metal bumps 570 may be formed on and under the copper layer 557 of the vias 558. Each of the metal bumps 570 may be of various types. A first type of metal bumps 570 may include (1) an adhesion layer 566a, such as titanium (Ti) or titanium nitride (TiN) layer having a thickness of between 1 nm and 200 nm, on and under the copper layer 557 of the vias 558, (2) a seed layer 566b, such as copper, on and under the adhesion layer 566a and (3) a copper layer 568 having a thickness of between 1 μm and 50 μm on and under the seed layer 566b. Alternatively, a second type of metal bumps 570 may include the adhesion layer 566a, seed layer 566b and copper layer 568 as mentioned above, and may further include a tin-containing solder cap 569 such as tin or a tin-silver alloy having a thickness of between 1 μm and 50 μm on and under the copper layer 568. Next, multiple metal bumps 578, such as tin-containing solder, may be optionally formed on the tops of the through package vias (TPVs) 582. Alternatively, FIG. 22 is a schematically cross-sectional view showing a chip package for a logic drive in accordance with another embodiment of the present application. Referring to FIGS. 20B, 21B and 22, after the polishing or grinding process applied to the polymer layer 565 is performed as illustrated in FIGS. 20B and 21B and before the CMP process or wafer backside grinding process applied to the interposer 551 is performed as illustrated in FIGS. 20B and 21B, a backside metal interconnection scheme 79 for the logic drive 300 (BISD) as seen in FIG. 22 may be formed on and above the semiconductor chips 100, polymer layer 565 and through package vias (TPVs) 582. The specification for the backside metal interconnection scheme (BISD) 79 may be referred to the specification for the SISC 29 as illustrated in FIG. 18. The backside metal interconnection scheme (BISD) 79 may include one or more interconnection metal layers 27 coupling to the through package vias (TPVs) 582 and one or more polymer layers 42 each between neighboring two of the interconnection metal layers 27, under a bottommost one of the interconnection metal layers 27 or over a topmost one of the interconnection metal layers 27, wherein the backside metal interconnection scheme (BISD) 79 has multiple fifth metal pads at bottoms of multiple openings 42a in the topmost one of its polymer layers 42.

Figure 23:
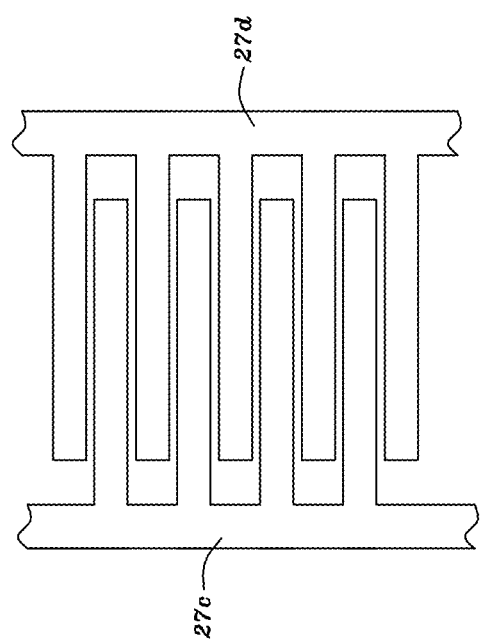
FIG. 23 is a top view showing a metal plane in accordance with an embodiment of the present application.

Next, referring to FIG. 22, multiple metal bumps 583 may be optionally formed on the fifth metal pads of the backside metal interconnection scheme (BISD) 79. The specification for the metal bumps 583 may be referred to the specification for the metal bumps 570 as illustrated in FIGS. 20B and 21B. FIG. 23 is a top view showing a metal plane in accordance with an embodiment of the present application. Referring to FIG. 23, one of the interconnection metal layers 27 of the BISD 79 as seen in FIG. 22 may include two metal planes 27c and 27d used as a power plane and ground plane respectively, wherein the metal planes 27c and 27d may have a thickness, for example, between 5 μm and 50 μm. Each of the metal planes 27c and 27d may be layout as an interlaced or interleaved shaped structure or fork-shaped structure, that is, each of the metal planes 27c and 27d may have multiple parallel-extension sections and a transverse connection section coupling the parallel-extension sections. One of the metal planes 27c and 27d may have one of the parallel-extension sections arranged between neighboring two of the parallel-extension sections of the other of the metal planes 27c and 27d.

Next, referring to FIG. 22, the chemically-and-mechanically-polishing (CMP) process or a wafer backside grinding process is applied to the backside of the interposer 551 as illustrated in FIGS. 20B and 21B. Next, the polymer layer 585 and metal bumps 570 as illustrated in FIGS. 20B and 21B may be formed at a bottom side of the interposer 551.

Figure 24A:
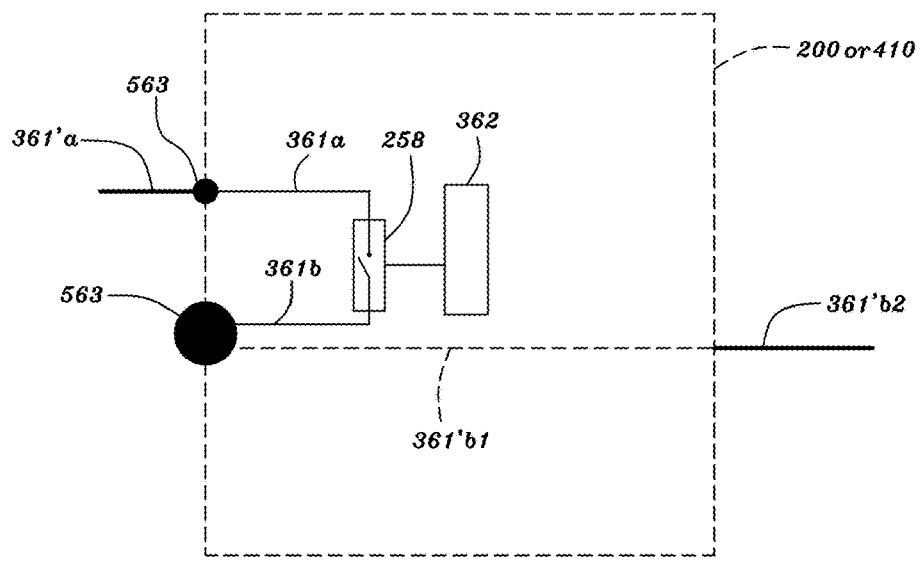
FIG. 24A is a circuit diagram showing multiple programmable interconnects provided by multiple inter-chip interconnects, configured to pass data through a pass/no-pass switch of a FPGA IC chip or DPIIC chip in accordance with an embodiment of the present application.
Figure 24B:
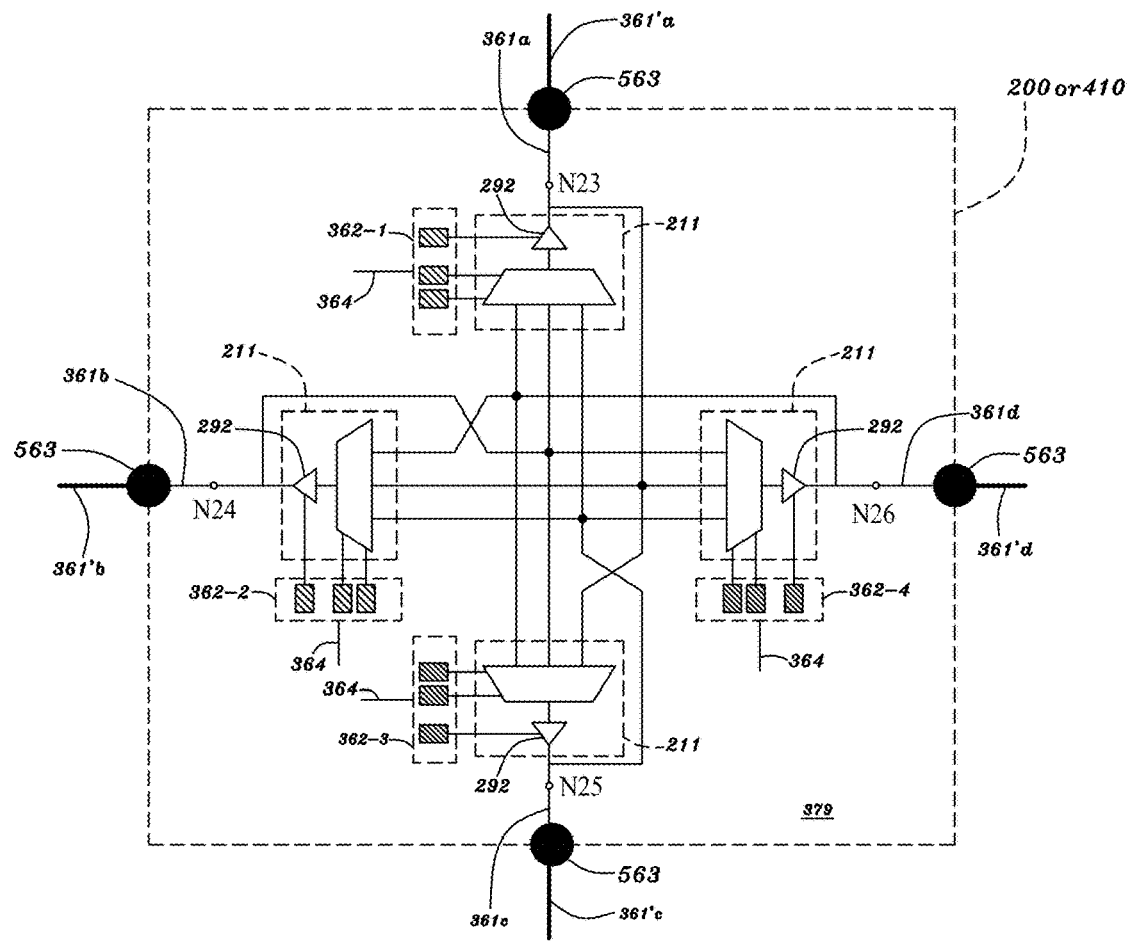
FIG. 24B is a circuit diagram showing multiple programmable interconnects provided by multiple inter-chip interconnects, configured to pass data through a cross-point switch of a FPGA IC chip or DPIIC chip in accordance with an embodiment of the present application.

Referring to FIG. 22, since the semiconductor chips 100 may include the FPGA IC chips 200 and DPIIC chips 410 as seen in FIG. 14, and the interconnection metal layers 27 of the BISD 79 as seen in FIG. 22 and the interconnection metal layers 6 and/or 27 of the FISIP 560 and/or SISIP 588 of the interposer 551 as seen in FIG. 19 are provided for the programmable interconnects 361 of the inter-chip interconnects 371 as seen in FIG. 14 coupling to the pass/no-pass switches 250 and/or cross-point switches 279 of the FPGA IC chips 200 and/or DPIIC chips 410 and/or to the programmable logic blocks 201 of the FPGA IC chips 200. Accordingly, the fifth metal pads and/or metal bumps 583, the metal bumps 570 and/or vias 558 and the through package via (TPV) 582 may couple to the pass/no-pass switches 250 and/or cross-point switches 279 of the FPGA IC chips 200 and/or DPIIC chips 410 and/or to the programmable logic blocks 201 of the FPGA IC chips 200 through the interconnection metal layers 27 of the BISD 79 and the interconnection metal layers 6 and/or 27 of the FISIP 560 and/or SISIP 588 of the interposer 551 to become programmable. For more elaboration, FIG. 24A is a circuit diagram showing multiple programmable interconnects provided by multiple inter-chip interconnects, configured to pass data through a pass/no-pass switch of a FPGA IC chip or DPIIC chip in accordance with an embodiment of the present application. FIG. 24B is a circuit diagram showing multiple programmable interconnects provided by multiple inter-chip interconnects, configured to pass data through a cross-point switch of a FPGA IC chip or DPIIC chip in accordance with an embodiment of the present application.

Referring to FIG. 24A, a first one of the programmable interconnects 361 may be divided into two sections 361a and 361'a configured to pass data to each other and a second one of the programmable interconnects 361 may be divided into three sections 361b, 361'b1 and 361'b2 configured to pass data to one another, wherein the FPGA IC chip 200 or DPIIC chip 410 may include the pass/no-pass switch 258 configured to switch on or off the connection between the first and second ones of the programmable interconnects 361. The section 361a of the first one of the programmable interconnects 361 may be provided by the interconnection metal layers 6 and/or 27 of the FISC 20 and/or SISC 29, as seen in FIG. 18, of the FPGA IC chip 200 or DPIIC chip 410 for the intra-chip interconnects 502 of the FPGA IC chip 200 or DPIIC chip 410 as seen in FIGS. 12A and 12B. The section 361'a of the first one of the programmable interconnects 361 may be provided by the interconnection metal layers 27 of the BISD 79 as seen in FIG. 22, the through package vias (TPVs) 582 as seen in FIGS. 20B, 21B and 22 and/or the interconnection metal layers 6 and/or 27 of the FISIP 560 and/or SISIP 588 of the interposer 551 as seen in FIG. 19 for the inter-chip interconnects 371 of the FPGA IC chip 200 or DPIIC chip 410 as seen in FIG. 14. The sections 361a and 361'a of the first one of the programmable interconnects 361 may pass data to each other through one of the small I/O circuits 203 of the FPGA IC chip 200 or DPIIC chip 410 as illustrated in FIGS. 5B, 12A, 12B and 13, one of the I/O pads 372 of the FPGA IC chip 200 or DPIIC chip 410 and one of the metal contacts 563 as seen in FIGS. 20B and 21B. The section 361b of the second one of the programmable interconnects 361 may be provided by the interconnection metal layers 6 and/or 27 of the FISC 20 and/or SISC 29, as seen in FIG. 18, of the FPGA IC chip 200 or DPIIC chip 410 for the intra-chip interconnects 502 of the FPGA IC chip 200 or DPIIC chip 410 as seen in FIGS. 12A and 12B. The section 361'b1 of the second one of the programmable interconnects 361 may be provided by the interconnection metal layers 6 and/or 27 of the FISIP 560 and/or SISIP 588 of the interposer 551, as seen in FIG. 19, under the FPGA IC chip 200 or DPIIC chip 410 for the inter-chip interconnects 371 of the FPGA IC chip 200 or DPIIC chip 410 as seen in FIG. 14. The section 361'b2 of the second one of the programmable interconnects 361 may be provided by the interconnection metal layers 6 and/or 27 of the FISIP 560 and/or SISIP 588 of the interposer 551, as seen in FIG. 19, not under the FPGA IC chip 200 or DPIIC chip 410 for the inter-chip interconnects 371 of the FPGA IC chip 200 or DPIIC chip 410 as seen in FIG. 14. The sections 361b and 361'b1 of the second one of the programmable interconnects 361 may pass data to each other through one of the small I/O circuits 203 of the FPGA IC chip 200 or DPIIC chip 410 as illustrated in FIGS. 5B, 12A, 12B and 13, one of the I/O pads 372 of the FPGA IC chip 200 or DPIIC chip 410 and one of the metal contacts 563 as seen in FIGS. 20B and 21B.

Referring to FIG. 24B, the FPGA IC chip 200 or DPIIC chip 410 may include the cross-point switch 379 configured to pass data in four directions. A first one of the programmable interconnects 361 may be divided into two sections 361a and 361'a configured to pass data to each other and to be associated with data at the node N23 of the cross-point switch 379 of the FPGA IC chip 200 or DPIIC chip 410, a second one of the programmable interconnects 361 may be divided into two sections 361b and 361'b configured to pass data to each other and to be associated with data at the node N24 of the cross-point switch 379 of the FPGA IC chip 200 or DPIIC chip 410, a third one of the programmable interconnects 361 may be divided into two sections 361c and 361'c configured to pass data to each other and to be associated with data at the node N25 of the cross-point switch 379 of the FPGA IC chip 200 or DPIIC chip 410 and a fourth one of the programmable interconnects 361 may be divided into two sections 361d and 361'd configured to pass data to each other and to be associated with data at the node N26 of the cross-point switch 379 of the FPGA IC chip 200 or DPIIC chip 410. The sections 361a, 361b, 361c and 361d of the first, second, third and fourth ones of the programmable interconnects 361 may be provided by the interconnection metal layers 6 and/or 27 of the FISC 20 and/or SISC 29, as seen in FIG. 18, of the FPGA IC chip 200 or DPIIC chip 410 for the intra-chip interconnects 502 of the FPGA IC chip 200 or DPIIC chip 410 as seen in FIGS. 12A and 12B. The sections 361'a, 361'b, 361'c and 361'd of the first, second, third and fourth ones of the programmable interconnects 361 may be provided by the interconnection metal layers 27 of the BISD 79 as seen in FIG. 22, the through package vias (TPVs) 582 as seen in FIGS. 20B, 21B and 22 and/or the interconnection metal layers 6 and/or 27 of the FISIP 560 and/or SISIP 588 of the interposer 551 as seen in FIG. 19 for the inter-chip interconnects 371 of the FPGA IC chip 200 or DPIIC chip 410 as seen in FIG. 14. For each of the first, second, third and fourth ones of the programmable interconnects 361, its section 361a, 361b, 361c or 361d may pass data to its section 361'a, 361'b, 361'c or 361'd through one of the small I/O circuits 203 of the FPGA IC chip 200 or DPIIC chip 410 as illustrated in FIGS. 5B, 12A, 12B and 13, one of the I/O pads 372 of the FPGA IC chip 200 or DPIIC chip 410 and one of the metal contacts 563 as seen in FIGS. 20B and 21B.

In a case, referring to FIGS. 12A, 12B, 16, 19 and 22, an expandable logic scheme based on a chip package, comprises: an interconnection substrate, such as interposer 551, comprising a set of data buses 315 for use in an expandable interconnection scheme, provided by the interconnection metal layers 27 of the SISIP 588 and the interconnection metal layers 6 of the FISIP 560, wherein the set of data buses 315 is divided into a plurality of data bus subsets, e.g., 315A, 315B, 315C and 315D; and a first field-programmable-gate-array (FPGA) integrated-circuit (IC) chip 200 comprising a plurality of first I/O ports 377, e.g., I/O Port 1, I/O Port 2, I/O Port 3 and I/O Port 4, coupling to the set of data buses 315 and at least one first I/O-port selection pad, e.g., 226, 228, 231 or 232, configured to select a first port, e.g., I/O Port 1, from the plurality of first I/O ports 377, e.g., I/O Port 1, I/O Port 2, I/O Port 3 and I/O Port 4, in a first clock cycle to pass a first data between a first data bus subset, e.g., 315A, of the plurality of data bus subsets, e.g., 315A, 315B, 315C and 315D, and the first field-programmable-gate-array (FPGA) integrated-circuit (IC) chip 200.

In a first example for the above case, the expandable logic scheme may further comprises a second field-programmable-gate-array (FPGA) integrated-circuit (IC) chip 200 comprising a plurality of second I/O ports 377, e.g., I/O Port 1, I/O Port 2, I/O Port 3 and I/O Port 4, coupling to the set of data buses 315 and at least one second I/O-port selection pad, e.g., 226, 228, 231 or 232, configured to select a second port, e.g., I/O Port 1, from the plurality of second I/O ports 377, e.g., I/O Port 1, I/O Port 2, I/O Port 3 and I/O Port 4, in the first clock cycle to pass the first data between the first data bus subset, e.g., 315A, and the second field-programmable-gate-array (FPGA) integrated-circuit (IC) chip 200. Alternatively, the second port, e.g., I/O Port 1, is configured to pass the first data from the second field-programmable-gate-array (FPGA) integrated-circuit (IC) chip 200 to the first data bus subset, e.g., 315A, in the first clock cycle, wherein the first port, e.g., I/O Port 1, is configured to pass the first data from the first data bus subset, e.g., 315A, to the first field-programmable-gate-array (FPGA) integrated-circuit (IC) chip 200 in the first clock cycle. Alternatively, the second port, e.g., I/O Port 1, is configured to pass the first data from the first data bus subset, e.g., 315A, to the second field-programmable-gate-array (FPGA) integrated-circuit (IC) chip 200 in the first clock cycle, and the first port, e.g., I/O Port 1, is configured to pass the first data from the first data bus subset, e.g., 315A, to the first field-programmable-gate-array (FPGA) integrated-circuit (IC) chip 200 in the first clock cycle.

In a second example for the above case, the expandable logic scheme may further comprises a memory chip, e.g., HBM IC chip 251, comprising a plurality of second I/O ports (not shown) coupling to the set of data buses, e.g., 315A, and at least one second I/O-port selection pad (not shown) configured to select a second port (not shown) from the plurality of second I/O ports (not shown) in the first clock cycle to pass data between the first data bus subset, e.g., 315A, and the memory chip 251. Alternatively, the second port (not shown) is configured to pass the first data from the memory chip 251 to the first data bus subset, e.g., 315A, in the first clock cycle, wherein the first port, e.g., I/O Port 1, is configured to pass the first data from the first data bus subset, e.g., 315A, to the first field-programmable-gate-array (FPGA) integrated-circuit (IC) chip 200 in the first clock cycle. Alternatively, the second port (not shown) is configured to pass the first data from the first data bus subset, e.g., 315A, to the memory chip 251 in the first clock cycle, and the first port, e.g., I/O Port 1, is configured to pass the first data from the first data bus subset, e.g., 315A, to the first field-programmable-gate-array (FPGA) integrated-circuit (IC) chip 200 in the first clock cycle. Alternatively, the first port, e.g., I/O Port 1, is configured to pass the first data from the first field-programmable-gate-array (FPGA) integrated-circuit (IC) chip 200 to the first data bus subset, e.g., 315A, in the first clock cycle, wherein the second port (not shown) is configured to pass the first data from the first data bus subset, e.g., 315A, to the memory chip 251 in the first clock cycle.

In a third example for the above case, the at least one first I/O-port selection pad, e.g., 226, 228, 231 or 232, is configured to select a second port, e.g., I/O Port 2, from the plurality of first I/O ports 377, e.g., I/O Port 1, I/O Port 2, I/O Port 3 and I/O Port 4, in the first clock cycle to pass a second data between a second data bus subset, e.g., 315B, of the plurality of data bus subsets, e.g., 315A, 315B, 315C and 315D, and the first field-programmable-gate-array (FPGA) integrated-circuit (IC) chip 200. Alternatively, the first port, e.g., I/O Port 1, is configured to pass the first data from the first field-programmable-gate-array (FPGA) integrated-circuit (IC) chip 200 to the first data bus subset, e.g., 315A, in the first clock cycle, and the second port, e.g., I/O Port 2, is configured to pass the second data from the first field-programmable-gate-array (FPGA) integrated-circuit (IC) chip 200 to the second data bus, e.g., 315B, in the first clock cycle. Alternatively, the first port, e.g., I/O Port 1, is configured to pass the first data from the first data bus subset, e.g., 315A, to the first field-programmable-gate-array (FPGA) integrated-circuit (IC) chip 200 in the first clock cycle, and the second port, e.g., I/O Port 2, is configured to pass the second data from the first field-programmable-gate-array (FPGA) integrated-circuit (IC) chip 200 to the second data bus subset, e.g., 315B, in the first clock cycle. Alternatively, the first port, e.g., I/O Port 1, is configured to pass the first data from the first data bus subset, e.g., 315A, to the first field-programmable-gate-array (FPGA) integrated-circuit (IC) chip 200 in the first clock cycle, and the second port, e.g., I/O Port 2, is configured to pass the second data from the second data bus subset, e.g., 315B, to the first field-programmable-gate-array (FPGA) integrated-circuit (IC) chip 200 in the first clock cycle.

In a fourth example for the above case, the first port, e.g., I/O Port 1, is configured to pass the first data from the first data bus subset, e.g., 315A, to the first field-programmable-gate-array (FPGA) integrated-circuit (IC) chip 200 in the first clock cycle, and the at least one first I/O-port selection pad, e.g., 226, 228, 231 or 232, is configured to select the first port, e.g., I/O Port 1, from the plurality of first I/O ports 377, e.g., I/O Port 1, I/O Port 2, I/O Port 3 and I/O Port 4, in a second clock cycle to pass a second data from the first field-programmable-gate-array (FPGA) integrated-circuit (IC) chip 200 to the first data bus subset, e.g., 315A.

Package-on-Package (POP) or Stack-Package Assembly for FOIT LOGIC Drives

Figure 25:
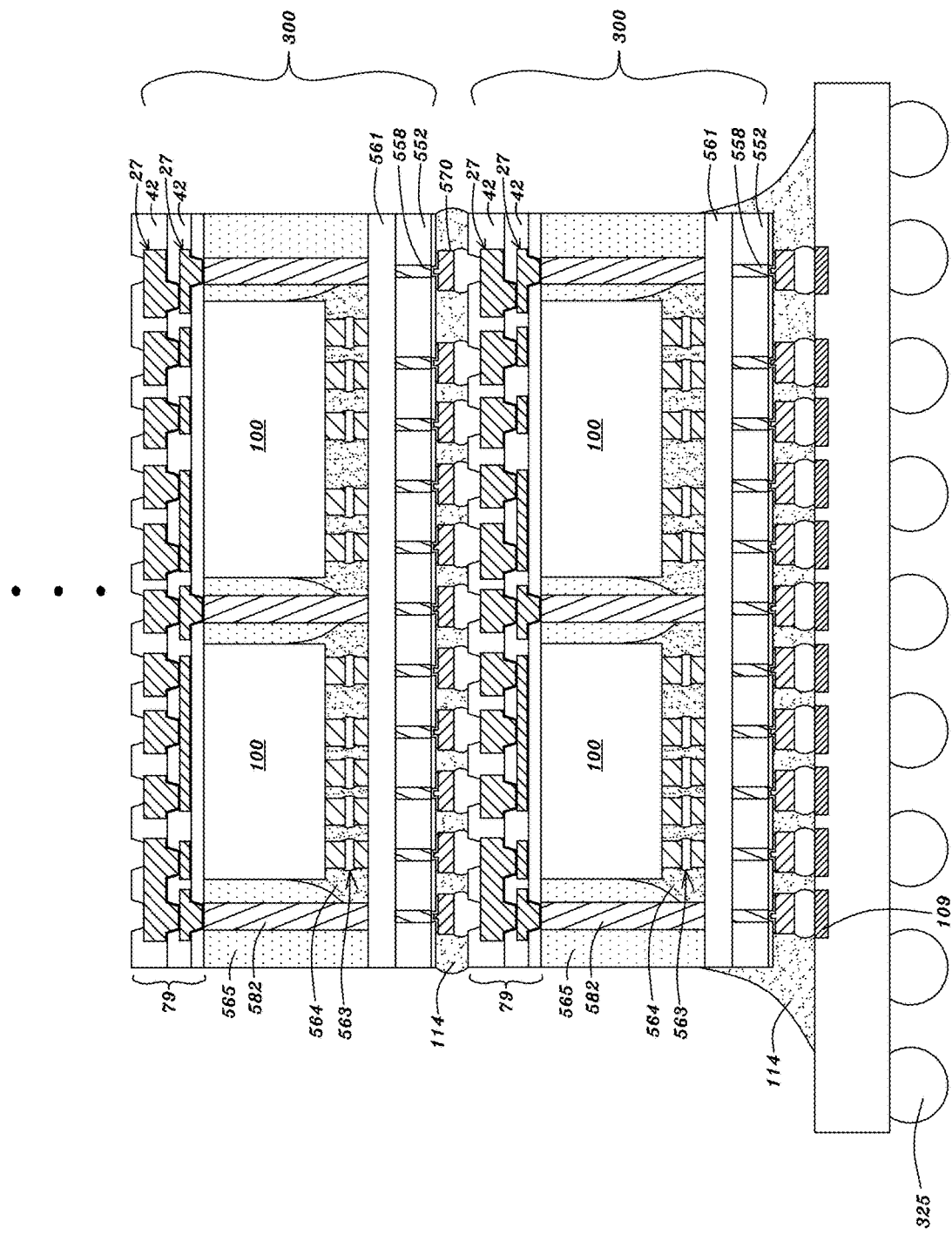
FIG. 25 is a schematically cross-sectional view showing a package-on-package assembly in accordance with an embodiment of the present application.

FIG. 25 is a schematically cross-sectional view showing a package-on-package assembly in accordance with an embodiment of the present application. Referring to FIG. 25, multiple logic drives 300 as seen in FIG. 22 may be stacked together. An upper one of the logic drives 300 may have its metal bumps 570 bonded to the fifth metal pads of the backside metal interconnection scheme (BISD) 79 of a lower one of the logic drives 300, and an underfill 114 may be filled between the upper and lower ones of the logic drives 300, enclosing the metal bumps 570 between the upper and lower ones of the logic drives 300. The bottom-most one of the logic drives 300 may have its metal bumps 570 bonded to multiple metal pads 109 of a circuit board 113 at a top surface thereof, and an underfill 114 may be filled between the bottommost one of the logic drives 300 and the circuit board 113, enclosing the metal bumps 570 between the bottommost one of the logic drives 300 and the circuit board 113. Multiple solder balls 325 are formed on a bottom surface of the circuit board 113.

Interposer-to-Interposer Assembly for Logic and Memory Drives

Figure 26:
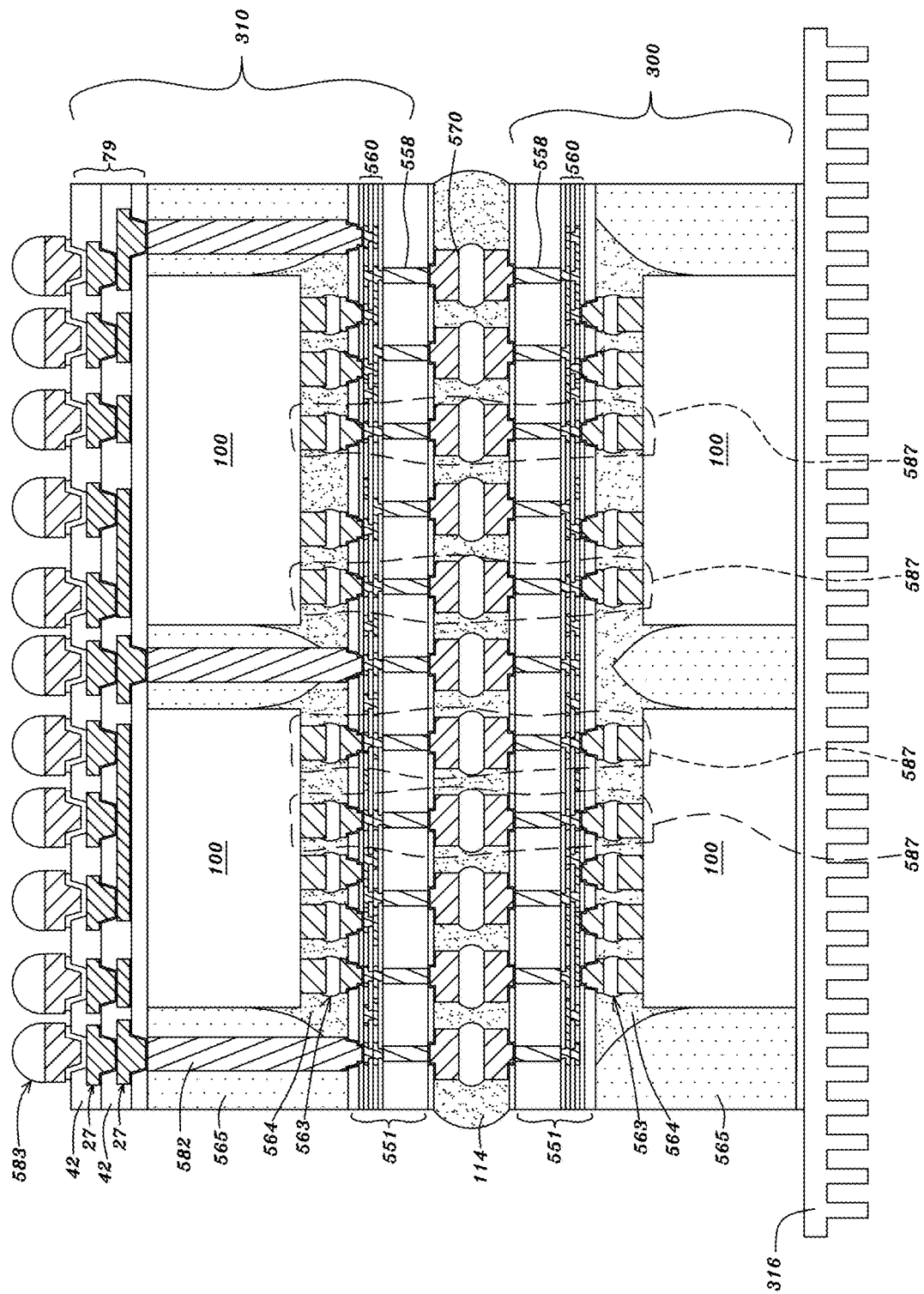
FIG. 26 is a schematically cross-sectional view showing an assembly for logic and memory drives in accordance with an embodiment of the present application.

FIG. 26 is a schematically cross-sectional view showing an assembly for FOIT logic and memory drives in accordance with an embodiment of the present application. Referring to FIG. 26, all of the FPGA IC chips 200, GPU chips 269a, CPU chips 269b and dedicated programmable interconnection IC chips 410 in the logic drives 300 as seen in FIG. 14 may not be provided but multiple memory chips, e.g., HBM IC chips, cache SRAM chips, DRAM IC chips, or NVMIC chips for MRAM or RRAM, may be provided for a memory drive 310 that also include the interposer 551, through package vias (TPVs) 582, backside metal interconnection scheme (BISD) 79 and metal bumps 570 and 583 as illustrated in FIG. 22. The memory drive 310 may have its metal bumps 570 to be bonded to the metal bumps 570 of the logic drive 300 to form multiple bonded contacts 586 between the memory drive 310 and logic drive 300. Each of stacked vias 587 may be composed of (1) one of the bonded contacts 586, (2) one of stacked portions provided by the vias 558 and interconnection metal layers 6 and/or 27 of the FISIP 560 and/or SISIP 588, as seen in FIG. 19, of the interposer 551 of the logic 300, (3) one of the bonded contacts 563 of the logic drive 300, (4) one of stacked portions provided by the vias 558 and interconnection metal layers 6 and/or 27 of the FISIP 560 and/or SISIP 588, as seen in FIG. 19, of the interposer 551 of the memory drive 310 and (5) one of the bonded contacts 563 of the memory drive 310, which are aligned in a vertical direction to form vertical signal paths between one of the semiconductor chips 100 of the logic drive 300, such as FPGA IC chip 200, GPU chip 269a or CPU chip 269c as seen in FIG. 18, and one of the semiconductor chips 100 of the memory drive 310, such as HBM IC chip or DRAM IC chip. A plurality of the vertical stacked path 587 having the number equal to or greater than 64, 128, 256, 512, 1024, 2048, 4096, 8K, or 16K, for example, may be connected between said one of the semiconductor chips 100 of the logic drive 300 and said one of the semiconductor chips 100 of the memory drive 310 for parallel signal transmission or power or ground delivery. Further, a heat sink 316 made of copper or aluminum for example may be mounted to backsides of the semiconductor chips 100 of the logic drive 300.

Internet or Network Between Data Centers and Users

Figure 27:
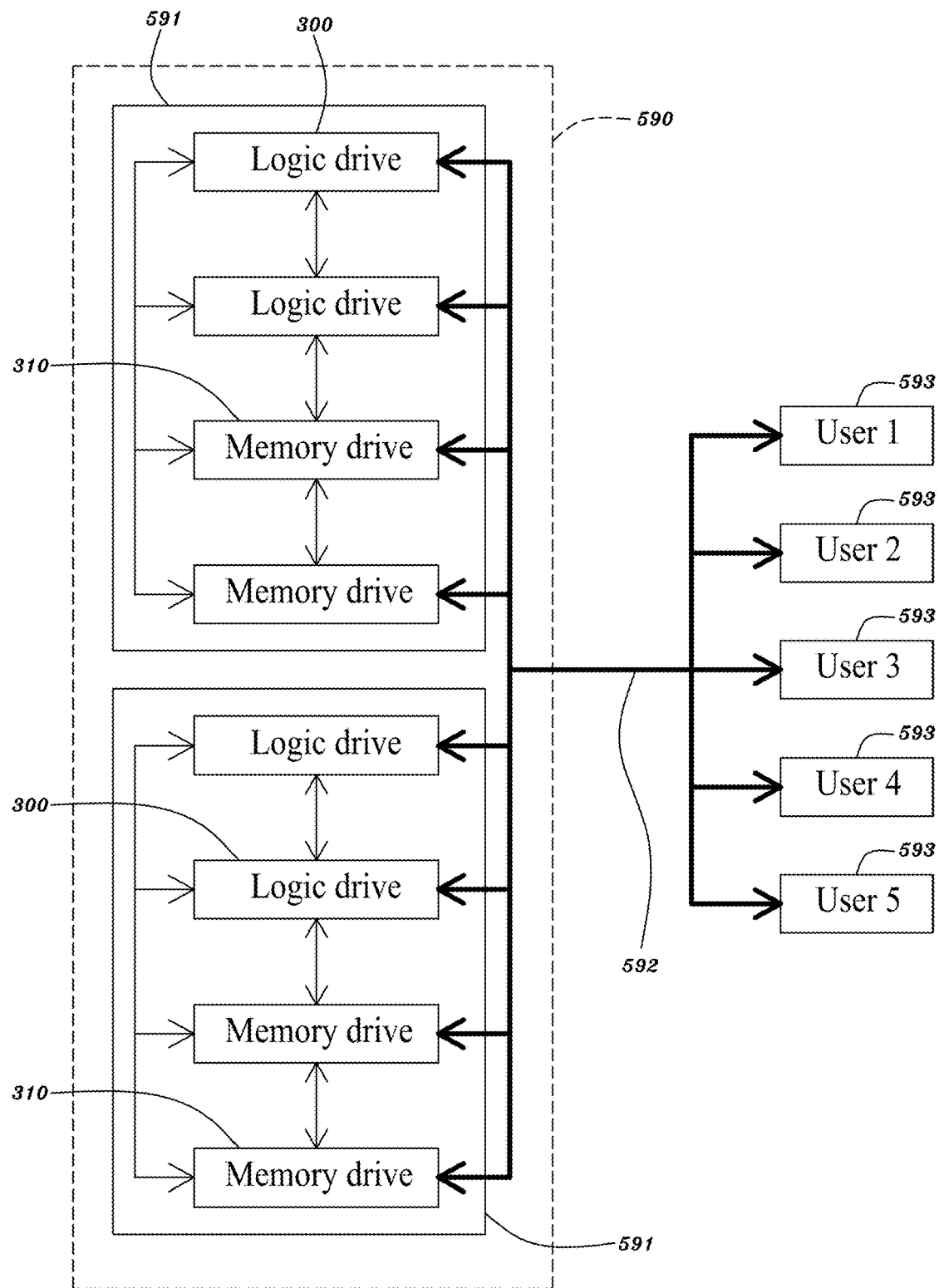
FIG. 27 is a block diagram illustrating networks between multiple data centers and multiple users in accordance with an embodiment of the present application.
Figure 28:
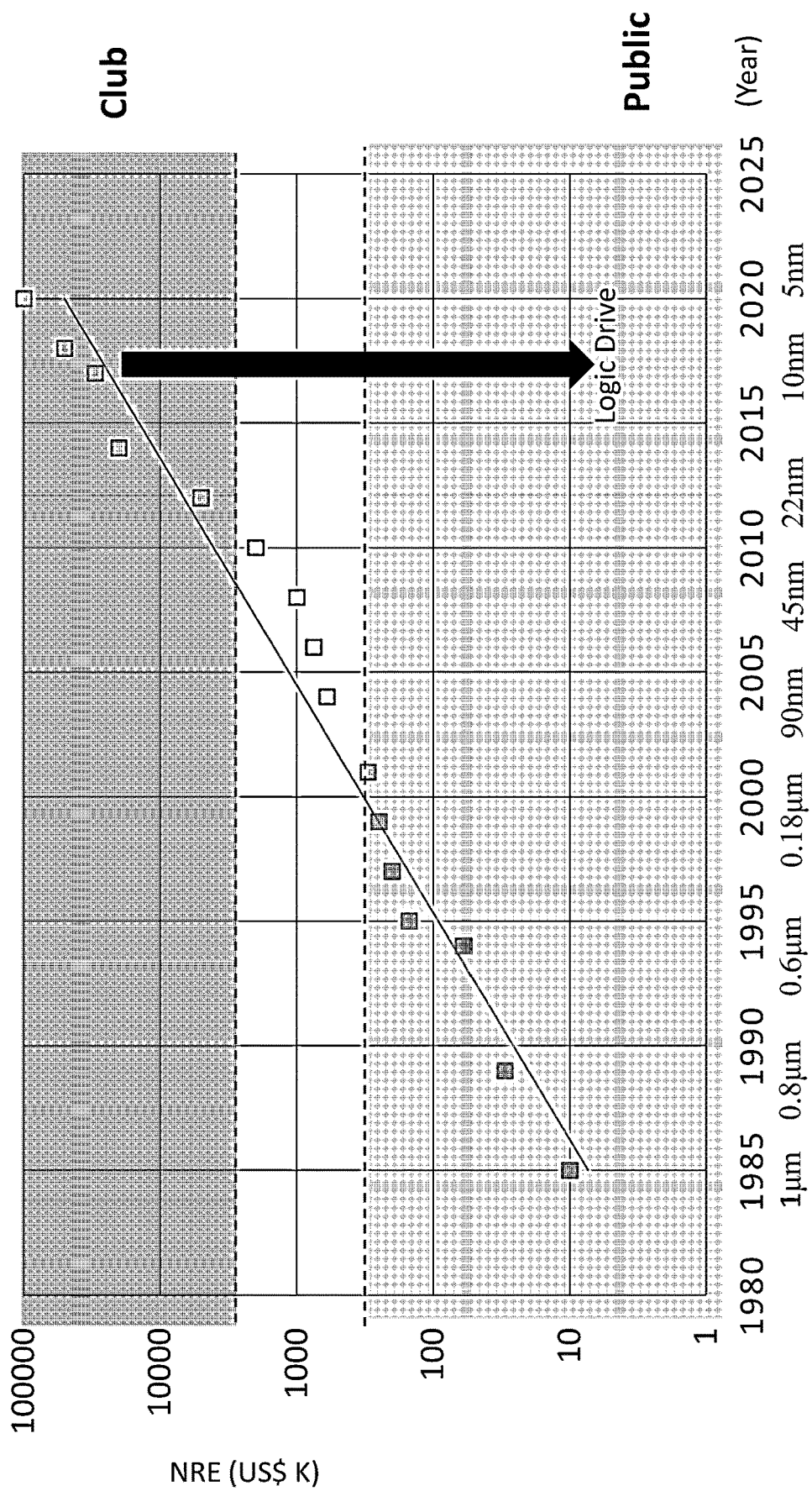
FIG. 28 is a chart showing a trend of relationship between non-recurring engineering (NRE) costs and technology nodes.

FIG. 27 is a block diagram illustrating networks between multiple data centers and multiple users in accordance with an embodiment of the present application. Referring to FIG. 27, in the cloud 590 are multiple data centers 591 connected to each other or one another via the internet or networks 592. In each of the data centers 591 may be a plurality of one of the standard commodity logic drives 300 and/or a plurality of one of the memory drives 310, as illustrated in FIG. 26, allowed for one or more of user devices 593, such as computers, smart phones or laptops, to offload and/or accelerate service-oriented functions of all or any combinations of functions of artificial intelligence (AI), machine learning, deep learning, big data, internet of things (TOT), industry computing, virtual reality (VR), augmented reality (AR), car electronics, graphic processing (GP), video streaming, digital signal processing (DSP), micro controlling (MC), and/or central processing (CP) when said one or more of the user devices 593 is connected via the internet or networks to the standard commodity logic drives 300 and/or memory drives 310 in one of the data centers 591 in the cloud 590. In each of the data centers 591, the standard commodity logic drives 300 may couple to each other or one another via local circuits of said each of the data centers 591 and/or the internet or networks 592 and to the memory drives 310 via local circuits of said each of the data centers 591 and/or the internet or networks 592, wherein the memory drives 310 may couple to each other or one another via local circuits of said each of the data centers 591 and/or the internet or networks 592. Accordingly, the standard commodity logic drives 300 and memory drives 310 in the data centers 591 in the cloud 590 may be used as an infrastructure-as-a-service (IaaS) resource for the user devices 593. Similarly, to renting virtual memories (VMs) in a cloud, the field programmable gate arrays (FPGAs), which may be considered as virtual logics (VL), may be rented by users. In a case, each of the standard commodity logic drives 300 in one or more of the data centers 591 may include the FPGA IC chips 200 fabricated using a semiconductor IC process technology node more advanced than 28 nm technology node. A software program may be written on the user devices 593 in a common programing language, such as Java, C++, C#, Scala, Swift, Matlab, Assembly Language, Pascal, Python, Visual Basic, PL/SQL or JavaScript language. The software program may be uploaded by one of the user devices 590 via the internet or networks 592 to the cloud 590 to program the standard commodity logic drives 300 in the data centers 591 or cloud 590. The programmed logic drives 300 in the cloud 590 may be used by said one or another of the user devices 593 for an application via the internet or networks 592.

The scope of protection is limited solely by the claims, and such scope is intended and should be interpreted to be as broad as is consistent with the ordinary meaning of the language that is used in the claims when interpreted in light of this specification and the prosecution history that follows, and to encompass all structural and functional equivalents thereof

What is claimed is:

1. A chip package comprising:
   a first interconnection scheme comprising a first interconnection metal layer, a second interconnection metal layer over the first interconnection metal layer and an insulating dielectric layer between the first and second interconnection metal layers;
   a first semiconductor chip over the first interconnection scheme, wherein the first semiconductor chip has a power supply voltage smaller than or equal to 0.5 volts, wherein the first interconnection scheme is under the first semiconductor chip and across an edge of the first semiconductor chip;
   a plurality of metal bumps between the first semiconductor chip and first interconnection scheme, wherein each of the plurality of metal bumps couples the first semiconductor chip to the first interconnection scheme;
   a second semiconductor chip over the first semiconductor chip; and
   a plurality of metal contacts between the first and second semiconductor chips.

2. The chip package of claim 1 further comprising a silicon substrate under the first interconnection scheme and a through silicon via (TSV) in the silicon substrate, wherein the through silicon via (TSV) extends vertically in the silicon substrate and couples to the first interconnection metal layer.

3. The chip package of claim 1, wherein each of the plurality of metal contacts comprises a copper layer.

4. The chip package of claim 1, wherein each of the plurality of metal contacts comprises tin.

5. The chip package of claim 1, wherein the first semiconductor chip comprises an I/O circuit having a driving capability between 0.1 and 1 pF.

6. The chip package of claim 1, wherein the first semiconductor chip comprises an I/O circuit having an input capacitance between 0.1 and 1 pF.

7. The chip package of claim 1, wherein the first semiconductor chip comprises a field-programmable-gate-array (FPGA) integrated-circuit (IC) chip.

8. The chip package of claim 1, wherein the first semiconductor chip comprises a logic chip.

9. The chip package of claim 1, wherein the second semiconductor chip comprises a memory chip.

10. The chip package of claim 1, wherein the first semiconductor chip is in a technology node more advanced than 10 nm.

11. The chip package of claim 1, wherein the power supply voltage is between 0.1 and 0.5 volts.

12. A chip package comprising:
a first semiconductor chip having a first semiconductor substrate and a transistor at a top surface of the first semiconductor substrate, wherein the first semiconductor chip has a power supply voltage smaller than or equal to 0.5 volts, wherein the first semiconductor chip comprises a plurality of first metal contacts at a top thereof; and
a second semiconductor chip over the first semiconductor chip, wherein the second semiconductor chip has a second semiconductor substrate and a transistor at a bottom surface of the second semiconductor substrate, wherein the bottom surface of the second semiconductor substrate faces the top surface of the first semiconductor substrate, wherein the second semiconductor chip comprises a plurality of second metal contacts at a bottom thereof, wherein each of the plurality of second metal contacts is coupled to and vertically aligned with one of the plurality of first metal contacts.

13. The chip package of claim 12, wherein each of the plurality of first metal contacts comprises a copper layer.

14. The chip package of claim 12, wherein each of the plurality of second metal contacts comprises a copper layer.

15. The chip package of claim 12, wherein the first semiconductor chip comprises an I/O circuit having a driving capability between 0.1 and 1 pF.

16. The chip package of claim 12, wherein the first semiconductor chip comprises an I/O circuit having an input capacitance between 0.1 and 1 pF.

17. The chip package of claim 12, wherein the first semiconductor chip comprises a field-programmable-gate-array (FPGA) integrated-circuit (IC) chip.

18. The chip package of claim 12, wherein the first semiconductor chip comprises a logic chip.

19. The chip package of claim 12, wherein the second semiconductor chip comprises a memory chip.

20. The chip package of claim 12, wherein the first semiconductor chip comprises a logic chip, and the second semiconductor chip comprises a cache static-random-access-memory (SRAM) chip.

21. The chip package of claim 12, wherein the first semiconductor chip is in a technology node more advanced than 10 nm.

22. The chip package of claim 12, wherein the power supply voltage is between 0.1 and 0.5 volts.

* * * * *